United States Patent [19]
Ooishi

[11] Patent Number: 6,028,810
[45] Date of Patent: Feb. 22, 2000

[54] FAST ACCESSIBLE DYNAMIC TYPE SEMICONDUCTOR MEMORY DEVICE

[75] Inventor: Tsukasa Ooishi, Hyogo, Japan

[73] Assignee: Mitsubishi Denki Kabushiki Kaisha, Tokyo, Japan

[21] Appl. No.: 09/124,230

[22] Filed: Jul. 29, 1998

Related U.S. Application Data

[62] Division of application No. 08/674,596, Jun. 27, 1996.

[30] Foreign Application Priority Data

Jul. 3, 1995 [JP] Japan ................................. 7-167358

[51] Int. Cl.[7] ........................................... G11C 8/00
[52] U.S. Cl. ............................. 365/230.03; 395/405
[58] Field of Search ............................ 395/405, 425; 365/230.03

[56] References Cited

U.S. PATENT DOCUMENTS

| | | | |
|---|---|---|---|
| 4,090,254 | 5/1978 | Ho et al. ........................ | 365/150 |
| 4,238,841 | 12/1980 | Clemen et al. ................ | 365/203 |
| 4,939,733 | 7/1990 | Furutani ........................ | 371/40.1 |
| 4,999,814 | 3/1991 | Hashimoto .................... | 365/222 |
| 5,229,971 | 7/1993 | Kiryu et al. ................ | 365/230.03 |
| 5,323,488 | 6/1994 | Udagawa ........................ | 395/425 |
| 5,373,475 | 12/1994 | Nagase .......................... | 365/222 |
| 5,410,664 | 4/1995 | Brooks et al. ................ | 395/400 |
| 5,418,754 | 5/1995 | Sakakibara .................... | 365/222 |
| 5,499,215 | 3/1996 | Hatta ........................ | 365/230.03 |
| 5,526,128 | 6/1996 | Fujiki et al. ................ | 358/444 |
| 5,544,105 | 8/1996 | Hirose et al. ................ | 365/189.11 |

*Primary Examiner*—David Nelms
*Assistant Examiner*—M. Tran
*Attorney, Agent, or Firm*—McDermott, Will & Emery

[57] ABSTRACT

Respective ones of a plurality of memory array blocks are rendered drivable independently of each other under control of an array activation control circuit. When data is read from one array block under control of the array activation control circuit, the data can be transferred to another array block by selecting and coupling a column in the other array block to a global I/O bus.

23 Claims, 77 Drawing Sheets

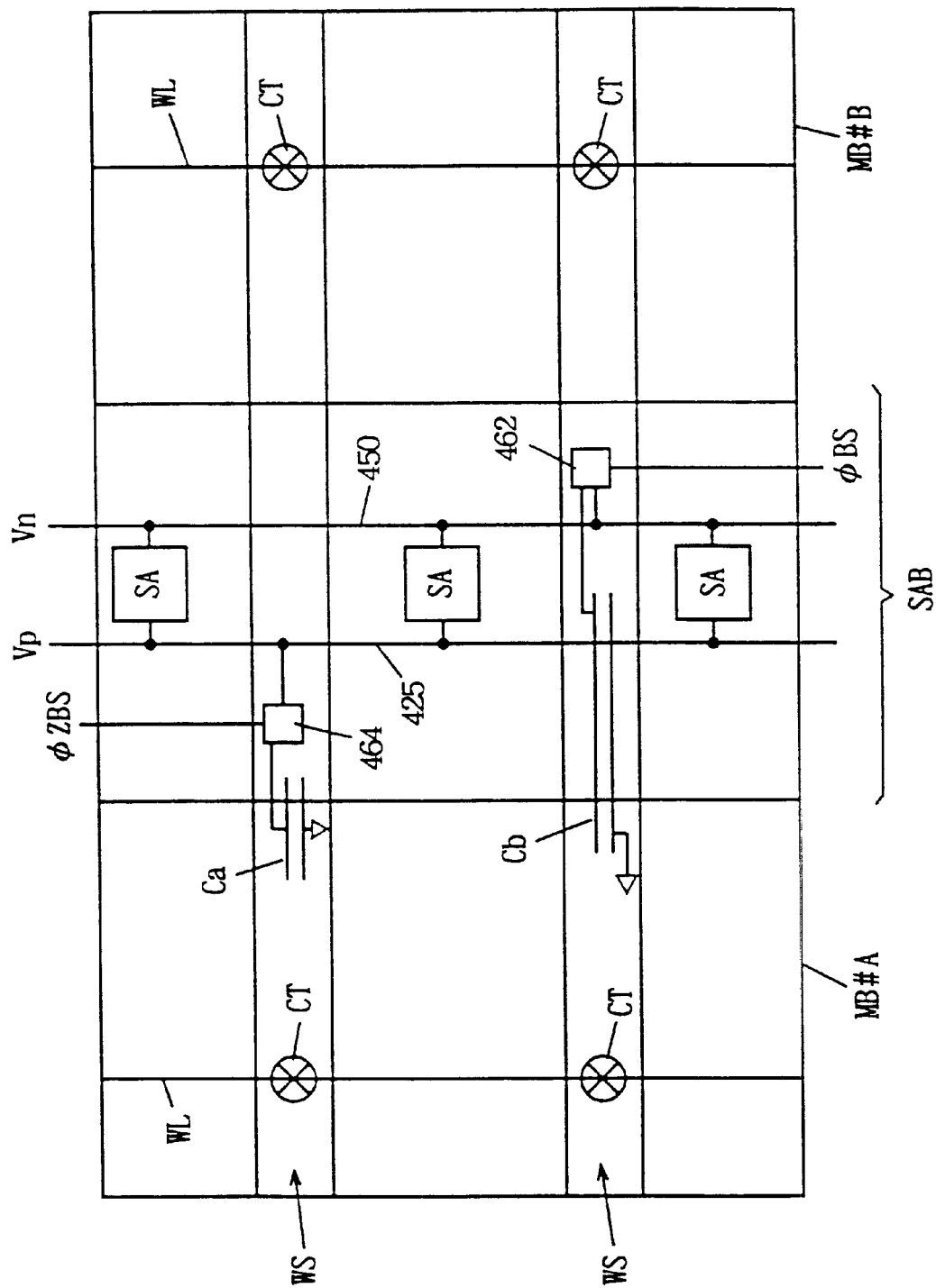

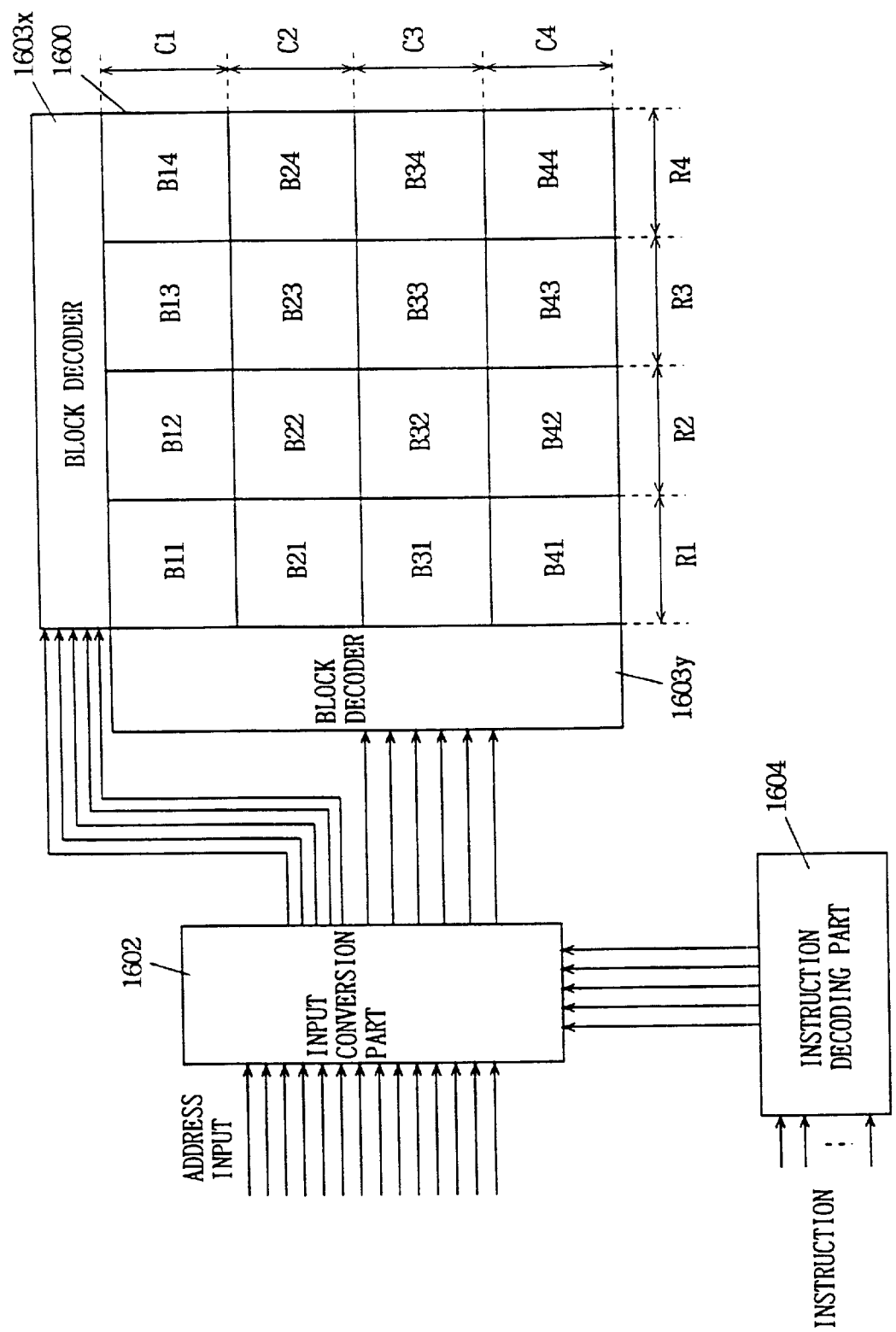

| A1 | A2 | AR1 | AR2 | SPECIFIED BLOCK |
|----|----|-----|-----|-----------------|
| 0  | 0  | 0   | 0   | R1 → R1         |
| 0  | 1  | 1   | 0   | R2 → R3         |
| 1  | 0  | 0   | 1   | R3 → R2         |
| 1  | 1  | 1   | 1   | R4 → R4         |

| A3 | A4 | AC1 | AC2 | SPECIFIED BLOCK |
|----|----|-----|-----|-----------------|
| 0  | 0  | 1   | 1   | C1 → C4         |
| 0  | 1  | 0   | 0   | C2 → C1         |
| 1  | 0  | 0   | 1   | C3 → C2         |
| 1  | 1  | 1   | 0   | C4 → C3         |

FIG. 62
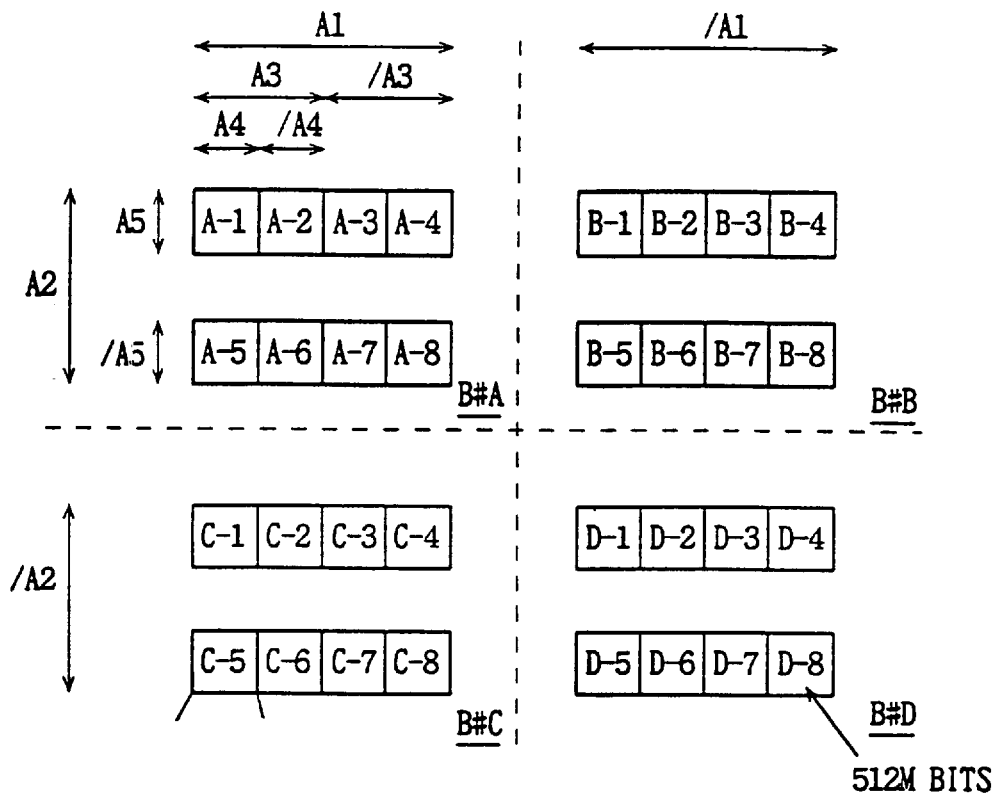
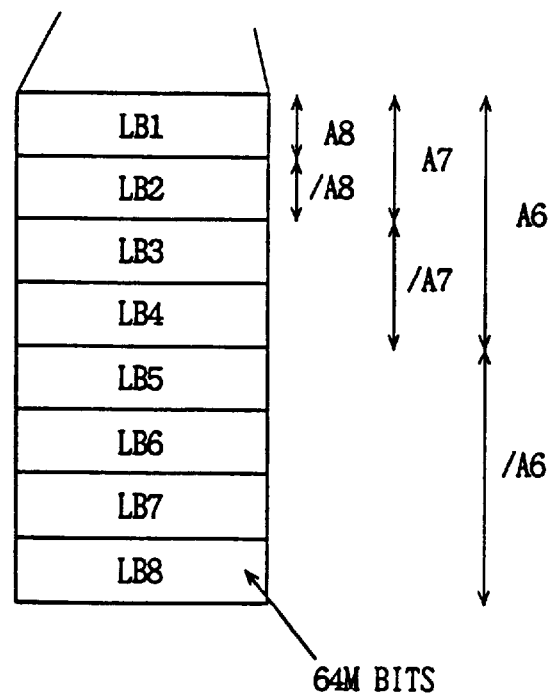
FIG. 62A

TO BUS CONVERSION CIRCUIT

FIG. 95A
| BANK ADDRESS | PAGE ADDRESS | | BANK ADDRESS COUNTER | PAGE ADDRESS COUNTER |
|---|---|---|---|---|
| 0 0 0 0 | 0 0 0 0 | | 0 0 0 0 | 0 0 0 0 |
| 0 0 0 0 | 0 0 0 1 | CONVERSION → | 0 0 0 1 | 0 0 0 0 |
| 0 0 0 0 | 0 0 1 0 | | 0 0 1 0 | 0 0 0 0 |
| 0 0 0 0 | 0 0 1 1 | | 0 0 1 1 | 0 0 0 0 |
| 0 0 0 0 | 0 1 0 0 | | 0 0 0 0 | 0 0 0 1 |
FIG. 95B
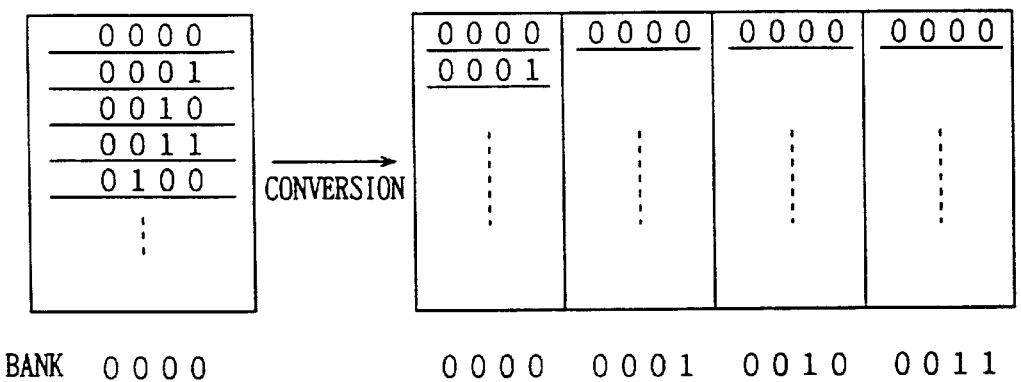
FIG. 96
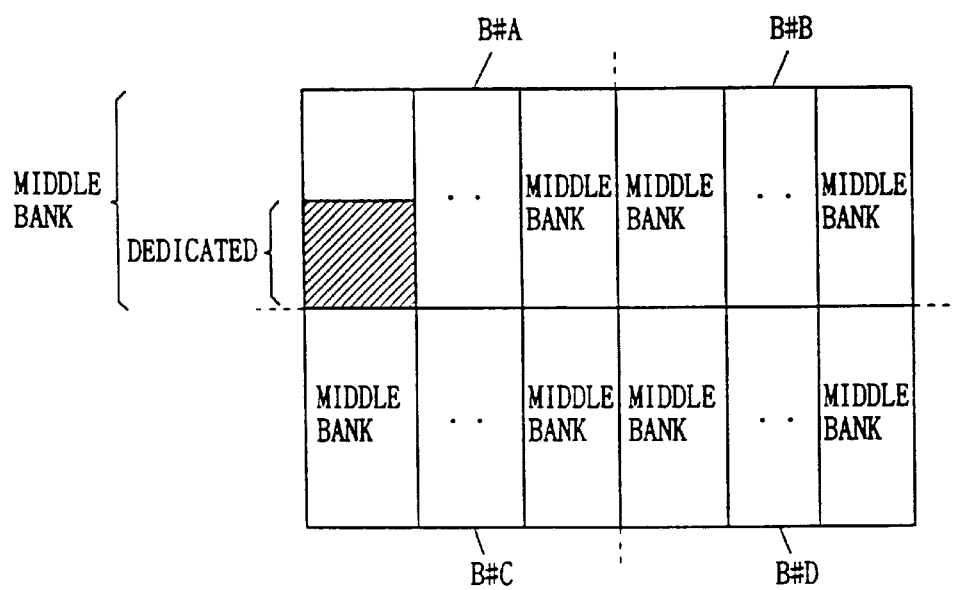

FAST ACCESSIBLE DYNAMIC TYPE SEMICONDUCTOR MEMORY DEVICE

This application is a divisional of application Ser. No. 08/674,596 filed Jun. 27, 1996.

BACKGROUND OF THE INVENTION

1. Field of the Invention

The present invention relates to a semiconductor memory device, and more particularly, it relates to a dynamic type semiconductor memory device which is accessible at a high speed.

2. Description of the Background Art

FIG. 97 schematically illustrates the structure of a main part of a conventional semiconductor memory device. Referring to FIG. 97, the semiconductor memory device includes a plurality of array blocks MBa to MBn. Each of the array blocks MBa includes a plurality of memory cells MC arranged in a form of rows and columns, a plurality of word lines WL arranged in correspondence to the respective rows and connected with the memory cells of the corresponding rows, and a plurality of bit line pairs BLP arranged in correspondence to the respective columns and connected with the memory cells of the corresponding columns. FIG. 97 representatively illustrates a single word line WL and a single bit line pair BLP in each of the array blocks MBa to MBn.

X decoders XDa to XDn, sense amplifier bands SABa to SABn and selector bands STRa to STRn are arranged in correspondence to the array blocks MBa to MBn respectively, while a Y decoder YD and a global I/O bus GI/O are provided in common for the array blocks MBa to MBn.

The X decoders XDa to XDn decode supplied row address signals (paths therefor are not shown in FIG. 97) upon activation thereof, to drive word lines which are arranged in correspondence to addressed rows of the corresponding array blocks MBa to MBn respectively.

The sense amplifier bands SABa to SABn include sense amplifiers which are arranged in correspondence to the respective columns (the bit line pairs BLP) of the corresponding array blocks MBa to MBn respectively, and detect, amplify and latch memory cell data appearing on the corresponding bit line pairs BLP upon activation thereof.

The Y decoder YD decodes supplied column address signals, and transmits a column selection signal for selecting an addressed column onto a column selection line CS. The selector bands STRa to STRn connect the addressed column (the bit line pairs BLP) which is designated by an array block selection signal (not shown) to the global I/O bus GI/O in response to the column selection signal transmitted from the Y decoder YD onto the column selection signal line CS and to the array block selection signal.

The global I/O bus GI/O is provided with a read driver RDR which is activated in data reading for amplifying data on the global I/O bus GI/O for transmission onto an internal read/write bus RWBS, and a write driver WDR which is activated in data writing for buffering data on the internal read/write bus RWBS for transmission to the global I/O bus GI/O.

An output buffer OBF which is activated in data reading for buffering the data on the internal read/write bus RWBS for outputting to a data input/output terminal DQ, and an input buffer IBF which is activated in data writing for forming internal write data from a data signal received from the data input/output terminal DQ for transmission to the internal read/write bus RWBS are provided between the read/write bus RWBS and the data input/output terminal DQ.

In the semiconductor memory device shown in FIG. 97, only one of the plurality of array blocks MBa to MBn is activated. In a state referred to as "array activation", a word line is selected in an array so that data of a memory cell which is connected with the selected word line is read onto each bit line pair BLP and amplified by an associated sense amplifier. Data is written in/read from only an array block which is designated by an array block selection signal.

FIG. 98 illustrates the internal structure of each of the array blocks MBa to MBn shown in FIG. 97 in detail. This FIG. 98 representatively shows only the structure of a portion which is related to one column of a single array block, with only a single word line WL shown.

Referring to FIG. 98, the bit line pair BLP includes bit lines BL and ZBL transmitting data signals which are complementary to each other. A memory cell MC which is arranged at the crossing between the bit line BL and the word line WL includes a capacitor MQ storing data in the form of electric charges, and an access transistor MT formed by an n-channel MOS transistor and connecting the memory capacitor MQ to the bit line BL in response to a signal potential on the word line WL.

A sense amplifier SA included in the sense amplifier band SAB includes a p-channel MOS transistor P1 having a first conduction terminal connected with the bit line BL, a control gate connected with the bit line ZBL, and a second conduction terminal coupled to receive a sense amplifier activation signal Vp, a p-channel MOS transistor P2 having a first conduction terminal connected with the bit line ZBL, a control gate connected with the bit line BL, and a second conduction terminal coupled to receive the sense amplifier activation signal Vp, an n-channel MOS transistor N4 having a first conduction terminal connected with the bit line BL, a control gate connected with the bit line ZBL, and a second conduction terminal coupled to receive a sense amplifier activation signal Vn, and an n-channel MOS transistor N5 having a first conduction terminal connected with the bit line ZBL, a control gate connected with the bit line BL, and a second conduction terminal coupled to receive the sense amplifier activation signal Vn.

The p-channel MOS transistors P1 and P2 form a flip-flop, to drive one having a higher potential of the bit lines BL and ZBL to a high level upon activation (high level) of the sense amplifier signal Vp. The n-channel MOS transistors N4 and N5 also form a flip-flop, to drive one having a lower potential of the bit lines BL and ZBL to a low level upon activation (low level) of the sense amplifier activation signal Vn.

A local I/O bus LI/OA consisting of local I/O lines LIOa and LIOb is arranged for an array block MB#A (any of MBa to MBn).

The selector band STR includes a column selection gate CSEL provided for the bit lines BL and ZBL to connect these bit lines BL and ZBL to the local I/O lines LIOa and LIOb in response to a column selection signal CS (a signal which is transmitted onto the column selection signal line shown in FIG. 97 and denoted by the same symbol), and a block selection gate BSELA for connecting the local I/O lines LIOa and LIOb respectively to global I/O lines GIOa and GIOb forming the global I/O bus GI/O in response to an array block selection signal TGA. The column selection gate CSEL includes a transfer gate N6 formed by an n-channel MOS transistor arranged between the bit line BL and the local I/O line LIOa, and a transfer gate N7 formed by an n-channel MOS transistor arranged between the bit line ZBL and the local I/O line LIOb. The block selection gate BSELA includes a transfer gate N8 formed by an n-channel transistor arranged between the local I/O line LIOa and the global I/O line GIOa, and a transfer gate N9 formed by an n-channel MOS transistor arranged between the local I/O line LIOb and the global I/O line GIOb.

FIG. 98 also shows a block selection gate BSELB which is provided for another array block MB#B. This block selection gate BSELB connects a local I/O line arranged for this array block MB#B to the global I/O bus GI/O in response to a block selection signal TGB.

The read driver RDR differentially amplifies complementary signals appearing on the global I/O bus GI/O, for transmission to the internal read/write bus RWBS. The write bus driver WDR amplifies the signals on the internal read/write bus RWBS, forms complementary write data, and transmits the amplified onto the global I/O lines GIOa and GIOb.

The bit lines BL and ZBL are provided with an equalize/precharge circuit EP which in turn precharges and equalizes the bit lines BL and ZBL at a prescribed precharge potential Vpr in response to an equalization signal EQ. This equalize/precharge circuit EP includes an n-channel MOS transistor N1 for connecting the bit lines BL and ZBL with each other in response to the equalization signal EQ, an n-channel MOS transistor N2 for transmitting the precharge potential Vpr to the bit line BL in response to the equalization signal EQ, and an n-channel MOS transistor N3 for transmitting the precharge potential Vpr to the bit lines ZBL in response to the equalization signal EQ. The equalization signal EQ enters a high level of an active state in a standby cycle of this semiconductor memory device. Operations are now described.

Consider an operation of replacing certain pixel data with another pixel data, which operation is frequently performed in image picture data processing or the like. Such an operation is executed in picture duplication processing or the like. An operation of transferring pixel data from the array block MB#A to the other array block MB#B will be described with reference to FIG. 99, which in turn is an operation waveform diagram. Referring to FIG. 99, control signals and the local I/O bus which are related to the array block MB#A are shown with ending characters "A", while those related to the array block MB#B are shown with ending characters "B".

When a row address strobe signal ZRAS is in an inactive state of a high level, both of equalization signals EQA and EQB are at high levels of active states. When the address strobe signal ZRAS is brought into an active state of a low level, a memory cell selecting operation in this semiconductor memory device is started. An externally supplied address signal (not shown) designates the array block MB#A, whereby the equalization signal EQA for this array block MB#A is brought to a low level and the equalize/precharge circuit EP is inactivated. Thus, the bit lines BL and ZBL are brought into floating states at the precharge potential Vpr in the array block MB#A. Then, a word line WLA is selected in the array block MB#A by the X decoder shown in FIG. 54 in accordance with an address signal which is supplied at the falling edge of the row address strobe signal ZRAS, and the potential on the word line WLA is increased. Thus, data of a memory cell which is connected with the selected word line WLA is read on a bit line pair BLPA, and the potentials of the bit line pair BLPA are changed in accordance with the selected memory cell data. FIG. 99 shows a waveform in the case of reading high-level data, as an example.

Then, when a prescribed time elapses and the potential difference between bit lines BLA and ZBLA of the bit line pair BLPA is sufficiently increased, the sense amplifier activation signals Vp and Vn are activated, so that the sense amplifier SA which is included in a sense amplifier band SABA differentially amplifies the potential difference on the bit line pair BLPA.

After the potential difference between the bit lines BL and ZBL is sufficiently enlarged by the sense amplifier SA, a column selection signal CSA from the Y decoder YD rises to a high level indicating a selecting state and the column selection gate CSEL conducts so that the bit lines BL and ZBL are connected to the local I/O lines LIOa and LIOb.

Then, the block selection signal TGA from a block decoder (not shown) is brought to a high level indicating a selecting state and the block selection gate BSELA conducts, so that the local I/O lines LIOa and LIOb are connected to the global I/O lines GIOa and GIOb. Thus, data of the selected memory cell detected and amplified by the sense amplifier SA is transmitted onto the global I/O bus GI/O.

Thereafter the read driver RDR is activated to differentially amplify the signal supplied on the global I/O bus GI/O, forms internal read data and transmits the same onto the internal read/write bus RWBS. The internal read data on the internal read/write bus RWBS is transmitted to the data input/output terminal DQ through the output buffer OBF (see FIG. 97). The read data is temporarily stored in data holding means such as a register provided in an exterior, to be rewritten in another array block of the semiconductor memory device. The semiconductor memory device performs an array precharge operation, in order to select another word line. Namely, the row address strobe signal ZRAS enters a high level of an inactive state, the selected word line WLA of the selected array block MB#A is brought into a non-selected state, and the access transistor MT included in the memory cell MC is brought into a nonconducting state.

Thereafter the sense amplifier activation signals Vp and Vn are inactivated and then the equalization signal EQA goes to a high level for activating the equalize/precharge circuit EP, thereby precharging the bit lines BL and ZBL of the bit line pair BLPA at the intermediate potential Vpr. At this time, the column selection signal CSA is in a nonselected state at a low level, and the bit line pair BLPA and the local I/O bus LI/OA are isolated from each other, while the local I/O bus LI/OA and the global I/O bus GI/O are also isolated from each other. Further, the output buffer OBF for the data input/output terminal DQ is inactivated and brought into an output high impedance state.

Then, the row address strobe signal ZRAS is brought into a low level of an active state again, in order to select the array block MB#B. At the same time, an address signal is supplied to designate the array block MB#B and a word line WLB in the array block MB#B. Thus, an equalization signal EQB enters a low level and an equalize/precharge circuit EP is inactivated in the designated array block MB#B. After the selected memory cell data appears on a bit line pair BLPB, sense amplifier activation signals VpB and VnP are activated so that the potentials of the bit line pair BLPB are changed in accordance with the selected memory cell data. Then, a column selection signal CSB enters a high level, so that the bit line pair BLPB is connected to a local I/O bus LI/OB. On the other hand, the data which is previously read and temporarily held externally is written through the input buffer IBF for data writing, and the written data is transmitted onto the global I/O bus through the write driver WDR.

When the data is transmitted onto the global I/O bus, the array block selection signal TGB enters a high level and the block selection gate BSELB conducts so that the global I/O bus GI/O and the local I/O bus LI/OB are connected with each other and the write data is transmitted to the local I/O bus LI/OB, and then to the selected bit line pair BLPB through a column selection gate CSELB. Driving ability of the write driver WDR is larger than the latching ability of the sense amplifier SA, whereby latch data of the sense amplifier SA provided for the bit line pair BLPB changes to the write data.

When the write operation is completed, the row address strobe signal ZRAS is brought into an inactive state at a high level again, the selected word line in the array block MB#B is inactivated again, the sense amplifier activation signals VpB and VnB are inactivated, a selector band STRB is also brought into a nonconducting state, and the local I/O bus LI/OB and the global I/O bus GI/O are isolated from each other. Thus, the array block MB#B is brought into a precharged state.

In the semiconductor memory device of an array division partial activation structure in which the memory array us divided into a plurality of array blocks and only one array block is activated, two ZRAS cycles (cycles as to the row address strobe signal ZRAS) are necessary for transferring data of a memory cell of an array block to a memory cell of another array block. In other words, a cycle of selecting a memory cell of a first array block and reading the data of the selected memory cell to an exterior of the device and a cycle of selecting a memory cell of a second array block and writing the externally read data in the selected memory cell are required. Thus, the data cannot be transferred between the array blocks at a high speed. Particularly when this semiconductor memory device is employed for image processing, an image processing such as duplication cannot be performed at a high speed but the data processing speed (drawing speed) is reduced and the performance of the processing system is deteriorated.

Further, bit lines are charged and discharged twice in total in the first and second array blocks in the data transfer. The bit lines are charged and discharged through the signal lines transmitting the sense amplifier activation signals Vp and Vn. Thus, current consumption for driving the sense amplifiers is disadvantageously increased.

When the access designation is changed from an array block to another one in a semiconductor memory device of a divided array structure, it is necessary to temporarily drive the semiconductor memory device to a precharged state (nonselected state), since the array blocks cannot be driven independently of each other. Therefore, a time called a RAS precharge time is required at the minimum in such change of the array blocks, and hence the access time is lengthened and rapid access cannot be performed.

When a single array block is accessed in a page mode, it is necessary to temporarily drive a selected page (selected word line) to a nonselected state and then drive the next page (word line) to a selected state in page switching (switching of the selected word line). Also in this case, the time called a RAS precharge time is required at the minimum, and hence the page cannot be switched at a high speed, and rapid access cannot be obtained.

In the conventional semiconductor memory device, further, connection between an internal data bus, i.e., input/output buffers, and bus lines of external data bus is fixedly set in one-to-one correspondence. A certain type of CPU (central processing unit) is provided with a byte swap function, so that 8-bit memories storing 8-bit data and the 8-bit data can be utilized in a 16-bit processing system by performing data transfer through upper or lower 8-bit data bus among 16-bit data bus, for example. In this byte swap function, however, connection between the CPU bus and memory bus is simply switched between upper and lower byte buses, while the switching mode is fixedly set for each memory. For example, a single 8-bit memory is connected with only upper or lower 8-bit bus of the CPU bus. For example, the CPU bus utilized in data writing and reading of this 8-bit memory cannot be changed, 8-bit data read from the 8-bit memory cannot be selectively connected to the upper or lower bus of the CPU bus depending on the processing application, and hence the data cannot be properly stored in internal registers of the CPU according to the contents of the arithmetic processing, the CPU changes the positions for storing the 8-bit data according to the arithmetic processing contents again in its interior, and the processing operations of the CPU are disadvantageously complicated.

When data transfer is performed through the byte swap function, unused data bus are in free states, disadvantageously leading to low bus utilization efficiency.

SUMMARY OF THE INVENTION

An object of the present invention is to provide a semiconductor memory device which can transfer data between array blocks at a high speed with low current consumption.

Another object of the present invention is to provide a semiconductor memory device which can drive a sense amplifier with low current consumption.

Still another object of the present invention is to provide a semiconductor memory device which can implement a high speed access over a plurality of memory blocks in a page mode.

A further object of the present invention is to provide a semiconductor memory device in which page change can be performed at high speed.

A further another object of the present invention is to provide a semiconductor memory device which can implement efficient and high speed data transfer with an external device.

Briefly stated, the present invention makes a plurality of array blocks drivable independently of each other, and selectively couples a sense amplifier activation signal line to a capacitance for utilizing a charge voltage at the capacitance as a sense amplifier activation signal, or couples internal data bus lines with external data bus lines.

A semiconductor memory device according to a first aspect of the present invention includes a plurality of array blocks which are coupled to a common data bus, array control circuitry for selecting an array block out of the plurality of array blocks in accordance with an address signal and selecting a memory cell of the selected array block to read data of the selected memory cell to the common data bus, and transfer circuitry for transferring the memory cell data which is read on the common data bus by the array control circuitry to an array block which is designated by a transfer address signal in response to a transfer instruction and the transfer address signal.

A semiconductor memory device according to a second aspect of the present invention includes a plurality of array blocks each having a plurality of memory cells arranged in a form of rows and columns, a plurality of bit line pairs arranged in correspondence to the respective columns, word lines arranged in correspondence to the respective rows, and a plurality of sense amplifiers arranged in correspondence to the respective columns, a plurality of gates interconnecting the respective columns of adjacent ones of the plurality of array blocks with each other, selection circuitry for selecting a memory cell of an array block which is designated by an address signal in response to the address signal and a transfer instruction, circuitry for activating a sense amplifier of the selected array block designated by the address signal in response to the address signal and the selection circuitry, connection circuitry for bringing a gate between the selected array block and an adjacent array block into a conducting state in response to the address signal and the transfer instruction, and for activating a sense amplifier of the adjacent array block in response to the address signal, the transfer instruction and the connection circuitry.

A semiconductor memory device according to a third aspect of the present invention includes a plurality of array blocks each having a plurality of memory cells arranged in a form of rows and columns, a plurality of bit line pairs arranged in correspondence to the respective columns, a plurality of word lines arranged in correspondence to the respective rows, and a plurality of sense amplifiers arranged in correspondence to the respective columns, a plurality of gates interconnecting the bit line pairs of the respective columns of adjacent ones of the plurality of array blocks with each other, sense amplifier activation circuitry activating the sense amplifiers of a selected array block which is designated by an address signal in response to the address signal and a transfer instruction, connection control circuitry for bringing a corresponding one of the plurality of gates into a conducting state in response to a refresh address signal and a refresh instruction when the refresh address signal designates the selected array block, sense amplifier activation control circuitry for activating the sense amplifiers of an array block which is adjacent to the selected array block in response to the connection control circuitry, refresh control circuitry for bringing a corresponding gate into a nonconducting state and refreshing memory cell data of the selected array block which is designated by the refresh address signal in response to the sense amplifier activation control circuitry, the refresh address signal and the refresh instruction, and control circuitry for bringing the gate of the adjacent array block into a conducting state and activating the sense amplifier activation circuitry for the selected array block after completion of refreshing in response to the refresh control circuitry.

A semiconductor memory device according to a fourth aspect of the present invention includes a plurality of memory cells arranged in a form of rows and columns, a plurality of word lines arranged in correspondence to the respective rows and connected with the memory cells of the corresponding rows respectively, a plurality of sense amplifiers arranged in correspondence to respective bit line pairs for detecting, amplifying and latching potentials on the corresponding bit line pairs in response to a sense amplifier activation signal on a sense amplifier activation signal line, sense amplifier driving circuitry for driving the sense amplifier activation signal line into a selected state in response to a sense amplifier driving signal, a capacitor, and connection circuitry for coupling the capacitor to the sense amplifier activation signal line for a prescribed period upon transition of the sense amplifier activation signal from inactivation to activation while coupling the capacitor to the sense amplifier activation signal for a prescribed period at transition of the sense amplifier activation signal from activation to inactivation.

A semiconductor memory device according to a fifth aspect of the present invention includes conversion circuitry for changing an accessing destination from that in a normal mode of operation. The conversion circuitry includes an address converter receiving an external address signal into an internal address signal designating a memory block different from the memory block designated by the external address signal, or includes a bus converter for changing a connection between internal data bus lines and external data bus lines.

In the semiconductor memory device according to the first aspect of the present invention, the memory cell data which is read on the common data bus by the array control circuitry is transferred to a transferee array block by the transfer circuitry, whereby data can be transferred between the array blocks at a high speed with no requirement for reading the memory cell data to the exterior for the data transfer.

In the semiconductor memory device according to the second aspect of the present invention, the bit line pairs of the adjacent array blocks are connected with each other through the gates when the transfer instruction is supplied, whereby data of memory cells of one row can be transferred to the adjacent array block at a high speed.

In the semiconductor memory device according to the third aspect of the present invention, the bit line pair of the adjacent array block is connected to that of the selected array block and the sense amplifier of the adjacent block is then activated when the sense amplifier is activated and brought into a data holding state and the refresh instruction is supplied, whereby the data held in the sense amplifier of the array block to be refreshed can be saved to the adjacent array block so that the array block can be refreshed with no destruction of the data held therein.

In the semiconductor memory device according to the fourth aspect of the present invention, the sense amplifier activation signal line and the capacitance are coupled with each other for the prescribed period at transition of the sense amplifier from inactivation to activation and vice versa, whereby the sense amplifier activation signal can be activated by reusing the charges of the sense amplifier activation signal, for reducing the current (charge) consumed for charging and discharging the sense amplifier activation signal.

In the fifth aspect of the present invention, if address conversion is performed, a defective memory block can be repaired without any redundant program circuit, and a replacing memory block can be accessed at high speed due to no provision of redundant program circuit. In addition, successive pages can be allocated to different memory blocks, and no wait is needed upon changing of pages in a page mode of operations. When data bus lines are selectively coupled, empty bus data lines can be used for another data transfer, resulting in improved data transfer efficiency and bus utilization efficiency. In addition, data bit positions can be internally changed, resulting in improved data operability.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 39 and 39A schematically illustrate an array part of a semiconductor memory device according to a fifth embodiment of the present invention;

FIG. 50 illustrates arranged positions of capacitors employed in the sixth embodiment of the present invention;

FIG. 54 illustrates the overall structure of a semiconductor memory device according to an embodiment 8 of the present invention;

FIGS. 62 and 62A illustrate address assignment of a memory array part shown in FIG. 61;

FIGS. 95A and 95B illustrate operations of an address conversion part shown in FIG. 94; and FIG. 96 illustrates the distribution of regions utilized for rapid data access in the embodiment 12 of the present invention.

DESCRIPTION OF THE PREFERRED EMBODIMENTS

[Embodiment 1]

Figure 1:
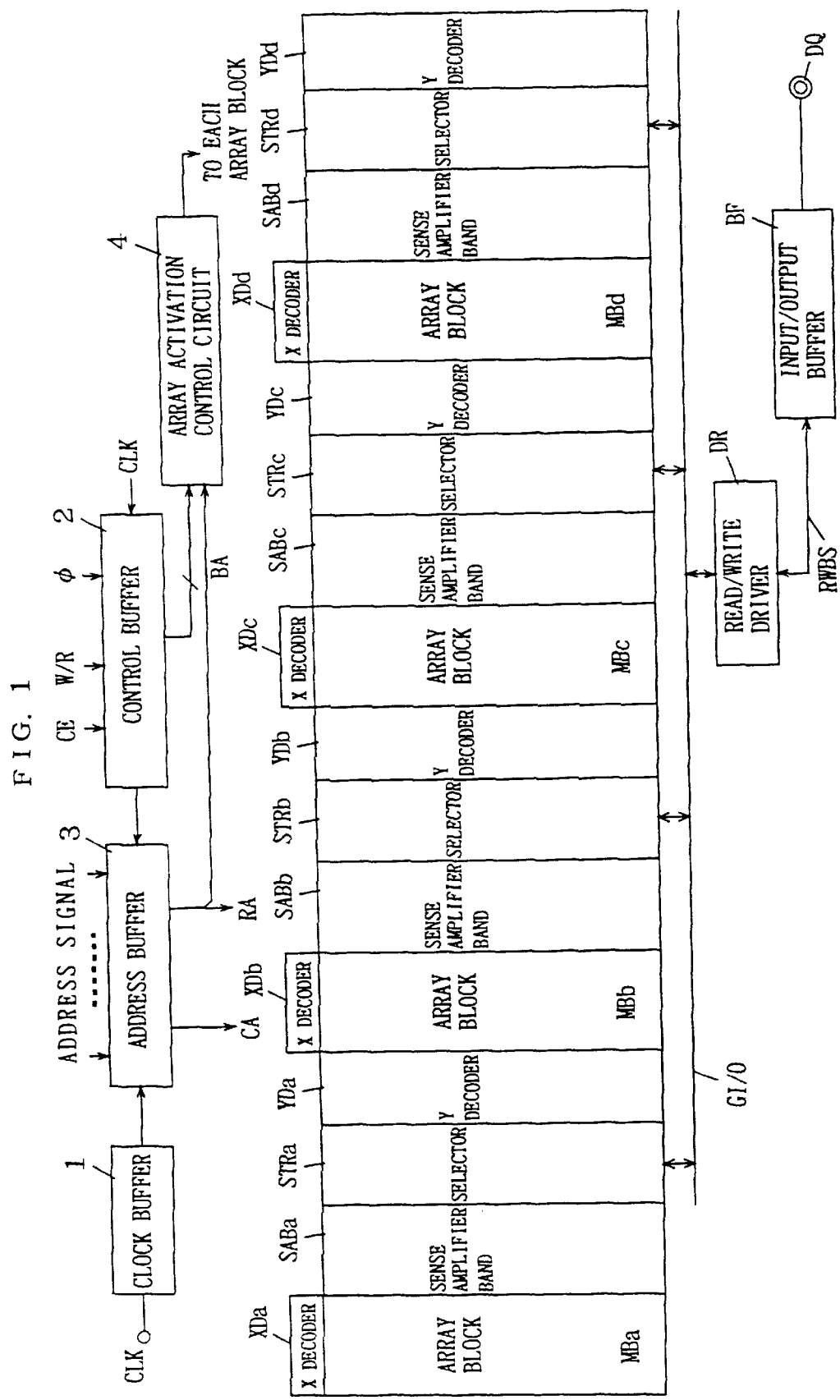
FIG. 1 schematically illustrates the overall structure of a semiconductor memory device according to a first embodiment of the present invention.

FIG. 1 schematically illustrates the overall structure of a semiconductor memory device according to a first embodiment of the present invention. Referring to FIG. 1, the semiconductor memory device includes four array blocks MBa to MBd with respect to one data input/output terminal DQ as an example. The number of the array blocks is not particularly limitative and may be increased further.

Each of the array blocks MBa to MBd includes a plurality of memory cells arranged in a form of rows and columns, a plurality of word lines arranged in correspondence to the respective rows, and a plurality of bit line pairs arranged in correspondence to the respective columns, as described later in detail.

In correspondence to the respective array blocks MBa to MBd, there are further provided X decoders XDa to XDd for decoding supplied row address signals to select the word lines of the corresponding array blocks MBa to MBd upon activation thereof, sense amplifier bands SABa to SABd including a plurality of sense amplifiers arranged in correspondence to the bit line pairs of the corresponding array blocks respectively for detecting, amplifying and latching potentials on the corresponding bit line pairs, and selectors STRa to STRd for connecting the sense amplifiers arranged on the corresponding columns of the corresponding array blocks to a global I/O bus GI/O in accordance with column selection signals.

In the structure shown in FIG. 1, Y decoders YDa to YDd are provided in correspondence to the array blocks MBa to MBd respectively, for generating column selection signals upon activation thereof. Y decoders YDa to YDd output the column selection signals (CS) only to the selectors provided in correspondence to the corresponding array blocks when activated. A read/write driver DR, which is provided for the global I/O bus GI/O, is connected to an input/output buffer BF through an internal read/write bus RWBS. The input/output buffer BF communicates data with the data input/output terminal DQ.

The semiconductor memory device shown in FIG. 1 further includes a clock buffer 1 for receiving an externally, periodically applied clock signal CLK having a constant pulse duration to form an internal clock signal, a control circuit 2 for incorporating externally applied control signals CE, W/R and φ in synchronization with the internal clock signal from the clock buffer 1 and generating internal control signals, and an address buffer 3 for incorporating an externally applied address signal in accordance with the internal clock signal from the clock buffer 1 and an instruction signal from the control circuit 2 and generating internal address signals BA, RA and CA.

The control signal CE, which is a chip enable signal, enters a high level of an active state at the leading (rising) edge of the clock signal CLK, so that a row selecting operation is started in the interior of the device. The signal W/R, which indicates data writing or reading, is set in a state indicating one of the data writing and reading simultaneously with activation of the chip enable signal CE. The control signal φ, which generically indicates control signals designating internal operations, includes various control signals such as a transfer instruction, a data rewrite instruction and a data holding instruction. Due to the structure of incorporating the control signals CE, W/R and φ and starting the internal operation in synchronization with the clock signal CLK, it is possible to independently activate a second array block when a first array block is in an active state, dissimilarly to the ordinary array division (partial activation) structure.

The address buffer 3 incorporates the externally applied address signal and simultaneously produces a row address signal RA and a column address signal CA. Due to such simultaneous production of the row address signal RA and the column address signal CA in activation of the chip enable signal CE, operations of a row selection circuit and a column selection circuit can be controlled independently of each other in each array block, while activation/inactivation of the sense amplifiers can be controlled independently of selection/nonselection of the word lines.

The semiconductor memory device further includes an array activation control circuit 4 for supplying a necessary control signal to an array block which is designated by a block address BA supplied from the address buffer 3, in accordance with the internal control signal from the control circuit 2 and the block address BA.

The array activation control circuit 4 activates and precharges the array blocks MBa to MBd independently of each other, as described later in detail. Namely, the array activation control circuit 4 activates the array block designated by the block address BA supplied from the address buffer 3 for a prescribed period in response to activation of the chip enable signal CE supplied from the control buffer 2. Due to the structure of driving the array blocks MBa to MBd independently of each other by the array activation control circuit 4, data of a memory cell selected in one array block can be transmitted to another array block at a high speed.

Figure 2:
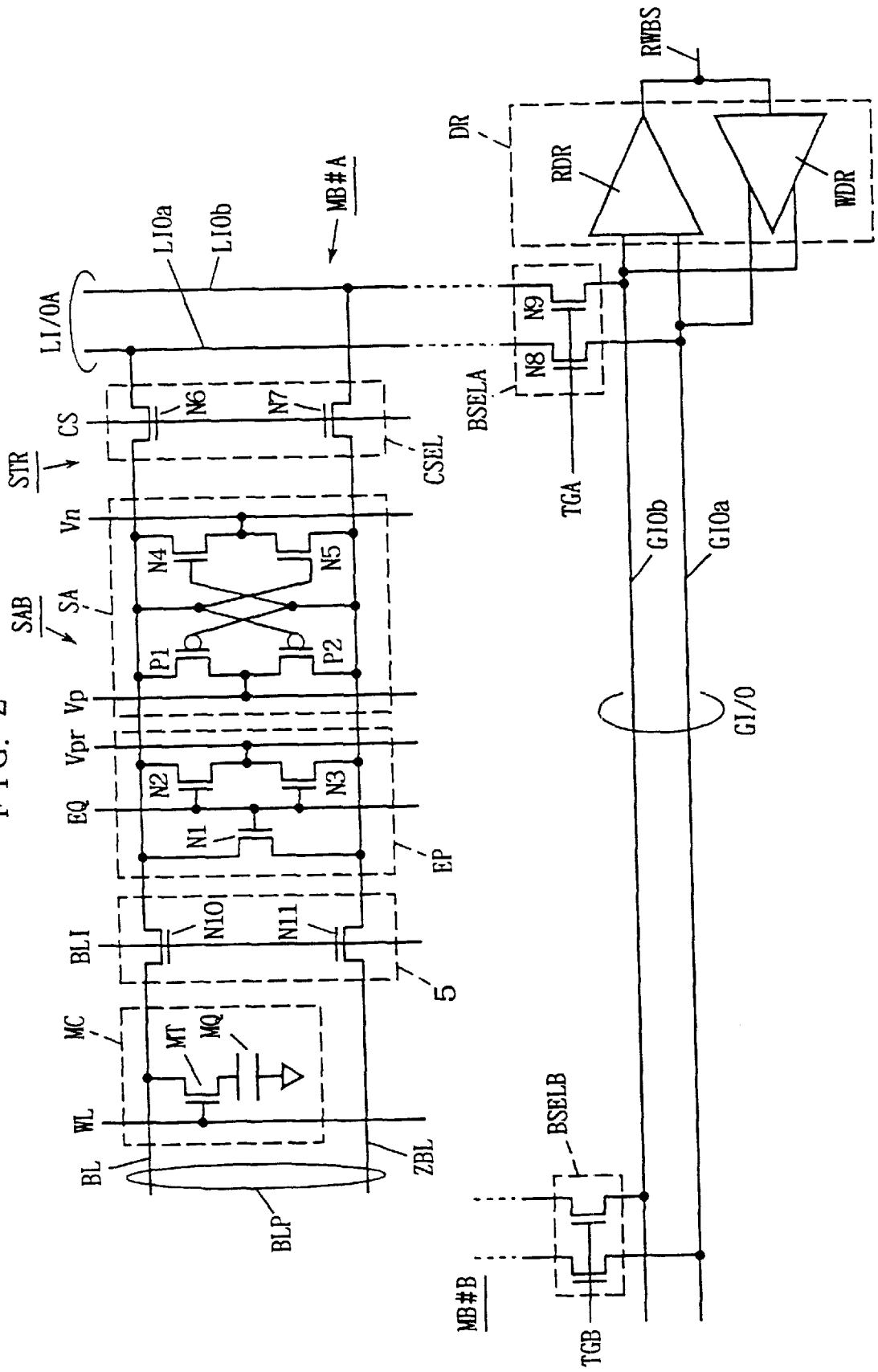
FIG. 2 illustrates the internal structure of an array block of the semiconductor memory device shown in FIG. 1 in more detail.

FIG. 2 shows the structure of each array block MB#A shown in FIG. 1 in more detail. Referring to FIG. 2, elements corresponding to those of the conventional semiconductor memory device shown in FIG. 55 are denoted by the same reference numerals, and the description thereof is omitted.

Referring to FIG. 2, a bit line isolation gate 5 selectively brought into a nonconducting state in response to a bit line isolation signal BLI is arranged between a portion of a memory cell MC and a bit line peripheral circuit including an equalize/precharge circuit EP and a sense amplifier SA for each of bit line pairs BLP. The bit line isolation gate 5 includes n-channel MOS transistors N10 and N11 provided for bit lines BL and ZBL respectively. The bit line isolation signal BLI is supplied to gates of these MOS transistors N10 and N11. Due to the bit line isolation gate 5 provided for each bit line pair BLP, the sense amplifier of a second array block can be utilized as a cache at the time of transferring memory cell data to the second array block, as described later in detail.

The read/write driver DR includes a read driver RDR and a write driver WDR, similarly to the conventional device. The operation is now described with reference to FIG. 3, which is an operation waveform diagram thereof.

A data transfer operation from the array block MB#A (any one of the array blocks MBa to MBd) to another array block MB#B is now described.

The clock signal CLK is regularly applied to the clock buffer 1, regardless of presence/absence of access to the semiconductor memory device. At the time of access, the chip enable signal CE is supplied to the control buffer 2 in the form of a one-shot pulse. The control buffer 2 incorporates the chip enable signal CE at the rising edge of the clock signal CLK, and supplies an internal chip enable signal to the address buffer 3 and the array activation control circuit 4. Upon activation of the internal chip enable signal from the control buffer 2, the address buffer 3 incorporates a supplied address signal and outputs internal address signals BA, RA and CA. The array activation control circuit 4 is activated upon activation of the internal chip enable signal from the control buffer 2 and incorporates the block address signal BA from the address buffer 3, to activate the X decoder XD provided for the array block designated by the block address signal BA.

Figure 3:
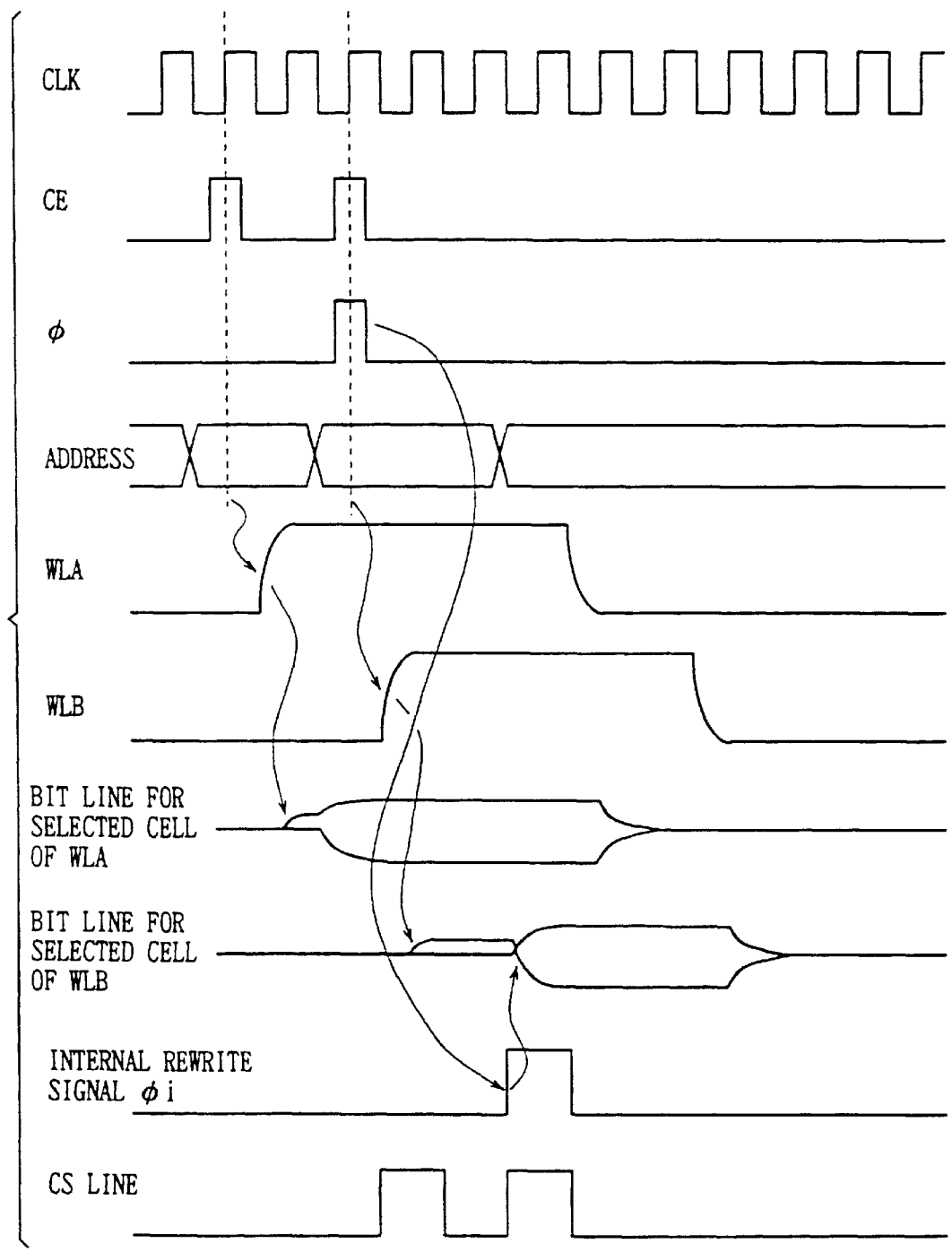
FIG. 3 is a signal waveform diagram showing operations of the semiconductor memory device according to the first embodiment of the present invention.

In the array block MB#A designated by the block address signal BA, a corresponding X decoder XD#A (any one of XDa to XDd) is activated, to decode the internal row address signal RA from the address buffer 3 and drive a word line WLA addressed in the array block MB#A to a selected state. Thus, data of a memory cell which is connected with the selected word line WLA is read on each bit line pair BLP in the array block MB#A. Referring to FIG. 3, high-level data of the memory cell connected with the word line WLA is read on a bit line pair BLPA, as an example. A rewrite instruction signal φ maintains a low level of an inactive state upon activation of the chip enable signal CE, so that each sense amplifier of a sense amplifier band SAB#A of the selected array block MB#A is activated at a prescribed timing to detect, amplify and latch the data of the memory cell connected with the selected word line.

In parallel with or after completion of the activation of the sense amplifier in the selected array block MB#A, a new chip enable signal CE is applied in the form of a one-shot pulse, and the control buffer 2 determines that the chip enable signal CE is in an active state of a high level at the rising edge of the clock signal CLK and a new access operation is designated, so that an internal chip enable signal CE is supplied to the address buffer 3 and the array activation control circuit 4. Since the rewrite instruction signal φ is applied in the form of a one-shot pulse at this time, the control buffer 2 similarly incorporates the rewrite instruction signal φ which in turn is in the active state of a high level at the rising edge of the clock signal CLK, and supplies the same to the array activation control circuit 4.

The address buffer 3 is activated in response to the internal chip enable signal from the control buffer 2, to incorporate the address signals RA and CA and the block address signal BA supplied at the rising edge of the clock signal CLK and generate an internal address signal. As described later in detail, the X decoder XD#A provided for the precedently selected array block MB#A still latches the previously supplied address signal even if the new internal address signal is supplied from the address buffer 3. Thus, the latched address signal is prevented from replaced by the newly supplied address signal.

In response to the rewrite instruction signal φ from the control buffer 2, the array activation control circuit 4 determines that the address signal supplied in this access cycle is that designating a memory cell of the array block to which data of the memory cell in the previously selected array block is transferred. In this state, a word line WLB is selected in the newly addressed array block (transfer destination array block) MB#B under control by the array activation control circuit 4, so that data of a memory cell connected with the word line WLB selected in the array block MB#B is transmitted onto each corresponding bit line pair BLP.

On the other hand, the array activation control circuit 4 activates a Y decoder YD#A for the previously designated array block MB#A at a prescribed timing. The activated Y decoder YD#A decodes the already latched column address signal CA, and activates the column selection signal CS for selecting the corresponding column of the selected array block MB#A, i.e., the bit line pair BLP. Thus, a column selection gate of the selector STR of the array block MB#A conducts so that the selected bit line pair BLP is connected to a local I/O bus LI/OA. Similarly, a block selection gate BSELA is brought into a conducting state in accordance with the block address signal BA, so that the local I/O bus LI/OA is connected to the global I/O bus GI/O. Thus, addressed memory cell data of the selected array block MB#A is transmitted onto the global I/O bus GI/O.

In response to the active rewrite instruction signal φ supplied from the control buffer 2, the array activation control circuit 4 delays an activation timing for a sense amplifier in the transfer source array block, in order to guarantee appearance of the memory cell data to be transferred on the global I/O bus GI/O.

Then, an internal rewrite signal φi is activated after a lapse of a prescribed period from the supply of the rewrite instruction signal φ. In response to such activation of the internal rewrite signal φi, the selector of the transfer destination array block conducts in accordance with an output signal of a Y decoder YD#B and that of a block decoder (not shown), so that the sense amplifier of the addressed column therein is connected to the global I/O bus GI/O. Thereafter the sense amplifier of the transfer destination array block MB#B is activated so that the transferred memory cell data is written in the selected memory cell in the block MB#B. In the array blocks MB#A and MB#B, array precharge operations are executed under control of the array activation control circuits 4 after a lapse of a prescribed period from activation of the chip enable signal CE.

Figure 4:
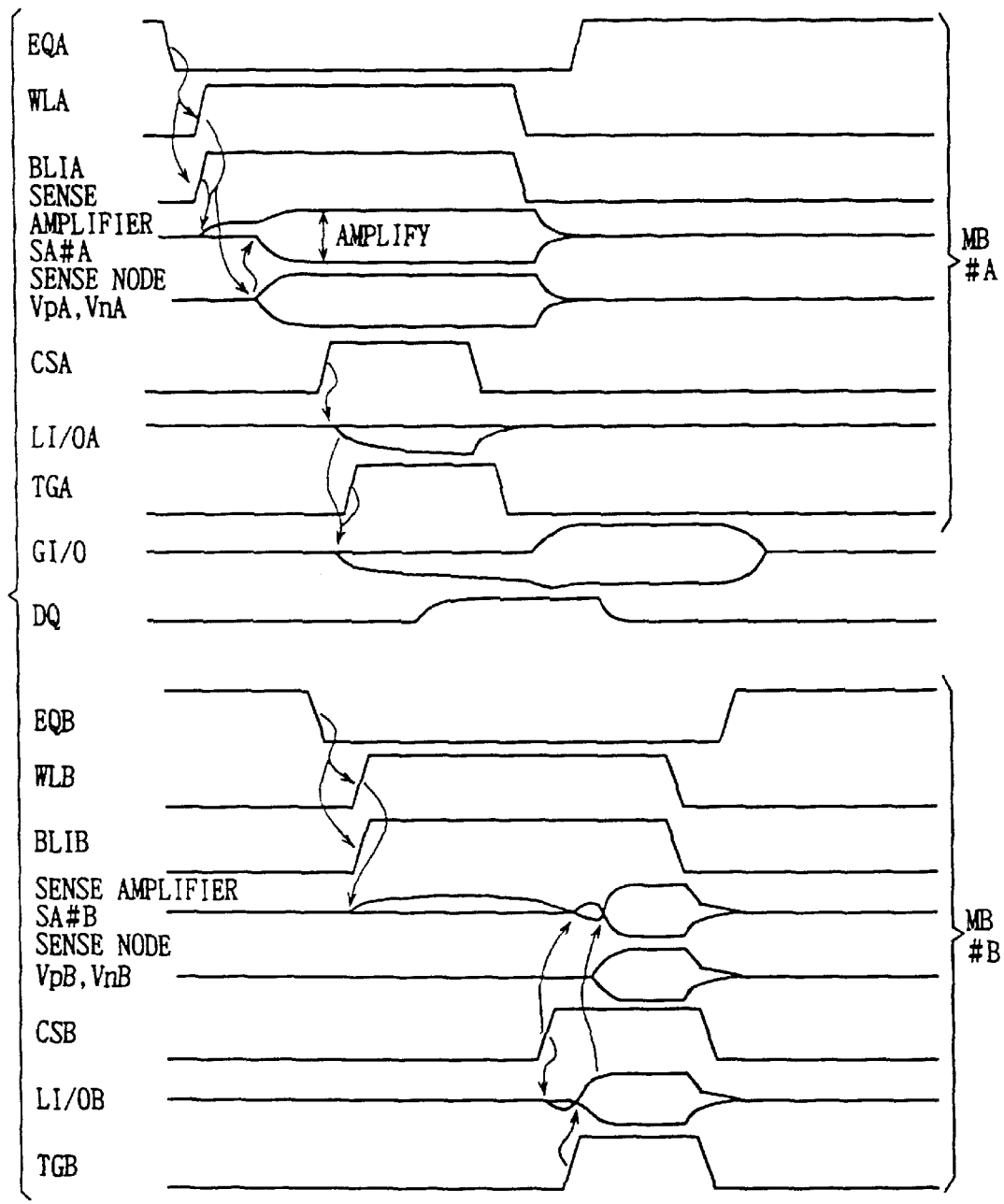
FIG. 4 illustrates signal waveforms in the array block of the semiconductor memory device according to the first embodiment of the present invention.

FIG. 4 is a waveform diagram representing the data transfer operation of the semiconductor memory device according to the first embodiment of the present invention. With reference to FIG. 4, the data transfer operation is now described more specifically.

In the array block MB#A, an equalization signal EQA is brought into an inactive state of a low level and the equalize/precharge circuit is inactivated in response to activation of the chip enable signal CE. Then, a bit line isolation instruction signal BLIA goes high so that the bit line pair BLPA is coupled to a sense node of a sense amplifier SA#A. The sense node of the sense amplifier indicates a node connecting a gate and a drain of one and another MOS transistors of a cross-coupled type sense amplifier. Then, the word line WLA is selected in accordance with the row address signal RA so that the potential of the selected word line WLA rises and the potential of the sense node of the sense amplifier SA#A is changed in accordance with data of the memory cell connected with the selected word line WLA. After the potential of the sense node is sufficiently enlarged, sense amplifier activation signals VpA and VnA are brought to high and low levels of active states respectively, so that the potential of the sense nodes of the sense amplifier SA#A is amplified. After the potential of the sense nodes of the sense amplifier SA#A is sufficiently amplified, the column selection signal CSA outputted from the Y decoder YD#A goes high, so that a column designated by the column selection signal CSA is connected to the local I/O bus LI/OA to change its potential. Then, the block selection gate BSELA conducts in accordance with activation of a block selection signal TGA, so that the local I/O bus LI/OA is connected to the global I/O bus GI/O to change its potential.

The read driver RDR and an output buffer OBF are activated in accordance with a read/write signal W/R which is supplied at the rising edge of the clock signal CLK, whereby the data on the global I/O bus GI/O is amplified and outputted to the data input/output terminal DQ.

In parallel with the access operation to the array block MB#A, on the other hand, a bit line isolation signal BLIB goes high in accordance with a transfer destination address signal while the potential of the selected word line WLB goes high in the array block MB#B. Thus, the data of the memory cell connected with the selected word line WLB is transmitted to sense nodes of a sense amplifier SA#B, to change the sense node potential of the sense amplifier SA#B. Since the rewrite instruction signal φ is in an active state, activation of the sense amplifier of the array block MB#B is retarded until the internal rewrite signal φi is activated, so that a sense operation is performed after the data on the global I/O bus GI/O is ascertained.

When the internal rewrite signal φi is activated, the write driver is first activated so that the potential on the global I/O bus GI/O is amplified. As shown in FIG. 2, the internal read/write bus RWBS is connected to an output of the read driver RDR and an input of the write driver WDR. Therefore, the potential on the global I/O bus GI/O is brought into a potential level obtained by further amplifying the data of the memory cell selected in the array block MB#A. Then, a column selection signal CSB is activated in the array block MB#B, so that a bit line pair BLPB (sense nodes of the sense amplifier SA#B) of the corresponding column is connected to a local I/O bus LI/OB. Even if the potential at sense nodes is changed due to the connection of the local LI/OB and the bit line pair BLPB, there causes no problem because the sense node potential is rewritten by data transferred from the memory array block MB#A.

Then, a block selection signal TGB for the array block MB#B enters an active state of a high level, a block selection gate BSELB conducts, the local I/O bus LI/OB is connected to the global I/O bus GI/O, the potential of the local I/O bus LI/OB is changed in accordance with a potential supplied from the write driver WDR, and the sense node potential of the sense amplifier SA#B is also changed in response thereto. Then, the sense amplifier of the array block MB#B is activated, writing of data in the selected memory cell and restoration of data of the remaining memory cells connected with the selected word line WLB are carried out, and the data transfer cycle is completed after a lapse of a prescribed period.

As hereinabove described, it is possible to activate a second array block when a first array block is in an active state by making the array blocks drivable independently of each other, whereby data transfer between the array blocks can be performed in a period by far shorter than 2 cycle periods of a row address strobe signal ZRAS.

[Modification of Transfer Operation]

Figure 5:
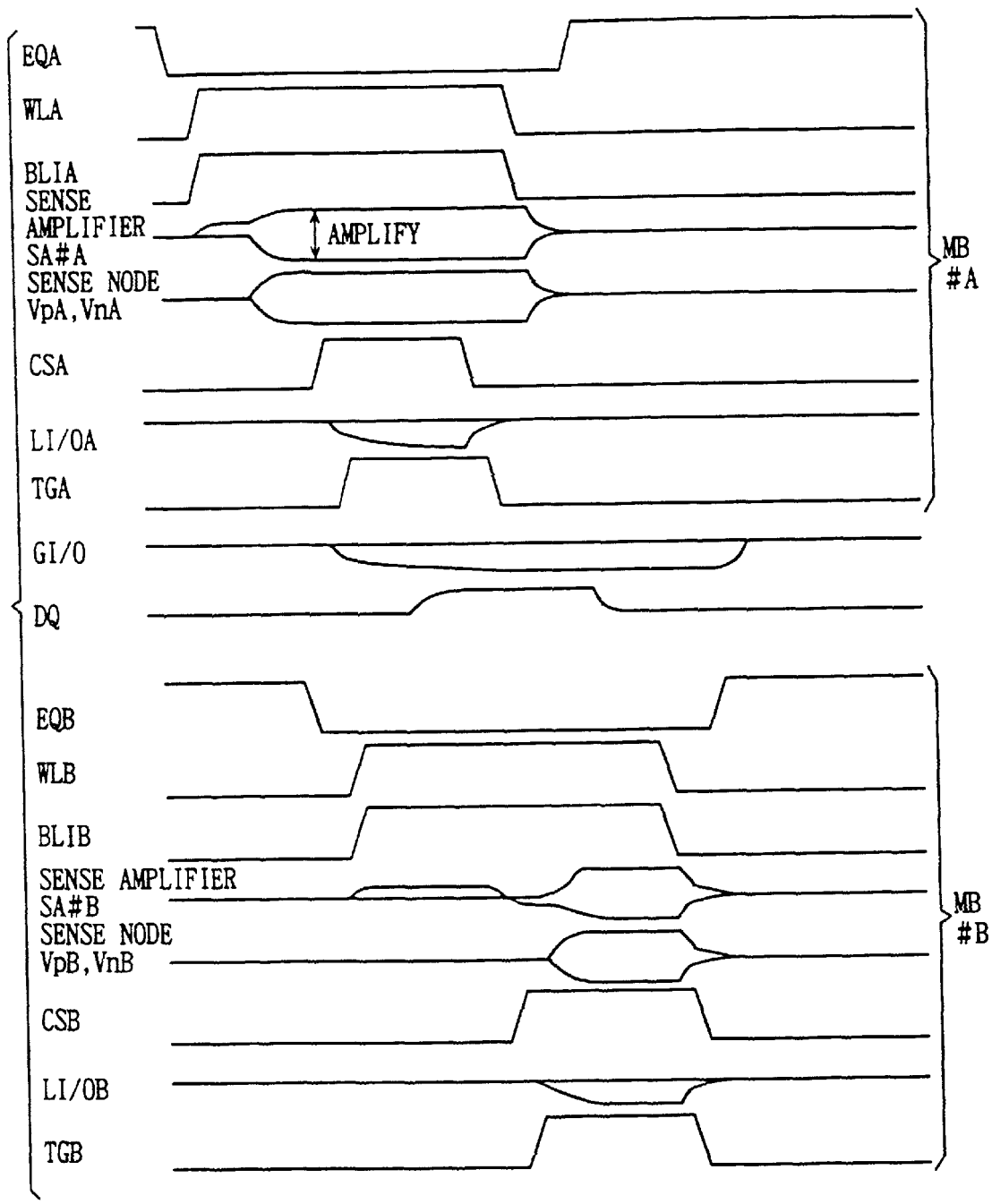
FIG. 5 illustrates signal waveforms showing operations of a modification of the semiconductor memory device according to the first embodiment of the present invention.

FIG. 5 is a waveform diagram representing a first modification of the data transfer operation of the semiconductor memory device according to the first embodiment of the present invention.

In the data transfer operation shown in FIG. 5, data is transferred from the array block MB#A to the array block MB#B. In this case, the array block MB#A performs an operation which is similar to that shown in FIG. 4. The write driver is not activated upon supply of rewrite instruction signal φ, and hence the global I/O bus GI/O maintains the potential of the data which is read from the array block MB#A.

In the array block MB#B, on the other hand, the word line WLB is selected in accordance with a transfer destination address signal, while a bit line isolation signal BLIB is also brought into an active state of a high level. Thus, data of a memory cell connected with the selected word line WLB is transmitted to the sense node of the sense amplifier SA#B through each bit line pair BLPB. After a lapse of a prescribed time, a column selection signal CSB from the Y decoder YD#B and a block selection signal TGB from the block decoder (not shown) are brought to high levels in response to the rewrite instruction signal φ. Thus, the sense node of the sense amplifier SA#B arranged in correspondence to the selected column is connected to the global I/O bus GI/O. Since the sense amplifier SA#B is in an inactive state, the potential of its sense node is changed in response to that on the global I/O bus GI/O. Thereafter sense amplifier activation signals VpB and VnB are activated, so that the potential of the sense node of the sense amplifier SA#B is amplified and written in the memory cell. Even if the sense node potential of the sense amplifier SA#B enters an indefinite state when the sense node is connected to the local I/O bus LI/OB, this indefinite data is replaced with the potential of the global I/O bus GI/O, and no problem is caused when the potential of the sense node of the sense amplifier SA#B is changed in response to that on the global I/O bus GI/O before activation of the sense amplifier activation signals VpB and VnB. Whichever of the column selection signal CSB and the block selection signal TGB may be activated faster. Further, whichever of the word line WL and the bit line isolation signal BLI may be activated faster.

As shown in FIG. 5, the data can be correctly transferred by activating the sense amplifier SA#B of the transfer destination array block after connection of the global I/O bus GI/O and the sense node, even if the write driver WDR is maintained in an inactive state in data rewriting.

[Structure of Peripheral Circuits]

Figure 6:
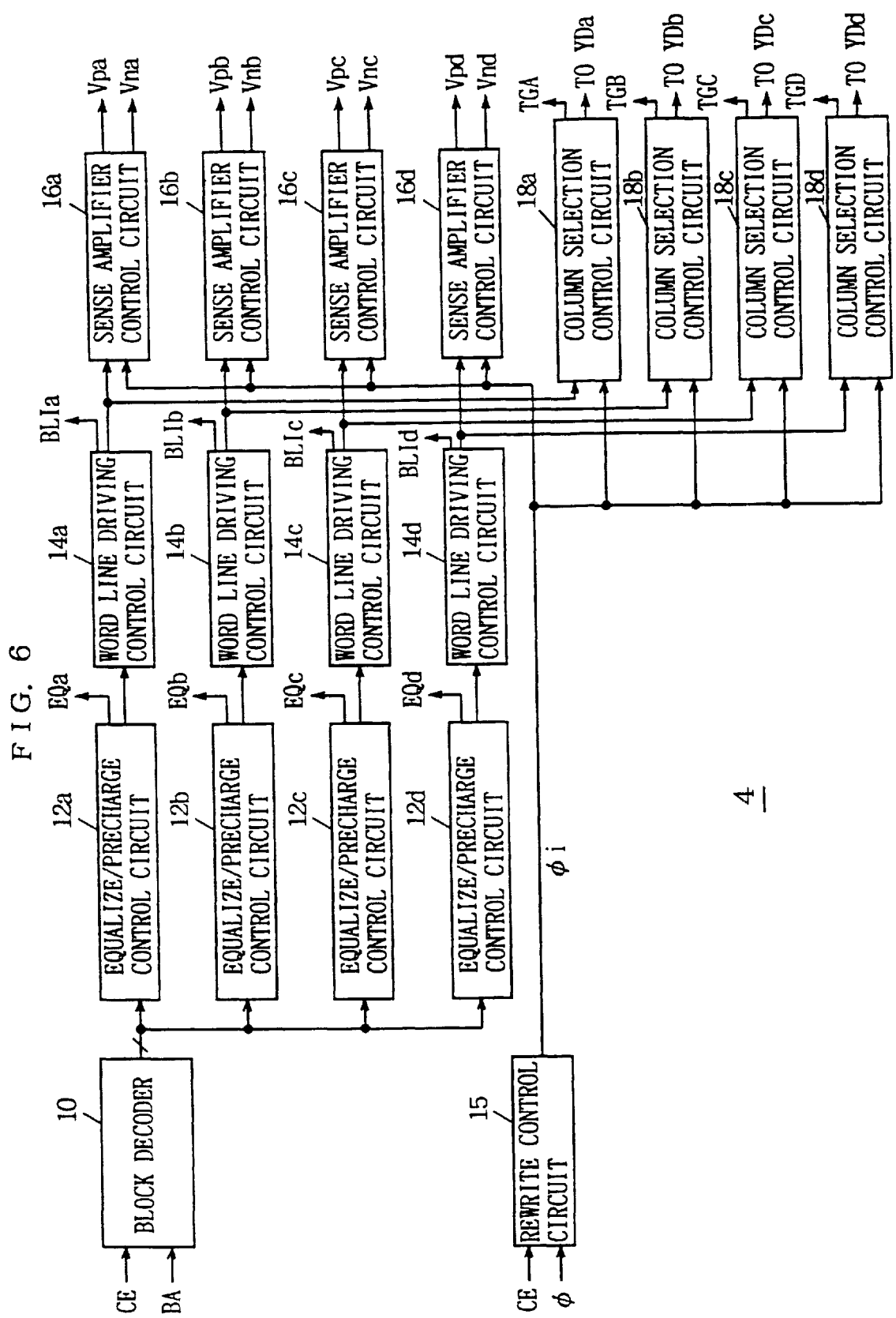
FIG. 6 illustrates the structure of an array activation control circuit shown in FIG. 1.

Array Activation Control Circuit:

FIG. 6 is a block diagram schematically showing the internal structure of the array activation control circuit 4 shown in FIG. 1. Referring to FIG. 6, the array activation control circuit 4 includes array activation/precharge control circuits provided in correspondence to the array blocks MBa to MBd respectively, in order to drive the array blocks MBa to MBd independently of each other. Namely, the array activation control circuit 4 includes a block decoder 10 which is activated in response to the chip enable signal CE to decode the block address signal BA and output a signal designating an addressed array block, equalize/precharge control circuits 12a to 12d activated in response to a block designation (activation) signal from the block decoder 10 to inactivate equalize/precharge circuits of the corresponding array blocks, word line driving control circuits 14a to 14d for activating word line selecting operations of the corresponding array blocks in response to inactivation of the equalization operation by the equalize/precharge control circuits 12a to 12d, a rewrite control circuit 15 for outputting the internal rewrite signal φi at a prescribed timing in response to the chip enable signal CE and the rewrite instruction signal φ, sense amplifier control circuits 16a to 16d for outputting sense amplifier activation signals Vp and Vn for activating the sense amplifiers of the corresponding array blocks in response to output signals from the word line driving control circuits 14a to 14d and the internal rewrite instruction signal φi from the rewrite control circuit 15, and column selection control circuits 18a to 18d for starting column selecting operations of the corresponding array blocks in response to word line selecting operation start instruction signals from the word line driving control circuits 14a to 14d and the internal rewrite instruction signal φi from the rewrite control circuit 15.

The equalize/precharge control circuits 12a to 12d inactivate equalization signals EQA to EQD for prescribed time periods with respect to the corresponding array blocks upon activation of the block designation signal from the block decoder 10. The respective word line driving control circuits 14a to 14d brings bit line isolation signals BLIA to BLID to high levels of active states for prescribed periods in response to changes of output signals of the corresponding equalize/precharge control circuits 12a to 12d, while activating X decoders, structures of which are described later, for a prescribed period.

The sense amplifier control circuits 16a to 16d activate sense amplifier activation signals VpA and VnA to VpD and VnD for prescribed periods at prescribed timings with respect to the corresponding array blocks upon inactivation of the internal rewrite instruction signal φi, in response to word line selecting operation start instruction signals from the word line driving control circuits 14a to 14d. In activation of the internal rewrite instruction signal φi, on the other hand, the sense amplifier control circuits 16a to 16d activate the corresponding sense amplifier activation signals VpA and VnA to VpD and VnD for a prescribed period in response to the activation of the internal rewrite instruction signal φi.

The column selection control circuits 18a to 18d activate block selection signals TGA to TGD at prescribed timings for prescribed periods while activating corresponding Y decoders, when activated. In activation of the internal rewrite instruction signal φi, the column selection control circuits 18a to 18d activate the block selection signals TGA to TGD while activating column selection signals from corresponding Y decoders YDa to YDd in response to the internal rewrite instruction signal φi.

Figure 7A:
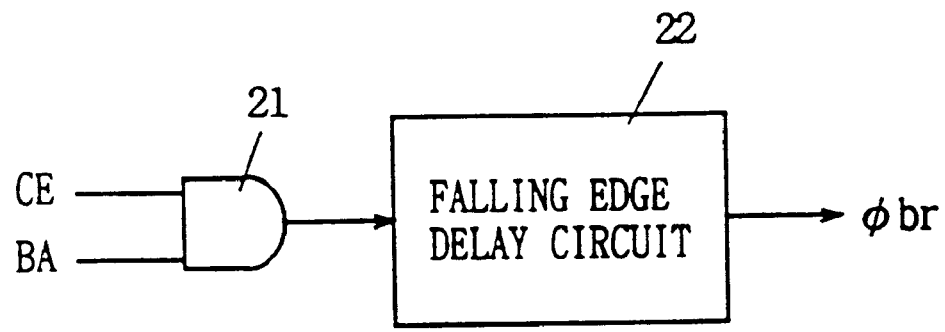
FIGS. 7A and 7B illustrate the structure and operation of a block decoder shown in FIG. 6 respectively.
Figure 7B:
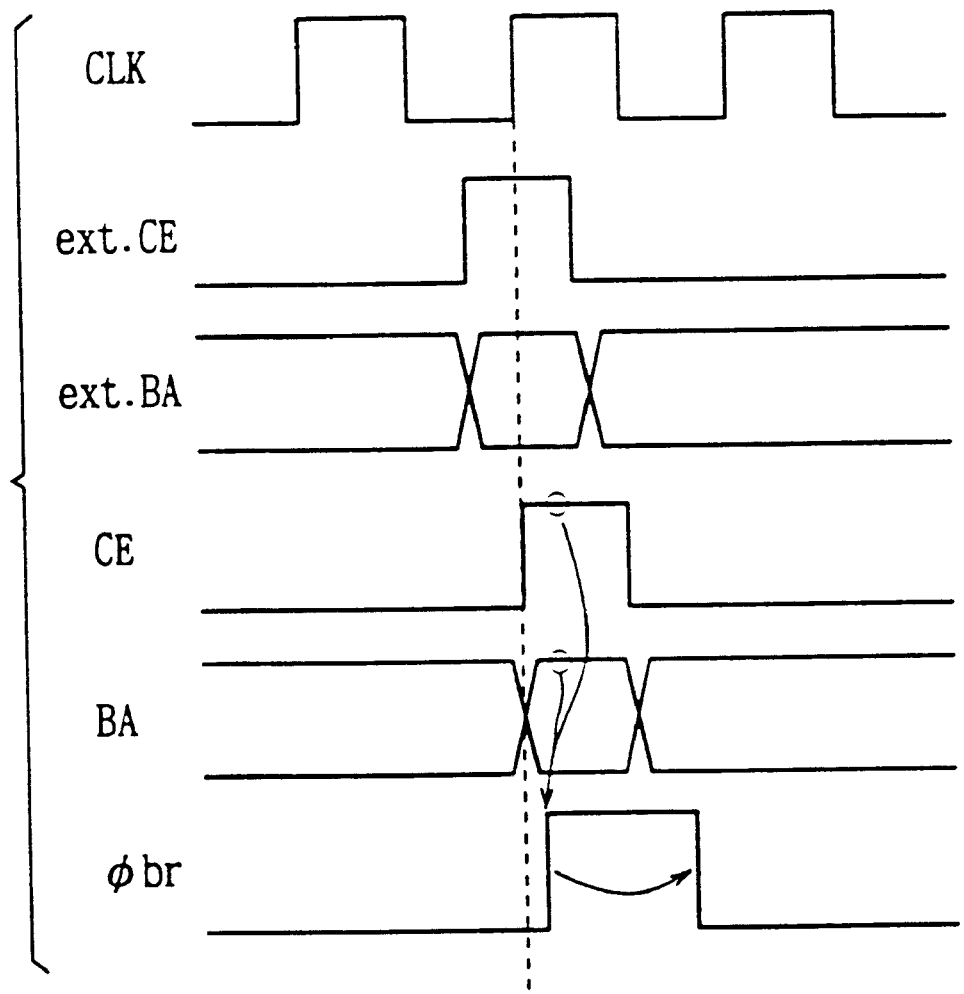

FIGS. 7A and 7B illustrate the structure and operation of the block decoder 10 shown in FIG. 6 respectively. Referring to FIG. 7A, the block decoder 10 includes a decoding circuit 21 which decodes the internal chip enable signal CE from the control buffer 2 and the block address signal BA from the address buffer 3, and a falling edge delay circuit 22 which delays the falling edge of an activation signal (high-level signal) from the decoding circuit 21. The falling edge delay circuit 22 outputs a block activation signal φbr for activating the corresponding array block.

The decoding circuit 21, which is formed by an AND circuit, for example, outputs a high-level signal indicating a selected state when both of the internal chip enable signal CE and the block address signal BA (2-bit address signal: in the case of four array blocks) are at high levels. The falling edge delay circuit 22 can have an arbitrary circuit structure, so far as it has a function of expanding a pulse duration. The operation of the block decoder 10 shown in FIG. 7A is now described with reference to FIG. 7B.

An external chip enable signal ext.CE is brought to a high level and an externally supplied block address signal ext.BA is brought into a definite or decided state at the rising edge of the external clock signal CLK. In this state, chip access is designated and the internal chip enable signal CE is brought to a high level for a prescribed period in response to rise of the clock signal CLK, while the internal block address signal BA is also brought into a definite state for a prescribed period. The decoder circuit 21 decodes the internal chip enable signal CE and the internal block address signal BA which are brought into definite states, and outputs a high-level signal to the array block designated by the block address signal BA. Thus, the block activation signal φbr outputted from the falling edge delay circuit 22 is brought into an active state of a high level for a prescribed period from the rising edge of the output signal of the decoding circuit 21. The pulse duration of the block activation signal φbr is sufficiently widened through the falling edge delay circuit 22, whereby a signal which can reliably activate the addressed array block can be outputted even when the pulse duration of the clock signal CLK is short and the definite periods of the internal chip enable and block address signals CE and BA are short.

Figure 8A:
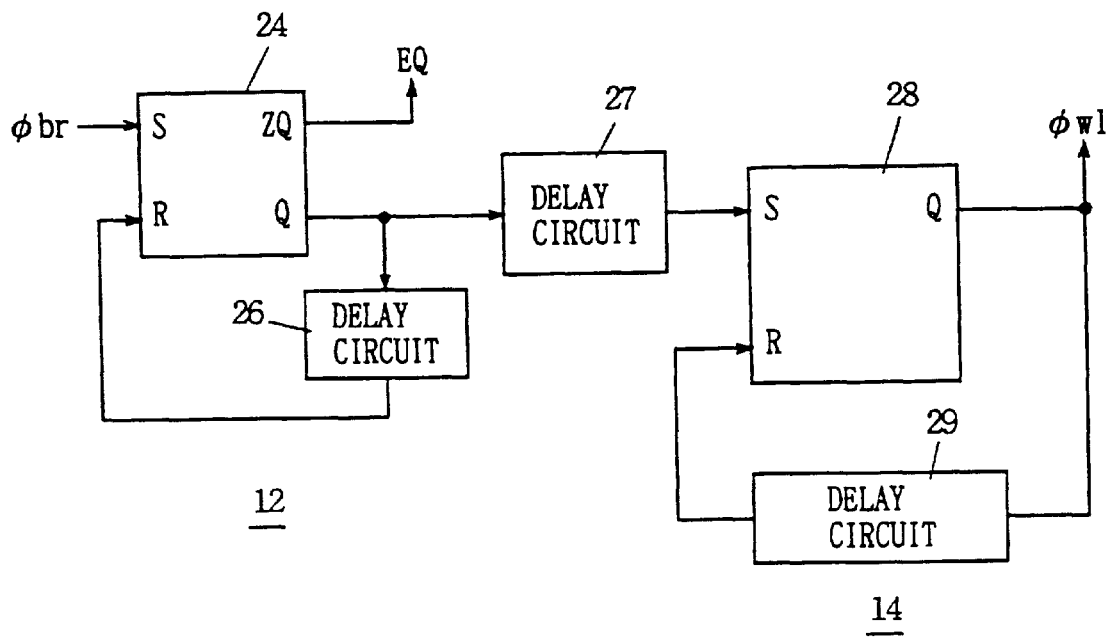
FIGS. 8A and 8B illustrate the structures and operations of an equalize/precharge control circuit and a word line driving control circuit shown in FIG. 6 respectively.

FIG. 8A illustrates exemplary structures of each of the equalize/precharge circuits 12a to 12d and each of the word line driving control circuits 14a to 14d shown in FIG. 6. This FIG. 8A shows the structures of an equalize/precharge control circuit 12 and a word line driving control circuit 14 for a single array block. Referring to FIG. 8A, the equalize/precharge control circuit 12 includes a reset preferential type set/reset flip-flop 24 set in response to activation of the block activation signal φbr. The equalization signal EQ is outputted from a complementary output ZQ of this flip-flop 24. An output signal from a true output Q of the flip-flop 24 is fed back to a reset input R through a delay circuit 26. An inactivation period of the equalization signal EQ is determined by a delay time provided by the delay circuit 26.

Figure 8B:
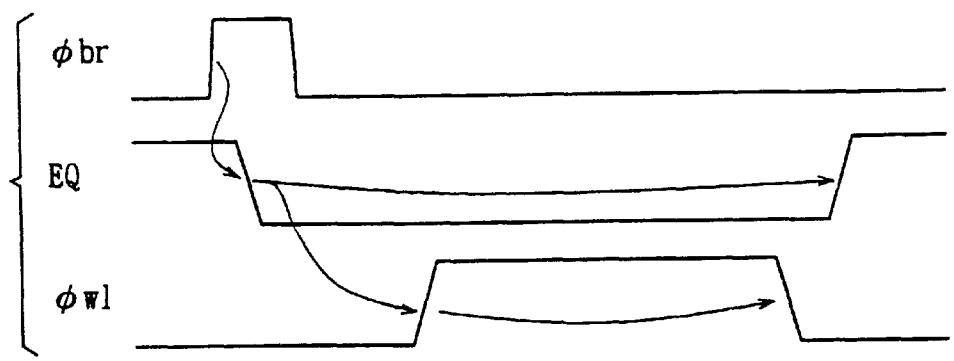

The word line driving control circuit 14 includes a delay circuit 27 for delaying the output signal from the true output Q of the flip-flop 24 included in the equalize/precharge control circuit 12 for a prescribed time, and a reset preferential type flip-flop 28 set upon activation (high level) of an output signal of the delay circuit 27. The flip-flop 28 outputs a word line selecting operation activation signal φwl. The output signal φwl of the flip-flop 28 is fed back to a reset input R thereof through a delay circuit 29. An activation period of the word line selecting operation activation signal φwl is determined by a delay time provided by the delay circuit 29. The operations of the circuits shown in FIG. 8A are now described with reference to FIG. 8B, which is an operation waveform diagram thereof.

The flip-flop 24 is set in response to rise of the block activation signal φbr, and the equalization signal EQ from its complementary output ZQ is brought to a low level. The output signal from the true output Q of the flip-flop 24 is fed back to the reset input R of the flip-flop 24 through the delay circuit 26. Therefore, the flip-flop 24 is reset after a lapse of a prescribed time from the transition of the equalization signal EQ into the inactive state of a low level, and the equalization signal EQ restores to a high level.

In the word line driving control circuit 14, on the other hand, the signal outputted from the true output Q of the flip-flop 24 is supplied to a set input S of the flip-flop 28 through the delay circuit 27. Therefore, the signal φwl from the true output Q of the flip-flop 28 is brought into an active state of a high level after a lapse of the delay time provided by the delay circuit 27 from the transition of the equalization signal EQ into the inactive state of a low level, so that a word line selecting operation is performed. After a lapse of the delay time provided by the delay circuit 29 from the transition of the signal φwl into the active state, the signal supplied to the reset input R of the flip-flop 28 is brought into an active state of a high level, the flip-flop 28 is reset and the signal φwl is brought into an inactive state of a low level.

The array blocks can be activated/precharged independently of each other by selecting the word lines for prescribed periods in the array blocks respectively.

In the structure shown in FIG. 8A, alternatively the output signal of the delay circuit 29 may be supplied to an input of the delay circuit 26. In this case, the delay time provided by the delay circuit 26 can be reduced thereby reducing the circuit scale. Further, the equalization signal EQ can reliably enter a high level to activate the equalization/precharge circuit after completion of the word line selecting operation.

The signal φwl may be utilized as the bit line isolation signal BLI.

Figure 9:
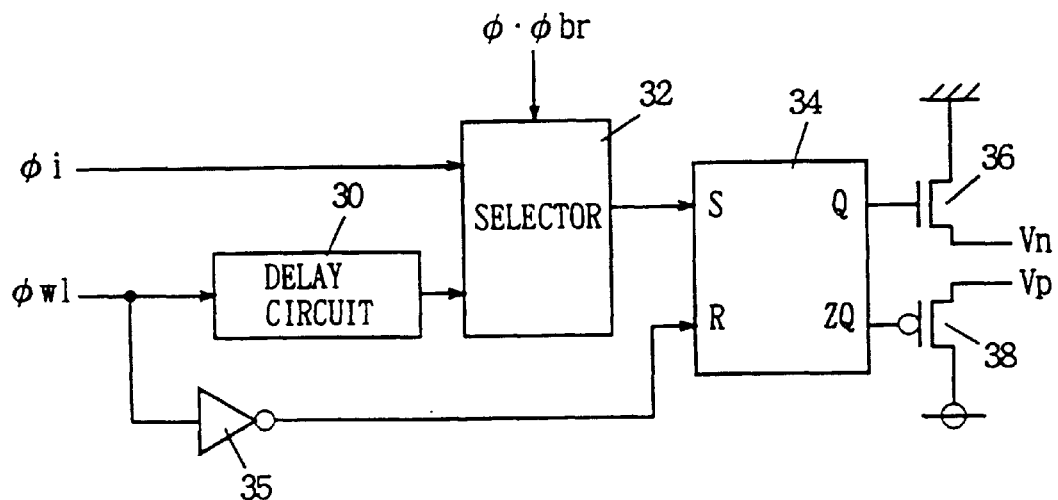
FIG. 9 illustrates the structure of a sense amplifier control circuit shown in FIG. 6.

FIG. 9 schematically illustrates the structure of each sense amplifier control circuit 16 shown in FIG. 6. Referring to FIG. 9, the sense amplifier control circuit 16 includes a delay circuit 30 for delaying the word line selecting operation activation signal φwl for a prescribed time, a selector 32 for selecting one of the internal rewrite signal φi and an output signal from the delay circuit 30 in response to an AND signal φ·φbr of the rewrite instruction signal φ and the block activation signal φbr, and a reset preferential type flip-flop 34 set upon activation of an output signal of the selector 32. An output signal of an inverter 35 receiving the word line selecting operation activation signal φwl is supplied to a reset input R of the flip-flop 34.

The sense amplifier control circuit 16 further includes a sense amplifier activation transistor 36 made conductive in response to an output signal from a true output Q of the flip-flop 34 to drive the sense amplifier activation signal Vn to the ground potential level, and another sense amplifier activation transistor 38 made conductive in response to an output signal from a complementary output ZQ of the flip-flop 34 to drive the sense amplifier activation signal Vp to a high level of a power source voltage or a high level of a high voltage level.

The selector 32 selects the internal rewrite signal φi when the rewrite instruction signal φ is in an active state of a high level and the array block activation signal φbr is activated to a high level. In other words, an activation timing for the sense amplifier is determined in accordance with the internal rewrite signal φi with respect to the array block which is designated as the transfer destination array block. When the signal φ·φbr is inactivated to a low level, the selector 32 selects the output signal of the delay circuit 30. When a signal supplied to a set input S is brought to a high level, the flip-flop 34 brings the true and complementary outputs Q and ZQ to high and low levels respectively. The flip-flop 34 is reset when a signal supplied to the reset input rises to a high level, to bring the true and complementary outputs Q and ZQ to low and high levels respectively. Therefore, transition of the sense amplifier activation signals Vn and Vp from activation to inactivation is determined by transition to inactivation of the word line selecting operation activation signal φwl.

Due to the structure shown in FIG. 9, the activation timing of the sense amplifier can be determined in accordance with the internal rewrite signal only in the transfer destination array block.

Each of the column selection control circuits 18a to 18d shown in FIG. 6 has a structure similar to that of the sense amplifier control circuit 16 shown in FIG. 9, except that transistors 36 and 38 provided at an output of the flip-flop 34 are not employed. A column selecting operation (control of conduction/nonconduction of the selector STR) is performed in accordance with an output signal (either Q or ZQ) of a flip-flop.

The rewrite control circuit 15 shown in FIG. 6 outputs the internal rewrite signal φi having a prescribed width after a lapse of a prescribed time when both of the chip enable signal CE and the rewrite instruction signal φ are in active states of high levels. This structure can be readily implemented by employing a one-shot pulse generation circuit and a delay circuit.

Figure 10:
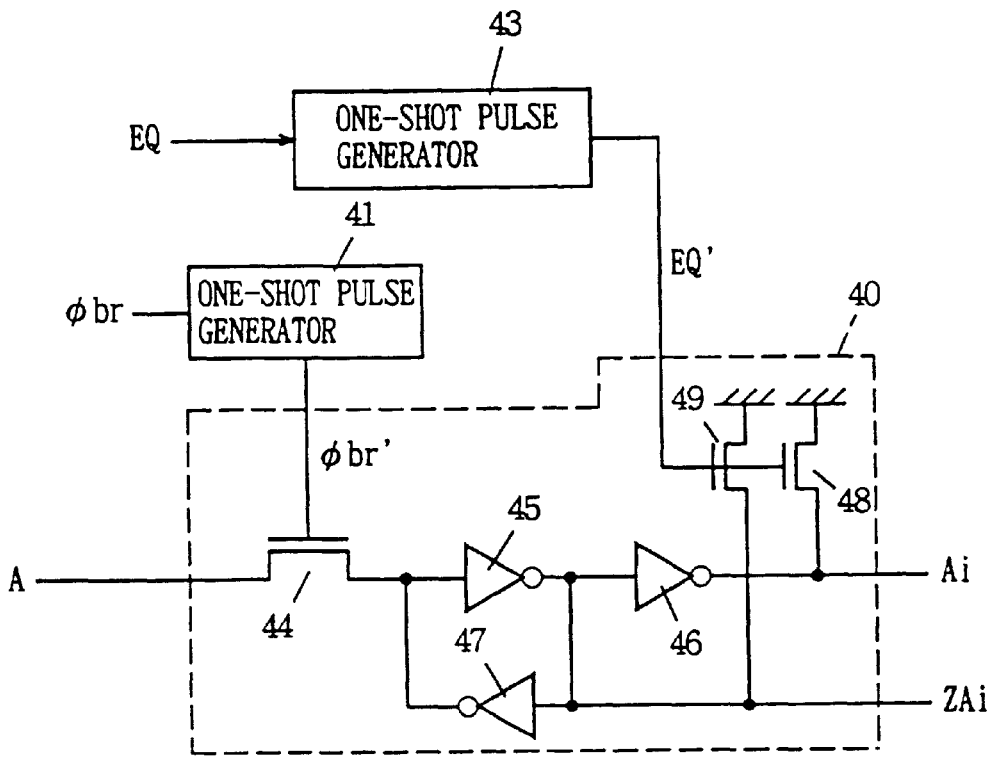
FIG. 10 illustrates the structure of an address latch provided in correspondence to each X decoder shown in FIG. 1.

FIG. 10 illustrates an exemplary structure of an address latch 40 arranged in correspondence to each array block.

Referring to FIG. 10, the address latch 40 incorporates an internal address signal A (including both row and column address signals RA and CA) supplied from the address buffer by an incorporation instruction signal φbr' from a one-shot pulse generation circuit 41, and resets an internal address Ai in response to a one shot pulse from a one-shot pulse generation circuit 43. The one-shot pulse generation circuit 41 generates the address incorporation instruction signal φbr' having a prescribed pulse duration in response to rise of the array block activation signal φbr. On the other hand, the one-shot pulse generation circuit 43 outputs a pulse signal EQ' brought to a low level for a prescribed period in accordance with inactivation of the equalization signal EQ of the corresponding array block.

The address latch 40 further includes a transfer gate 44 formed by an n-channel MOS transistor, for example and made conductive in response to the address incorporation instruction signal φbr' to pass the address signal A supplied from the address buffer, cascade-connected two stages of inverters 45 and 46 for amplifying the address signal supplied through the transfer gate 44, and an inverter 47 for receiving and inverting an output signal of the inverter 45 for transmission to an input part of the inverter 45. Driving ability of the inverter 46 is made smaller than that of the inverter 45. The inverter 46 outputs the internal address signal Ai, while the inverter 45 outputs an internal address signal ZAi.

Figure 11:
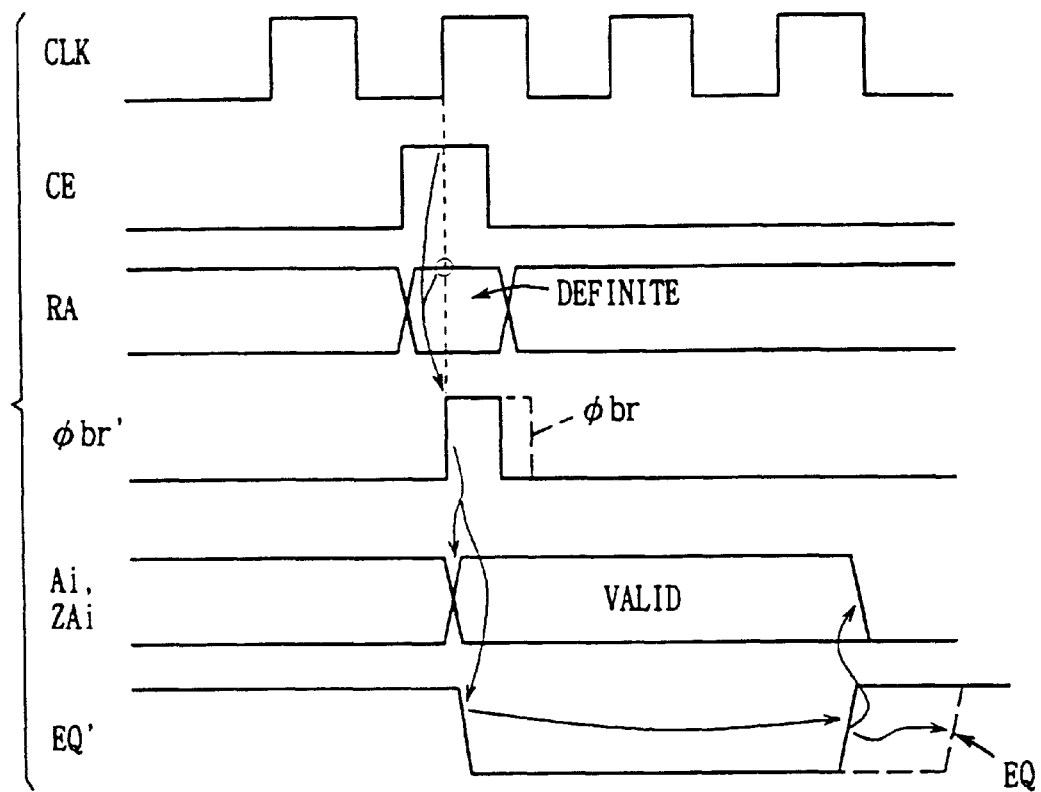
FIG. 11 is a signal waveform diagram representing operations of the circuits shown in FIGS. 9 and 10.

The address latch 40 further includes reset transistors 48 and 49 for resetting the internal address signals Ai and ZAi to low levels in response to the pulse signal EQ' from the one-shot pulse generation circuit 43. The operation of the address latch 40 shown in FIG. 10 is now described with reference to FIG. 11, which is an operation waveform diagram thereof.

The internal chip enable signal CE is brought into an active state of a high level at the rising edge of the clock signal CLK, so that the currently supplied address signal is brought into a definite state. In response to the rise of the chip enable signal CE, the block decoder 10 shown in FIG. 6 outputs the block activation signal φbr to the addressed array block. In response to activation of the block activation signal φbr, the one-shot pulse generation circuit 41 outputs the signal φbr' having a prescribed time width (pulse duration shorter than that of the block activation signal φbr). In response to transition of the signal φbr' to a high level, the transfer gate 44 conducts to pass the currently supplied address signal A for supply to an input part of the inverter 45. In the one-shot pulse generation circuit 43, on the other hand, the pulse signal EQ' is brought to a low level for a prescribed period in response to the equalization signal EQ from the equalize/precharge control circuit shown in FIG. 8A and the reset transistors 48 and 49 are brought into nonconducting states. Thus, the internal addresses Ai and ZAi are changed in accordance with the currently supplied address signal A, and latched by the inverters 45 and 47.

The transfer gate 44 is brought into a nonconducting state when the signal φbr' goes low. Thus, the addresses Ai and ZAi (complementary address signals) which are brought into valid states are sustainingly outputted to the array block. Even if a next transfer address is supplied while the address latch 40 latches the internal address signals Ai and ZAi, the signal φbr' outputted from the one-shot pulse generation circuit 41 is brought into an active state of a high level only with respect to the transfer destination array block in this case, whereby the internal address signals Ai and ZAi are sustainingly latched in the previously addressed array block with no influence.

When a prescribed time elapses from fall of the signal EQ' to a low level, this signal EQ' rises to a high level, the reset transistors 48 and 49 conduct, and both of the internal address signals Ai and ZAi are brought to low levels. The equalization signal EQ goes high after a lapse of a prescribed period from the transition of the signal EQ' to the high level.

Figure 12:
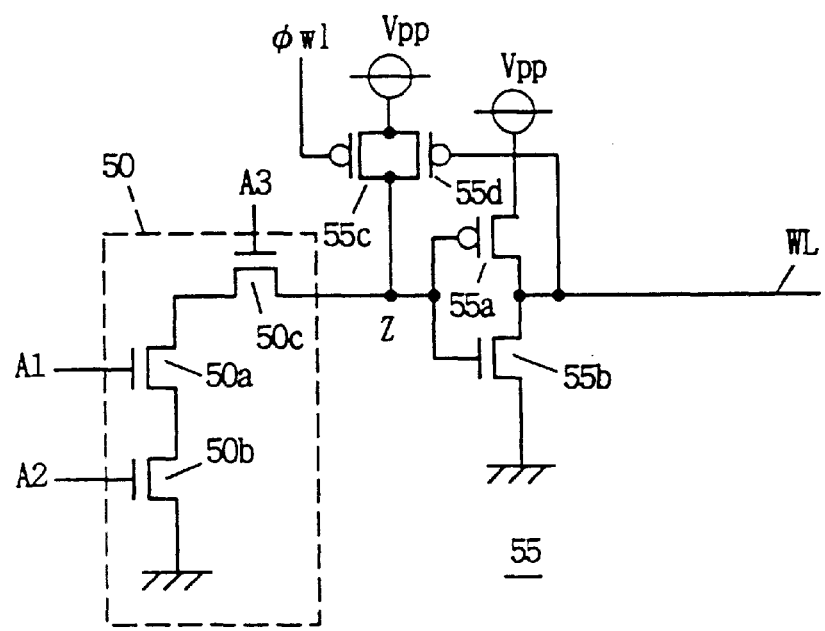
FIG. 12 illustrates the structure of the X decoder shown in FIG. 1.

FIG. 12 illustrates a specific structure X decoder circuit of decoder XD provided for a word line WL in FIG. 1. Referring to FIG. 12, the X decoder circuit includes a row decoding circuit 50 for decoding the internal address signal to produce a row selection signal designating a corresponding word line, and a word driver 55 for driving the corresponding word line WL to a selected state in response to an output signal from the row decoding circuit 50. The row decoding circuit 50 includes n-channel MOS transistors 50a, 50b and 50c connected in series between an internal node Z and a ground node, for receiving internal address signals A1 to A3 respectively. The row decoding circuit 50 is a NAND type decoding circuit. In the structure of the row decoding circuit 50, the address signal A3 may be supplied to row decoding circuits which are provided for a plurality of (e.g., four) word lines in common, and one of the four word lines is selected by the remaining address signals A1 and A2.

The word driver 55 includes a p-channel MOS transistor 55a and an n-channel MOS transistor 55b connected between a node receiving a high voltage Vpp and the ground node, and having gates thereof connected to the internal node Z. The MOS transistors 55a and 55b form an inverter, to transmit the high voltage Vpp to the corresponding word line WL when the potential on the internal node Z is at a low level. When the potential on the internal node Z is at a high level, on the other hand, the corresponding word line WL is kept at a low level of a nonselected state.

The word driver 55 further includes a p-channel MOS transistor 55c which conducts in inactivation of the word line selecting operation activation signal φwl for transmitting the high voltage Vpp to the internal node Z, and a p-channel MOS transistor 55d which conducts to transmit the high voltage Vpp to the internal node Z when the potential on the word line WL is at a low level. When a word line selecting operation is carried out, the signal φwl is at a high level and the MOS transistor 55c is in a nonconducting state. In this case, the potential of the internal node Z is determined in accordance with an output signal of the row decoding circuit 50, and the potential of the word line WL is determined in accordance with the potential on the internal node Z. When the signal φwl is brought to a low level, the word line selecting operation is completed, the MOS transistor 55c conducts, and the internal node Z is charged to the high voltage Vpp level. At this time, all address signals A1 to A3 are reset to low levels (see the address latch of FIG. 10), and the row decoding circuit 50 is brought into an output high impedance state. The internal node Z is maintained at the high voltage Vpp level, thereby reliably bringing the MOS transistor 55a into a nonconducting state and holding the nonselected word line WL at the ground potential level through the MOS transistor 55b.

[Array Modification 1]

Figure 13:
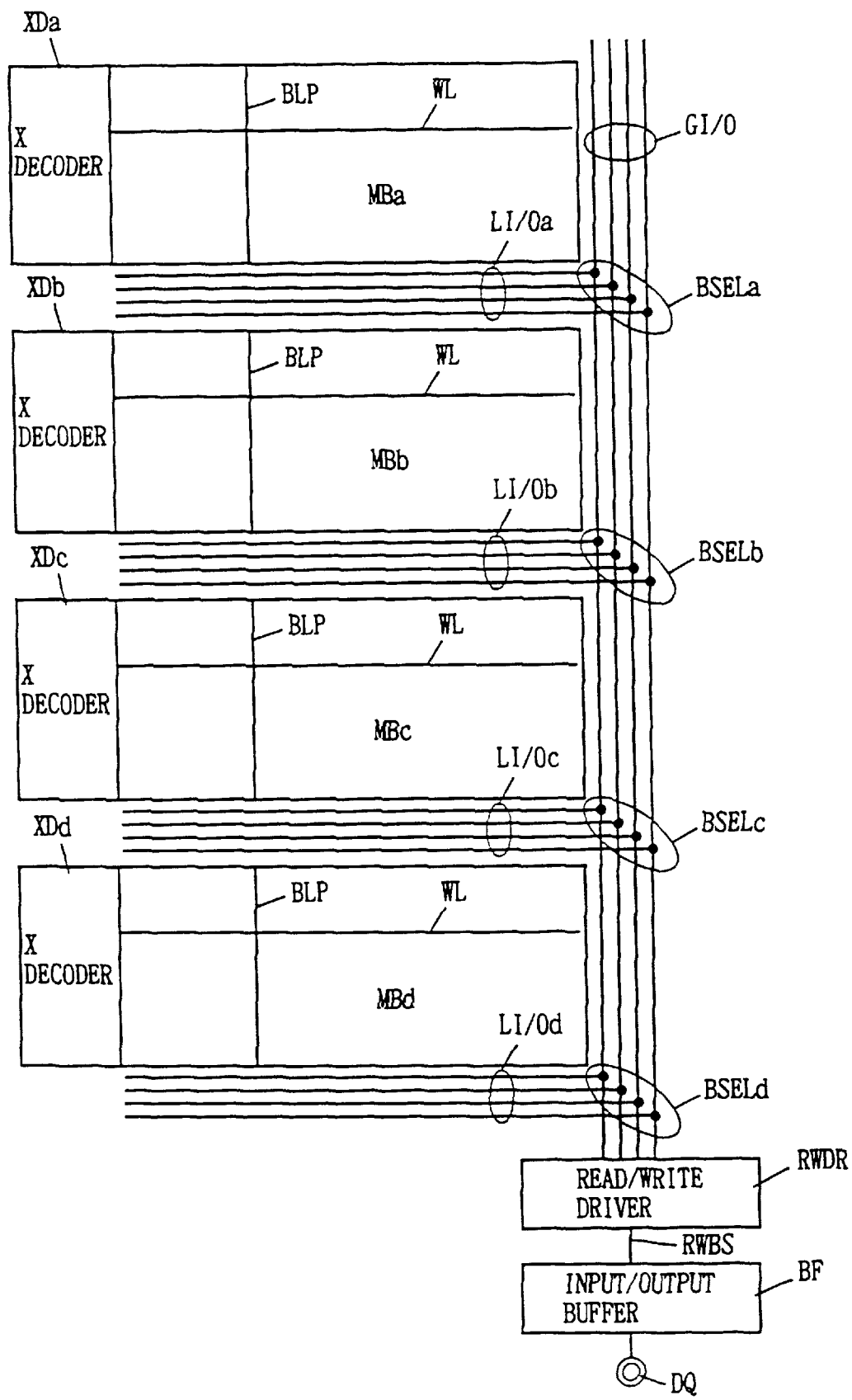
FIG. 13 illustrates the structure of a first modification of the semiconductor memory device according to the first embodiment of the present invention.

FIG. 13 illustrates the structure of a modification of the first embodiment of the present invention. This FIG. 13 schematically illustrates arrays of a semiconductor memory device and I/O buses for data transmission. Referring to FIG. 13, local I/O buses LI/Oa to LI/Od each for transmitting a plurality of bits (4 bits in FIG. 13) of data are arranged in correspondence to array blocks MBa to MBd respectively. 4-bit global I/O bus GI/O is arranged for the 4-bit local I/O buses LI/Oa to LI/Od in common. Block selection gates BSELa to BSELd are arranged at crossings between the respective local I/O buses LI/Oa to LI/Od and the global I/O bus GI/O. The block selection gates BSELa to BSELd are identical in structure to those shown in FIG. 2.

A read/write driver RWDR is provided for the global I/O bus GI/O for inputting/outputting 1-bit data. This read/write driver RWDR is coupled to an input/output buffer BF through an internal read/write bus RWBS.

Figure 14:
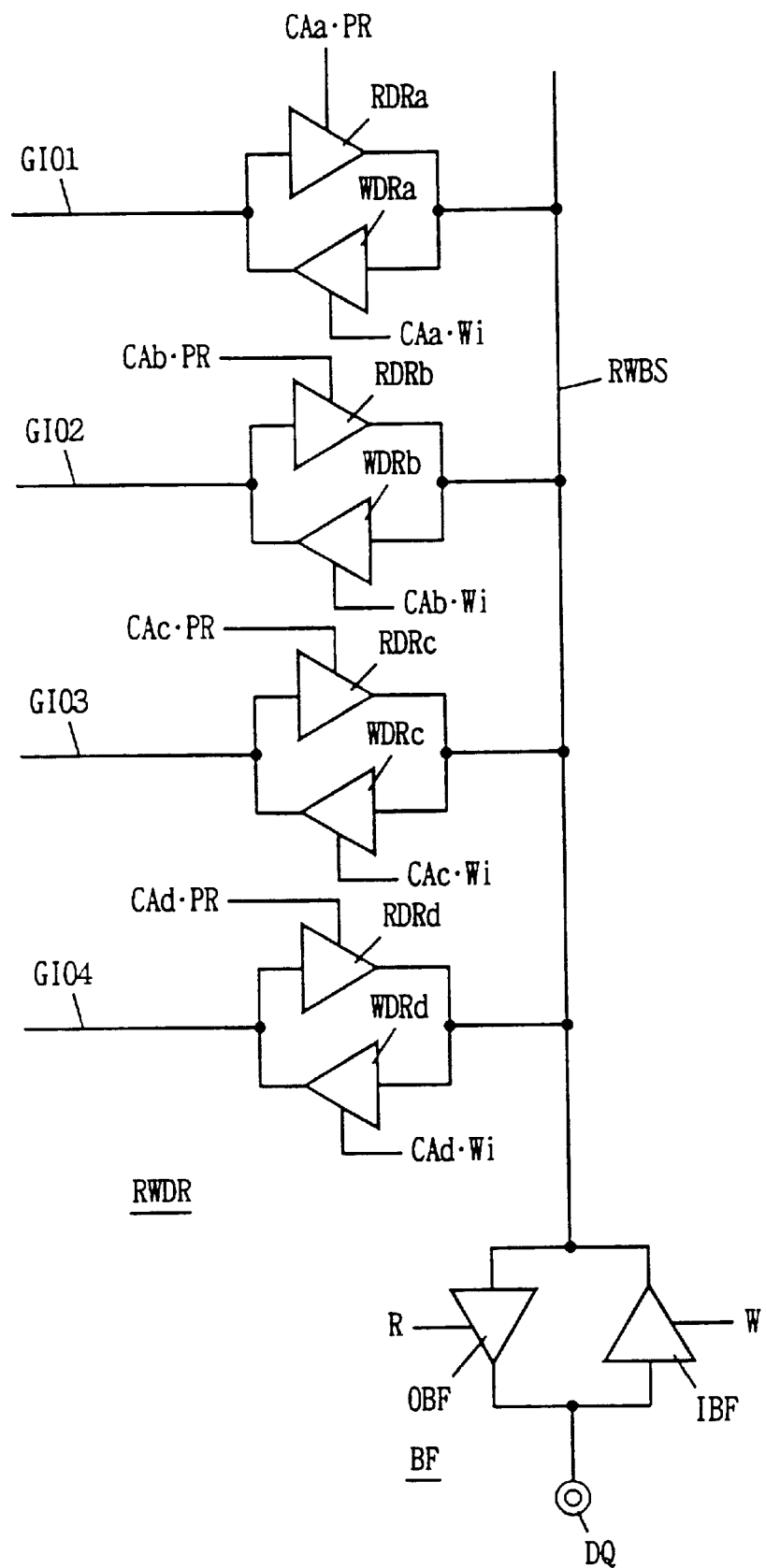
FIG. 14 illustrates the structure of a read/write driver shown in FIG. 13.

FIG. 14 schematically illustrates the structure of the read/write driver RWDR shown in FIG. 13. Referring to FIG. 14, the read/write driver RWDR includes a read driver RDRa and a write driver WDRa which are provided for a global I/O bus GIO1, a read driver RDRb and a write driver WDRb which are provided for a global I/O bus GIO2, a read driver RDRc and a write driver WDRc which are provided for a global I/O bus GIO3, and a read driver RDRd and a write driver WDRd which are provided for a global I/O bus GIO4. The read driver RDRa is activated when both of a block address signal BAa designating the array block MBa and a preamplifier enable signal (internal read instruction signal) PR are in active states, to amplify data on the global I/O bus GIO1 for outputting onto the internal read/write bus RWBS. The write driver WDRa is activated when both of the block address signal BAa and an internal write instruction signal Wi are in active states, to amplify the data on the read/write bus RWBS for transmission onto the global I/O bus GIO1.

The read driver RDRb is activated when both of a block address signal BAa designating the array block MBb and the preamplifier enable signal PR are in active states, to amplify data on the global I/O bus GIO2 for transmission onto the internal read/write bus RWBS. The write driver WDRb is activated upon activation of signals Wi and BAb.

The read driver RDRc is activated when both of a block address signal BAc designating the array block MBc and the preamplifier enable signal PR are in active states, to amplify data on the global I/O bus GIO3 for transmission onto the internal read/write bus RWBS. The write driver WDRc is activated when both of the block address signal BAc and the internal write instruction signal Wi are in active states, to amplify the data on the internal read/write bus RWBS for transmission onto the global I/O bus GIO3. The read driver RDRd is activated upon activation of a block address signal BAd designating the array block MBd and the preamplifier enable signal PR, to amplify data on the global I/O bus GIO4 for transmission to the internal read/write bus RWBS. The write driver WDRd is activated when both of the block address signal BAd and the internal write instruction signal Wi are in active states, to amplify data on the internal read/write bus RWBS for transmission onto the global I/O bus GIO4.

The input/output buffer includes an output buffer OBF which is activated in response to a read instruction signal R to amplify the data on the internal read/write bus RWBS and transmit the same to a data output terminal DQ, and an input buffer IBF which is activated upon activation of a write instruction signal W to amplify data on the data input/output terminal DQ for transmission onto the internal read/write bus RWBS.

According to the structure shown in FIGS. 13 and 14, 4-bit memory cell data can be transmitted from one array block to another array block in accordance with the operation waveform diagram shown in FIG. 5, when the write drivers WDRa to WDRd included in the read/write driver RWDR are not employed in data transfer. When the write drivers are employed in data transfer, on the other hand, memory cell data of one bit among four bits can be transferred to a transfer destination array block without rewriting original data, by inactivating a column selection signal in the transfer source array block. Selection of one bit from four bits is achieved by decoding column address of two least significant bits, for example. Since four bit line pairs are simultaneously selected in one array block, one pair is selected from the four bit line pairs which are selected at the same time. In this case, data transfer is performed in accordance with the operation waveforms shown in FIG. 4. Data transfer can be performed in parallel with data reading, by avoiding simultaneous selection of the column selection signals CSA and CSB.

[Array Modification 2]

Figure 15:
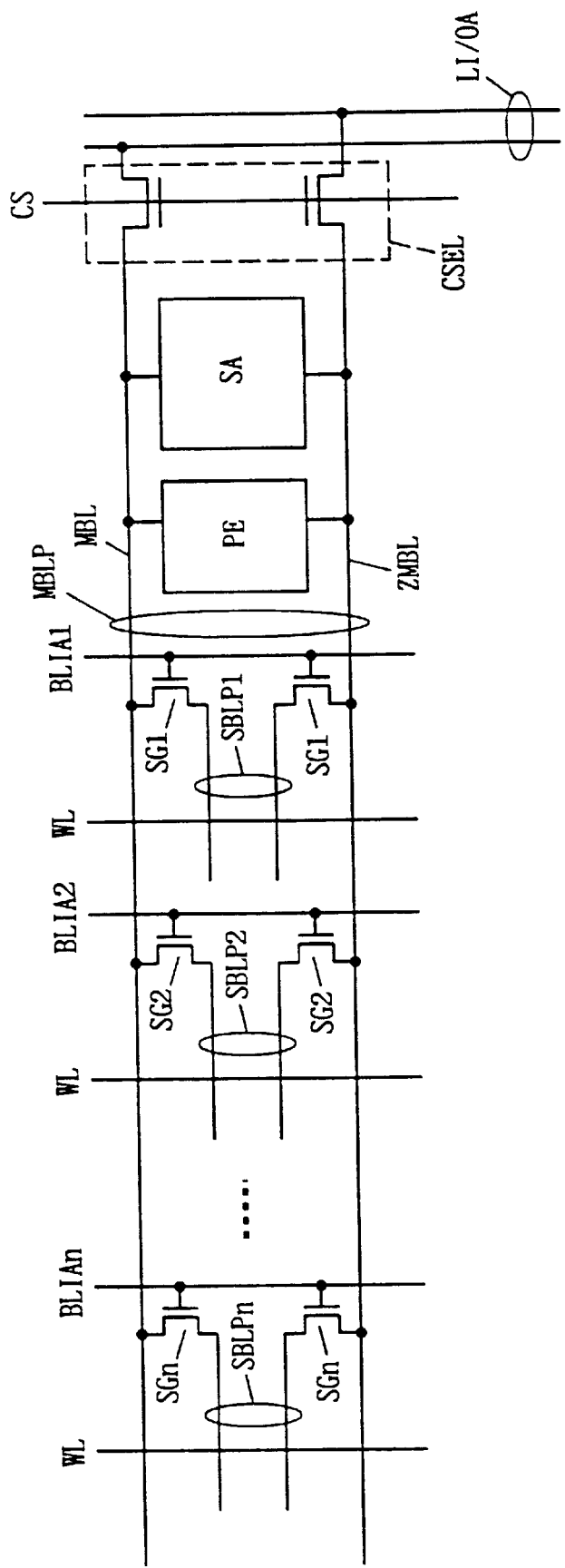
FIG. 15 illustrates the structure of a portion related to one column of an array block according to a second modification of the semiconductor memory device according to the first embodiment of the present invention.

FIG. 15 illustrates a second modification of the semiconductor memory device according to the first embodiment of the present invention. This FIG. 15 shows only the structure of a part related to memory cells of one column of one array block. In the structure shown in FIG. 15, bit lines are in a hierarchical structure of main bit lines and subbit lines. Namely, a plurality of subbit line pairs SLBP1 to SBLPn are arranged with respect to a main bit line pair MBLP consisting of main bit lines MBL and ZMBL. The subbit line pair SBLP1 is connected to the main bit line pair MBLP through a selection gate SG1 which conducts in response to a bit line isolation signal BILA1. The subbit line pair SBLP2 is connected to the main bit line pair MBLP through a selection gate SG2 which conducts in response to a bit line isolation signal BLIA2. The subbit line pair SBLPn is connected to the main bit line pair MBLP through a selection gate SGn which conducts in response to a bit line isolation signal BLIAn. A sense amplifier SA and a precharge/equalize circuit PE are arranged for the main bit line pair MBLP. This main bit line pair MBLP is connected to a local I/O bus LI/OA through a column selection gate CSEL. Memory cells (not shown) are arranged at crossings between the respective subbit line pairs SBLP1 to SBLPn and word lines. No memory cell is directly connected to the main bit line pair MBLP. Thus, parasitic capacitances of the memory cells are not connected to the main bit line pair MBLP, whereby the parasitic capacitance of the main bit line pair MBLP can be reduced.

In operation, only a subbit line pair SBLPi (i=one of 1 to n) crossing a selected word line is connected to the main bit line pair MBLP. Also in a semiconductor memory device of the hierarchical bit line structure shown in FIG. 15, data can be transferred from one array block to another array block, similarly to the aforementioned embodiment. The bit line isolation signal BLIA in the aforementioned embodiment may be utilized as a signal connecting the subbit line pair with the main bit line pair.

According to the first embodiment of the present invention, as hereinabove described, the array blocks are rendered drivable independently of each other while the external control signal and the address signal are incorporated in synchronization with the clock signal, whereby the data can be transferred between the array block at a high speed, with no complicated timing control.

[Embodiment 2]

Figure 16:
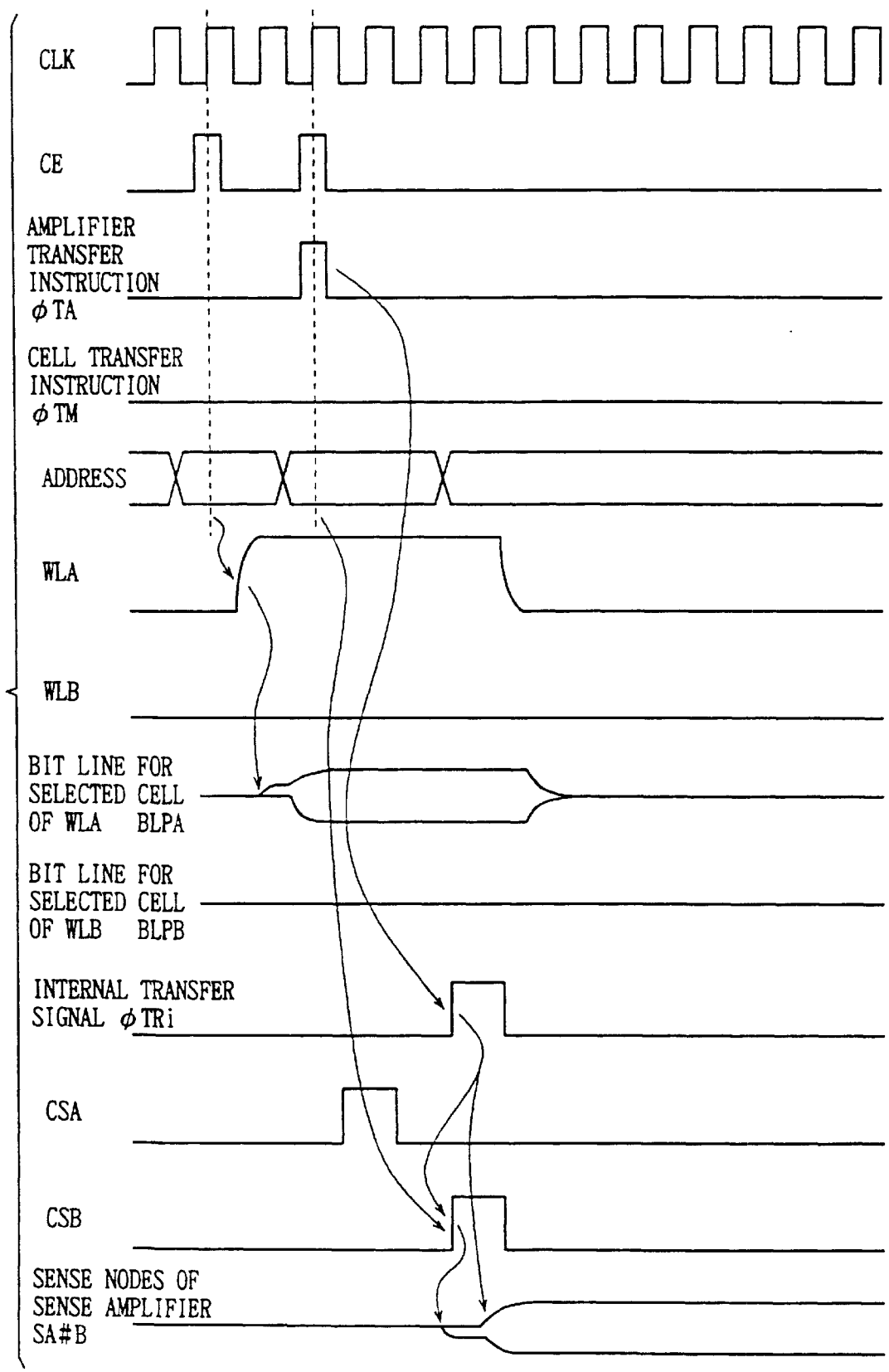
FIG. 16 illustrates signal waveforms representing operations of a semiconductor memory device according to a second embodiment of the present invention.

FIG. 16 is a signal waveform diagram representing operations of a semiconductor memory device according to a second embodiment of the present invention. The operations of the semiconductor memory device according to the second embodiment of the present invention and a structure for implementing the operations are now described in order.

According to the second embodiment of the present invention, two instructions, i.e., an amplifier transfer instruction φTA and a cell transfer instruction φTM, are employed. The amplifier transfer instruction φTA instructs transfer of data of a memory cell of one array block to a sense amplifier of another array block to be latched therein. The cell transfer instruction φTM instructs transfer of data of a memory cell of one array block to a memory cell of another array block to be written therein. When the amplifier transfer instruction φTA is employed, no data writing is performed in the memory cell of the transfer destination array block but only latching by the sense amplifier is carried out. Thus, it is possible to utilize the sense amplifier as a cache by regularly activating the same, and to save memory cell data of one array block in a sense amplifier of another array block. Data of a certain memory cell is processed in the exterior and the processed data is written in the original memory cell, while unprocessed data is held in a sense amplifier of another array block. The unprocessed data can be taken out when necessary, so that an operation such as addition or multiplication can be continuously carried out using the same coefficient data in arithmetic processing, for example.

Referring to FIG. 16, a chip enable signal CE is brought to a high level of an active state at the rising edge of a clock signal CLK. In this state, both of the amplifier transfer instruction φTA and the cell transfer instruction φTM are at low levels of inactive states. At this time, an ordinary access operation is performed so that an address signal supplied at the rising edge of the clock signal CLK is incorporated and a row and a column are selected in the addressed array block. Namely, an addressed word line WLA is selected in an array block MB#A, and the potential of the selected word line WLA is increased. In response to this, data of a memory cell connected with the selected word line WLA is transmitted to a corresponding bit line pair BLPA, to change the potential of the selected word line WLA. Then, the chip enable signal CE is again brought to a high level of an active state at the rising edge of the clock signal CLK at an appropriate interval. At this time, the amplifier transfer instruction φTA is also brought to a high level of an active state. Upon activation of the amplifier transfer instruction φTA, a part of a currently incorporated address signal designating a row address is ignored so that no word line is selected in any array block. Only a block address signal and a column address signal are utilized.

In the array block MB#A, on the other hand, a column selection signal is brought to a high level of an active state in accordance with a result of decoding of the column address signal similarly to the ordinary operation, so that data of a corresponding memory cell is transmitted onto a global I/O line. Thereafter an internal transfer signal φTRi is brought into an active state of a high level at a prescribed timing (after activation of the column selection signal CSA) in response to activation of the amplifier transfer instruction φTA. In response to the internal transfer signal φTRi, a Y decoder is activated in a transfer destination array block MB#B so that the data read on the global I/O line GI/O from the array block MB#A is transmitted to sense nodes of a sense amplifier SA#B to change the potential of these sense nodes. At this time, the sense amplifier SA#B is not yet activated. Thus, the sense node potential of the sense amplifier SA#B is readily changed in accordance with the potential on the global I/O line. Then, the sense amplifier SA#B of the transfer destination array block MB#B is activated after a lapse of a prescribed period from the activation of the internal transfer signal φTRi, so that potential difference (transfer data) appearing on the sense nodes is amplified and latched. Through the aforementioned series of operations, the memory cell data of the array block MA#A is latched by the sense nodes of the sense amplifier SA#B of the other array block MA#B.

Figure 17:
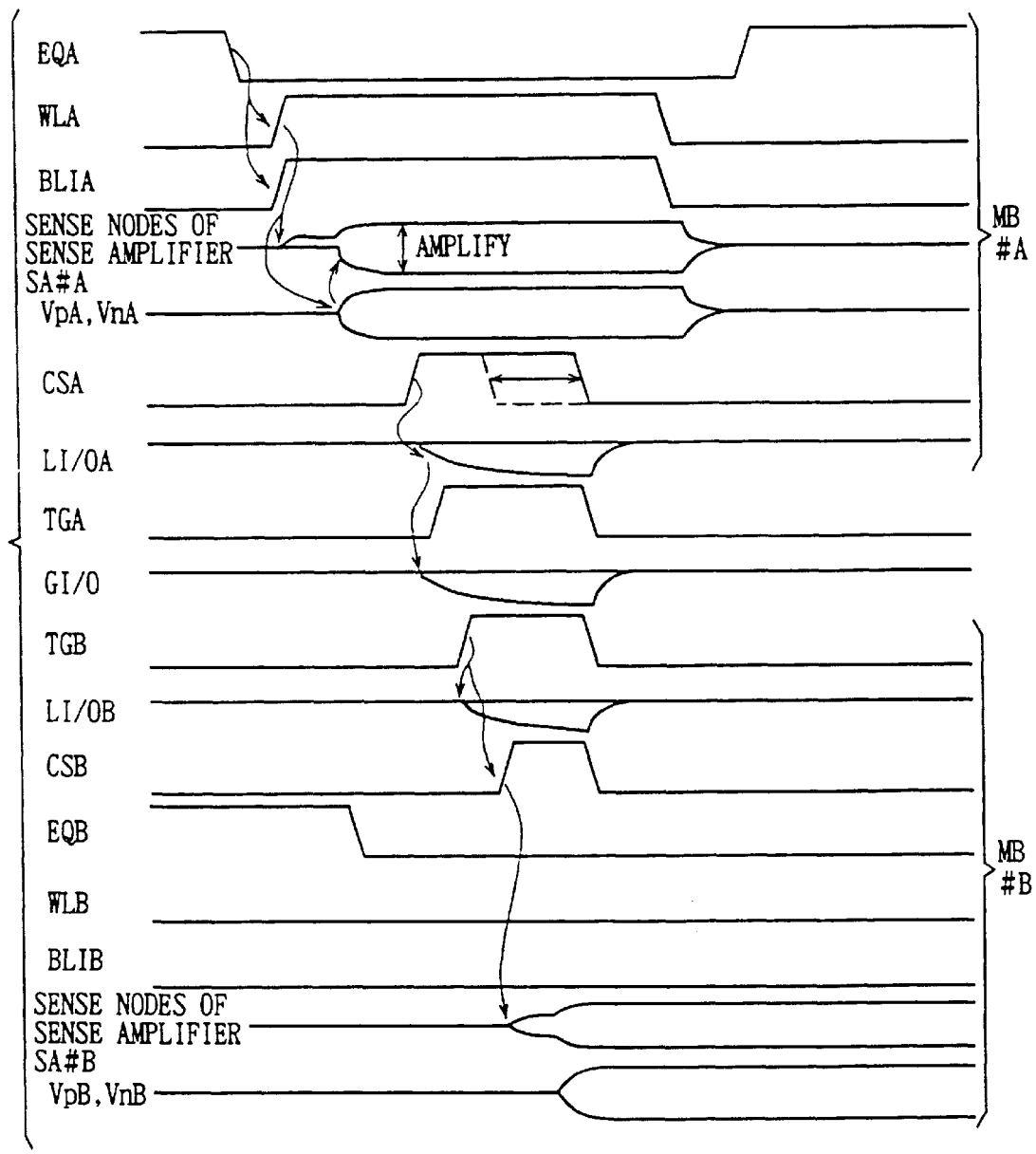
FIG. 17 illustrates signal waveforms representing internal operations of the semiconductor memory device according to the second embodiment of the present invention in more detail.

FIG. 17 is a waveform diagram showing internal signals in an amplifier transfer operation. With reference to FIG. 17, the internal operations of arrays are now described in more detail.

When the chip enable signal CE is first activated as shown in FIG. 16, a memory cell selecting operation is executed in the array block MB#A. Namely, an equalization signal EQA is brought to a low level of an inactive state, and the word line WLA is then selected to have its potential increased. At this time, a bit line isolation signal BLIA is also brought to a high level, so that the data of the selected memory cell is transmitted to sense nodes of a sense amplifier SA#A. When the potential difference of the sense nodes of the sense amplifier SA#A is sufficiently enlarged, sense amplifier activation signals Vpa and VnA are activated so that the potential of the sense nodes of the sense amplifier SA#A is differentially amplified. Thereafter the column selection signal CSA from a Y decoder is brought to a high level, so that the potential of the sense nodes of the sense amplifier SA#A is transmitted onto a local I/O bus LI/OA. Then, a block selection gate BSELA conducts in accordance with a block selection signal TGA, so that the potential on the local I/O bus LI/OA is transmitted onto the global I/O bus GI/O.

In the array block MB#B, an equalization signal EQB is inactivated in parallel with a memory cell selecting operation and a data read operation of this array block MB#A. At this time, by the amplifier transfer instruction φTA, no word line selection is performed and a bit line isolation signal BLIB maintains a low level of an inactive state. When a prescribed period elapses after supply of the amplifier transfer instruction φTA, a column selection signal CSB and a block selection signal TGB are brought into active states of high levels for prescribed periods in response to the internal transfer signal φTRi, so that the data transmitted onto the global I/O bus is transmitted to the sense nodes of the sense amplifier SA#B to change the sense node potential. At this time, the bit line isolation signal BLIB maintains an inactive state of a low level, a parasitic capacitance of each of the sense nodes of the sense amplifier SA#B is small, and the potential of the sense nodes is readily changed in accordance with that on the global I/O bus. When the sense node potential of the sense amplifier SA#B is changed and the potential difference is sufficiently enlarged, sense amplifier activation signals VpB and VnB are activated, so that the potential of the sense nodes of the sense amplifier SA#B is amplified and latched by the activated sense amplifier SA#B. Thereafter this state is maintained.

Figure 18:
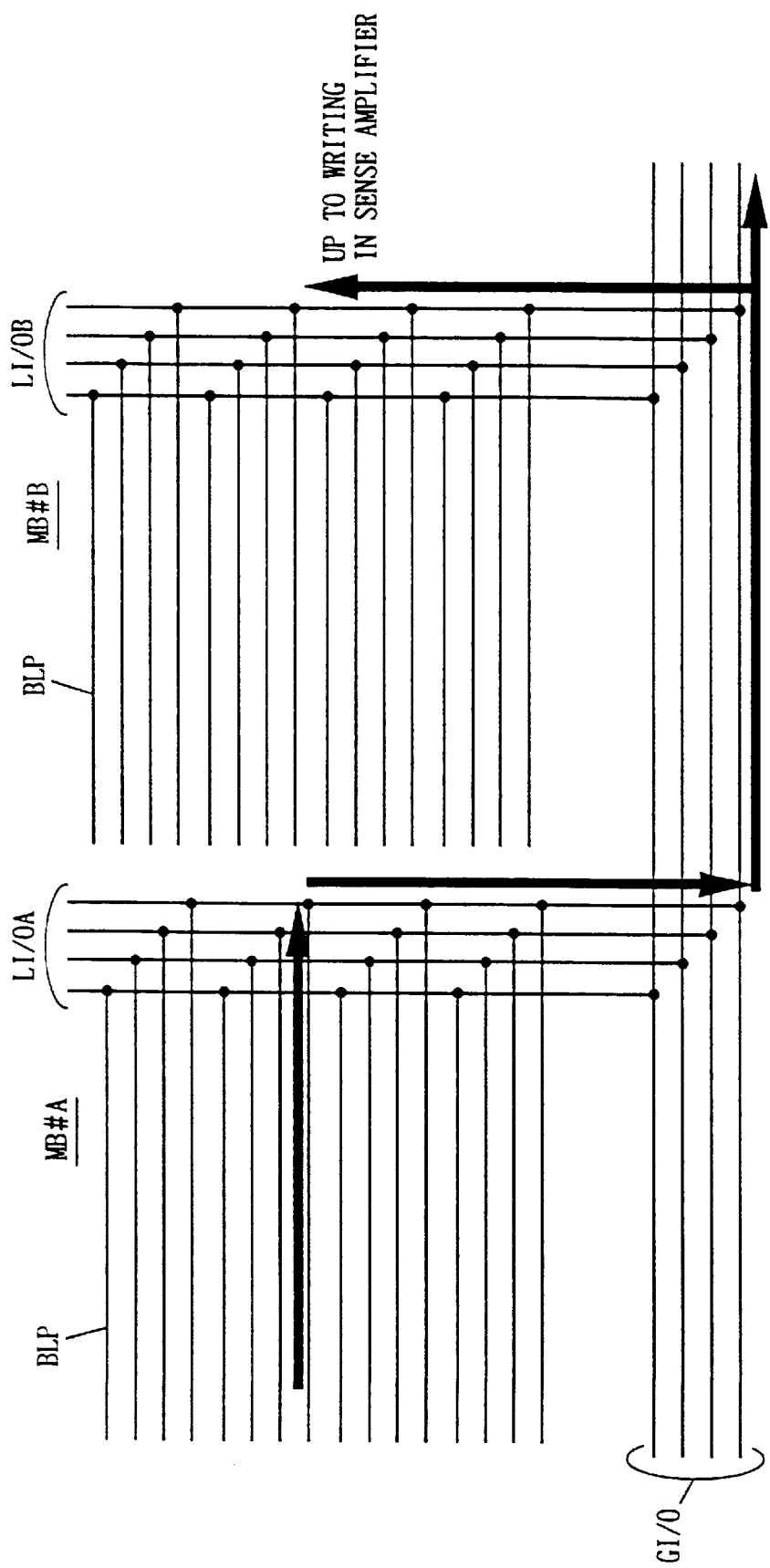
FIG. 18 illustrates a data transfer operation of the semiconductor memory device according to the second embodiment of the present invention.

FIG. 18 representatively illustrates a memory cell data transmission path in the amplifier transfer operation. In the structure of the semiconductor memory device shown in FIG. 18, all of the local I/O buses LI/OA and LI/OB and the global I/O bus GI/O have 4-bit widths, for example. 4-bit memory cell data simultaneously selected in the array block MB#A are transferred and read to the exterior through the global I/O bus GI/O (only 1 bit or 4-bit data may be read), while they are simultaneously transferred to and latched in the sense amplifier of the array block MB#B through the local I/O bus LI/OB of the array block MB#B. In the structure shown in FIG. 18, only 1-bit data may be transferred to the sense amplifier of the array block MB#B, similarly to the structure shown in FIG. 14.

Figure 19:
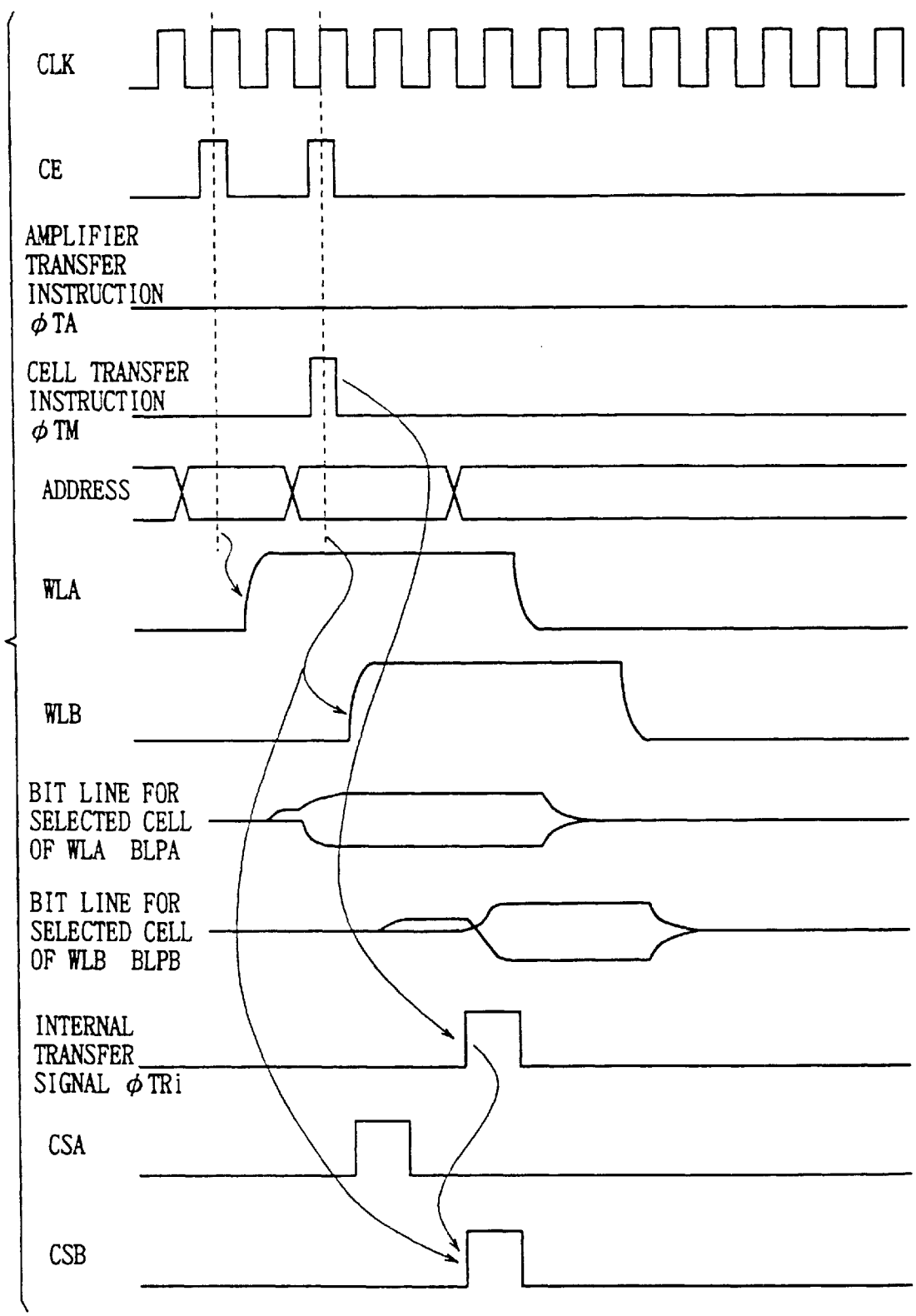
FIG. 19 is a signal waveform diagram representing operations of the semiconductor memory device according to the second embodiment of the present invention.

FIG. 19 is a signal waveform diagram representing operations in cell transfer. Upon activation of the cell transfer instruction φTM, a word line is selected in a transfer destination array block. At this time, all of row, column and block address signals are utilized, as for an address signal which is supplied in synchronization with the chip enable signal CE activated at the rising edge of the clock signal CLK. In this case, word line selection and memory cell selection are already executed in the array block MB#A in accordance with the previously supplied chip enable signal CE and the address signal supplied simultaneously therewith, similarly to the previous amplifier transfer operation.

Upon activation of the cell transfer instruction φTM, a word line WLB is first selected in the transfer destination array block MB#B, so that the potential of the selected word line WLB rises. At this time, the bit line isolation signal BLIB is also brought into an active state of a high level as described later, so that data of a memory cell connected with the selected word line WLB will be amplified by the sense amplifier. The column selection signal CSA rises to a high level in the array block MB#A so that the selected memory cell data is transferred to the global I/O bus GI/O, and thereafter the array block MB#B carries out a column selecting operation in response to activation of the internal transfer signal φTRi, so that the column selection signal CSB for the selected column goes high and the global I/O bus GI/O is connected to the sense amplifier SA#B of the array block MB#B.

Since the sense amplifier SA#B is not yet activated, the potential of its sense nodes (potential of a bit line pair BLPB) is readily changed in accordance with that on the global I/O bus GI/O even if the selected memory cell data of the array block MB#A is transmitted. After the potential of the sense nodes of the sense amplifier SA#B is sufficiently changed, a sense amplifier activation signal (not shown in FIG. 19) is activated so that the sense amplifier SA#B performs a sensing operation for detecting and amplifying the memory cell data transmitted from the global I/O bus GI/O for writing into the selected memory cell. Through the series of operations, the selected memory cell data of the array block MB#A is written in the memory cell of the array block MB#B.

Figure 20:
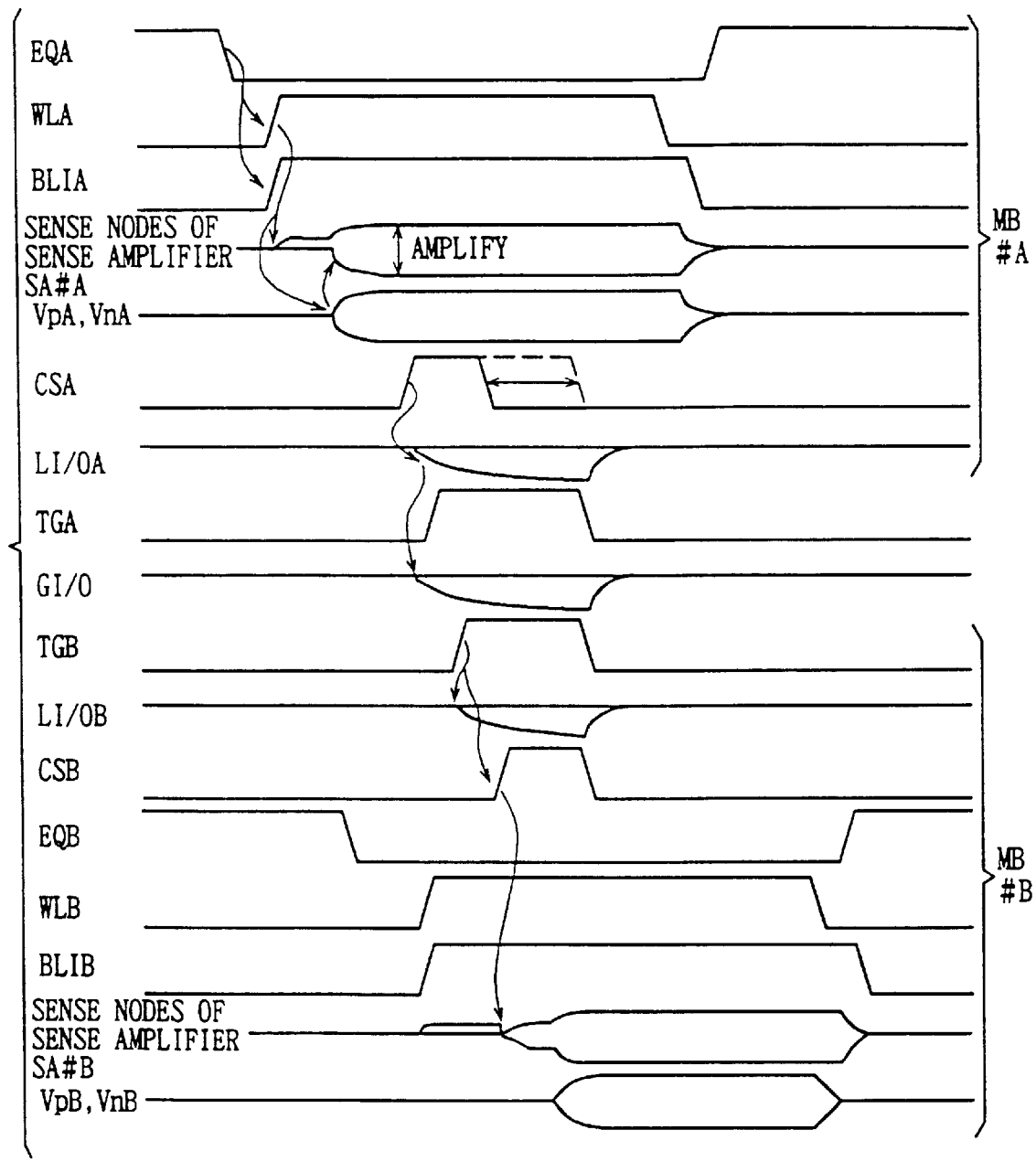
FIG. 20 is a signal waveform diagram representing the operations of the second embodiment of the present invention in more detail.

FIG. 20 illustrates internal signal waveforms in the cell transfer operation. In the array block MB#A, the selected word line WLA and the bit line isolation signal BLIA rise to high levels after rise of the equalization signal EQA, so that data of the memory cell connected with the selected word line WLA is transmitted to the sense nodes of the sense amplifier SA#A. Then, the sense amplifier activation signals VpA and VnA are activated at prescribed timings, and then the column selection signal CSA is brought to a high level, so that the potential of the sense nodes of the sense amplifier SA#A is transmitted to the local I/O bus LI/OA. Thereafter the block selection signal TGA is brought to a high level, so that the data on the local I/O bus LI/OA is transmitted onto the global I/O bus GI/O.

In parallel with the sensing and amplification and transmission of the memory cell data in the array block MB#A to the global I/O bus GI/O, on the other hand, the array block MB#B similarly performs a memory cell selecting operation. Namely, the word line WLB and the bit line isolation signal BLIB rise to high levels after the equalization signal EQB is brought to a low level, so that the data of the selected memory cell is transmitted to the sense nodes of the sense amplifier SA#B. Thereafter the block selection signal TGB and the column selection signal CSB are brought to high levels in accordance with activation of the internal transfer signal, so that the data on the global I/O bus GI/O is transmitted to the sense nodes of the sense amplifier SA#B through the local I/O bus LI/OB. The sense amplifier SA#B is not yet activated at this time, whereby the sense node potential of the sense amplifier SA#B is changed in accordance with the data transmitted from the global I/O bus GI/O. Thereafter the sense amplifier activation signals VpB and VnB are activated, so that the data of the selected memory cell is written in the selected memory cell of the array block MB#B. Then, the potential of the selected word line WLB rises, the equalization signal EQB is brought to a high level, the potential of the bit line pair and the sense nodes of the sense amplifier SA#B are equalized, and thereafter the bit line isolation signal BLIB is brought to a low level.

While the column selection signal CSA is activated at a timing which is not overlapped with the activation of column selection signal CSB of the array block MB#B in FIG. 20, alternatively they may be made active at timings at which their active states are overlapped with each other, as shown by broken lines in FIG. 20.

Figure 21:
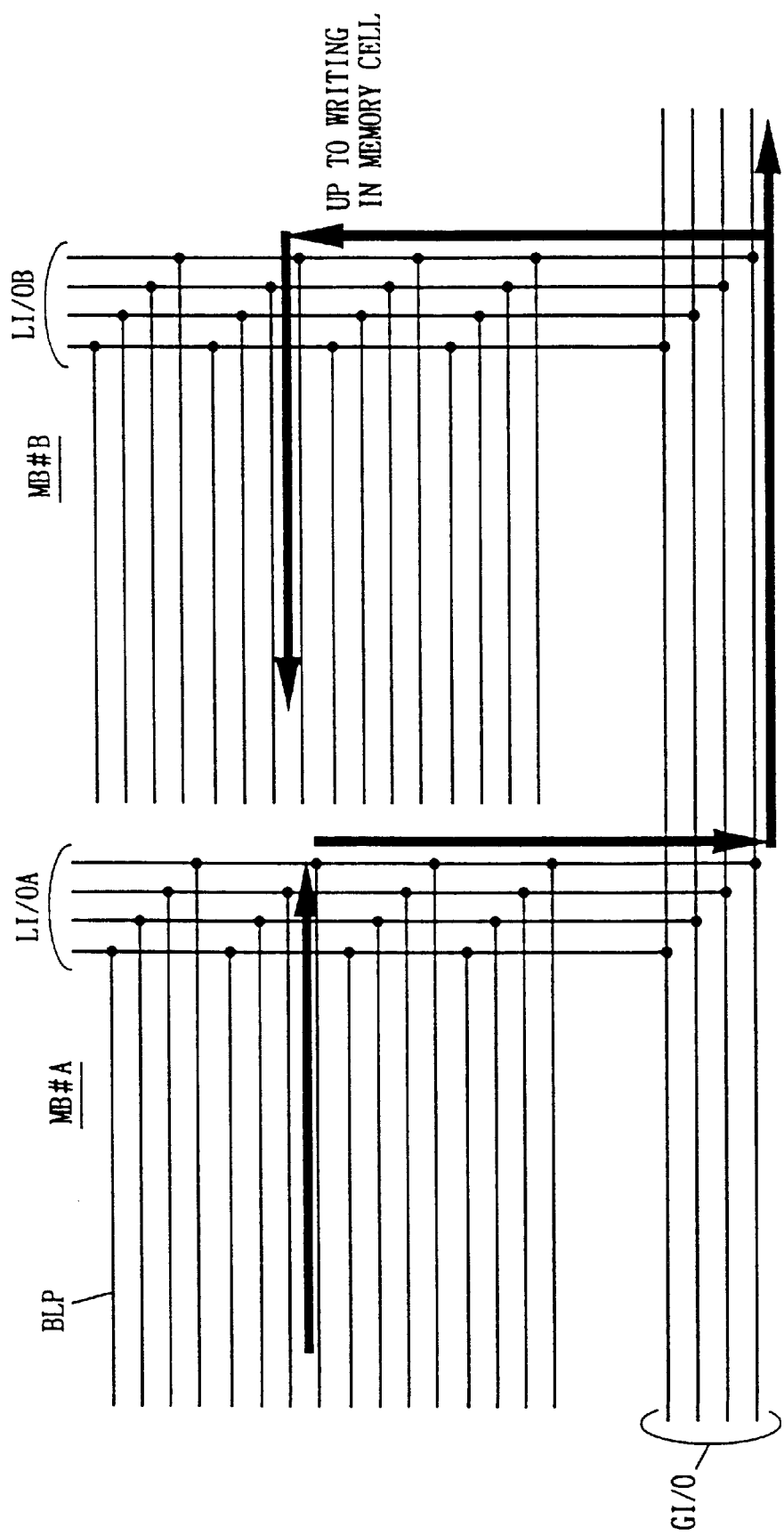
FIG. 21 illustrates a data transfer operation of the semiconductor memory device according to the second embodiment of the present invention.

Due to the aforementioned series of operations, data of the memory cell selected in the array block MB#A is transmitted to and written in the memory cell of the array block MB#B through the local I/O bus LI/OA, the global I/O bus GI/O and the local I/O bus LI/OB, as shown in FIG. 21. Referring to FIG. 21, 4-bit memory cells are simultaneously selected in one array block, as an example. In this case, 4-bit memory cell data may be transmitted from the array block MB#A to the array block MB#B.

Figure 22:
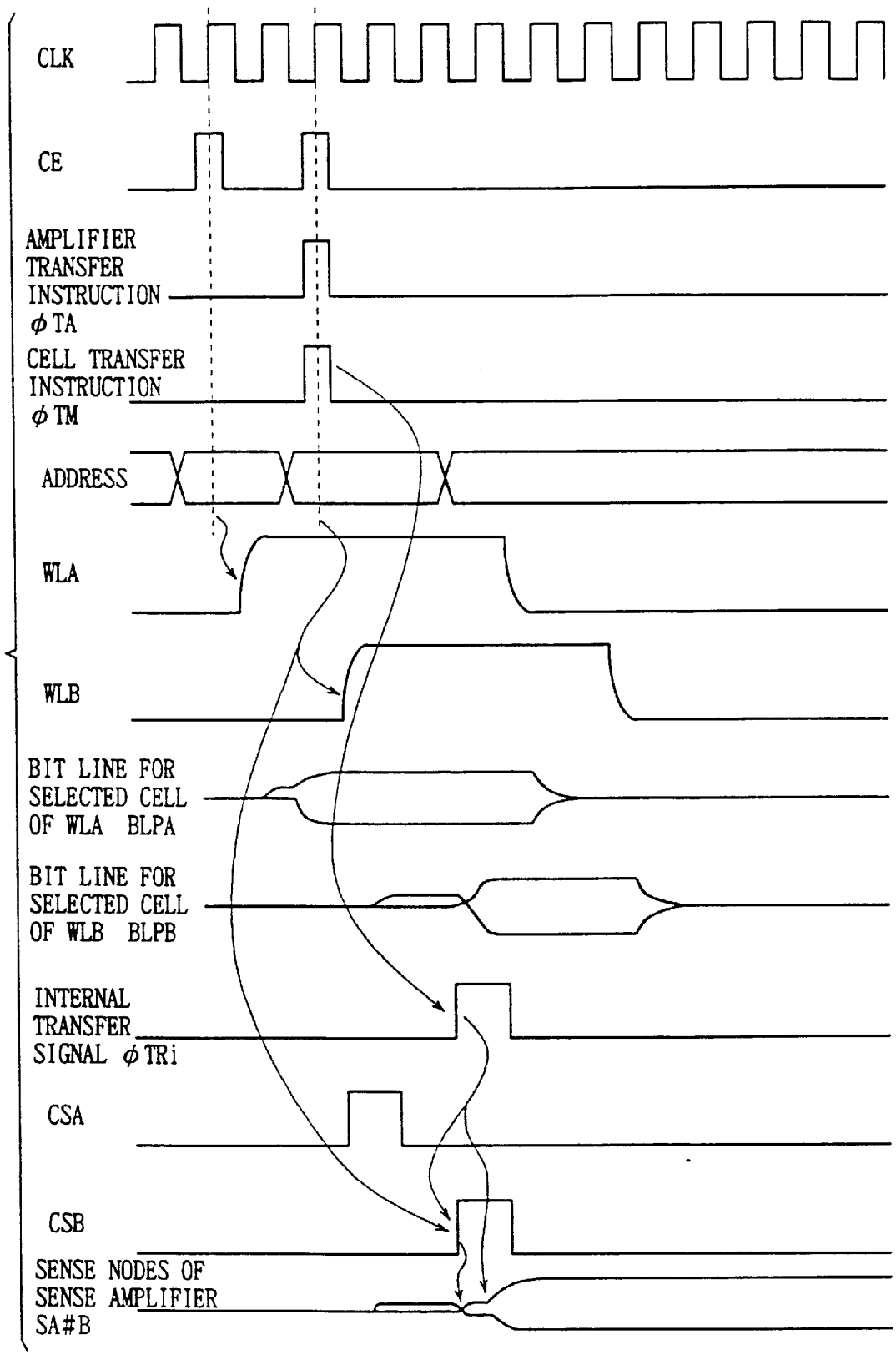
FIG. 22 is a signal waveform diagram representing operations of the semiconductor memory device according to the second embodiment of the present invention.

FIG. 22 shows other operation waveforms of the second embodiment of the present invention. Referring to FIG. 22, both of the amplifier transfer instruction φTA and the cell transfer instruction φTM are activated. In this state, the data of the memory cell selected in the array block MB#A is written in the memory cell of the array block MB#B and sustainingly latched in the sense amplifier. Namely, the aforementioned amplifier transfer and cell transfer operations are executed in combination.

[Operation of Rewriting Data held in Sense Amplifier]

Figure 23:
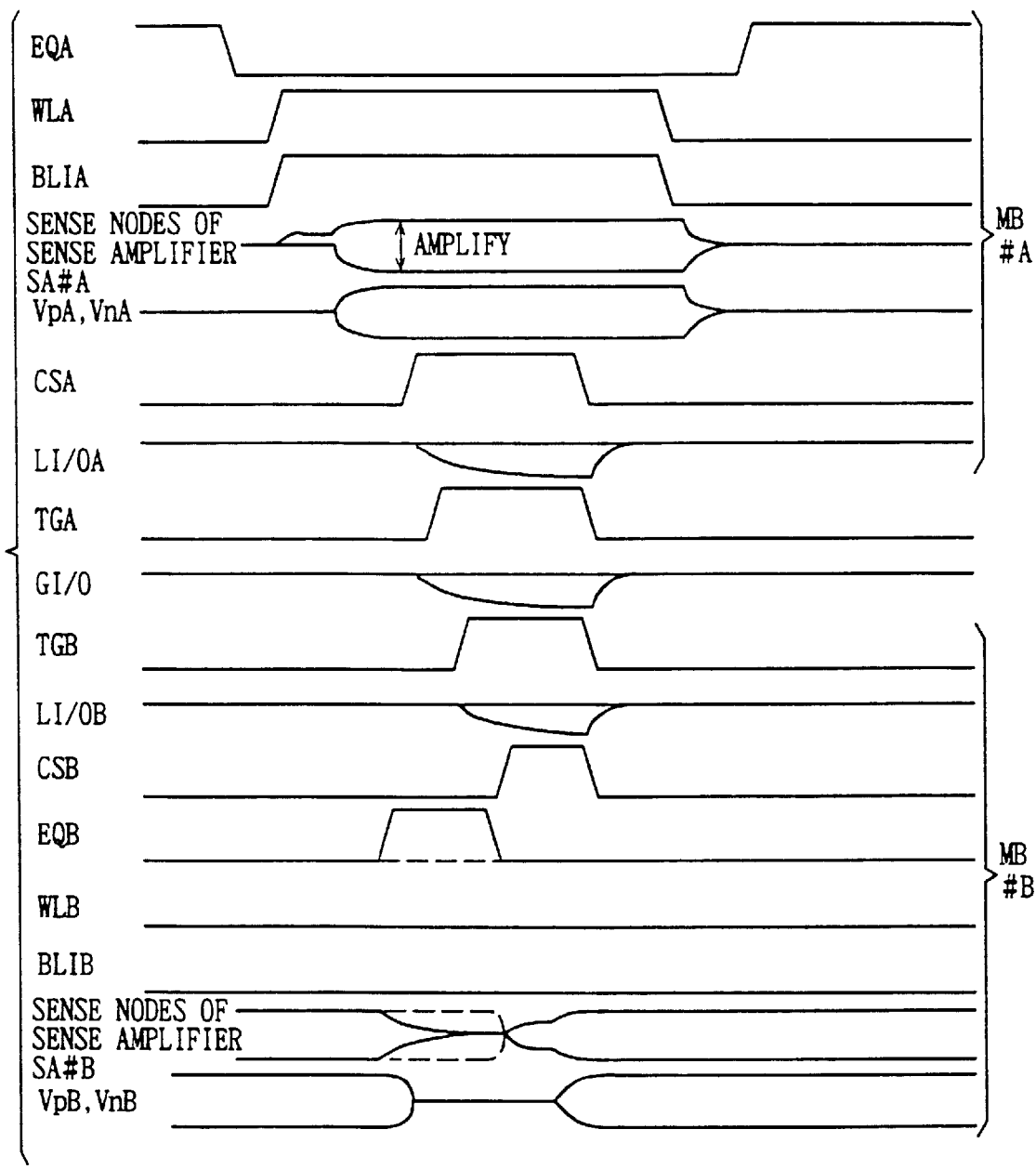
FIG. 23 is a waveform diagram of internal signals representing the operations of the semiconductor memory device according to the second embodiment of the present invention in more detail.

FIG. 23 is a signal waveform diagram representing an operation for rewriting a held data by a sense transfer operation. Referring to FIG. 23, the sense amplifier holds data transferred by the sense transfer operation in the array block MB#B. In this state, data is transferred to the same address position of the array block MB#B again from the array block MB#A or another array block. In this case, the array block MB#A selects the word line WLA and activates the bit line isolation signal BLIA similarly to the aforementioned operation, and then the sense amplifier SA#A senses and amplifies the data so that the sensed and amplified data is transmitted to the local I/O bus LI/OA and the global I/O bus GI/O. When a sense transfer instruction is activated and the current transfer destination address is identical to a previously supplied transfer target (destination) address, the sense amplifier activation signals VpB and VnB are inactivated and the equalization signal EQB is activated in the array block MB#B, so that the sense nodes of the sense amplifier SA#B are equalized. Then, the equalization signal EQB is inactivated and thereafter the column selection signal CSB and the block selection signal TGB are brought to high levels, so that the data on the global I/O bus GI/O is transmitted to the sense nodes of the sense amplifier SA#B. Thereafter the sense amplifier activation signals VpB and VnB are activated so that the data transmitted from the global I/O bus GI/O is amplified and latched at the sense nodes of the sense amplifier SA#B.

Alternatively, the equalization signal EQB of the array block MB#B may be maintained at a low level of an inactive state while the sense amplifier activation signals VpB and VnB are brought into inactive states for a prescribed period in the sense transfer operation, as shown in broken lines in FIG. 23. In this case, the sense nodes of the sense amplifier SA#B are brought into an electrically floating state at a potential corresponding to the data held therein. When the global I/O bus GI/O is connected with the sense node of the sense amplifier SA#B in this state, the potential of this sense nodes is changed in response to the signal potential from the global I/O bus GI/O. The capacitance of each of the sense nodes of the sense amplifier SA#B is sufficiently small as compared with that of the global I/O bus, whereby this sense nodes are sufficiently charged and discharged in accordance with data signals (charges) from the global I/O bus GI/O so that the potential thereat can be changed.

When a cell transfer operation of writing data in the memory cell is also performed in the operation waveform diagram shown in FIG. 23, the word line WLB and the bit line isolation signal BLIB are brought to high levels of active states after inactivation of the equalization signal EQB and before activation of the sense amplifier SA#B.

[Control Circuit]

Figure 24:
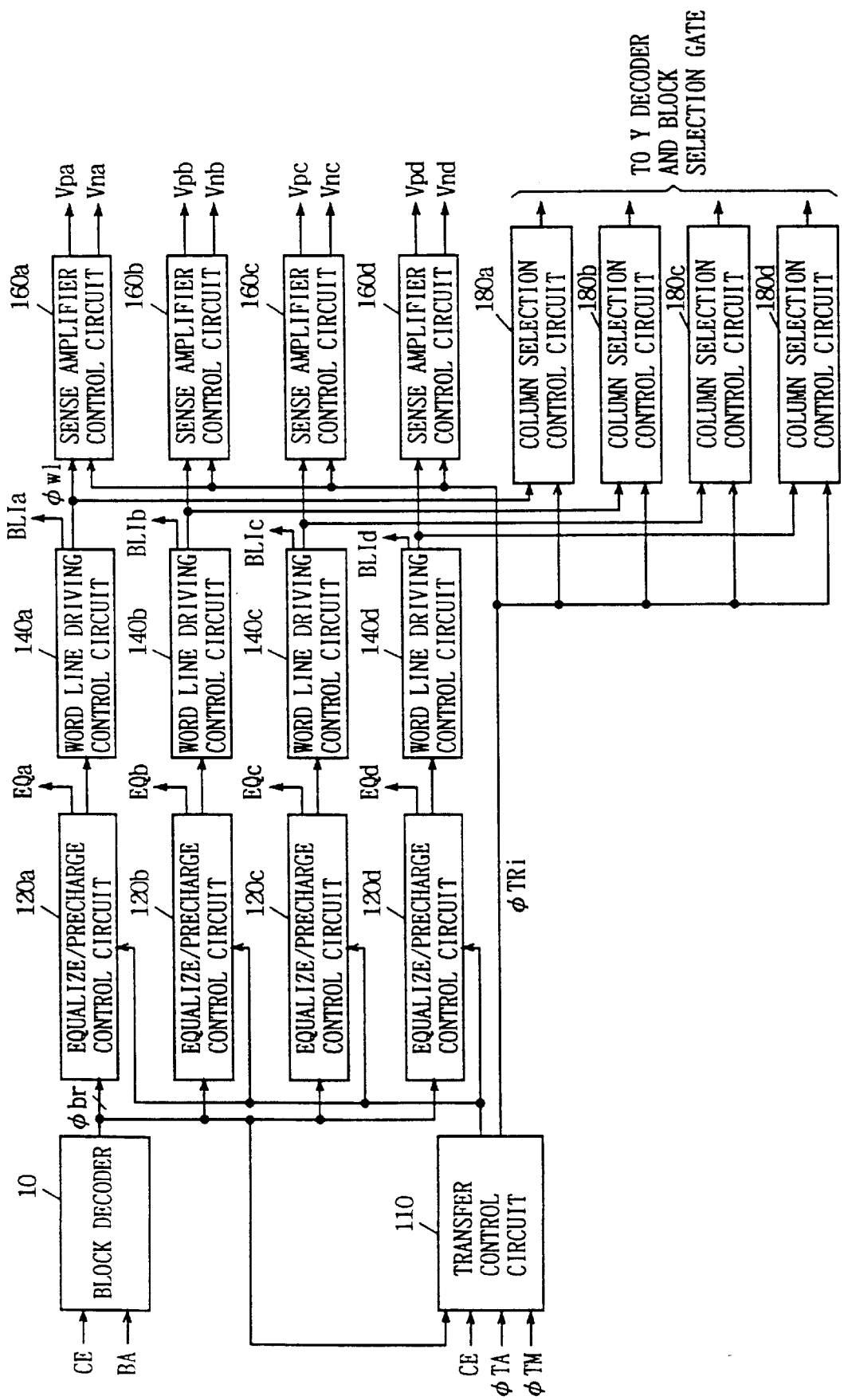
FIG. 24 illustrates the structure of a control part for implementing the second embodiment of the present invention.

FIG. 24 is a block diagram schematically showing the structure of an array activation control part of the semiconductor memory device according to the second embodiment of the present invention. The overall structure of the semiconductor memory device according to the second embodiment is identical to the structure shown in FIG. 1.

Referring to FIG. 24, the array activation control part includes a block decoder 10 which is activated upon activation of the internal chip enable signal CE, decodes an internal block address signal BA and outputs a block activation signal φbr for activating an addressed array block. This block activation signal φbr (φbra-φbrd) is generated for each array block. Only an array block of an activated block activation signal φbr (any of φbra to φbrd) is activated.

The array activation control part further includes a transfer control circuit 110 which receives the block activation signal φbr from the block decoder 10, the internal chip enable signal CE, a sense amplifier transfer instruction signal (amplifier transfer instruction) φTA and a memory cell transfer instruction signal (cell transfer instruction) φTM for outputting the internal transfer instruction signal φTRi at a prescribed timing and generating signals for controlling equalize/precharge operations of equalize/precharge control circuits 120a to 120d. The equalize/precharge control circuits 120a to 120d are provided to array blocks MAa to MAd respectively, and execute equalization/precharge operations of the corresponding array blocks when activated. The array activation control part further includes word line driving control circuits 140a to 140d, sense amplifier control circuits 160a to 160d and column selection control circuits 180a to 180d, which are provided to the array blocks MAa to MAd respectively. While functions of these circuit parts themselves are identical to those described with reference to the embodiment 1, the internal structures thereof are different since they receive the transfer instruction signal φTRi. These structures will be described later.

Specific structures of the respective parts are now described.

The block decoder 10, which is identical in structure to that shown in FIG. 7A, is activated in accordance with the internal chip enable signal CE generated in synchronization with rise of the clock signal CLK for decoding the currently supplied block address signal BA and outputting the block activation signal φbr (φbra to φbrd) for the addressed array block.

Figure 25:
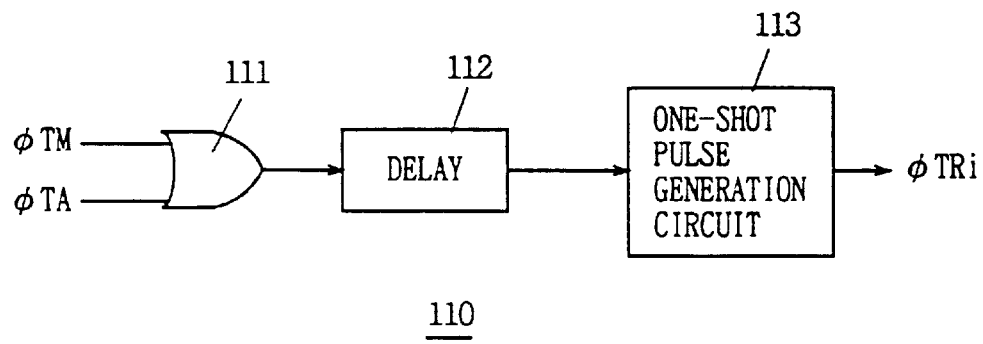
FIG. 25 schematically illustrates the structure of a transfer control circuit shown in FIG. 24.

FIG. 25 schematically illustrates the structure of the transfer control circuit 110 shown in FIG. 24. This figure shows the structure of a part of the transfer control circuit 110 generating the internal transfer instruction signal. The structures of the remaining parts (parts controlling the sense amplifier control circuits 160a to 160d and the equalization/precharge control circuits 120a to 120d) are described later in combination with those of the respective parts.

Referring to FIG. 25, the transfer control circuit 110 includes an OR gate 111 which receives the sense amplifier transfer instruction signal φTA and the memory cell transfer instruction signal φTM, a delay circuit 112 which delays an output signal of the OR gate 111 by a prescribed time, and a one-shot pulse generation circuit 113 which generates a one-shot pulse having a prescribed time width in response to rise of an output signal of the delay circuit 112. This one-shot pulse generation circuit 113 may be implemented by the aforementioned structure of a flip-flop and a delay circuit.

In the transfer control circuit 110 shown in FIG. 25, the one-shot pulse generation circuit 113 generates a one-shot pulse signal φTRi instructing data transfer at a prescribed timing, when at least one of the transfer instruction signals φTA and φTM is brought into an active state of a high level.

[Structures of Equalization/Precharge Control Circuit and Word Line Driving Control Circuit]

Figure 26:
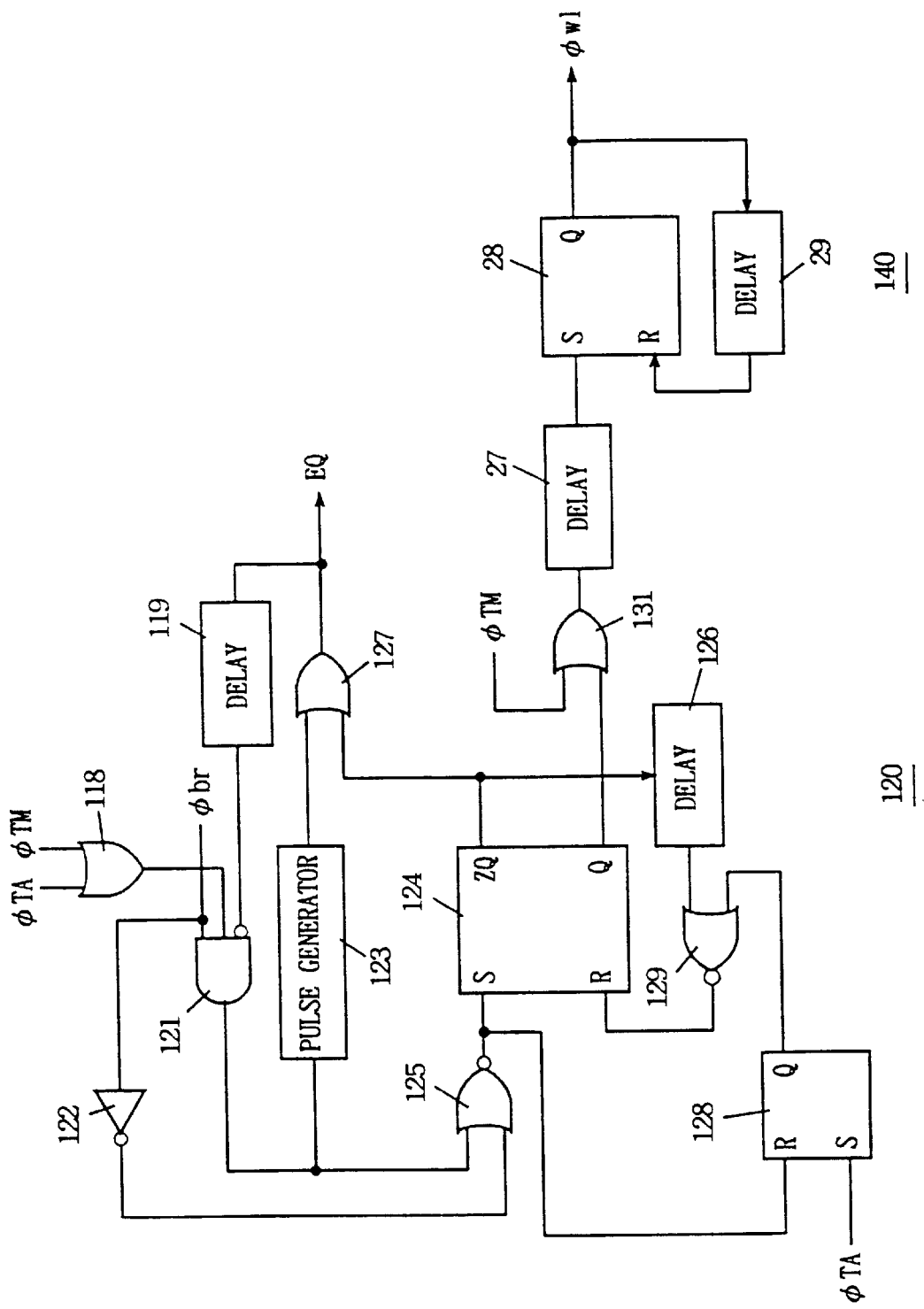
FIG. 26 illustrates the structure of an equalize/precharge control circuit shown in FIG. 24.

FIG. 26 illustrates the structures of the equalize/precharge control circuit 120 (120a to 120d) and the word line driving control circuit 140 (140a to 140d) of the semiconductor memory device according to the second embodiment of the present invention. Referring to FIG. 26, the word line driving control circuit 140 is identical in structure to that shown in FIG. 8A, and corresponding portions are denoted by the same reference numerals.

The equalize/precharge circuit 120 includes an OR gate 118 (corresponding to the OR gate 111) which receives the signals φTA and φTM, a delay circuit 119 which delays the equalization signal EQ (EQa to EQd) for a prescribed time, a gate circuit 121 which receives an output signal of the delay circuit 119 at its false input and receives the block activation signal φbr and an output signal of the OR gate 118 at its true inputs, a pulse generation circuit 123 generating a pulse signal which in turn goes high for a prescribed period when an output signal of the gate circuit 121 is at a high level, an inverter 122 which inverts the block activation signal φbr, a NOR gate 125 which receives output signals of the gate circuit 121 and the inverter 122, and a reset preferential type set/reset flip-flop 124 which is set in response to rise of an output signal of the NOR gate 125.

The equalize/precharge control circuit 120 further includes an OR circuit 127 which receives an output signal from a complementary output ZQ of the flip-flop 124 and an output signal from the pulse generation circuit 123, a delay circuit 126 which delays the output signal from the complementary output ZQ of the flip-flop 124 for a prescribed time, a set/reset flip-flop 128 which is reset in response to an output signal of the NOR circuit 125 and set in response to the sense amplifier transfer instruction signal φTA, and a NOR circuit 129 which receives an output signal from a true output Q of the flip-flop 128 and an output signal of the delay circuit 126. An output signal of the NOR circuit 129 is supplied to a reset input R of the flip-flop 124. A signal from a Q output of the flip-flop 124 is supplied to a delay circuit 27 through an OR circuit 131 which receives the signal φTM at its one input. The operations of the equalize/precharge circuit 120 are now described with reference to FIGS. 27A and 27B, which are operation waveform diagrams thereof.

Figure 27A:
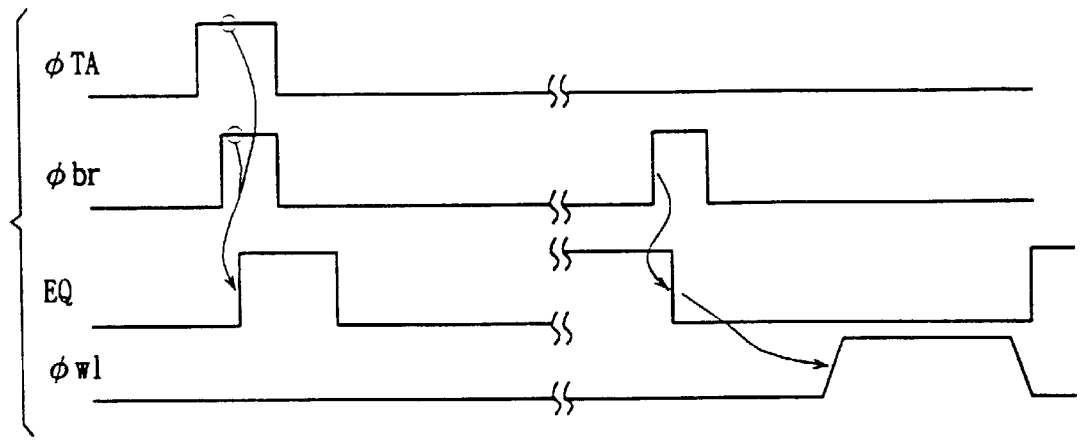
FIGS. 27A and 27B are signal waveform diagrams representing operations of the equalize/precharge control circuit shown in FIG. 26.

Referring to FIG. 27A, the equalization signal EQ is at a low level when the array block which is designated by the block activation signal φbr already holds data at its sense amplifiers. When the sense amplifier transfer instruction signal is activated in the state where the sense amplifiers hold the data, the output signal of the gate circuit 121 goes high so that the pulse generation circuit 123 outputs a pulse signal which goes high for a prescribed period. At this time, the output signal of the gate circuit 121 is at a high level, the output signal of the NOR circuit 125 is fixed at a low level, and a set operation on the flip-flop 124 is inhibited. Therefore, the equalization signal EQ from the OR circuit 127 rises to a high level for a prescribed time. The flip-flop 124 maintains a reset state. In this state, the signal φTM is at a low level, a word line selecting operation activation signal φwl maintains a low level in the word line driving control circuit 140, and a word line selecting operation in this transfer array block is inhibited.

The delay circuit 119 prevents the output signal of the gate circuit 121 from going to a low level to enter the flip-flop 124 into a set state in transition of the equalization signal EQ from a low level to a high level.

When the transfer array block holds no data in its sense amplifier, on the other hand, the equalization signal EQ is at a high level. In this state, the output signal of the gate circuit 121 is at a low level, and a pulse generating from the pulse generation circuit 123 is inhibited. In this case, the NOR circuit 125 serves as an inverter, and outputs a high-level signal in response to the block activation signal φbr. Thus, the flip-flop 124 is set while the flip-flop 128 is reset. At this time, the sense amplifier transfer instruction signal φTA is also in an active state, and the set/reset flip-flop 128 comprises a set preferential structure and is brought into a set state when active signal supplied to its set and reset inputs S and R, so that an output signal from its true output Q is set at a high level. Thus, the output signal of the NOR circuit 129 is fixed at a low level, and resetting of the flip-flop 124 is inhibited. When the flip-flop 124 is set and the output signal from its true output Q rises to a high level, the output signal of the delay circuit 27 rises after a lapse of a prescribed time, a flip-flop 28 is set and the word line selecting operation activation signal φwl is brought into an active state of a high level for a prescribed time.

Figure 27B:
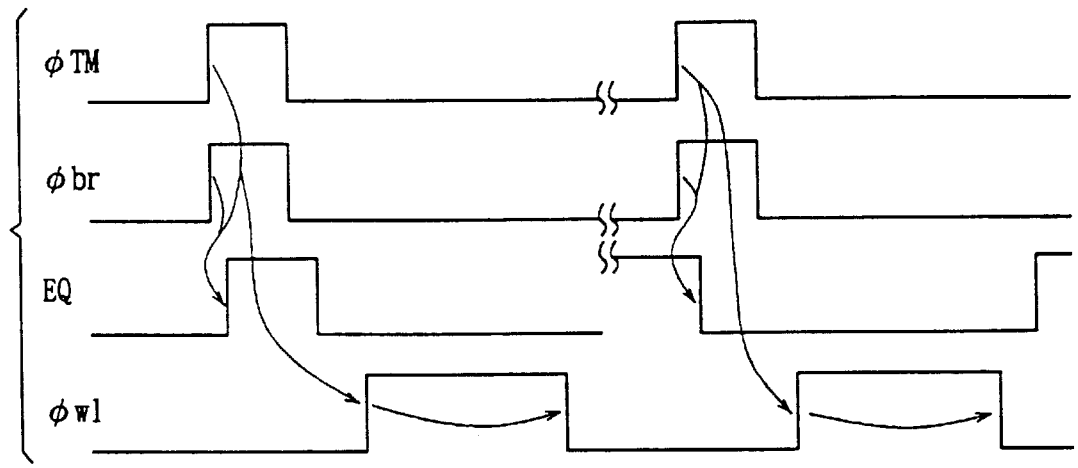

In the memory cell transfer operation shown in FIG. 27B, on the other hand, the signal φTA is at a low level, and the block activation signal φbr is at a high level. In this case, the memory cell transfer instruction signal φTM is at a high level, and the output signal of the OR circuit 118 is brought to a high level. Thus, the output signal of the gate circuit 121 goes high when the equalization signal EQ is at a low level while the former goes low when the latter is at a high level. Therefore, activation/inactivation of the equalization signal EQ is controlled depending on whether or not the transfer destination array block holds data in its sense amplifiers. When the transfer destination array block already holds data in its sense amplifiers, the output signal of the OR circuit 131 receiving the memory cell transfer instruction signal φTM and the output signal of the true output Q of the flip-flop 124 are brought to a high level, and the flip-flop 28 is set by the output signal of the delay circuit 27, so that the word line selecting operation activation signal φwl is activated for a prescribed period. Thus, the transfer destination array block executes a word line selecting operation when the memory cell transfer instruction signal φTM is supplied, regardless of whether the transfer destination array block holds data in its sense amplifier or not.

[Structure of Sense Amplifier Control Circuit]

Figure 28:
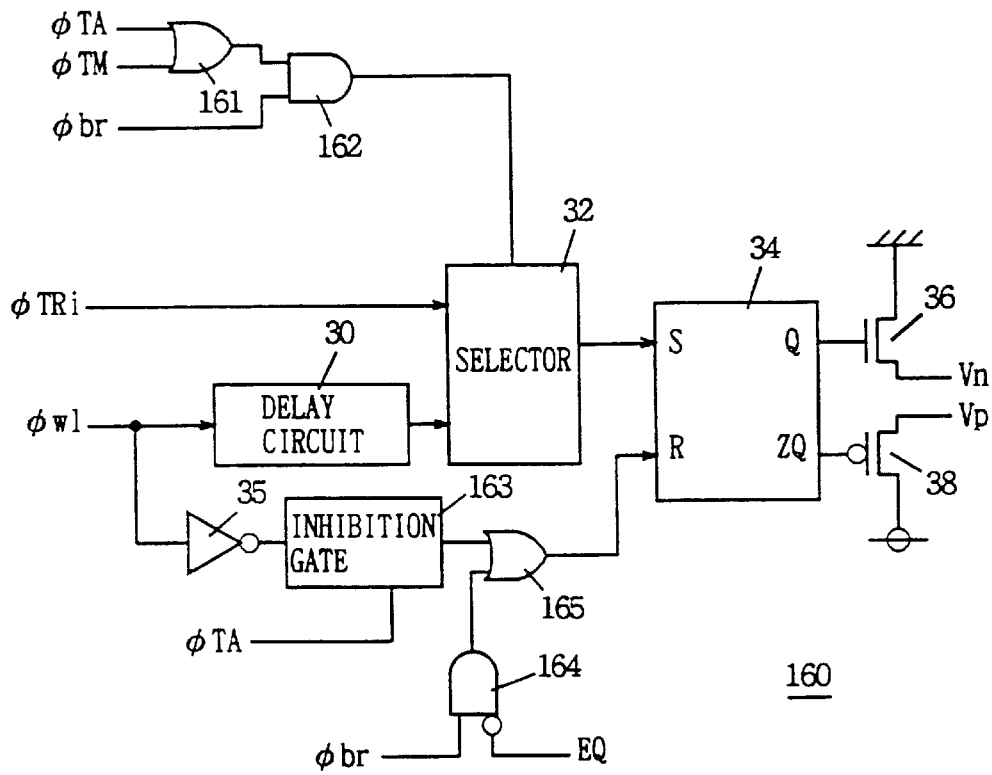
FIG. 28 illustrates the structure of a sense amplifier control circuit shown in FIG. 24.

FIG. 28 illustrates an exemplary structure of sense amplifier control circuit 160 shown in FIG. 24. Referring to FIG. 28, the sense amplifier control circuit 160 includes an OR circuit 161 which receives the transfer instruction signals φTA and φTM, and an AND circuit 162 which receives an output signal of the OR circuit 161 and the block activation signal φbr. The circuits 161 and 162 may be included in the transfer control circuit 110 shown in FIG. 24.

The sense amplifier control circuit 160 shown in FIG. 28 further includes an inhibition gate 163 which inhibits transmission of an output signal of an inverter 35 receiving the word line selecting operation activation signal φwl upon activation of the sense amplifier transfer instruction signal φTA, a gate circuit 164 which receives the block activation signal φbr and the equalization signal EQ, and an OR circuit 165 which receives output signals of the inhibition gate 163 and the gate circuit 164, in addition to the structure of the sense amplifier control circuit shown in FIG. 9. The remaining parts are identical in structure to those of the sense amplifier control circuit shown in FIG. 9, and corresponding portions are denoted by the same reference numerals.

Figure 29:
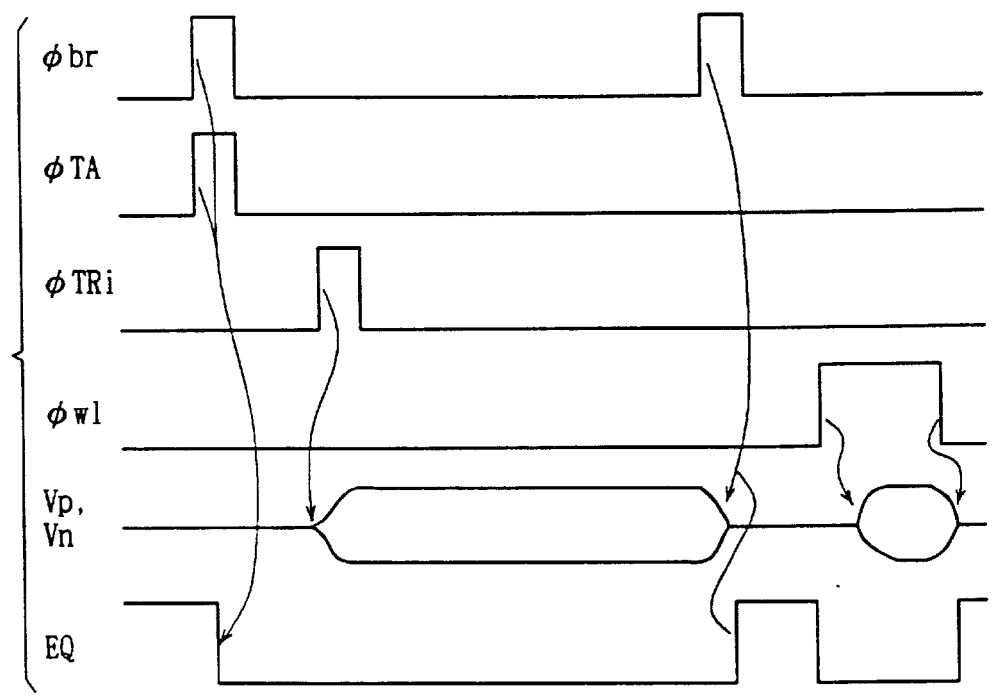
FIG. 29 is a signal waveform diagram representing operations of the sense amplifier control circuit shown in FIG. 28.

The inhibition gate 163 fixedly sets its output signal in an inactive state of a low level in response to activation of the sense amplifier transfer instruction signal φTA. This inhibition gate 163 can be formed by a latch circuit which is brought into a nonconducting state in response to the sense amplifier transfer instruction signal φTA and brought into a conducting state in response to inactivation of the signal φwl. The gate circuit 164 outputs a high-level signal when the equalization signal EQ is at a low level and the block activation signal φbr is at a high level. The operation is now described with reference to FIG. 29.

When both of the block activation signal φbr and the sense amplifier transfer instruction signal φTA are at high levels and the equalization signal EQ is also at a high level, the equalization signal EQ is brought to a low level by the circuit part described above with reference to FIG. 26. While a flip-flop 34 may be reset by the output signal of the OR circuit 165 at this time, no problem is caused in this case since the flip-flop 34 is already in a reset state.

Further, the output signals of the OR circuit 161 and the AND circuit 162 are brought to high levels at this time, and a selector 32 is set in a state of selecting the internal transfer instruction signal φTRi. When the internal transfer instruction signal φTRi is activated, an active signal is supplied to a set input S of the flip-flop 34 through the selector 32 to set the flip-flop 34, whereby transistors 36 and 38 conduct and sense amplifier activation signals Vn and Vp are activated. The inhibition gate 163 inhibits transmission of the output signal of the inverter 35 in response to activation of the signal φTA, whereby the flip-flop 34 is not reset but maintains the set state. Thus, the sense amplifier activation signals Vp and Vn maintain the active states.

When this array block is again accessed in this state, the output signal of the gate circuit 164 rises to a high level in response to activation of the block activation signal φbr since the equalization signal EQ is at a low level, whereby the flip-flop 34 is reset through the OR circuit 165. Thus, the sense amplifier activation signals Vp and Vn are inactivated. The structure of bringing the equalization signal EQ from the low level to a high level for a prescribed period is implemented by that shown in FIG. 26.

In a normal access operation, after a lapse of a prescribed time since the word line selecting operation activation signal φwl is brought to a high level, the flip-flop 34 is set through the selector 32 and the sense amplifier activation signals Vp and Vn are activated. When the word line selecting operation activation signal φwl is inactivated, the inhibition gate 163 passes the output signal of the inverter 35 due to inactivation of the signal φTA, whereby the flip-flop 34 is reset in accordance with the output signal of the OR circuit 165 and the sense amplifier activation signals Vp and Vn are inactivated.

In a memory cell transfer operation, on the other hand, the signal φTM is brought to a high level, the output signal of the gate circuit 162 goes high, and the selector 32 is set in a state of selecting the internal transfer instruction signal φTRi. In this case, the sense amplifier activation signals Vp and Vn are activated in response to activation of the internal transfer instruction signal φTRi, and inactivated in response to transition of the signal φwl from an active state to an inactive state (the signal φwl is activated in the memory cell transfer operation).

The structure of an X decoder is identical to that of the first embodiment shown in FIG. 12. Further, the -structure of the address latch of the first embodiment shown in FIG. 10 can be utilized for that of an address latch in the second embodiment.

According to the second embodiment of the present invention, as hereinabove described, the array blocks are made drivable independently of each other and data can be transferred from one array block to a sense amplifier of or a memory cell of another array block, whereby the memory cell data can be saved or cached depending on the application of the processing, and a semiconductor memory device having high versatility can be implemented.

[Embodiment 3]

Figure 30:
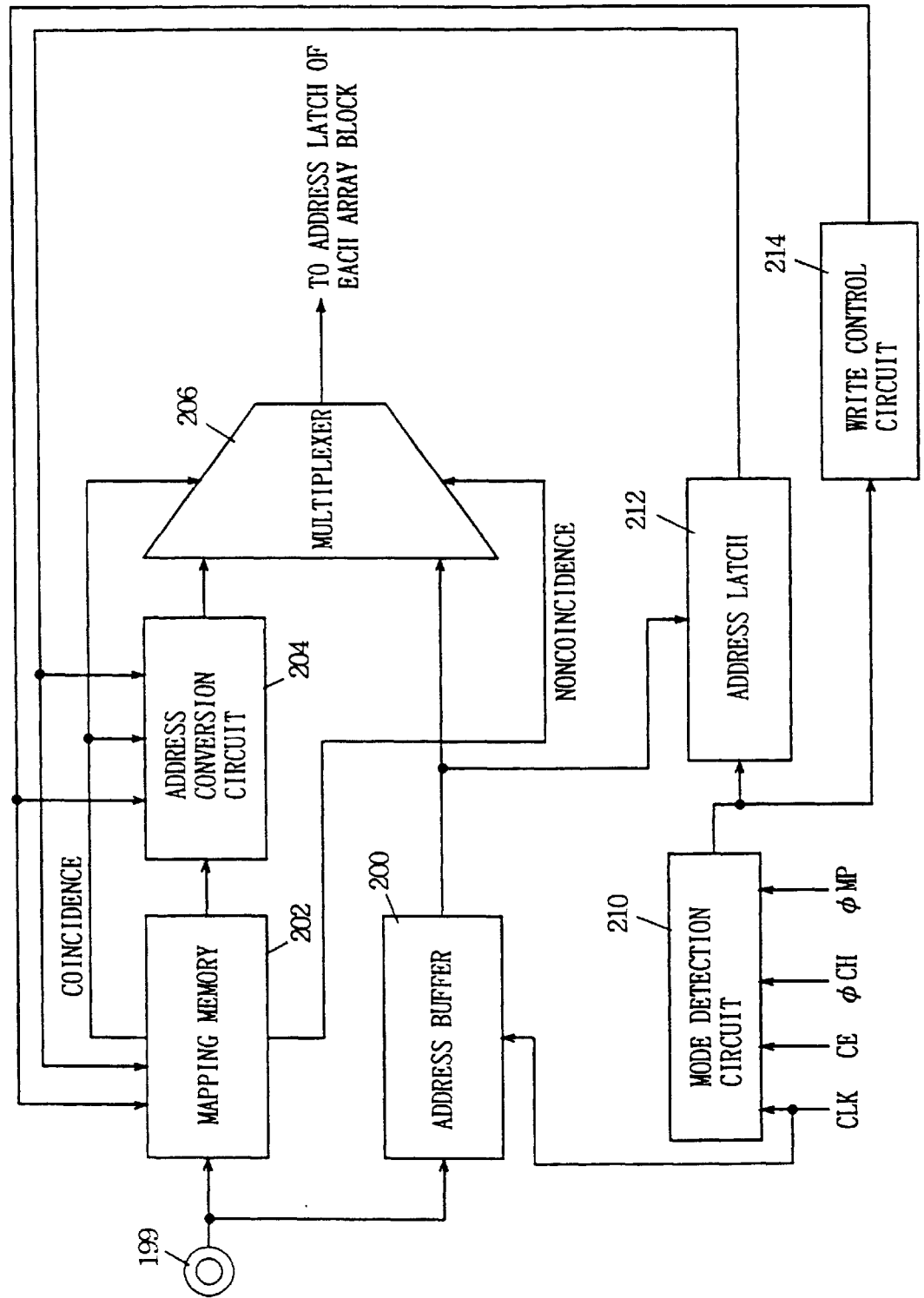
FIG. 30 illustrates the structure of an address input part of a semiconductor memory device according to a third embodiment of the present invention.

FIG. 30 illustrates the structure of a principal part of a semiconductor device according to a third embodiment of the present invention. This FIG. 30 shows the structure of an address input part. An internal address signal outputted from the address input part shown in FIG. 30 is supplied to a block decoder and a row selection circuit of each array block shown in each of the embodiments 1 and 2.

Referring to FIG. 30, the address input part includes an address buffer 200 which incorporates the address signal supplied to an address input terminal 199 in synchronization with a clock signal CLK, a mapping memory 202 which stores a pretransfer address indicating a location of memory cell data before transfer, an address conversion circuit 204 which stores a protransfer address indicating a location after transfer of data at the untransferred address signal stored in the mapping memory 202 in correspondence to each pretransferred address signal, and a multiplexer 206 which passes one of the address signals of the address buffer 200 and the address conversion circuit 204 for generating an internal address signal. The mapping memory 202 is formed by a content addressable memory (CAM), for example, and the address conversion circuit 204 is formed by a register, for example.

Figure 31:
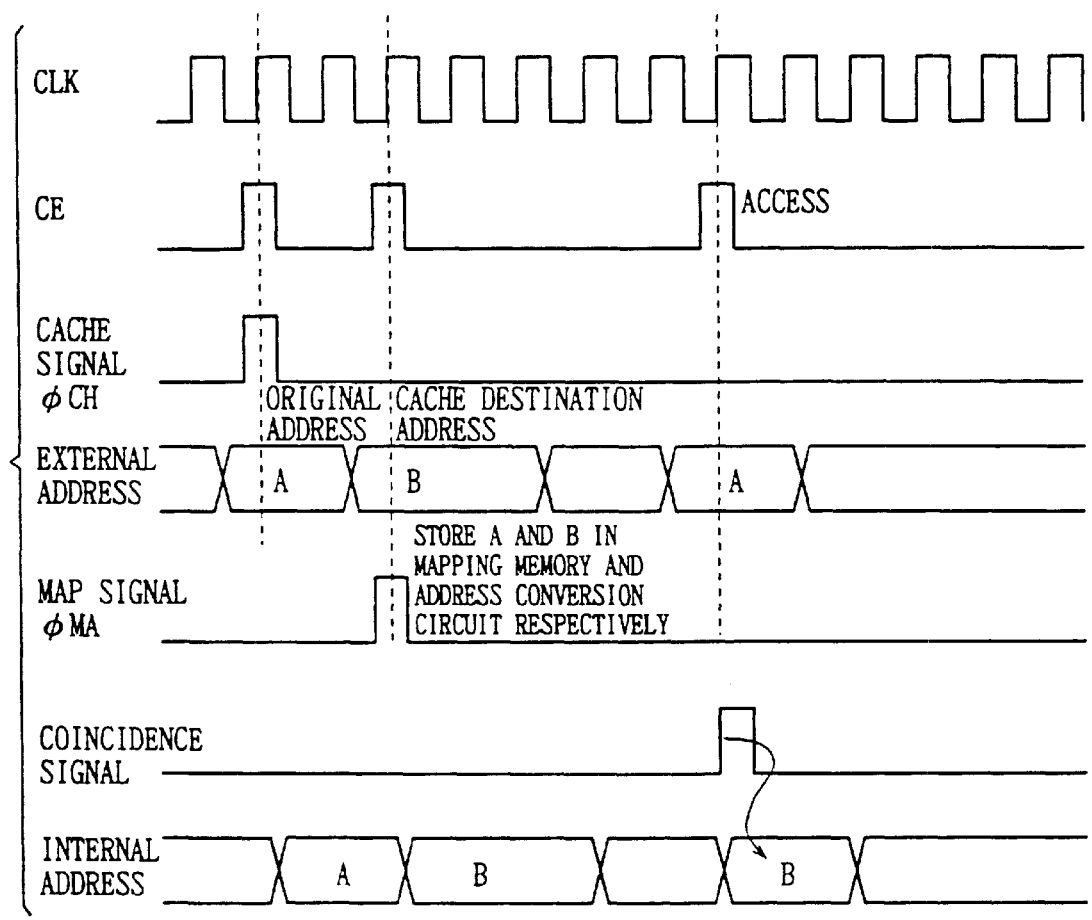
FIG. 31 is a signal waveform diagram representing operations of the address input part shown in FIG. 30.

The address input part further includes a mode detection circuit 210 which receives an external clock signal CLK, a chip enable signal CE, a cache signal φCH and a map signal φMP and detects a designated mode, an address latch 212 which latches address signals supplied from the address buffer 200 under control of the mode detection circuit 210, and a write control circuit 214 which writes the addresses stored in the address latch 212 in the mapping memory 202 and the address conversion circuit 204 under control of the mode detection circuit 210. The address latch 212 stores pretransfer and protransfer addresses. The operations are now described with reference to FIG. 31 which is an operation waveform diagram thereof.

The chip enable signal CE and the cache signal φCH designating data transfer are brought into an active state of a high level at the rising edge of the clock signal CLK. Thus, data transfer is designated and an address (A) of a memory cell having data transferred is stored in the address latch 212 under control of the mode detection circuit 210. In this state, the multiplexer 206 selects the original address supplied from the address buffer 200, i.e., the pretransfer address, under control of the mode detection circuit 210 for supplying to an address latch of each array block.

Then, an address B designating the transfer destination is supplied, and the chip enable signal CE and the map signal φMA are brought into active states of high levels at the rising edge of the clock signal CLK. The mode detection circuit 210 detects the supply of the transfer destination address in accordance with the chip enable signal CE and the map signal φMA, and stores the address signal which in turn is supplied from the address buffer 200 in the address latch 212. Also in this case, the multiplexer 206 selects the address signal from the address buffer 200 and supplies the same to each array block under control of the mode detection circuit 210, so that a data transfer operation is performed.

On the other hand, the write control circuit 214 generates write addresses to the mapping memory 202 and the address conversion circuit 204 under control of the mode detection circuit 210, and stores the original address (pretransfer address) and the cache address (transfer destination address) which are stored in the address latch 212.

When the chip enable signal CE is thereafter activated at the rising edge of the clock signal CLK and the original address (A) is supplied to the address input terminal 199, the mapping memory 202 compares the supplied address with the stored original address (called a cache address), and outputs a signal indicating the result of the comparison. Further, upon coincidence the mapping memory 202 reads the corresponding transfer destination address (cache destination address) from the address conversion circuit 204 and supplies the same to the multiplexer 206. The multiplexer 206 selects the address signal supplied from the address conversion circuit 204 in accordance with a coincidence signal from the mapping memory 202, and supplies the same to the address latch of each array block. Thus, the transfer destination address (B) is designated as an internal address with respect to the externally supplied cache address (A). When a sense amplifier latches data in the array block, this sense amplifier can be utilized as a cache for reading or writing data stored in the transfer destination address.

As hereinabove described, data which is transferred to a sense amplifier of another array block can be read at a high speed through the mapping memory 202 and the address conversion circuit 204.

Figure 32:
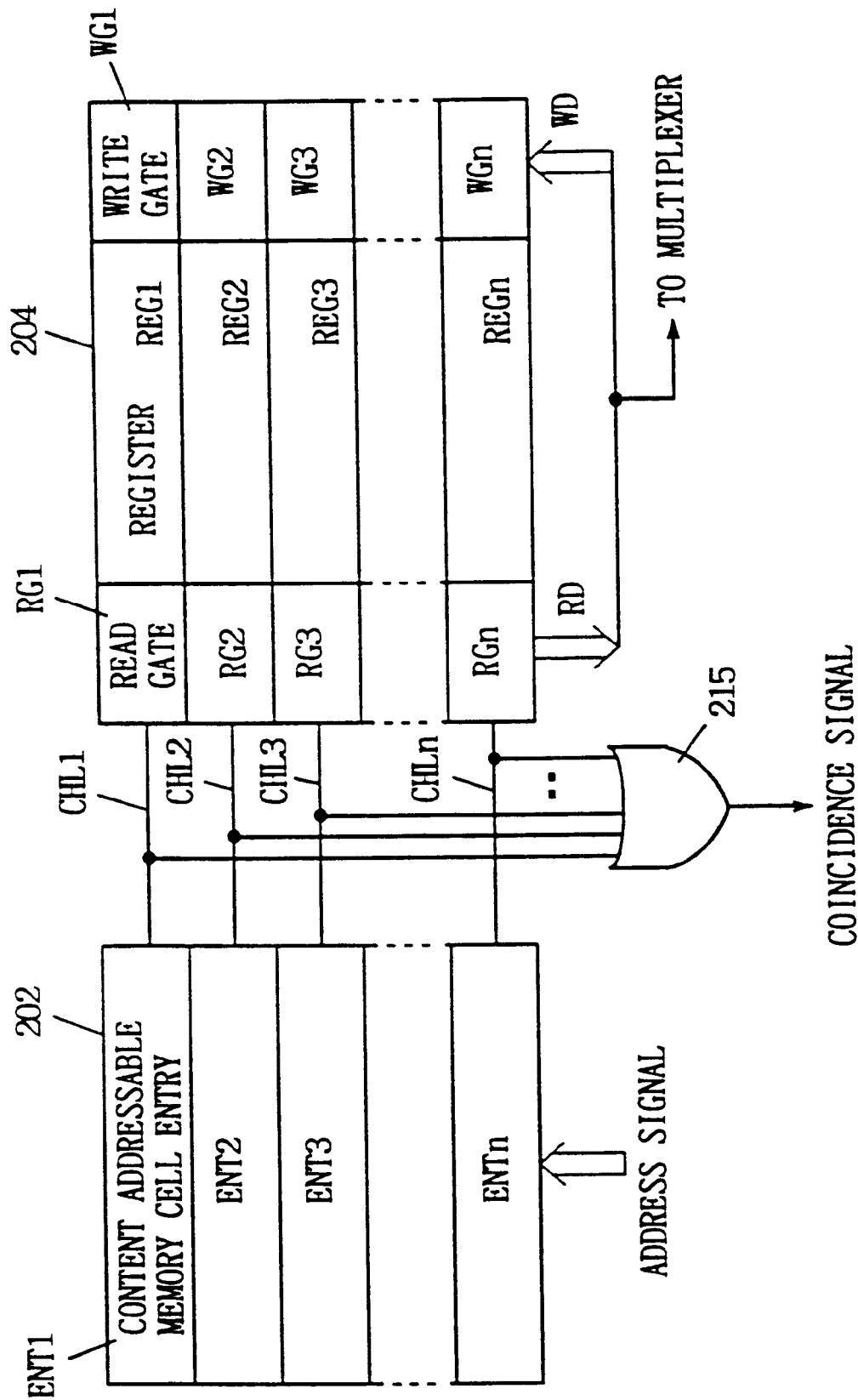
FIG. 32 illustrates the structures of a mapping memory and an address conversion circuit shown in FIG. 30 in more detail.

FIG. 32 schematically illustrates the structures of the mapping memory 202 and the address conversion circuit 204 shown in FIG. 30. Referring to FIG. 32, the mapping memory 202 includes a plurality of content addressable memory cell entries ENT1 to ENTn each storing the original address signal. The content addressable memory cell entries ENT1 to ENTn are connected with coincidence lines CHL1 to CHLn respectively. The coincidence lines CHL1 to CHLn are brought into active states of high levels when the address signals stored in the corresponding content addressable memory cell entries ENT1 to ENTn coincide with an externally supplied address signal respectively.

The address conversion circuit 204 includes registers REG1 to REGn which are provided in correspondence to the entries ENT1 to ENTn of the mapping memory 202, and read gates RG1 to RGn which are provided in correspondence to the registers REG1 to REGn for transmitting the contents of the corresponding registers onto a read data line RD upon activation of corresponding coincidence lines CHL1 to CHLn. The address conversion circuit 204 further includes write gates WG1 to WGn for writing data latched in the address latches in writing of transfer destination address signals under control of the write control circuit. The write gates WG1 to WGn are provided in correspondence to the registers REG1 to REGn and selectively activated in accordance with activation signals from the write control circuit, to connect the corresponding registers REG1 to REGn to a write data bus WD.

The write control circuit includes an address generator (not clearly shown) such as an address counter, and stores the addresses which are stored in the address latch 212 in the mapping memory 202 and the address conversion circuit 204. Data are written in the content addressable memory cell entries ENT1 to ENTn by an ordinary method. Namely, an entry selection signal line (word line) is brought into a selected state and the original address signal is supplied to the mapping memory, so that the original address signal is stored in a selected content addressable memory cell entry.

The coincidence signal is outputted from an OR gate 215 which receives signals on the coincidence lines CHL1 to CHLn. The coincidence signal is activated when any of the coincidence lines CHL1 to CHLn is activated. At this time, a read gate which is provided in correspondence to the coincidence line indicating coincidence conducts so that the content of the corresponding register is read and supplied to the multiplexer.

The address latch 212 may simply have a structure of storing supplied address signals in original and transfer destination address signal storage regions respectively under control of the mode detection circuit 210.

According to the structure of the third embodiment of the present invention, as hereinabove described, the original address signal and the transfer destination address signal are stored in linkage (in association) so that the transfer destination address signal is outputted as an internal address signal when the supplied signal coincides with the registered original address signal, whereby the transfer destination memory cell can be readily accessed in this semiconductor memory device so that unprocessed data of a certain memory cell which is saved in processing of data can be accessed again, for example. Further, the sense amplifier of the transfer destination array block can be utilized as a cache, thereby enabling high-speed access.

[Embodiment 4]

Figure 33:
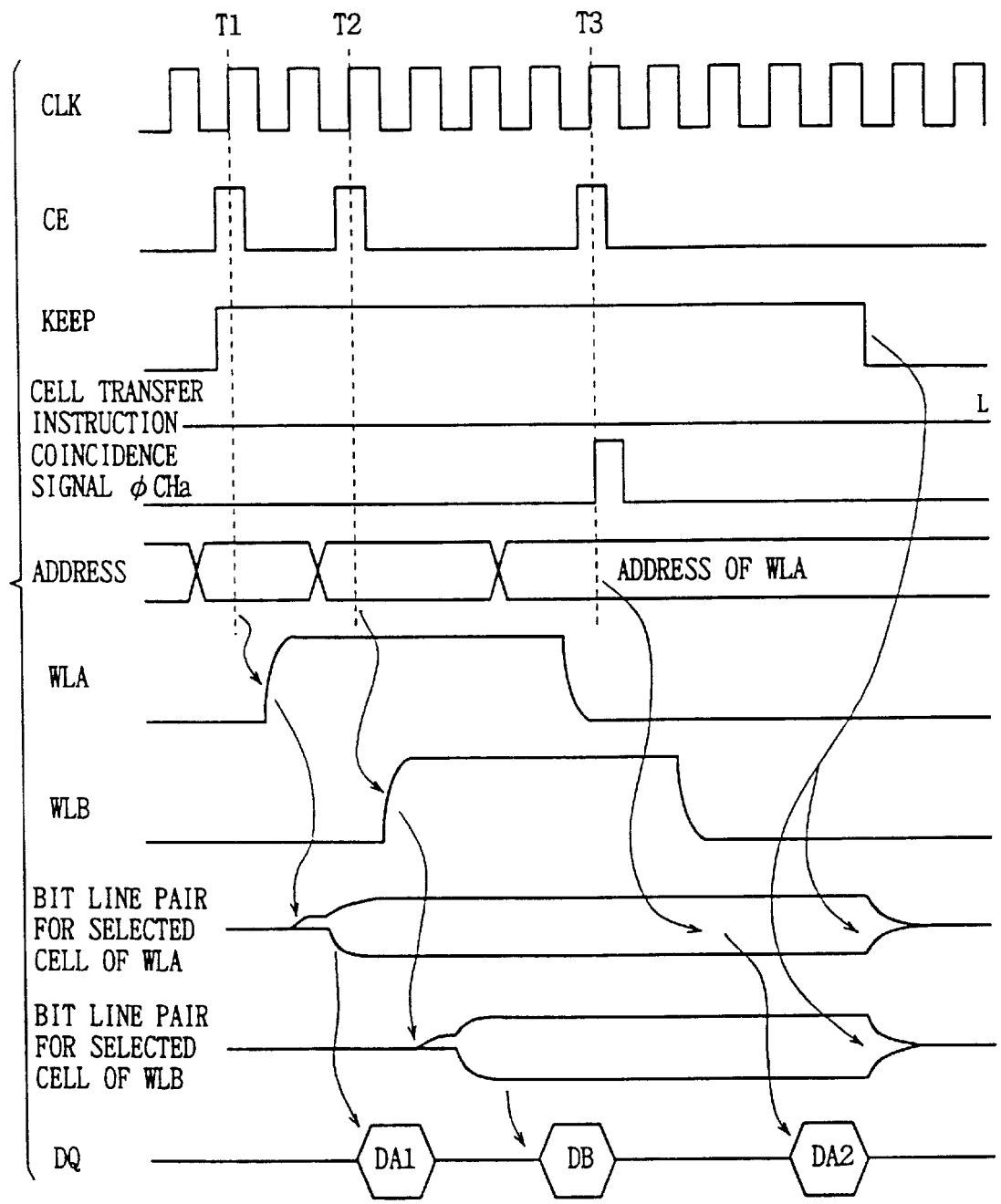
FIG. 33 is a signal waveform diagram representing operations of a semiconductor memory device according to a fourth embodiment of the present invention.

FIG. 33 is a waveform diagram showing operations of a semiconductor memory device according to a fourth embodiment of the present invention. The operations of the semiconductor memory device according to the fourth embodiment of the present invention are now described with reference to the waveform diagram shown in FIG. 33.

At the rising edge of a clock signal CLK, a chip enable signal CE and a data holding instruction signal KEEP are brought to high levels. In this state, a word line WLA is selected in an array block in accordance with an address signal which is supplied at time T1 so that data of a memory cell connected with the selected word line WLA is read onto a bit line, a sense amplifier is then activated, and then column selection is performed so that data DA1 is read out. Since the data holding instruction signal KEEP is at a high level, the sense amplifier maintains an active state in the selected array block even if the word line WLA falls to a low level after a lapse of a prescribed period.

The chip enable signal CE is again supplied at time T2, whereby a word line WLB is selected in another array block in accordance with a currently supplied address signal, the potential of this word line WLB rises, data of memory cells connected with the selected word line WLB is read onto bit line pairs, and a column selecting operation is then performed, so that data DB of a memory cell which is arranged on the selected column is read among memory cells connected with the word line WLB.

When an address signal designating the same row address as that supplied at time T1 is supplied at time T3 to designate the word line WLA, no row selecting operation is performed but only a column is selected so that data DA2 of a corresponding memory cell is read among memory cells connected with the word line WLA, since the data of the word line WLA is held by the sense amplifiers due to the signal KEEP. Thereafter the sense amplifiers maintain the active state in the selected array block while the signal KEEP is at a high level, so that only a column selecting operation is performed and data of the corresponding memory cell is read when a selecting operation is designated in any array block.

Due to the aforementioned series of operations, the semiconductor memory device can be utilized as a cache in accordance with the signal KEEP, whereby no row selecting operation is required but the data can be read at a high speed when the selected word line is accessed again.

Figure 34:
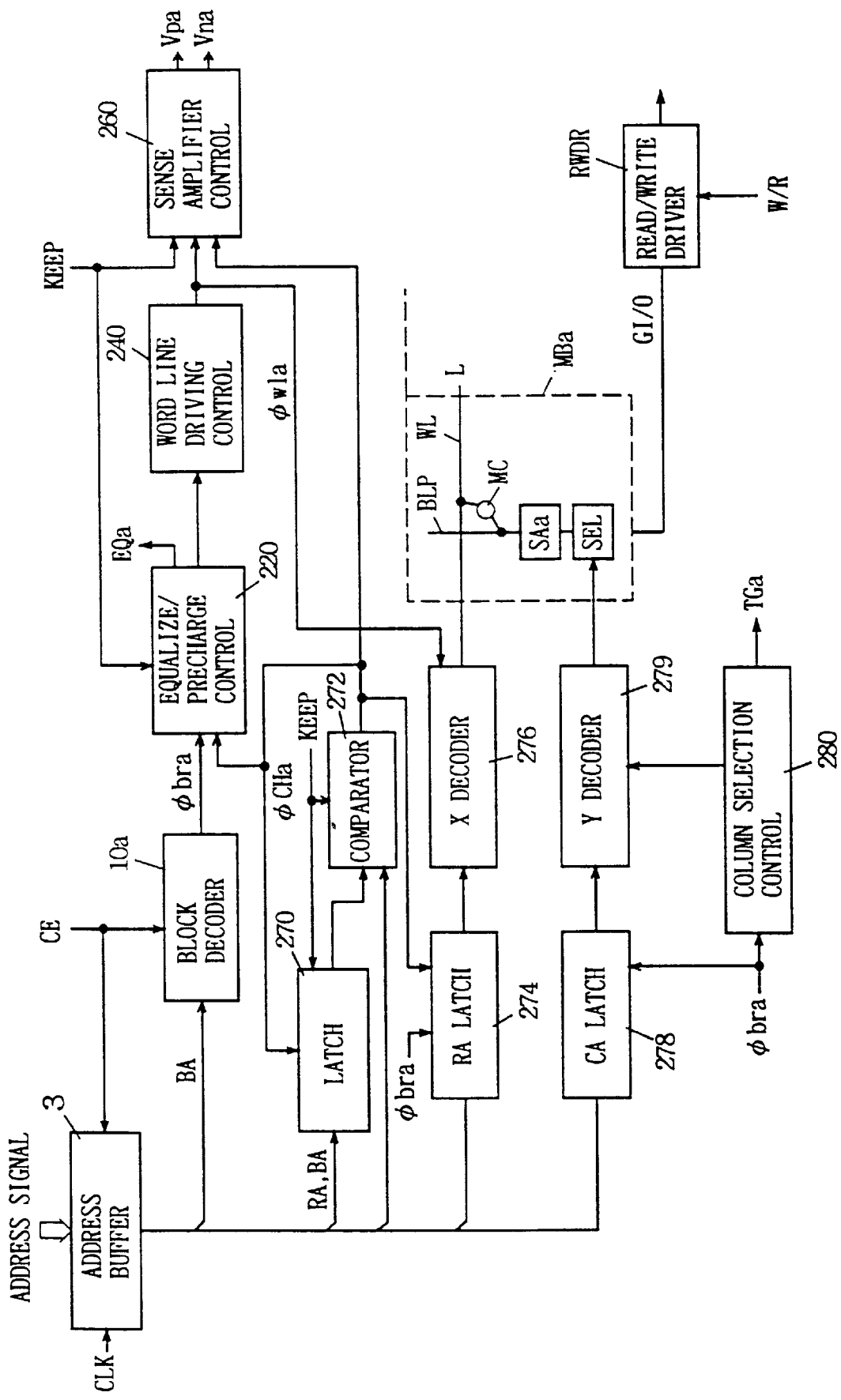
FIG. 34 illustrates the structure of a control part for implementing the operations shown in FIG. 33.

FIG. 34 illustrates the structure of an array activation control part of the semiconductor memory device according to the fourth embodiment of the present invention. This FIG. 34 shows only the structure of an array activation control part for an array block MBa. Similar structures are employed also for remaining array blocks MBb to MBd.

Referring to FIG. 34, the array activation control part includes a block decoder 10a which is activated in response to the chip enable signal CE for decoding a block address signal BA from an address buffer 3 and outputting a block activation signal φbra, an equalize/precharge control circuit 220 which selectively activates and inactivates an equalization signal EQa in response to the block activation signal φbra from the block decoder 10a and a coincidence signal φCHa from a comparator 272 described later, a word line driving control circuit 240 outputting a word line selecting operation activation signal φwla which is brought into an active state for a prescribed period in response to fall of the equalization signal EQa from the equalize/precharge control circuit 220, and a sense amplifier control circuit 260 which selectively activates sense amplifier activation signals Vpa and Vna in response to the data holding signal (data hold instructing signal) KEEP, the signal φwla outputted from the word line driving control circuit 240 and the coincidence signal 100 CHa from the comparator 272. The internal structures of the equalize/precharge control circuit 220 and the sense amplifier control circuit 260 are described later. The structure of the word line driving control circuit 240 is similar to that described with reference to the second embodiment.

The array activation control circuit further includes a latch 270 which latches an internal row address signal RA and an internal block address signal BA supplied from the address buffer 3 in response to the output signal φCHa of the comparator 272 and the data holding signal KEEP. When the coincidence signal φCHa indicates noncoincidence upon activation (high level) of the data holding signal KEEP, the latch 270 latches the currently supplied row and block address signals RA and BA. On the other hand, the latch data of the latch 270 are reset in inactivation (transition from a high level to a low level) of the data holding signal KEEP.

The comparator 272 compares the address signals latched in the latch 270 with row and block address signals supplied from the address buffer 3, and drives the coincidence signal φCHa to an active or inactive state in accordance with the result of the comparison.

An RA latch 274 is provided with respect to an X decoder 276, for latching an internal row address signal from the address buffer 3 in accordance with the block activation signal φbra and the coincidence signal φCHa. A CA latch 278 is provided with respect to a Y decoder 279, for latching an internal column address signal supplied from the address buffer 3 in response to the block activation signal φbra. The X decoder 276 is activated in response to the word line selecting operation activation signal φwla from the word line driving control circuit 240. The RA latch 274 maintains a reset state when the coincidence signal φCHa indicates coincidence, even if the block activation signal φbra is activated. A decoding start timing of the Y decoder 279 is determined by a column selection control circuit 280 which in turn is activated in response to the block activation signal φbra. The column selection control circuit 280 activates a block selection signal TGA which controls conduction of a block selection gate (gate connecting local and global I/O lines with each other) at a prescribed timing in response to the block activation signal φbra.

An output signal (word line driving signal) from the X decoder 276 is transmitted onto a word line WL which is arranged in the array block MBa. An output signal of the Y decoder 279 is supplied to a column selection gate SEL provided on a bit line pair BLP which is arranged in the array block MBa. A sense amplifier SAa which is provided on each bit line pair BLP of the array block MBa is activated in response to the sense amplifier activation signals vpa and Vna from the sense amplifier control circuit 260. The control operations shown in FIG. 34 are now described with reference to FIGS. 35 and 36 which are operation waveform diagrams thereof.

Figure 35:
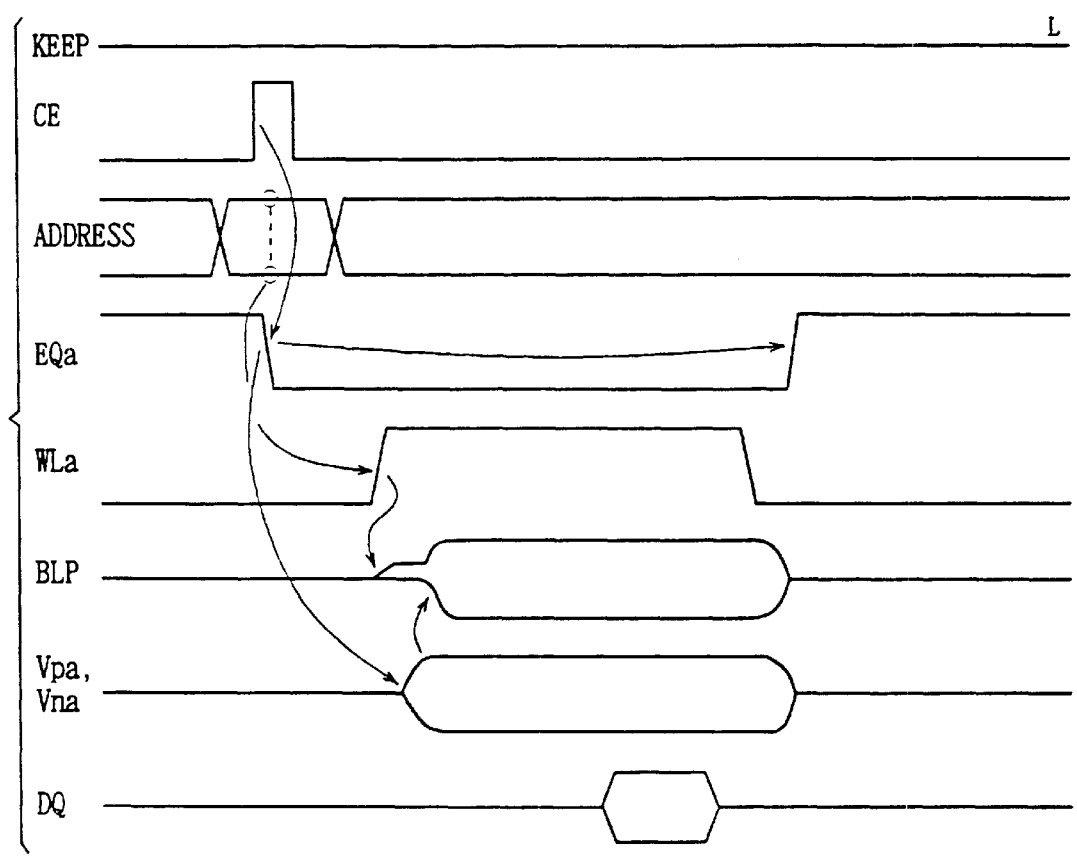
FIG. 35 illustrates signal waveforms in a normal operation in the fourth embodiment of the present invention.

FIG. 35 is a waveform diagram showing a normal operation. In the normal operation, the data holding signal KEEP maintains a low level of an inactive state. In this case, the comparator 272 is inactivated so that its comparing operation is inhibited, and the coincidence signal φCHa is fixed at a low level. In response to activation of the chip enable signal CE, the block address signal BA from the address buffer 3 is decoded by the block decoder 10a, so that the block activation signal φbra is activated. In response to this, the equalization signal EQa from the equalize/precharge control signal 220 is brought to a low level of an inactive state. In response to the inactivation of the equalization signal EQa from the equalize/precharge control circuit 220, the word line driving control circuit 240 activates the word line selecting operation activation signal φwla after a lapse of a prescribed time, and supplies the same to the X decoder 276. Since the coincidence detection signal φCHa is in an inactive state, the RA latch 274 latches the internal row address signal RA supplied from the address buffer 3 in response to the block activation signal φbra and supplies the same to the X decoder 276.

The X decoder 276 is activated in response to the signal φwla from the word line driving control circuit 240, decodes the address signal received from the RA latch 274, and drives a word line WLa to a selected state for a prescribed period. The period for selecting the word line WLa is determined by the signal φwla outputted from the word line driving control circuit 240. When data of a memory cell connected with the selected word line WLa is supplied to the bit line pair BLP and its potential difference is sufficiently enlarged, the sense amplifier activation signals Vpa and Vna from the sense amplifier control circuit 260 are activated so that the data of the bit line pair BLP is amplified.

On the other hand, the CA latch 278 latches the internal column address signal supplied from the address buffer 3 in response to activation of the block activation signal φbra. The Y decoder 279 is activated under control of the column selection control circuit 280, to decode the internal column address signal latched by the CA latch 278 and output a column selection signal. Thus, the bit line pair BLP corresponding to the selected column is connected to the global I/O line through column and block selection gates SEL. Thereafter a read/write driver RWDR is activated at a prescribed timing in response to a read/write signal W/R, so that the data is outputted through an input/output buffer.

Figure 36:
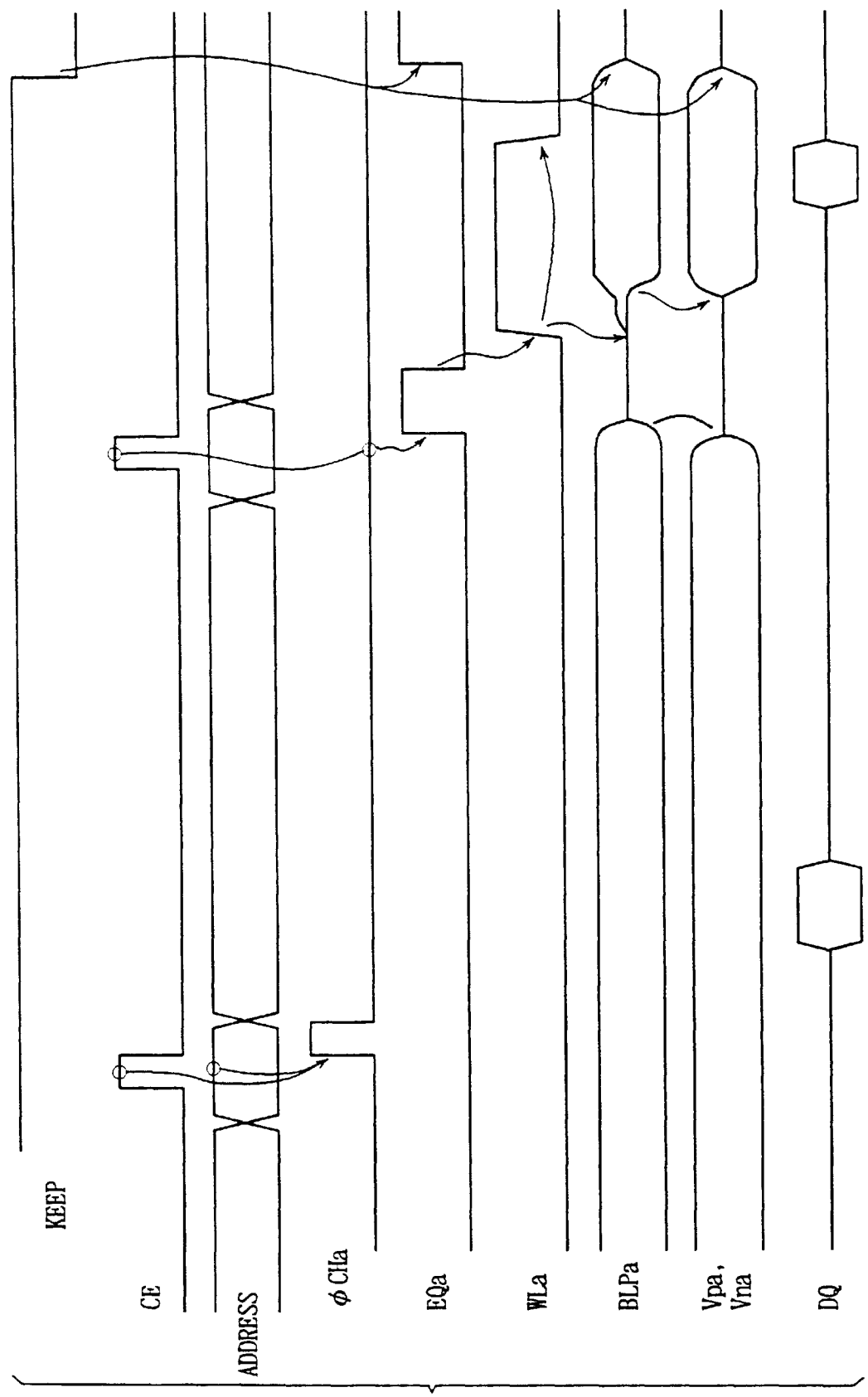
FIG. 36 is a waveform diagram showing transfer/write operations in data holding in the fourth embodiment of the present invention.

FIG. 36 is a waveform diagram representing an operation performed when the data holding signal KEEP is in an active state. When the data holding signal KEEP is in the active state of a high level, the sense amplifier activation signals Vpa and Vna already maintain active states. When the chip enable signal CE is activated, the internal address signal from the address buffer 3 is brought into a definite or decided state. The comparator 272 compares the internal row address signal RA and the block address signal BA which are latched in the latch 270 with the internal row address signal and the block address signal which are supplied from the address buffer 3. When these signals are identical to each other, i.e., when the same word line of the same array block MBa is selected, the coincidence signal φCHa from the comparator 272 is activated. In response to the activation of the coincidence signal φCHa, the equalize/precharge control circuit 220 is inhibited of operation and maintains the state of the precedent cycle, i.e., an inactive state. In this state, therefore, the word line selecting operation activation signal φwla from the word line driving control circuit 240 maintains an inactive state, so that selection of a new word line by the RA latch 274 and the X decoder 276 is inhibited. The sense amplifier control circuit 260 maintains the sense amplifier activation signals Vpa and Vna in active states in response to the active coincidence signal φCHa from the comparator 272.

The CA latch 278 latches the internal column address signal from the address signal supplied simultaneously with the chip enable signal CE, and the Y decoder 279 is activated under control of the column selection control circuit 280. Thus, data of a memory cell designated by the internal column address signal is selected among data of memory cells of one row already selected and latched by the sense amplifier SAa, and transmitted onto the global I/O bus, and then supplied to the input/output buffer (not shown) through the read/write driver RWDR.

When the address signal which is supplied upon activation of the chip enable signal CE designates a row address which is different from that of the memory cells having data held by the sense amplifier, the output signal of the comparator 272 maintains an inactive state. In this case, the equalize/precharge control circuit 220 maintains the equalization signal EQa at a high level for a prescribed period in response to activation of the block activation signal φbra from the block decoder 10a. Also at this time, the sense amplifier control circuit 260 maintains the sense amplifier activation signals Vpa and Vna in inactive states in response to the inactive coincidence signal φCHa from the comparator 272. Thus, the data of the memory cells held in the sense amplifier SAa are reset. Then, the word line driving control circuit 240 activates the signal φwla in response to fall of the equalization signal EQa.

The RA latch 274 latches the internal row address signal RA from the address buffer 3 and transmits the same to the X decoder 276 in response to the inactive coincidence detection signal φCHa from the comparator 272 and to activation of the block activation signal φbra. The X decoder 276 is activated for a prescribed period in response to the word line selecting operation activation signal φwla, and selects a word line corresponding to a newly addressed row.

In response to the activation of the word line selecting operation activation signal φwla, the sense amplifier control circuit 260 activates the sense amplifier activation signals Vpa and Vna at a certain timing. Thus, the data of the memory cell of the newly addressed row is sensed, amplified and latched by the sense amplifier SAa. Then, the internal column address signal which is latched by the CA latch 278 is decoded by the Y decoder 279, and a column selection signal designating the corresponding column is activated. Thus, the data of the newly addressed memory cell is transmitted onto the global I/O bus GI/O. When the data holding signal KEEP is at a high level, the sense amplifier control circuit 260 maintains the sense amplifier activation signals Vpa and Vna in active states even if the signal φwla from the word line driving control circuit 240 is inactivated. The X decoder 287 is brought into a precharged state in response to inactivation of the signal φwla.

Further, the latch 270 latches the internal row address signal RA and the internal block address signal BA which are supplied from the address buffer 3, in response to the inactive coincidence detection signal φCHa from the comparator 272. Thus, the address signal indicating the selected word line is updated.

When the data holding signal KEEP is brought to a low level of an inactive state, the address signal latched by the latch 270 is reset, the sense amplifier activation signals Vpa and Vna from the sense amplifier control circuit 260 are also inactivated, and the equalization signal EQa rises to a high level.

[Structure of Equalization/Precharge Control Circuit]

Figure 37A:
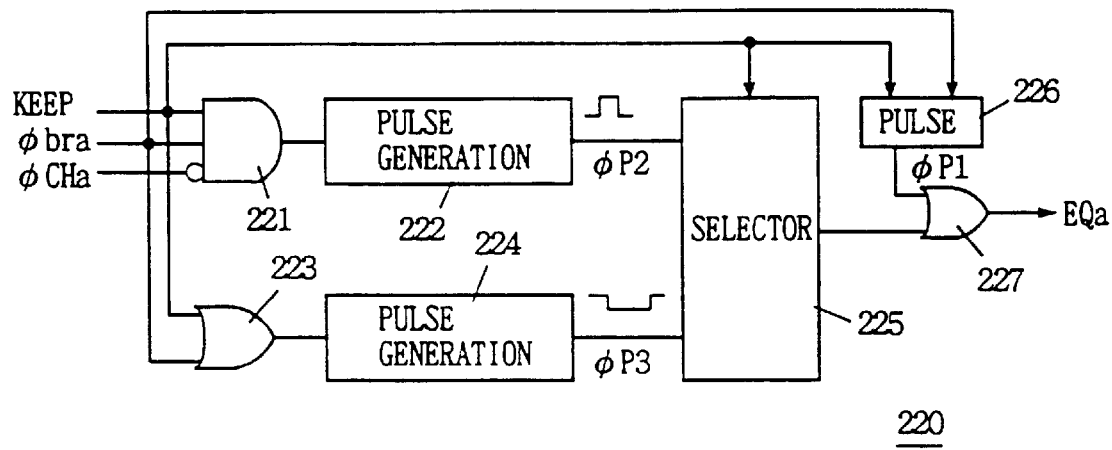
FIGS. 37A and 37B illustrate the structure and operation waveforms of an equalize/precharge control circuit shown in FIG. 34.
Figure 37B:
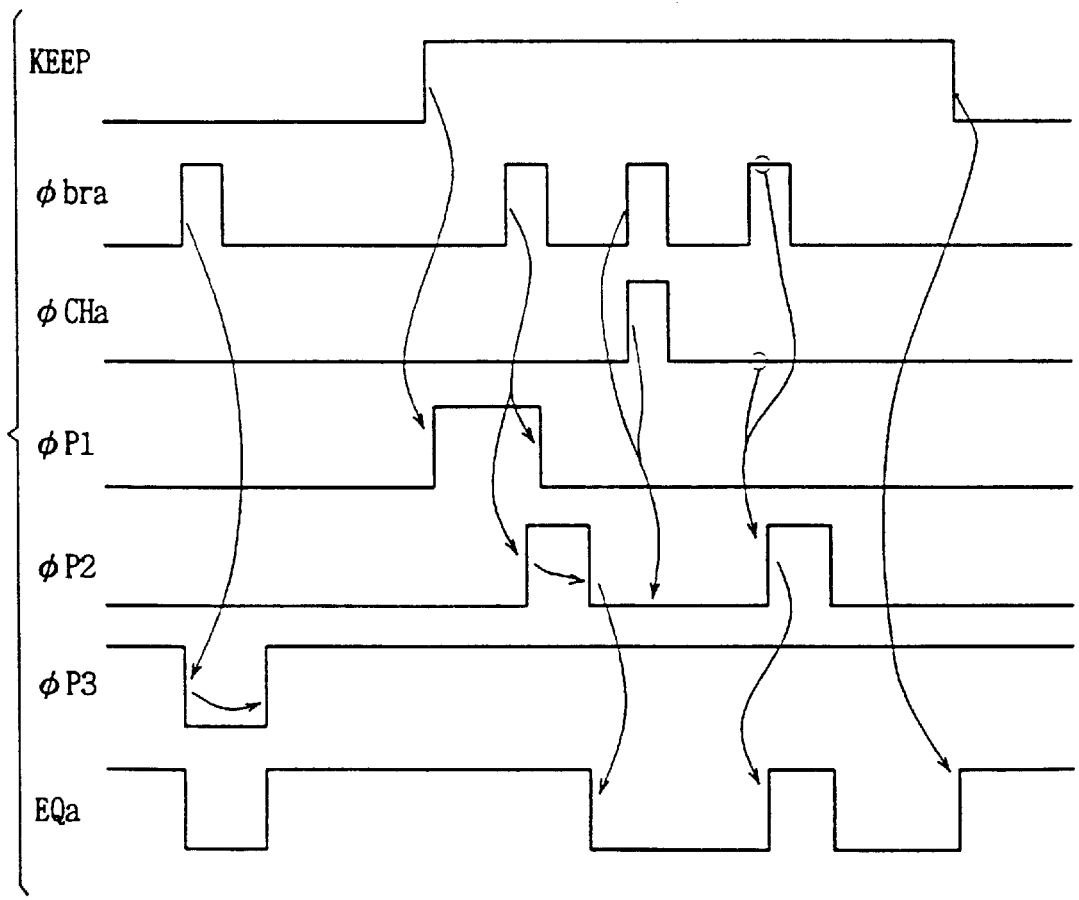

FIGS. 37A and 37B illustrate the structure and operation of the equalize/precharge control circuit shown in FIG. 34. Referring to FIG. 37A, the equalize/precharge control circuit 220 includes a gate circuit 221 which receives the signals KEEP and φbra at its true inputs while receiving the signal φCHa at its complementary input, a pulse generation circuit 222 which generates a pulse signal having a prescribed time width in response to rise of an output signal of the gate circuit 221, an OR circuit 223 which receives the signals KEEP and φbra, another pulse generator 224 generating a pulse signal which goes low for a prescribed period in response to rise of an output signal of the OR circuit 223, a selector 225 which selects one of the pulse generators 222 and 224 in response to the signal KEEP, a pulse generator 226 generating a pulse signal which rises in response to rise of the signal KEEP and falls in response to rise of the signal φbra, and an OR circuit 227 which receives an output signal from the pulse generator 226 and an output of the selector 225. The OR circuit 227 outputs the equalization signal EQa. The operation of the equalize/precharge control circuit 220 shown in FIG. 37A is now described with reference to FIG. 37B, which is an operation waveform diagram thereof.

When the signal KEEP is at a low level, the output signal of the gate circuit 221 is fixed at a low level. The selector 225 is set in a state of selecting a pulse signal φp3 from the pulse generator 224. The pulse generator 226 generates no pulse since the signal KEEP is fixed at the low level.

The OR circuit 223 serves as a buffer circuit, for buffering the signal φbra for supplying to the pulse generator 224. The pulse generator 224 generates the pulse signal φp3 which is brought to a low level for a prescribed period, in response to rise of the signal from the OR circuit 223. The selector 225 selects and passes the pulse signal φp3 from the pulse generator 224. The OR circuit 227 currently serves as a buffer circuit (the output signal of the pulse generator 226 is at a low level), and the pulse signal φp3 is outputted as the equalization signal EQa.

When the signal KEEP rises to a high level, in response to this rise the pulse generator 226 brings an output signal φp1 to a high level. Thus, the equalization signal EQa from the OR circuit 227 is brought to a high level. If the array block MBa is in a precharged state, the equalization EQa simply maintains a high level, with no change of the state.

When the block activation signal φbra is activated in this state, the coincidence signal φCHa outputted from the comparator (see FIG. 34) is at a low level indicating noncoincidence in the first cycle (the latch 270 shown in FIG. 34 is reset in response to the rise of the signal KEEP, and designates no row). Responsively, the output signal of the gate circuit 221 rises to a high level, and a pulse signal φp2 from the pulse generator 222 is brought to a high level for a prescribed period. The selector 225 selects the output signal of the pulse generator 222 in response to the signal KEEP. The pulse signal φp1 from the pulse generator 226 is brought to a low level in response to rise of the block activation signal φbra. The timings of the pulse signals φp1 and φp2 are so set that high-level periods thereof are overlapped with each other. Therefore, the equalization signal EQa is brought to a low level from a high level after a lapse of a prescribed time, so that a word line selecting operation is started.

Then, when access is made and both of the block activation signal φbra and the coincidence signal φCHa are brought to high levels, the output signal of the gate circuit 221 is at a low level in this case, and the pulse signal φp2 from the pulse generator 222 maintains a low level. Therefore, the equalization signal EQa also maintains a low level.

Then, when the block activation signal φbra again goes high and the coincidence signal φCHa is at a low level, the pulse signal φp2 is generated from the pulse generator 222, the equalization signal EQa is brought to a high level for a prescribed period, and the array block MBa is precharged. Thereafter a word line is selected so that a new memory cell data is selected. When the signal KEEP is brought to a low level, the selector 225 selects the high-level pulse signal φp3 from the pulse generator 224, and the equalization signal EQa rises to a high level in response.

As to the structure of the word line driving control circuit, the structure employed in any of the first and second embodiments can be utilized.

[Structure of Sense Amplifier Control Circuit]

Figure 38A:
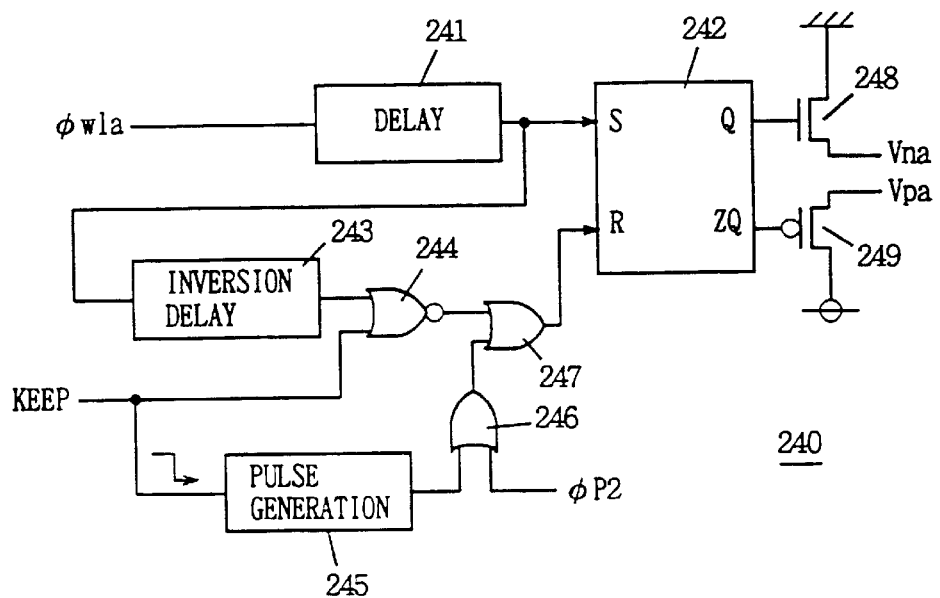
FIGS. 38A and 38B illustrate the structure and operation waveforms of a word line driving control circuit shown in FIG. 34.
Figure 38B:
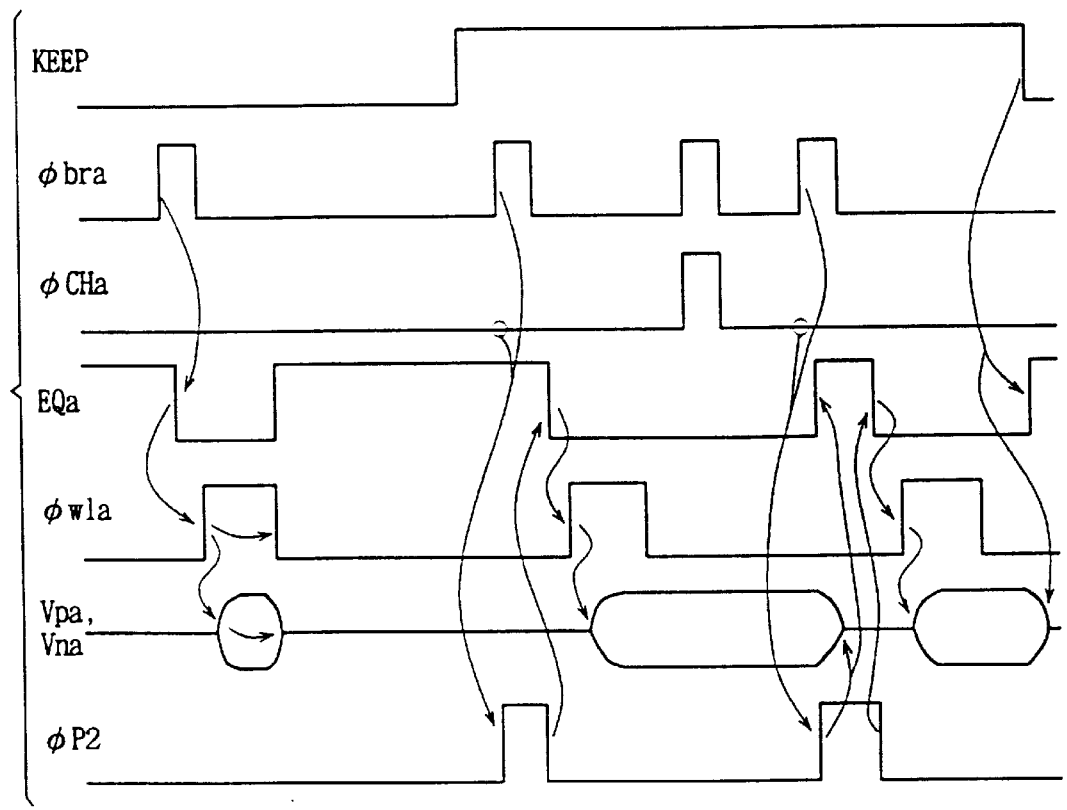

FIGS. 38A and 38B illustrate the structure and operation of the sense amplifier control circuit shown in FIG. 34 respectively.

Referring to FIG. 38A, the sense amplifier control circuit 240 includes a delay circuit 241 which delays the word line selecting operation activation signal φwla for a prescribed time, a set/reset flip-flop 242 which is set in response to rise of an output signal of the delay circuit 241, an inversion delay circuit 213 which delays an output signal from the delay circuit 241 for a prescribed time while inverting the output signal, a NOR circuit 244 which receives the data holding signal KEEP and an output signal of the inversion delay circuit 243, a pulse generator 245 generating a pulse signal which is brought to a high level for a prescribed time in response to fall of the signal KEEP, an OR circuit 246 which receives an output signal of the pulse generator 245 and the pulse signal φp2 shown in FIG. 37B, and an OR circuit 247 which receives output signals from the NOR circuit 244 and the OR circuit 246. The flip-flop 242 is reset in response to rise of an output signal of the OR circuit 247.

An output signal from a complementary output ZQ of the flip-flop 242 is supplied to a gate of a p-channel MOS transistor 249 which outputs the sense amplifier activation signal Vpa. An output signal from a Q output of the flip-flop 242 is supplied to a gate of an n-channel transistor 248 outputting the sense amplifier activation signal Vna. With reference to the operation waveform diagram shown in FIG. 38B, the operation of the sense amplifier control circuit shown in FIG. 38A is now described.

When the signal KEEP is at a low level, the NOR circuit 244 serves as an inverter. When the block activation signal φbra is brought to a high level, the equalization signal EQa falls from a high level to a low level, and the word line selecting operation activation signal φwla is brought to a high level for a prescribed period in response to the fall of the equalization signal EQa. In response to the rise of the signal φwla, the flip-flop 242 is set in accordance with the output signal of the delay circuit 241, and then reset by the inversion delay circuit 243, the NOR circuit 244 and the OR circuit 247 after a lapse of a prescribed time. Thus, the sense amplifier activation signals Vpa and Vna are activated for a prescribed time.

When the data holding signal KEEP is brought to a high level, the pulse signal φp2 is brought to a high level for a prescribed period, and the flip-flop 242 is reset through the OR circuits 246 and 247. At this time, the sense amplifier activation signals Vna and Vpa are in reset states (inactive states), to cause no problem. When the pulse signal φp2 falls to a low level, the equalization signal EQa falls from a high level to a low level, and the word line selecting operation activation signal φwla is brought into an active state of a high level for a prescribed period in response. In response to the rise of the word line selecting operation activation signal φwla, the flip-flop 242 is set after a lapse of a prescribed time, and the sense amplifier activation signals Vna and Vpa are activated. Since the signal KEEP is at a high level and the output signal of the NOR circuit 244 is fixed at a low level, resetting of the flip-flop 242 is inhibited and the sense amplifier activation signals Vna and Vpa maintain the active states.

When both of the signals φbra and φCHa are brought into active states of high levels, the equalization signal EQa maintains a low level and the sense amplifier activation signals Vna and Vpa also maintain active states.

When the signal φbra is at a high level and the signal φCHa is at a low level, the pulse signal φp2 is brought to a high level, the flip-flop 242 is reset and the sense amplifier activation signals Vpa and Vna are inactivated. When the equalization signal EQa is brought from a high level to a low level in accordance with the pulse signal φp2, the word line selecting operation activation signal φwla is brought to a high level for a prescribed period, so that an operation of selecting a new word line is carried out. In response to the rise of the word line selecting operation activation signal φwla, the flip-flop 242 is set after a lapse of a prescribed time, and the sense amplifier activation signals Vpa and Vna are activated. Thereafter the aforementioned operations are repeated. When the signal KEEP falls from a high level to a low level, the pulse generator 245 outputs a pulse signal having a prescribed time width, the flip-flop 242 is reset through the OR circuits 246 and 247, and the sense amplifier activation signals Vna and Vpa are inactivated.

In the fourth embodiment, a bit line isolation gate may be provided between each bit line pair and each sense amplifier to connect/isolate the bit line pair with/from the sense amplifier in response to activation/inactivation of the sense amplifier. In this case, activation/inactivation of a bit line isolation signal BLI may be controlled in accordance with the word line selecting operation activation signal φwla.

According to the fourth embodiment of the present invention, as hereinabove described, the array blocks are made drivable independently of each other while data is held in the sense amplifier in each array block, whereby each array block can be utilized as a cache and high-speed access is enabled.

[Embodiment 5]

Figure 39:
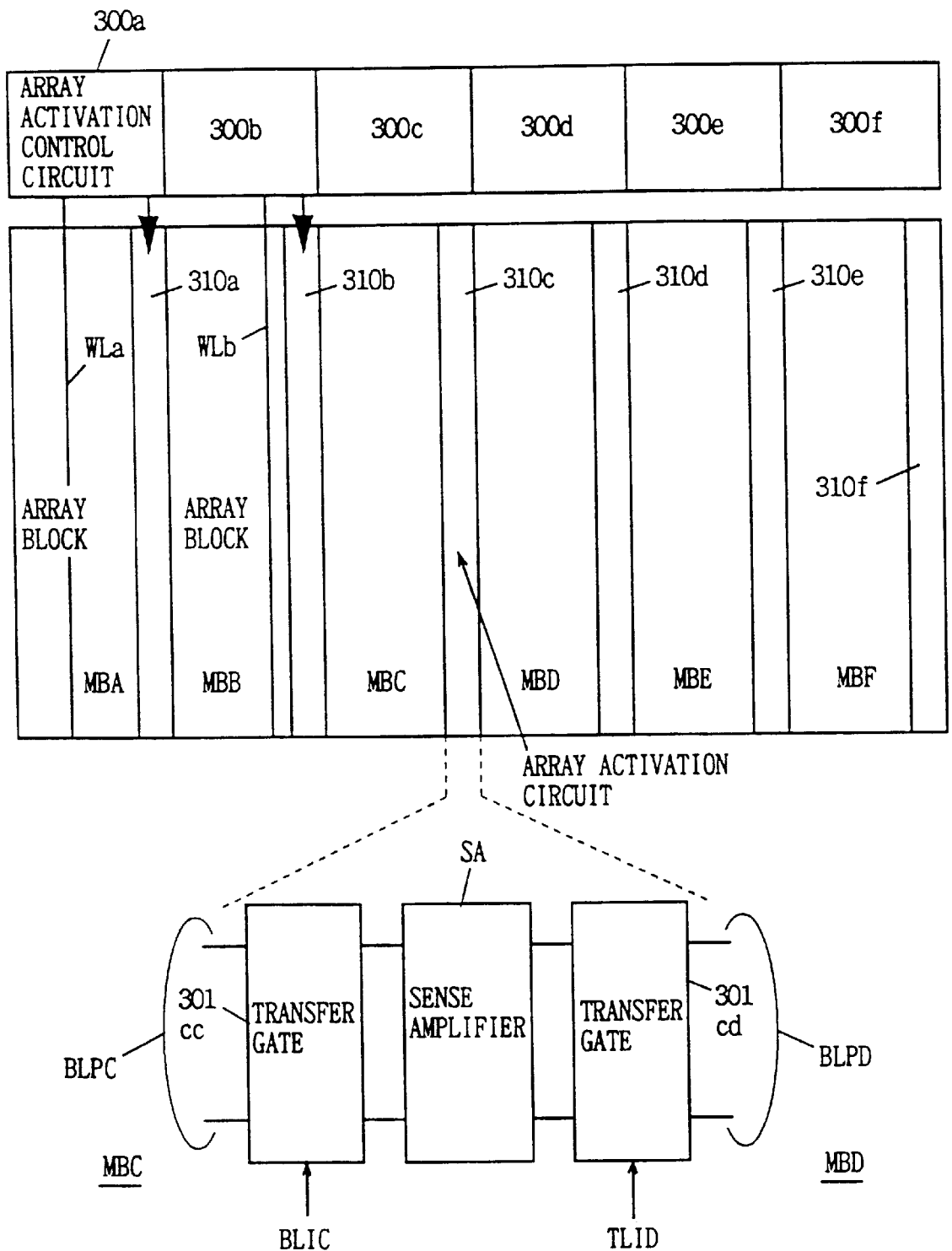

FIG. 39 illustrates the structure of an array part of a semiconductor memory device according to a fifth embodiment of the present invention. Referring to FIG. 39, the array of this semiconductor memory device is divided into a plurality of array blocks MBA to MBF. Array activation control circuits 300a to 300f which are operable independently of each other are arranged in correspondence to the array blocks MBA to MBF respectively. Further, array activation circuits 310a to 310e including sense amplifiers and equalization circuits are provided in correspondence to the array blocks MBA to MBF respectively. Each array activation circuit includes a sense amplifier SA which is provided for respective bit line pairs, and transfer gates 301 for connecting bit line pairs of adjacent array blocks respectively. FIG. 39 shows the structure of a part which is provided for bit line pairs BLPC and BLPD in an array activation circuit 310c between the array blocks MBC and MBD. The sense amplifier SA can be connected with the bit line pair BLPD of the array block MBD upon conduction of a transfer gate 301cd. In an ordinary operation, the sense amplifier SA is connected to the bit line pair BLPC of the array block MBC through a transfer gate 301cc.

Figure 40:
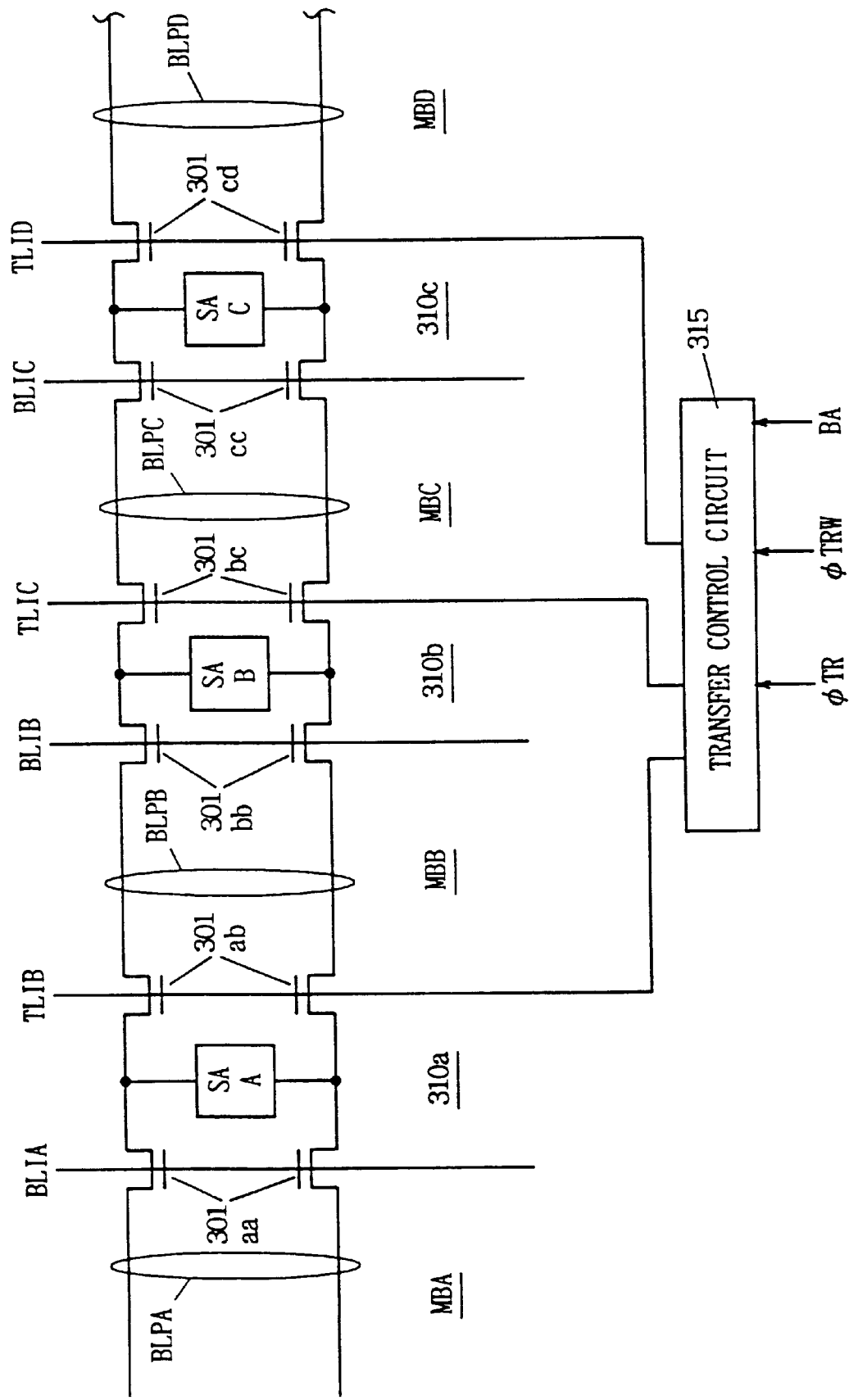
FIG. 40 more specifically illustrates the structure of array blocks shown in FIG. 39.

FIG. 40 illustrates the structure of the array activation circuits which are provided for the respective array blocks in an enlarged manner. As shown in FIG. 40, the array activation circuit 310a provided between the array blocks MBA and MBB includes a sense amplifier SAA which is connected to bit line pairs BLPA and BLPB of the array blocks MBA and MBB through transfer gates 301aa and 301ab respectively. The array activation circuit 310b includes a sense amplifier SAB which is connected to the bit line pairs BLPB and BLPC of the array blocks MBB and MBC through transfer gates 301bb and 301bc respectively.

Figure 41:
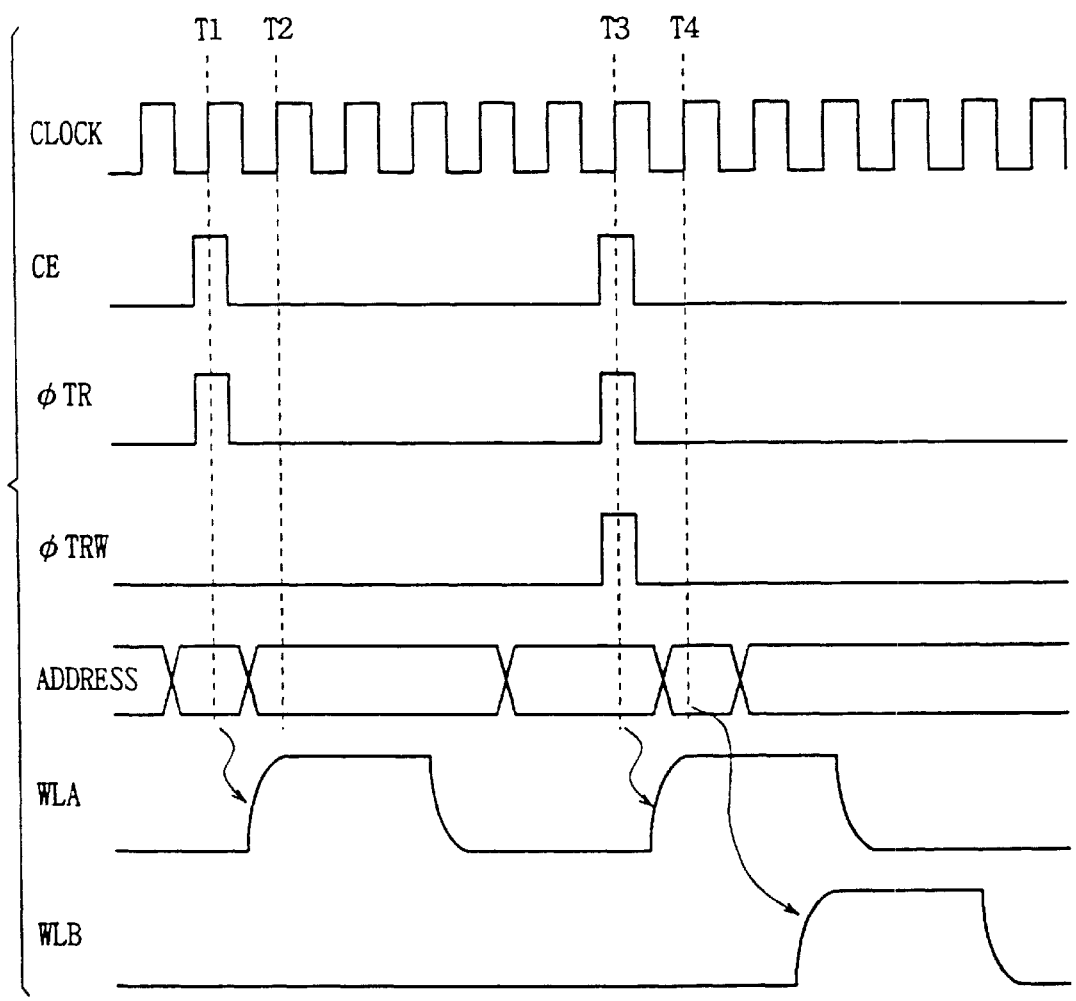
FIG. 41 is a signal waveform diagram representing operations of the semiconductor memory device shown in FIG. 39.

The array activation circuit 310c includes a sense amplifier SAC which is connected to the bit line pairs BLPC and BLPD of the array blocks MBC and MBD through transfer gates 301cc and 301cd respectively. Similar connection is made also as to the remaining array blocks. The transfer gates 301ab, 301bc, 301cd . . . are brought into conducting states under control of a transfer control circuit 315. Memory cell data of one row can be transferred between adjacent array blocks through the control of the transfer control circuit 315. The operations of the semiconductor memory device shown in FIGS. 39 and 40 are now described with reference to FIG. 41, which is an operation waveform diagram thereof.

This semiconductor memory device includes a transfer instruction signal φTR designating data transfer between the array blocks, and a write instruction signal φTRW writing data in a memory cell of the transfer destination array block.

At time T1, a chip enable signal CE is brought to a high level at the rising edge of a clock signal CLK, and a transfer signal φbr is activated and the write instruction signal φTRW is set at a low level. In this case, a word line WLA is selected in an array block MB#A which is addressed in accordance with an address signal ascertained at the time T1, so that selected memory cell data is read out. Upon activation of the transfer signal φTR, the transfer destination array block is designated in accordance with an address signal supplied in a next clock cycle T2. Data of a memory cell which is connected with the word line WLA in the array block addressed at the time T1 is transferred to the transfer destination array block. Then, the sense amplifier is activated in this transfer destination array block so that the data is held therein.

At a time T3, the chip enable signal CE is brought to a high level of an active state and both of the transfer signal φTR and the write instruction signal φTRW are brought to high levels, whereby the addressed word line WLA is selected in the array block MB#A in accordance with the address signal at the time T3, so that the data of the memory cell connected with the selected word line WLA is read and sensed, amplified and latched by the sense amplifier. A word line WLB is selected in the transfer destination array block in accordance with an address signal supplied in a next clock cycle T4 and the sense amplifier is then activated in the transfer destination array block, so that the data of the memory cell connected with the word line WLA is written in a memory cell connected with the selected word line WLB.

Figure 42:
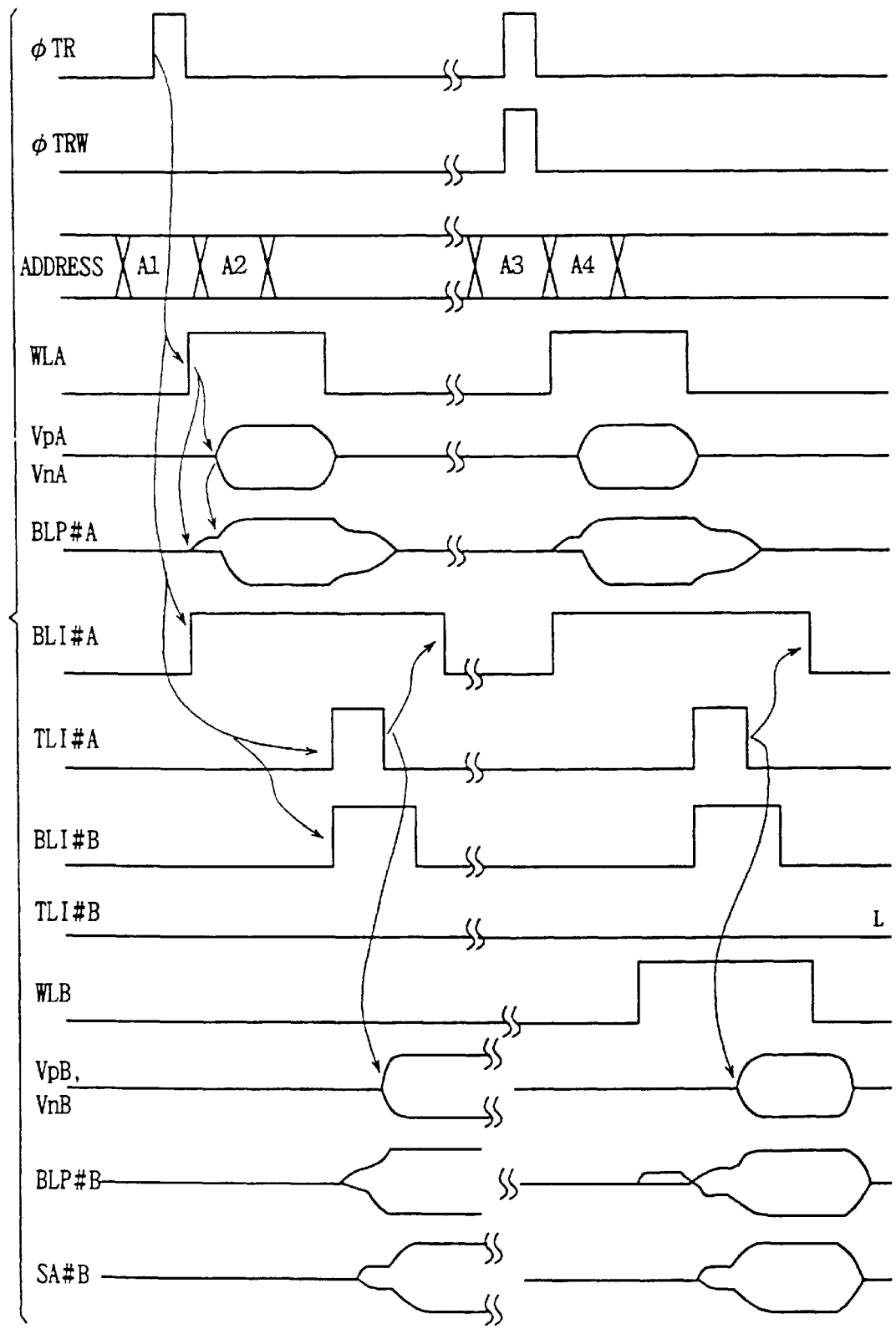
FIG. 42 illustrates waveforms of internal signals of the operation waveform diagram shown in FIG. 41 in more detail.

FIG. 42 illustrates the internal transfer operation of the semiconductor memory device according to the fifth embodiment of the present invention in more detail. This FIG. 34 represents a data transfer operation from the array block MB#A to the array block MB#B which is adjacent thereto. When only the transfer instruction signal φTR is in an active state, the word line WLA of the array block MB#A is selected in accordance with an address A1. At this time, a bit line isolation signal BLI#A is brought to a high level, the sense amplifier SA#A is connected with a bit line pair BLP#A, and the data of the memory cell connected with the word line WLA is transmitted to the sense amplifier SAA through the bit line pair BL#A. Then, sense amplifier activation signals VpA and VnA are activated so that data on the bit line pair BLP#A is amplified and latched.

Then, the word line WLA and the sense amplifier activation signals VpA and VnP are inactivated and thereafter a transfer instruction signal TLI#A is brought to a high level so that a bit line pair BLP#B of the array block MB#B is connected with the sense amplifier SA#A. An equalization signal EQ#B is at a low level, and the bit line pair BLP#B in an electrically floating state is charged and discharged by the data latched by sense nodes of the sense amplifier SA#A (and charges of the bit line pair BLP#A) so that its potential is slowly changed. In synchronization with transition of the transfer instruction signal TLI#A to a high level, a bit line isolation signal BLI#B is also brought to a high level. Thus, the bit line pair BLP#B of the array block MB#B is connected to a sense amplifier SA#B, so that the potential of its sense nodes is changed. Then, sense amplifier activation signals VpB and VnB are activated so that the sense amplifier SA#B operates to differentially amplify the potential of the bit line pair BLP#B.

The transfer instruction signal TLI#A is brought to a low level before activation of the sense amplifier SA#B, and the transfer gate 301ab is brought into an off state. In the array block MB#A, the sense nodes and the bit line pair are equalized in response to inactivation (low level) of the transfer instruction signal TLI#A. After completion of this equalization, the bit line isolation signal BLI#A is brought to a low level.

In the array block MB#B, the bit line isolation signal BLI#B is brought to a low level. At this time, the bit line pair BLP#B and the sense amplifier SA#B hold the amplified potentials thereof.

This array block MB#B may be structured so that the bit line pair BLP#B is equalized to an intermediate potential and only the sense amplifier SA#B holds the amplified data. This structure is readily implemented by connecting the equalization circuit to each bit line pair and arranging the transfer gate between the sense amplifier and the equalization circuit.

When both of the transfer instruction signal φTR and the write instruction signal φTRW are brought to high levels, the word line WLA is selected in the array block MB#A in accordance with address signals A3 and A4, and the sense amplifier SA#A senses and amplifies the memory cell data connected with the word line WLA. Also in the array block MB#B, the word line WLB is selected. When the transfer instruction signal TLI#A and the signal BLI#B are brought to high levels, charges held in the sense nodes of the sense amplifier SA#A of the array block MB#A and the bit line pair BLP#A are transmitted onto the bit line pair BLP#B of the array block MB#B.

The potential of the array block MB#A is charged and discharged to power supply and ground potential levels, and even if the word line WLB is selected in the array block MB#B and the selected memory cell data of the word line WLB is changed in accordance with the data transferred from the array block MB#A. Then, the sense amplifier SA#B is activated, and the data transferred to the array block MB#B is sensed and amplified and written in the memory cell connected with the word line WLB. After a lapse of a prescribed time, the sense amplifier SA#B is inactivated and then the bit line pair BLP#B and the sense nodes of the sense amplifier SA#B are equalized. At this time, the sense amplifier SA#B may sustainingly hold the amplified data.

Due to the aforementioned operation sequence, memory cell data of one row can be readily transferred between adjacent array blocks. When such operations are repeatedly executed, memory cell data of one row can be transferred from one array block to a plurality of array blocks, so that image processing such as duplication or painting out of pictures can be implemented at a high speed in picture data processing, for example.

Figure 43:
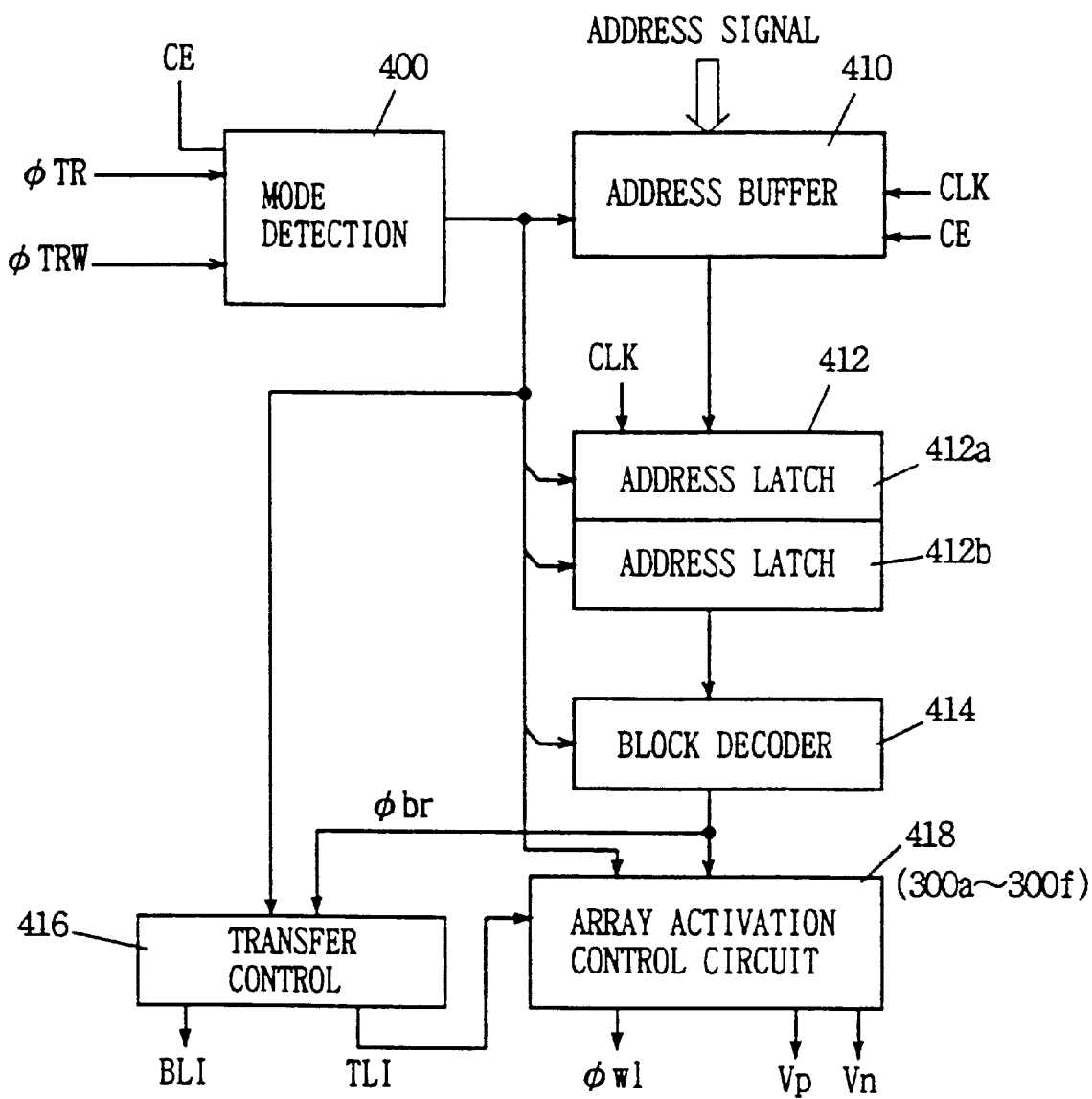
FIG. 43 schematically illustrates the structure of a control part employed in the fifth embodiment of the present invention.

FIG. 43 illustrates the structure of a control system implementing the operations of the semiconductor memory device according to the fifth embodiment of the present invention. Referring to FIG. 43, the control system includes a mode detector 400 which receives the transfer instruction signal φTR and the write instruction signal φTRW in response to the chip enable signal CE for detecting the designated mode, an address buffer 410 which incorporates the address signal in synchronization with the clock signal under control of the mode detection circuit 400, an address latch 412 which latches the address signal supplied from the address buffer 410 every clock cycle when a transfer instruction is detected by the mode detection circuit 400, a clock decoder 414 which decodes the address signal stored in the address latch 412, a transfer control circuit 416 (corresponding to the transfer control circuit 315 shown in FIG. 40) which outputs a bit line isolation signal BLI and a transfer instruction signal TLI in accordance with the block activation signal φbr from the block decoder 414 and a mode detection signal from the mode detection circuit 400, and an array activation control circuit 418 which activates the addressed array block in response to the block activation signal from the block decoder 414. The array activation control circuit 418 corresponds to the array activation control circuits 300a to 300f shown in FIG. 39.

The address latch 412 includes address latches 412a and 412b which latch two address signals supplied from the address buffer 410 in accordance with a transfer mode instruction signal from the mode detector 400. The address signals latched by the address latches 412a and 412b are transferred to X and Y decoders (not shown). In data transfer, data writing/reading may be inhibited. Alternatively, data writing/reading may be performed on an array block which is first addressed.

In accordance with the block activation signal from the block decoder 414, the transfer control circuit 416 brings the transfer instruction signal TLI provided for the array block designated by the block activation signal into an active state of a high level. In transfer mode detection by the mode detector 400, the array activation control circuit 418 activates an equalization signal (not shown) in response to inactivation of the transfer instruction signal TLI from the transfer control circuit 416. The transfer control circuit 416 executes activation/inactivation of the bit line isolation signal BLI with respect to the block designated by the block activation signal φbr and an adjacent (or transfer destination) array block in accordance with the transfer mode detection signal from the mode detector 400.

The internal structures of the array activation control circuit 418 and the transfer control circuit 416 can be readily implemented through the structures of the control circuits shown in the first to third embodiments, although the same are not illustrated in detail. When a transfer mode is designated, the sense amplifier of the first array block may be inactivated and then the sense amplifier is activated in the adjacent (transfer destination) array block.

According to the fifth embodiment of the present invention, as hereinabove described, data of a word line of one row can be transferred between adjacent array blocks, whereby data duplication can be performed at a high speed so that filling (painting out processing) can be readily implemented in image processing, for example.

[Embodiment 6]

Figure 44:
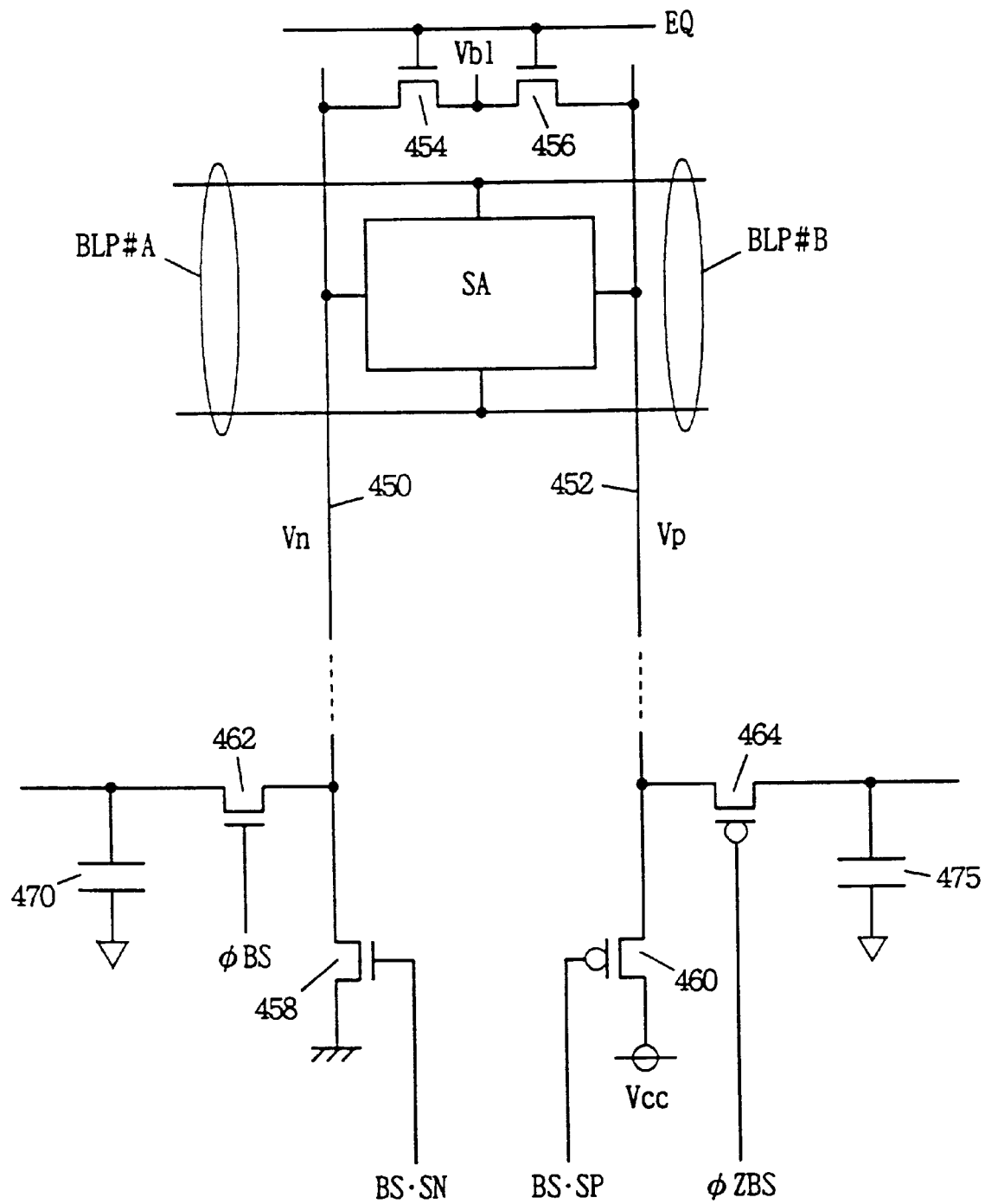
FIG. 44 illustrates the structure of a main part of a semiconductor memory device according to a sixth embodiment of the present invention.

FIG. 44 illustrates the structure of a principal part of a semiconductor memory device according to a sixth embodiment of the present invention. This FIG. 44 shows the structure of a sense amplifier SA arranged between array blocks. The arrangement of the array blocks is identical to that shown in FIG. 39. FIG. 44 shows no transfer gates for connecting bit line pairs BLP#A and BLP#B with the sense amplifier SA.

The sense amplifier SA is activated in response to sense amplifier activation signals Vn and Vp transmitted through sense amplifier activation signal lines 450 and 452 respectively. Transfer gates 454 and 456 formed by n-channel MOS transistors which conduct in response to an equalization signal EQ for transmitting a precharge potential Vb1 to the sense amplifier activation signal lines 450 and 452 respectively are arranged between the sense amplifier activation signal lines 450 and 452. The circuit part for equalizing the sense amplifier activation signal lines may further be provided with an equalization transistor for electrically short-circuiting the sense amplifier activation signal lines 450 and 452.

Sense amplifier activation transistors 458 and 460 which conduct in response to sense amplifier driving signals BS•SN and BS•SP respectively are provided for the sense amplifier activation signal lines 450 and 452 respectively. The sense amplifier activation transistor 458 couples the sense amplifier activation signal line 450 to the ground potential when made conductive. On the other hand, the sense amplifier activation transistor 460 couples the sense amplifier activation signal line 452 to a source potential Vcc (or a high voltage Vpp>Vcc) when made conductive. The sense amplifier driving signal BS•SN, which is an AND (logical product) signal of a block designation signal BS and a sense amplifier driving signal SN, is brought into an active state of a high level when these signals are activated. On the other hand, the signal BS•SP, which is an AND signal of the block selection signal BS and a sense amplifier activation signal SP, is brought into an active state of a low level when these signals are activated.

Figure 45:
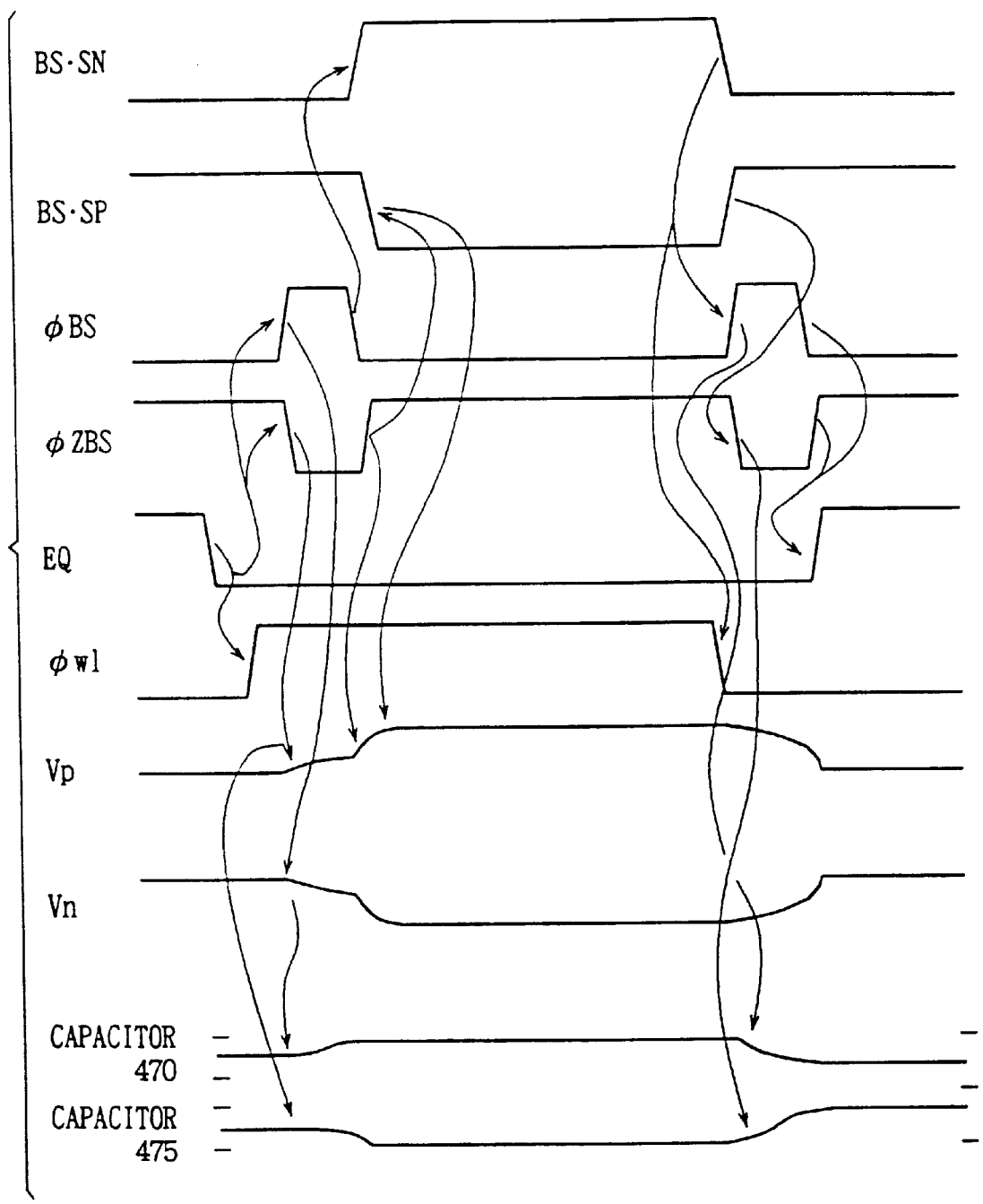
FIG. 45 is a signal waveform diagram representing operations of the semiconductor memory device shown in FIG. 44.

A transfer gate 462 formed by an n-channel MOS transistor which connects a first electrode of a capacitor 470 with the sense amplifier activation signal line 450 in response to a connection timing signal φBS is further arranged for the sense amplifier activation signal line 450. On the other hand, a transfer gate 464 formed by a p-channel MOS transistor which conducts upon activation of a connection timing signal φZBS for connecting the sense amplifier activation signal line 452 with a first electrode of a capacitor 475 is arranged for the sense amplifier activation signal line 452. The capacitors 470 and 475 are arranged in common for a plurality of array blocks (shown in FIG. 44). The connection timing signals φBS and φZBS are activated for a prescribed period before transition of the sense amplifier activation signals BS•SN and BS•SP from inactivation to activation, and also brought into active states for a prescribed period after transition of the sense amplifier activation signals BS•SN and BS•SP from activation to inactivation. The operations of the circuit shown in FIG. 44 are now described with reference to FIG. 45 which is an operation waveform diagram thereof.

In nonselection of the corresponding array block, the signal φBS is at a low level and the signal φZBS is at a high level, while both of the transfer gates 462 and 464 are in nonconducting states. The capacitors 470 and 475 are charged/discharged in a precedent cycle. The charge potential of the capacitor 470 is lower than an intermediate potential, while that of the capacitor 475 is rendered higher than the intermediate potential, as described later in detail.

When an array block is designated, the equalization signal EQ for the designated array block is brought from a high level to a low level in accordance with the block activation signal, and equalization of the sense amplifier activation signal lines 450 and 452 is stopped. The equalization signal EQ for the sense amplifier activation signal lines 450 and 452 may differ from that supplied to an equalize/precharge circuit which is provided for a bit line pair BLP. Namely, the equalization signal EQP for the sense amplifier activation signal lines shown in FIG. 44 may be brought into an active state of a high level only in inactivation of sense amplifiers.

When a prescribed period elapses after the equalization signal EQ is brought into the low level, a word line selecting operation activation signal φwl (not shown) is brought to a high level, so that a corresponding word line is selected in the addressed array block (when the word line is selected in the addressed array block). After a lapse of a prescribed time (after selected memory cell data is read on each bit line pair), the control timing signal φBS is brought to a high level for a prescribed period while the signal φZBS is brought to a low level for a prescribed time. Thus, the transfer gates 462 and 464 conduct and charges of the capacitors 470 and 475 are transmitted to the sense amplifier activation signal lines 450 and 452 respectively. Thus, the potential level of the sense amplifier activation signal Vn is reduced from the intermediate potential by the charges of the capacitor 470, while the potential of the sense amplifier activation signal Vp is increased from the intermediate potential by the charges from the capacitor 475. The sense amplifier activation signals Vn and Vp are activated by the charges from the capacitors 470 and 475, whereby the sense amplifier SA is activated to start its sensing operation.

Then, the timing signals φBS and φZBS are inactivated, the sense amplifier driving signals BS•SN and BS•SP are then activated, the sense amplifier activation transistors 458 and 460 conduct, and the sense amplifier activation signals Vn and Vp are brought to low and high levels respectively. Thus, the sense amplifier SA drives the potentials of the corresponding bit line pair BLP#A or BLP#B to the ground and power supply potential levels at a high speed. Upon activation of the sense amplifier SA, the amounts of the charges flowing from the sense amplifier activation signal line 450 to the ground potential and from the power supply potential (or a high voltage application node) to the sense amplifier activation signal line 452 can be reduced through the charges of the capacitors 470 and 475, thereby reducing current consumption. Since the sense amplifier SA is driven by the charges of the capacitors 470 and 475, the sense amplifier activation signals Vn and Vp are relatively slowly changed upon activation of the sense amplifier SA, so that the sense amplifier SA slowly performs a sense operation and the potentials of the corresponding bit line pair BLP#A (or BLP#B) can be reliably amplified.

When a prescribed period elapses after completion of the sensing operation, the word line selecting operation activation signal φwl is brought to a low level from the high level, while the sense amplifier driving signals BS•SN and BS•SP are also brought to low and high levels of inactive states respectively. Thus, the sense amplifier activation transistors 458 and 460 are brought into nonconducting states. In response to the inactivation of the sense amplifier driving signals BS•SN and BS•SP, the control timing signal φBS goes high for a prescribed period while the control timing signal φZBS is brought to a low level for a prescribed period. The equalization signal EQ still maintains the low level at this time. Therefore, the sense amplifier activation signals 450 and 452 are connected to the capacitors 470 and 475 through the transfer gates 462 and 464 respectively. Thus, a first electrode potential of the capacitor 470 is reduced while the potential of the capacitor 475 is increased by charges from the sense amplifier activation signal line 452. The charge potentials of the capacitors 470 and 475 are determined by ratios of respective capacitance values of the capacitors 470 and 475 to those of parasitic capacitances of the lines 450 and 452.

The charges of the capacitors 470 and 475 can be . utilized in a next cycle by storing the charges of the sense amplifier activation signal lines 450 and 452 in the capacitors 470 and 475, thereby reducing current consumption for driving the sense amplifier. When the control timing signals φBS and φZBS are inactivated, the equalization signal EQ is brought to a high level, the transfer gates 454 and 456 conduct, and the sense amplifier activation signal lines 450 and 452 are precharged at a precharge potential Vb1 and equalized.

Figure 46:
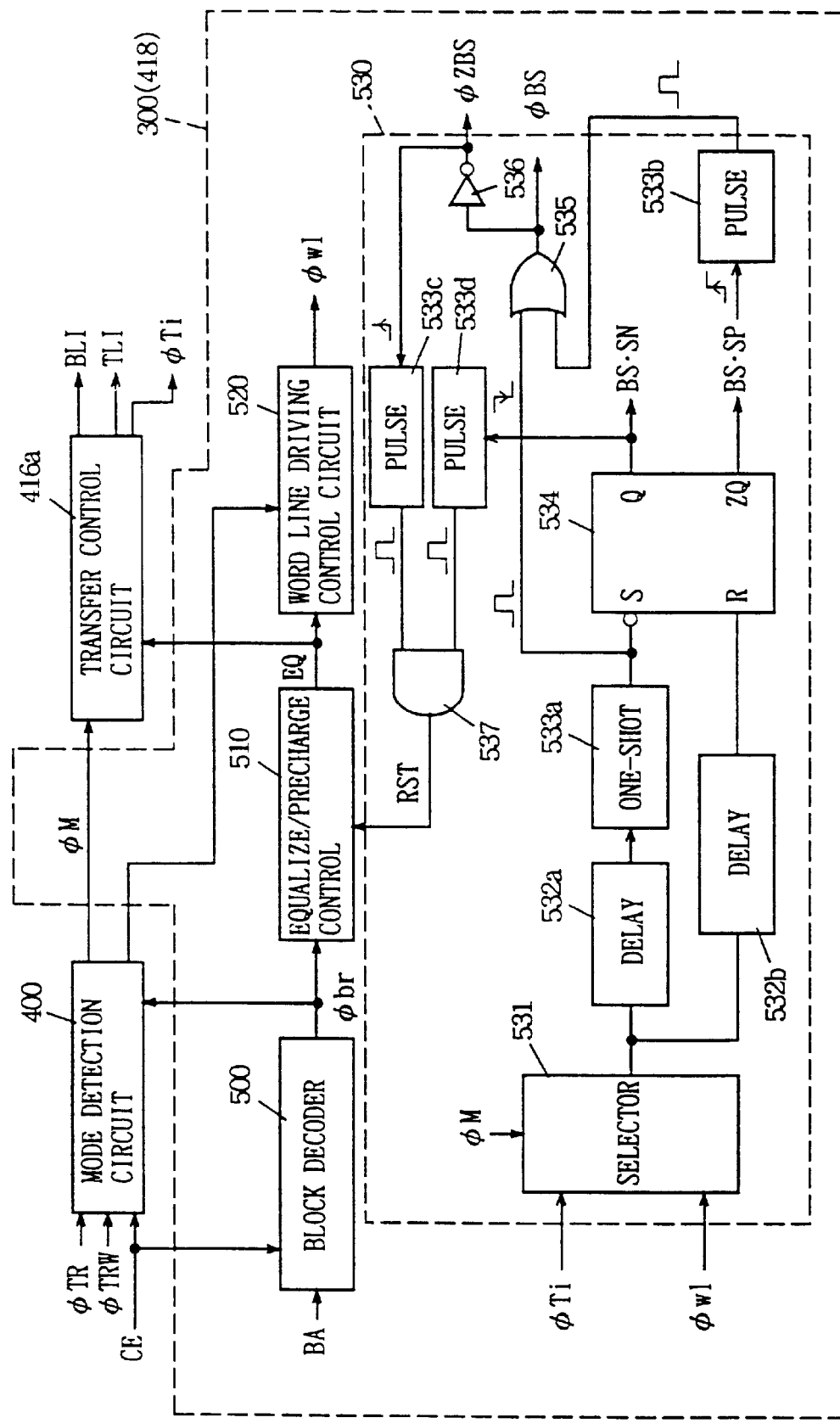
FIG. 46 illustrates the structure of a control part of the semiconductor memory device according to the sixth embodiment of the present invention.

FIG. 46 illustrates the structure of an array activation control circuit 300 for one array block of the semiconductor memory device according to the sixth embodiment of the present invention. Referring to FIG. 46, the array activation control circuit 300 (a circuit part provided for one array block of the array activation control circuit 418 shown in FIG. 43) includes a block decoder 500 which is activated upon activation of the chip enable signal CE for decoding a block address signal BA supplied from an address buffer (not shown) and outputting the block activation signal φbr, an equalize/precharge control circuit 510 which selectively inactivates the equalization signal EQ in accordance with the block activation signal φbr from the block decoder 500, and a word line driving control circuit 520 which outputs the word line selecting operation activation signal φwl in accordance with the equalization signal EQ from the equalize/precharge control circuit 510 and a mode detection signal from a mode detection circuit 400. When the mode detection signal from the mode detection circuit 400 indicates nonselection of a word line in the corresponding array block, the word line driving control circuit 520 maintains the word line selecting operation activation signal φwl in an inactive state of a low level.

Referring to FIG. 46, the mode detection circuit 400 is illustrated as generating a mode detection signal and a transfer instruction signal φM to the addressed circuit part in accordance with the block activation signal φbr from the block decoder 500. The mode detection circuit 400 is similar in structure to that shown in FIG. 39.

A sense amplifier control circuit 530 includes a selector 531 for selecting one of a transfer instruction signal φTi from a transfer control circuit 416a which in turn is described later and the word line selecting operation activation signal φwl in accordance with the transfer mode detection signal φM from the mode detection circuit 400, a delay circuit 532a which delays a signal supplied from the selector 531 for a prescribed time, a one-shot pulse generator 533a which generates a one-shot pulse in response to rise of an output signal from the delay circuit 532a, a delay circuit 532b which delays an output signal of the selector 531 for a prescribed time, and a set/reset flip-flop 534 which is set in response to fall of the pulse signal outputted from the one-shot pulse generation circuit 533a and reset in response to rise of an output signal of the delay circuit 532b. The sense amplifier driving signals BS•SN and BS•SP are outputted from a true output Q and a complementary output ZQ of the flip-flop 534 respectively.

The sense amplifier control circuit 530 further includes a pulse generation circuit 533b which generates a one-shot pulse signal in response to rise of the sense amplifier driving signal BS•SP outputted from the flip-flop 534, an OR circuit 535 which receives the pulse signals from the one-shot pulse generation circuits 533a and 533b, and an inverter 536 which receives an output signal from the OR circuit 535. The OR circuit 535 outputs the control timing signal φBS, while the inverter 536 outputs the control signal φZBS.

The sense amplifier control circuit 530 further includes a pulse generation circuit 533c which outputs a pulse signal having a prescribed time width in response to rise of the output signal of the inverter 536, a pulse generation circuit 533d which outputs a one-shot pulse signal in response to fall of the sense amplifier driving signal BS•SN, and an AND circuit 537 which receives the output signals of the pulse generation circuits 533c and 533d. When a reset signal RST from the AND circuit 537 is brought to a high level, the equalization signal EQ from the equalize/precharge control circuit 510 is brought to a high level of an active state from an inactive state (the equalization signal EQ is reset).

The transfer control circuit 416 selectively brings a bit line isolation signal BLI, a transfer gate connection signal TLI and an internal data transfer signal φTi into active/inactive states at prescribed timings (see the fifth embodiment) in response to the transfer mode detection signal φM from the mode detection circuit, in accordance with transition of the equalization signal EQ from activation to inactivation.

In the structure of the sense amplifier control circuit 530 shown in FIG. 46, the transfer mode detection signal φM is activated with respect to an array block which receives transfer data, while the signal φM is set in an inactive state similarly to an ordinary operation in an array block of a data transfer source. The selector 531 selects the internal transfer signal φTi when the transfer mode detection signal φM indicates a transfer mode, and selects the word line selecting operation activation signal φwl when the transfer mode detection signal φM is in an inactive state and indicates no data transfer.

The transfer instruction signal φTi is generated at a prescribed timing, to be activated after the array blocks are again isolated from each other after a lapse of a prescribed period from connection of bit line pairs between the array blocks.

The output signal of the selector 531 is brought to a high level, and the one-shot pulse generation circuit 533a outputs a one-shot pulse signal after a lapse of a prescribed period. Thus, the signals φBS and φZBS are brought to high and low levels respectively. In response to fall of the pulse signal from the one-shot pulse generation circuit 533a, the flip-flop 534 is set, the sense amplifier driving signals BS•SN and BS•SP are brought to high and low levels respectively, and the sense amplifier is activated. When an activation period for the sense amplifier completes, i.e., when the output signal of the delay circuit 532b rises to a high level, the flip-flop 534 is reset and the sense amplifier driving signals BS•SN and BS•SP are brought to low and high levels respectively. The pulse generation circuit 533b generates a one-shot pulse signal in response to the rise of the sense amplifier driving signal BS•SP. Thus, the control timing signal φBS is again brought to a high level and the control signal φZBS is brought to a low level.

The pulse generation circuit 533d generates a one-shot pulse signal in response to fall of the sense amplifier driving signal BS•SN from a high level to a low level, while the pulse generation circuit 533c generates a one-shot pulse signal in response to rise of the control timing signal φZBS. When both of the pulse signals outputted from the pulse generation circuits 533c and 533d go high, the reset signal RST and the equalization signal EQ are brought to high levels. Due to employment of the pulse generation circuits 533c and 533d, the equalization signal EQ can be prevented from being erroneously reset in transition of the sense amplifier from inactivation to activation, the sensing operation is reliably completed, and the equalization signal EQ can be driven to a high level after completion of charging of the capacitors.

Figure 47A:
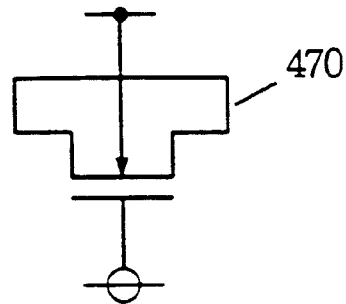
FIGS. 47A and 47B illustrate the structures of capacitors which are coupled to a sense amplifier activation signal Vn shown in FIG. 44.
Figure 47B:
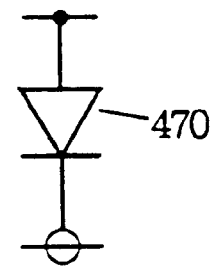

FIGS. 47A and 47B illustrate structures of the capacitor 470 shown in FIG. 40. Referring to FIG. 47A, the capacitor 470 is formed by a MOS capacitor. This MOS capacitor 470 has a gate which is connected to receive a source potential, and a drain, a source and a substrate which are coupled in common to the sense amplifier activation signal line 450. In the structure shown in FIG. 47B, the capacitor 470 is formed by a reverse-biased P-N diode. Namely, a cathode of this diode 470 is connected to receive a power supply potential, while its anode is coupled to the signal line 450.

Figure 48A:
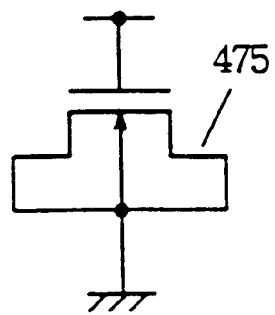
FIGS. 48A to 48C illustrate the structures of capacitors which are coupled to a sense amplifier activation signal Vp shown in FIG. 44.
Figure 48B:
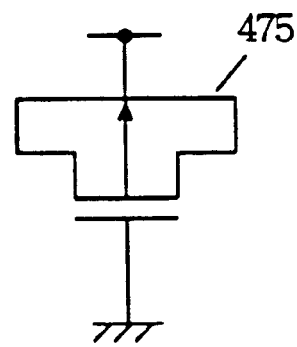
Figure 48C:
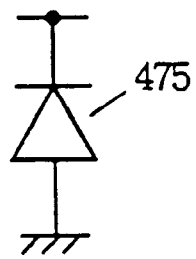

FIGS. 48A to 48C illustrate structures of the capacitor 475 shown in FIG. 44. The capacitor 475 shown in FIG. 48A is formed by an n-channel MOS transistor having a gate, a source and a substrate which are coupled to receive the ground potential, and a gate which is coupled to the sense amplifier activation signal line. The gate potential is higher than the source and drain potentials, whereby a channel is formed in the MOS transistor and serves as a second electrode of the capacitor 475. The capacitor 475 shown in FIG. 48B is formed by a p-channel MOS transistor having a gate which is connected to receive the ground potential, and a source, a drain and a substrate region which are coupled together to the sense amplifier activation signal line 452. In this structure, the gate potential is lower than the source and drain potentials, whereby a channel is formed and serves as a first electrode of the capacitor 475. Further, the capacitor 475 shown in FIG. 48C is formed by a reverse-biased PN diode. This diode has an anode which is connected to receive the ground potential, and a cathode which is coupled to the signal line 452.

Figure 49:
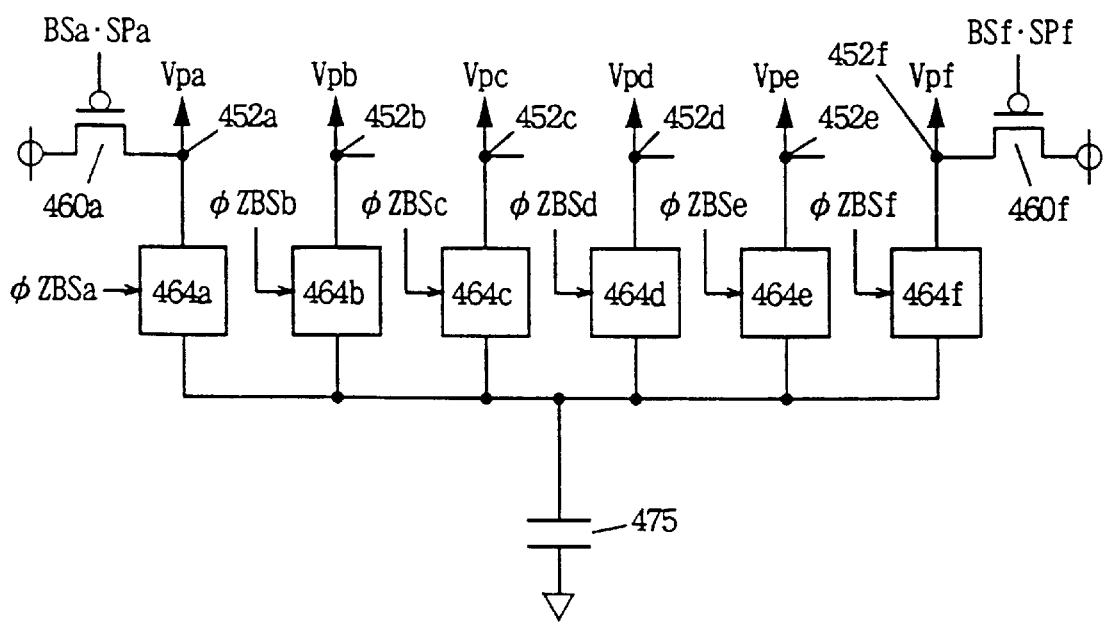
FIG. 49 schematically illustrates the overall connection arrangement of capacitors of the semiconductor memory device according to the sixth embodiment of the present invention.

FIG. 49 illustrates connection between sense amplifier activation signals Vpa to Vpf for array blocks MBA to MBF and the capacitor 475. Referring to FIG. 49, the first electrode of the capacitor 475 is connected with sense amplifier activation signal lines 452a to 452f through transfer gates (selectors) 464a to 464f respectively. The respective transfer gates 464a to 464f conduct in response to control timing signals φZBSa to φZBSf respectively. FIG. 49 representatively shows sense amplifier driving transistors 460a and 460f which are provided for the sense amplifier driving transistors 460a and 460f respectively. The sense amplifier driving transistors 460a and 460f conduct in response to sense amplifier driving signals BSa•SPa and BSf•SPf respectively. Due to the structure shown in FIG. 49, charges utilized for activating a sense amplifier driving signal in a selected array block in data transfer can be again utilized in activation of a sense amplifier of another array block, for reducing current consumption.

FIG. 50 illustrates an arrangement of capacitors. This FIG. 50 representatively shows sense amplifiers SA in a sense amplifier band SAB which is arranged between two array blocks MB#A and MB#B. The array blocks MB#A and MB#B each are provided with word line shunt regions WS. In these word line shunt regions WS, word lines of relatively high resistances which are made of polysilicon or the like are connected to a low-resistance conductors of aluminum, for example, which are formed on an upper layer thereof through contact holes CT. No bit lines are present in these regions. Capacitors Ca and Cb are formed and the transfer gates 462 and 464 are arranged in these regions. FIG. 50 shows the capacitors Ca and Cb only in the array block MB#A. When parallel electrode type capacitors utilizing interconnection layers which are above the word line shunting low-resistance conductors are used, or when P-N junctions are utilized, capacitors can be formed in the word line shunt regions in common for a plurality of array blocks MBA to MBF. When P-N junction capacitances are employed, N-wells (or P-wells) are formed in substrate regions in the word line shunt regions, and P-type impurity regions (or N-type impurity regions) are formed on the surfaces thereof. Capacitors which are common for all array blocks can be formed with no influences by the contact holes CT in the word line shunt regions.

Alternatively, the capacitors may not be provided in common for all array blocks, but capacitors for re-using charges of sense amplifier activation signals may be provided for the respective array blocks independently of each other.

[Application of Another Structure]

Figure 51:
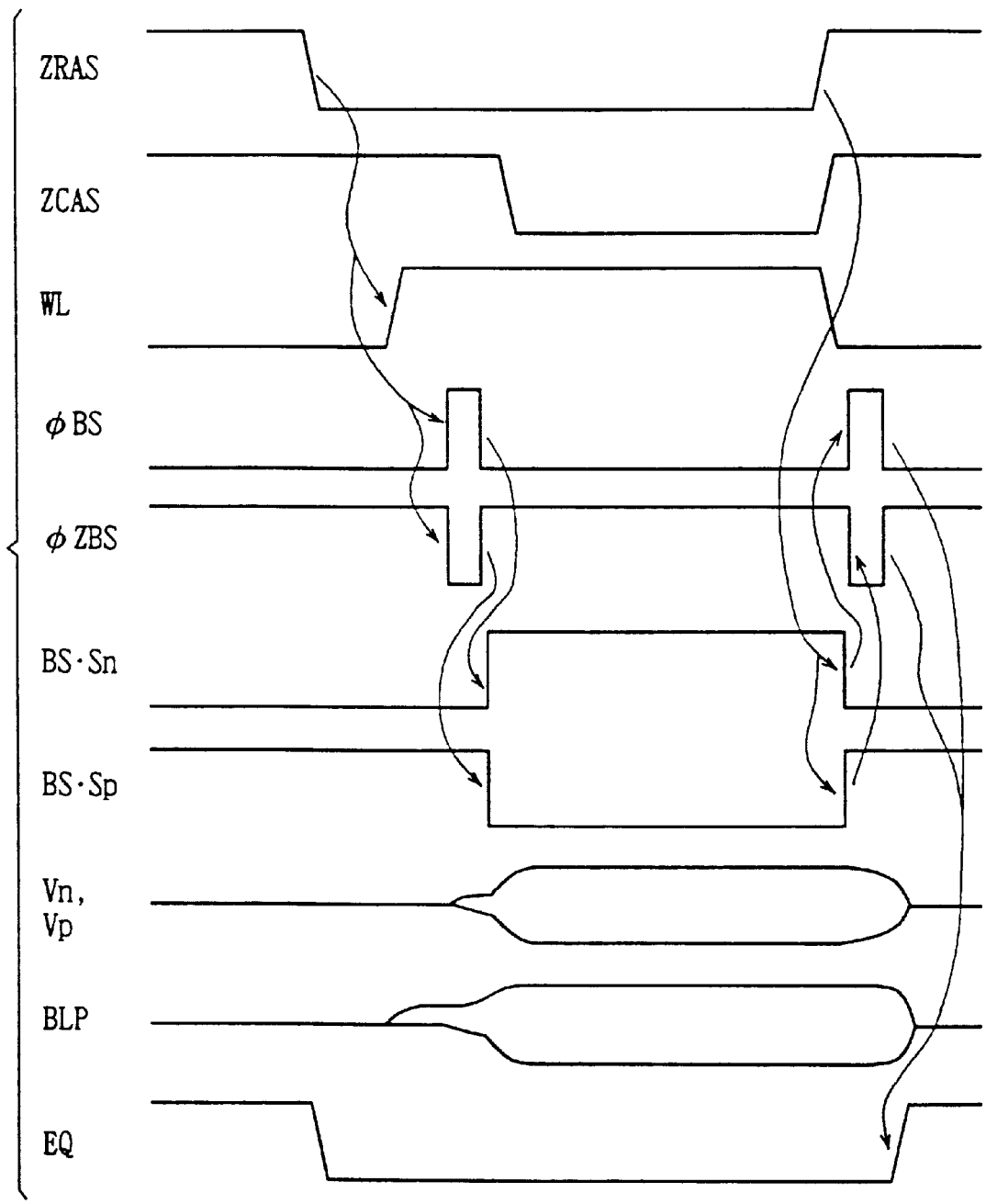
FIG. 51 is a waveform diagram representing operations of a modification of the sixth embodiment of the present invention.

FIG. 51 illustrates application of another semiconductor memory device according to the sixth embodiment of the present invention. This FIG. 51 shows operation waveforms of a standard DRAM. In the standard DRAM (dynamic random access memory), a memory cycle is started at the falling edge of an external row address strobe signal ZRAS, and a word line WL is selected in accordance with a currently supplied address signal, so that the potential of the selected word line WL is increased. After a lapse of a prescribed time, control timing signals φBS and φZBS are brought to high and low levels respectively. After the signals φBS and φZBS are inactivated, sense amplifier driving signals BS•Sn and BS•Sp are brought to high and low levels respectively, thereby activating a sense amplifier at a high speed. Thus, sense amplifier activation signals Vn and Vp are slowly increased in accordance with the signals φBS and φZBS and thereafter rise at high speed in response to the sense amplifier driving signals BS•Sn and BS•Sp. Thus, bit line potentials are differentially driven to power supply and ground potentials at a high speed.

When the row address strobe signal ZRAS rises from a low level to a high level, one memory cell cycle is completed. In response to the rise of the row address strobe signal ZRAS, the sense amplifier driving signals BS•Sn and BS•Sp are brought to low and high levels respectively. At this time, the control timing signals φBS and φZBS are brought to high and low levels respectively for a prescribed period in response to the inactivation of the sense amplifier driving signals BS•Sn and BS•Sp. After the timing signals φBS and φZBS are inactivated, an equalization signal EQ is brought to a high level.

Due to the aforementioned operation sequence, charges employed for sense amplifier activation can be re-used in a sense amplifier driving circuit part also in a standard DRAM, whereby a current consumption which is necessary for sense amplifier driving can be reduced.

According to the structure of the sixth embodiment of the present invention, as hereinabove described, the sense amplifier activation signal lines are connected to the capacitors, whereby charges consumed for sense amplifier activation can be reused so that current consumption in sense amplifier driving can be reduced.

[Embodiment 7]

Figure 52:
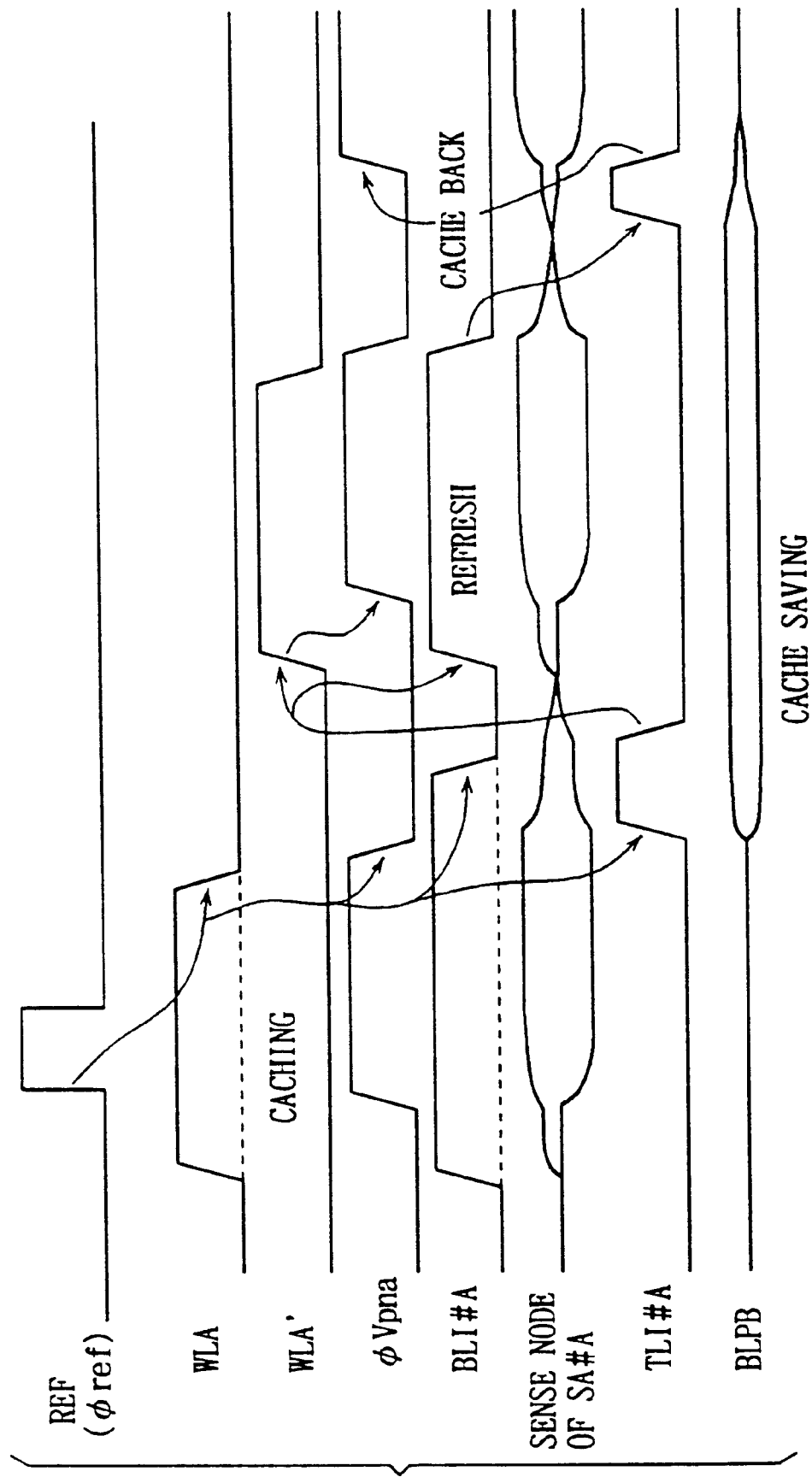
FIG. 52 is a signal waveform diagram representing operations of a semiconductor memory device according to a seventh embodiment of the present invention.

FIG. 52 is a waveform diagram representing operations of a semiconductor memory device according to a seventh embodiment of the present invention. The semiconductor memory device employed in the seventh embodiment has an array structure which is similar to that shown in FIG. 39. Namely, adjacent array blocks are interconnected with each other through a transfer gate 301ab. A sense amplifier which is provided in an array block MB#A is connected to a bit line pair of an adjacent array block MB#B in accordance with a transfer instruction signal TLI#A. With reference to FIGS. 52 and 39, the operations of the semiconductor device according to the seventh embodiment of the present invention are now described.

In the array block MB#A (any one of MBA to MBF), a sense amplifier SA#A is in an active state and holds memory cell data of one row. While a word line WLA is also in an active state in FIG. 52, this word line WLA may be in an inactive state, as shown by a broken line in FIG. 52.

Consider that a refresh instruction signal REF or an internal refresh instruction signal φREF is supplied from the exterior of the device to designate a refresh operation for the array block MB#A in this state. The data held by the sense amplifier SA#A at its sense nodes must not be erased by the refreshing. In this state, the selected word line WLA is brought into a nonselected state, while a sense amplifier activation signal φVpna (including Vpa and Vna) is inactivated. After the sense amplifier activation signal φVpna is inactivated, the transfer instruction signal TLI#A is activated for a prescribed period, a bit line pair BLPA (not shown in FIG. 52) and the sense nodes of the sense amplifier SA#A are connected to a bit line pair BLPB of the adjacent array block MB#B so that charges held in the sense nodes of the sense amplifier SA#A are transmitted to the bit line pair BLPB of the adjacent array block MB#B to change the potential of the bit line pair BLPB.

When the transfer instruction signal TLI#A is inactivated and the array block MB#A is again isolated from the array block MB#B, a word line WLA' is selected in accordance with a refresh address signal which is described later and a bit line isolation signal BL#A is brought to a high level substantially at the same time in the array block MB#A, so that data of a memory cell which is connected to the word line WLA' corresponding to the refresh row is transmitted to the sense node of the sense amplifier SA#A. Then, the sense amplifier activation signal φVpna is activated so that data of the memory cell connected with the word line WLA' is sensed and amplified and the amplified data is written in the memory cell which is connected with the word line WLA'. Thus, the data of the memory cell which is connected with the word line WLA' corresponding to the refresh row is refreshed.

When the refresh cycle is completed, i.e., when the word line WLA' is brought to a nonselected state, the sense amplifier activation signal φVpna is inactivated and the bit line isolation signal BLI#A is brought to a low level, the transfer instruction signal TLI#A is then brought to a high level for a prescribed period. Thus, the data saved in the adjacent array block MB#B is again transmitted to the sense nodes of the sense amplifier SA#A of the array block MB#A. At this time, charges held in the sense nodes of the sense amplifier SA#A are simply transmitted to the bit line pair BLPB and again transferred to the sense amplifier SA#A, and hence the potential of the sense nodes of the sense amplifier SA#A is sufficiently readily changed from a precharged potential.

Thereafter the transfer instruction signal TLI#A is inactivated, the sense amplifier activation signal φVpna is activated, the sense node potential of the sense amplifier SA#A is amplified, and the data saved in the array block MB#B is again amplified and held in the sense nodes of the sense amplifier SA#A. Thus, the data (cache data) held at the sense nodes of the sense amplifier SA#A is again cached back (restored).

In the array block MB#B, the bit line pair BLPB is brought into an electrically floating state when the transfer instruction signal TLI#A is first activated, and equalized and precharged after the transfer instruction signal TLI#A is finally activated again for a prescribed period.

Figure 53:
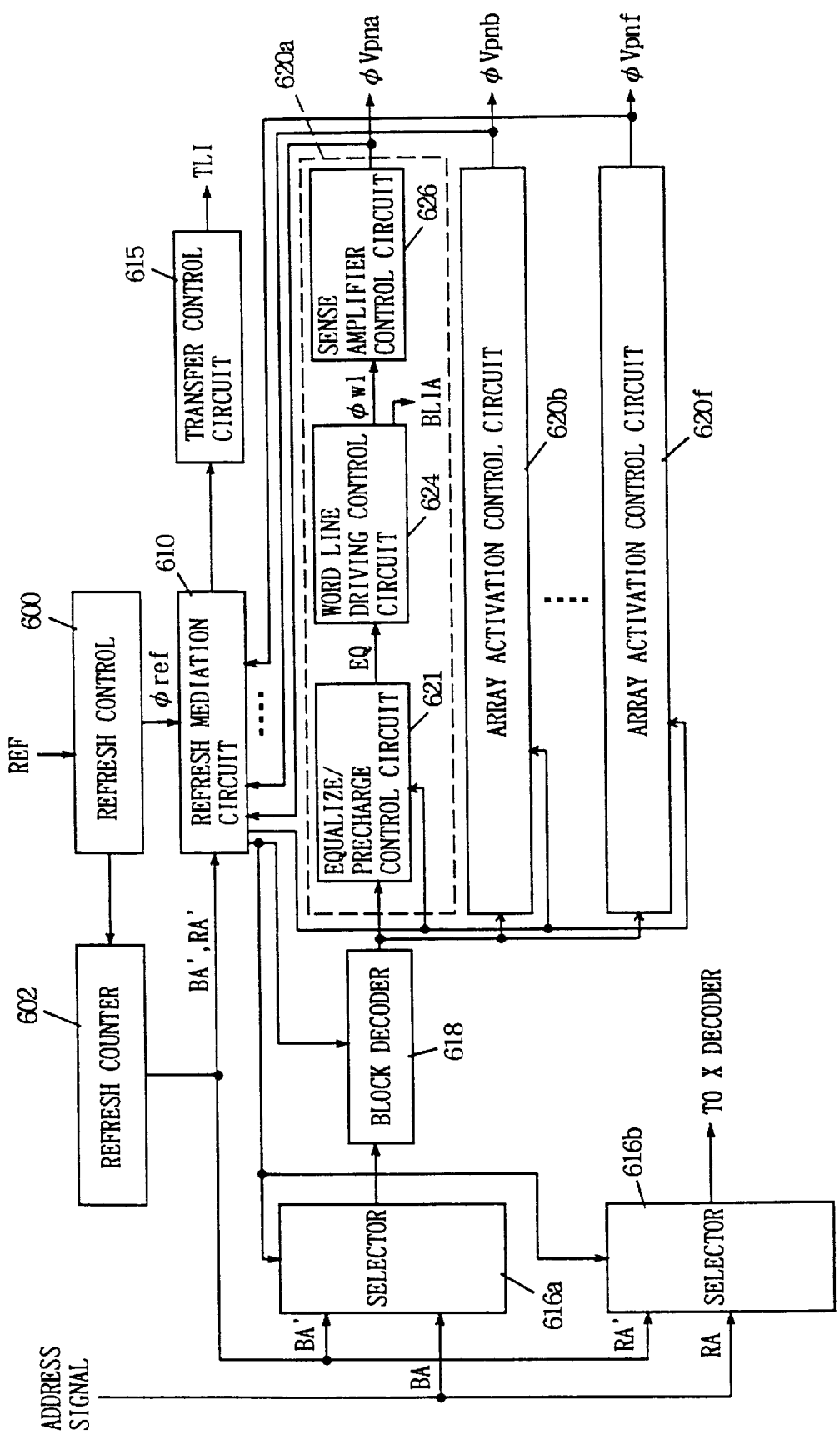
FIG. 53 illustrates the structure of a control part of the semiconductor memory device according to the seventh embodiment of the present invention.

FIG. 53 illustrates the structure of a control part of the semiconductor memory device according to the seventh embodiment of the present invention. Referring to FIG. 53, the control part of the semiconductor memory device according to the seventh embodiment of the present invention includes a refresh control circuit 600 which outputs the refresh instruction signal φref in response to the externally supplied refresh instruction signal REF, and a refresh counter 602 which outputs a refresh address indicating a refresh row in accordance with the refresh instruction signal from the refresh control circuit 600. The count value of the refresh counter 602 is incremented upon completion of the refreshing. This refresh counter 602 outputs a block address BA' designating an array block and a row address signal RA' designating a word line in the array block.

This control part further includes array activation control circuits 620a to 620f which are provided in correspondence to the array blocks MBA to MBF. The array activation control circuits 620a to 620f are identical in structure to each other, and FIG. 53 shows only the structure of the array activation control circuit 620a. The array activation control circuit 620a includes an equalize/precharge control circuit 621 which is activated in response to a block activation signal from a block decoder 618 for controlling an equalize/precharge operation of the array block, a word line driving control circuit 624 which outputs a word line selecting operation activation signal φwl and a bit line isolation signal BLIA in response to change of an equalize instruction signal from the equalize/precharge control circuit 621, and a sense amplifier control circuit 626 which outputs a sense amplifier activation signal in response to the word line selecting operation activation signal φwl from the word line driving control circuit 624. The sense amplifier control circuit 626 outputs the sense amplifier activation signal φVpna. The array activation control circuits 620b to 620f output sense amplifier activation signals φVpnb to φVpnf respectively.

The control part further includes a refresh mediation circuit 610 which receives the sense amplifier activation signals φVpna to φVpnf from the array activation control circuits 620a to 620f and the refresh instruction signal φRED from the refresh control circuit 600 and performs mediation on data transfer required for refresh operations, and a transfer control circuit 615 which outputs a transfer instruction signal TLI in accordance with an output signal of the refresh mediation circuit 610.

The control part of the semiconductor memory device further includes a selector 616a which selects one of a refresh block address signal BA' from the refresh counter 620 and a block address signal BA included in an externally supplied address signal and supplies the selected one to the block decoder 618, and another selector 616b which selects one of a refresh row address signal RA' supplied from the refresh circuit 602 and a row address signal RA included in the externally supplied address signal and supplies the selected one to an X decoder (not shown) under control of the refresh mediation circuit 610.

The refresh mediation circuit 610 monitors the states of the sense amplifier activation signals φVpna to φVpnf which are outputted from the array activation control circuits 620a to 620f, thereby regularly monitoring which sense amplifier activation signal is in an active state. When the refresh instruction signal φref is supplied, the refresh mediation circuit 610 identifies whether or not the sense amplifier activation signal φVpn in the array block designated by the refresh block address signal BA' is in an active state in accordance with the refresh block address signal BA' from the refresh counter 602.

When the sense amplifier activation signal φVpn is in an inactive state in the array block which in turn is designated by the refresh block address signal BA', the refresh mediation circuit 610 sets the selectors 616a and 616b in states respectively selecting the refresh block and row address signals BA' and RA' from the refresh counter 602, and then activates the block decoder 618. Thus, a word line corresponding to the refresh row address signal RA' is selected in the array block designated by the refresh block address signal BA', and data of a memory cell which is connected with the word line corresponding to the refresh row address is refreshed.

When any of the sense amplifier activation signals φVpna to φVpnf is in an active state when the refresh instruction signal φref is supplied from the refresh control circuit 600, the refresh mediation circuit 610 identifies whether or not the sense amplifier activation signal φVpn for the array block designated by the refresh block address signal BA' supplied from the refresh counter 602 is in an active state. When the sense amplifier activation signal for the array block designated by the refresh block address BA' is in an active state, the refresh mediation circuit 610 maintains the block decoder 618 in an inactive state, brings the equalization signal from the equalize/precharge control circuit 621 to a high level, brings the selected word line into a nonselected state and inactivates the sense amplifier activation signal from the sense amplifier control circuit 626.

FIG. 53 shows no control paths from the refresh mediation circuit 610 to the word line driving control circuit 624 and the sense amplifier control circuit 626. The refresh mediation circuit 610 may simply supply reset signals to the word line driving control circuit 624 and the sense amplifier control circuit 626.

The refresh mediation circuit 610 inactivates the active sense amplifier activation signal φVpn, and thereafter supplies the transfer control circuit 615 with a signal instructing data transfer in accordance with the block address signal BA'. Thus, the transfer control circuit 615 activates the transfer instruction signal TLI (TLI#A) provided for the array block MB#B designated by the refresh block address signal BA' for a prescribed period. When the transfer instruction signal TLI (TLI#A) from the transfer control circuit 615 is inactivated, the refresh mediation circuit 610 activates the block decoder 618. The selectors 616a and 616b are set in states of selecting the refresh block address signal BA' and the refresh row address signal RA' in response to the refresh instruction signal φref, under control of the refresh mediation circuit 610. Thus, the word line designated by the refresh row address signal RA' is selected in the array block MB#A, and thereafter the sense amplifier activation signal φVpn is activated to refresh the data of the memory cell which is connected to the word line designated by the refresh row address.

When transition of the sense amplifier activation signal from activation to inactivation is detected, the refresh mediation circuit 610 supplies an instruction to the transfer control circuit 615 and activates the transfer instruction signal TLI (TLI#A) for a prescribed period again to bring the transfer gate provided in the array block MB#A into a conducting state. Thus, the data from the array block MB#B is returned to the array block MB#A again. When the transfer instruction signal TLI from the transfer control circuit 615 is inactivated, the refresh mediation circuit 510 activates the sense amplifier activation signal φVpn for the array block MB#A again.

When the sense amplifier activation signal φVpn is in an active state in the array block designated by the refresh block address signal BA', the refresh mediation circuit 610 controls the equalize/precharge control circuit 621 of the adjacent array block MB#B, and brings the equalization signal EQ to a low level. At this time, a word line selecting operation in the adjacent array block is inhibited. For this structure, the refresh mediation circuit 610 may brings only the equalization signal EQ of the adjacent array block MB#B to the low level and inhibits the word line selecting operation therein in response to the refresh instruction.

In the structure shown in FIG. 53, the adjacent array block transfers data to an array block which is adjacent rightward in the horizontal direction in FIG. 39. When the rightmost array block MBF performs refreshing, data transfer (saving of cache data) is performed toward the array block MBE which is adjacent to the array block MBF.

When the refresh operation is completed, the refresh control circuit 500 increments the count value of the refresh counter 602 by 1, while inactivating the refresh instruction signal φref. The refresh arbitration circuit 610 sets the selectors 616a and 616b in states selecting the externally supplied address signals BA and RA in response to the inactivation of the refresh instruction signal φref. In this state, the block decoder 618 is activated upon activation of a chip enable signal CE (not shown).

According to the seventh embodiment of the present invention, as hereinabove described, the data currently latched by a sense amplifier is saved to an adjacent array block when the array block including the sense amplifier is to be refreshed, whereby the refresh can be performed without damaging the data held in the sense amplifier.

When refreshing is performed in one array block, a sense amplifier may be activated in the saving destination array block so that access is made to the sense amplifier. Address conversion (block address conversion) can be performed in saving for refreshing.

In this case, the refreshing and external access can be simultaneously performed in a parallel manner by arranging the selectors 616a and 616b in correspondence to the array blocks. When only the selector designated by the refresh block address signal BA' is set in a state of selecting the refresh block address signal and the refresh row address signal, the array blocks can be driven independently of each other, whereby the refreshing and the external access can be performed in parallel with each other.

According to the structure of the seventh embodiment of the present invention, further, charges stored in the sense nodes of the sense amplifier SA#A are simply transmitted to the bit line pair BLPB of the adjacent array block MB#B in data transfer from the array block MB#A to the adjacent array block MB#B, and no current is consumed since the charges are merely dispersed.

[Embodiment 8]

FIG. 54 schematically illustrates the overall structure of a semiconductor memory device according to an embodiment 8 of the present invention. Referring to FIG. 54, the semiconductor memory device includes a memory array 1600 including a plurality of array blocks Be to Be to Be to B44 which are arranged in the form of a matrix, an input conversion part 1602 for converting an externally supplied address input and forming an internal address signal, block decoders 1603x and 1603y for driving one of the array blocks Be to B44 of the memory array 1600 to a selected state in accordance with the internal address signal converted by the input conversion part 1602, and an instruction decoding part 1604 for decoding a supplied instruction, forming a signal deciding an address conversion instruction in the input conversion part 1602 and its mode and supplying the same to the input conversion part 1602.

Similarly to the aforementioned embodiments, the array blocks Be to B44 can be driven to selected/nonselected states independently of each other. While it is not particularly necessary to arrange these array blocks Be to B44 in the form of a matrix, this embodiment is structured utilizing a plurality of memory mats which are arranged in the form of a matrix in a general DRAM (the arrangement of each array block of this memory array is described later in detail).

In the memory array 1600, each of the array blocks Be to B44 is selected by one of row block specifying signals R1 to R4 and column block specifying signals C1 to C4. While these block specifying signals R1 to R4 and C1 to C4 correspond to address signals of plural bits, each block specifying signal is indicated by a single signal, for simplifying the explanation.

The instruction decoding part 1604 determines whether or not the address conversion must be performed in the input conversion part 1602 in accordance with a supplied instruction, and converts an input address signal which is supplied to the input conversion part 1602, for supply to the block decoders 1603x and 1603y if the determination is of yes. This input conversion part 1602 performs address conversion only on an array block address specifying an array block, with no conversion on an address signal for specifying a memory cell in the interior of the array block. Therefore, FIG. 54 illustrates only a structure for the array block address for specifying the array block.

Figures 55A, 55B, 55C:
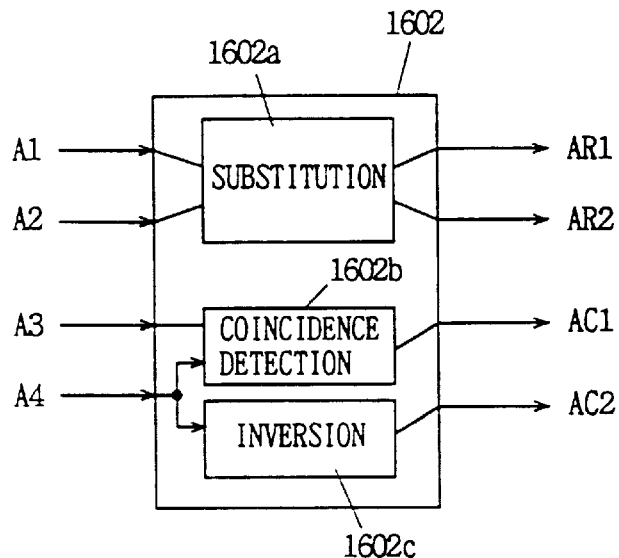
FIG. 55A illustrates the structure of an input conversion part shown in FIG. 54, and FIGS. 55B and 55C illustrate the operations of the input conversion part.

FIG. 55A illustrates an exemplary structure of the input conversion part 1602 shown in FIG. 54. Referring to FIG. 55A, the input conversion part 1602 includes a substitution circuit 1602a which receives address bits A1 and A2 specifying a row array block and interchanges the bit positions thereof for outputting internal address signal bits AR1 and AR2, a coincidence detection circuit 1602 which receives address bits A3 and A4 specifying a column block and detects coincidence of the logics thereof, and an inversion circuit 1602c which outputs the address bit A4 while inverting its logic. The coincidence detection circuit 1602b outputs an internal address bit AC1, and the inversion circuit 1602c outputs an internal address bit AC2. The internal address bits AR1 and AR2 are supplied to the block decoder 1603x shown in FIG. 54, while the internal address bits AC1 and AC2 are supplied to the block decoder 1603y shown in FIG. 54.

The processing functions of the substitution circuit 1602a, the coincidence detection circuit 1602b and the inversion circuit 1602c are specified by a decoded signal from the instruction decoding part 1604. Namely, the address conversion function shown in FIG. 55A is executed only when the instruction decoding part 1604 commands address conversion. The operations of the input conversion part 1602 are now described with reference to tables shown in FIGS. 55B and 55C.

With reference to the table shown in FIG. 55B, the operations of the substitution circuit 1602a are now described. When the address bits A1 and A2 are (A1, A2)=(0, 0), (0, 1), (1, 0) and (1, 1), the row array block specifying signals R1, R2, R3 and R4 are selected respectively. The substitution circuit 1602a changes the bit positions of the address bits A1 and A1 when activated. As shown in FIG. 55B, therefore, the bit positions of the address bits (A1, A2) are converted so that the internal address signal bits AR1 and AR2 are outputted. Even if the bit positions are converted in the substitution circuit 602a when the address bits A1 and A2, (A1, A2), are (0, 0) and (1, 1), therefore, the block specifying signals R1 and R4 which are brought to selected states remain unchanged. When the address bits A1 and A2 are (0, 1) and (1, 0) and the row array block specifying signals R2 and R3 are selected, on the other hand, the row array block specifying signals R3 and R2 are selected due to conversion.

With reference to FIG. 55C, conversion modes of the address bits A3 and A4 are now described. It is assumed here that the column block specifying signals C1, C2, C3 and C4 are selected when the address bits (A3, A4) are (0, 0), (0, 1), (1, 0) and (1, 1) respectively. The coincidence detection circuit 1602b outputs a high-level ("1") signal when the address bits A3 and A4 coincide in logic with each other. Therefore, the internal address bit AC1 is "1" when the address bits (A3, A4) are (0, 0) and (1, 1). On the other hand, the inversion circuit 1602c inverts the address bit A4, and hence the internal address signal bit AC2 is "1" and "0" when the address bits (A3, A4) are (0, 0) and (1, 1) respectively. When the address bits A3 and A4 bring the column array block specifying signals C1, C2, C3 and C4 to selected states, therefore, the column array block specifying signals C4, C1, C2 and C3 are selected due to the conversion function of the input conversion part 1602.

Consider that the array block B11 is selected, for example. In this case, the externally supplied address signal bits A1, A2, A3 and A4 are 0, 0, 0 and 0 (refer to FIGS. 55B and 55C). When the address signal bits are converted by the input conversion part 1602, the internal address signal bits AR1, AR2, AC1 and AC2 are 0, 0, 1 and 1 respectively. Therefore, the row array block specifying signal R1 and the column array block specifying signal C4 are selected, so that the array block B41 is selected. Thus, the array block B41, which is different from the array block B11 specified by the external address signal bits A1 to A4, is selected.

An access operation to the semiconductor memory device through the address conversion function is now described with reference to a waveform diagram shown in FIG. 56.

Consider that a word line WL1 (corresponding to one page) is selected in one array block Ba (the array block B11 shown in FIG. 54, for example) so that an access operation to a memory cell which is connected with the word line WL1 is performed. In this case, output data Q is outputted after a lapse of a prescribed time from selection of the word line WL1. Consider an operation of accessing the memory cells which are connected to the word line WL1 in a page mode and then accessing a word line WL2 which is different from the word line WL1 in the page mode. When address conversion is performed in the input conversion part 1602, another array block Bb is selected even if address bits specifying the array block Ba are supplied, so that the array block Bb (the array block B41 shown in FIG. 54, for example) is selected and the word line WL2 is selected in this selected array block Bb. Thus, it is possible to continuously access the array block Bb at a high speed for selecting the word line WL2 without a time period called a RAS precharge time tRP in general.

Figure 56:
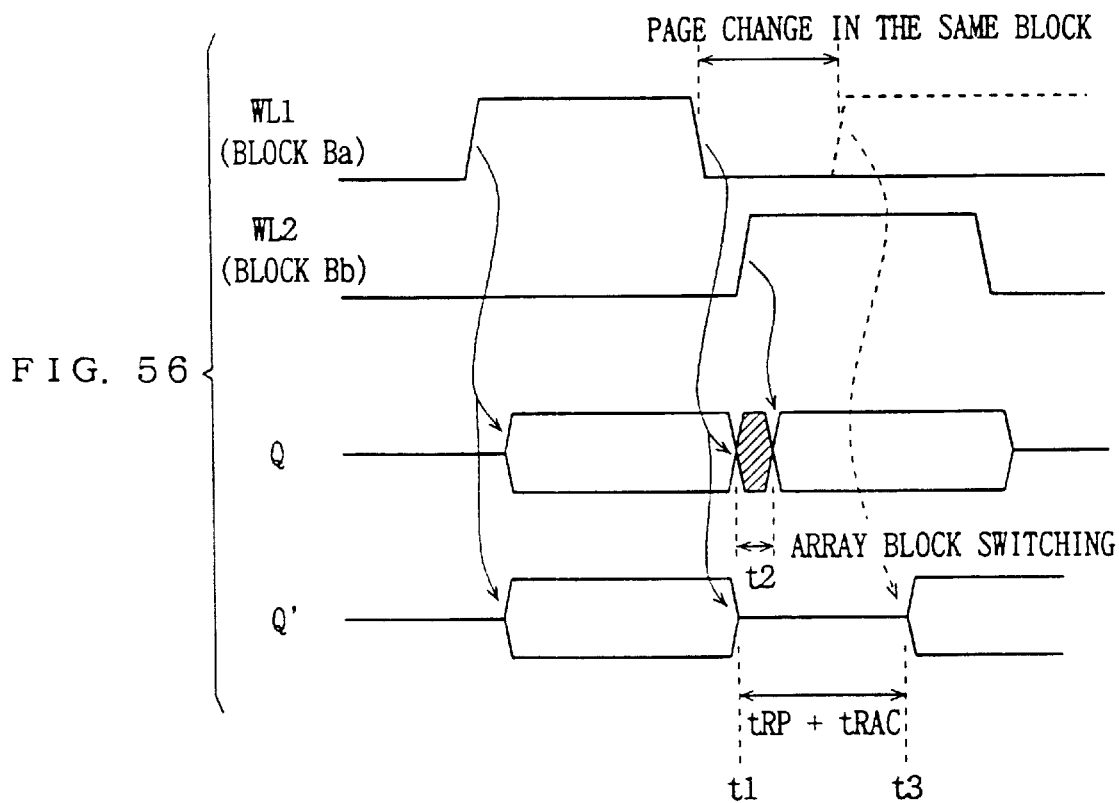
FIG. 56 is a waveform diagram illustrating operations of the semiconductor memory device according to the embodiment 8 of the present invention.

As shown in FIG. 56, therefore, the word line WL1 of the block Ba is brought to a nonselected state, so that the array block Bb can be accessed by immediately supplying address signals. Therefore, the data of a memory cell connected with the word line WL2 of the block Bb can be read at a time t2. If this address conversion is not performed, the word line WL2 is included in the block Ba, and it is necessary to temporarily drive the array block Ba to a nonselected state and access the array block Ba again after a lapse of the RAS precharge time tRP, for selecting the word line (rise of this word line is shown by a broken line in FIG. 56). Data Q' is outputted after the word line shown by the broken line in FIG. 56 is driven to a selected state. In this case, therefore, the data of the memory cell which is connected with the word line WL2 is outputted as the output data Q' at a time t3 after lapses of the RAS precharge time tRP and an RAS access time tRAC from the output of the data Q' of the memory cell in the word line WL1. As clearly understood from the operation waveform diagram shown in FIG. 56, it is possible to access a memory cell of another page (word line) only in a time required for switching the array block when different pages (word lines) of the same array block are continuously accessed in case of performing address conversion. When this address conversion is not performed, on the other hand, the RAS precharge time and the RAS access time are required in order to change the page for reading the memory cell data of the other page. In case of continuously accessing different pages, therefore, it is possible to access the selected memory cells at a high speed by performing address conversion and successively accessing different array blocks.

Determination as to whether or not address conversion is performed and operation control in the continuous access are executed by the instruction decoding part 1604 shown in FIG. 54. In general, a CPU (central processing unit) supplies information indicating whether accessing data is that employed for operation or an instruction. It is possible to access data at a high speed by introducing information as to whether or not the data is serially accessed, i.e., information indicating the attribute (type) of the data such as image data or sound data, for example, into the data, decoding the data attribute information included in the instruction in the instruction decoding part 1604 and implementing address conversion in page switching in case of such data (image data, for example) that different pages of the same array block are continuously accessed.

Figure 57:
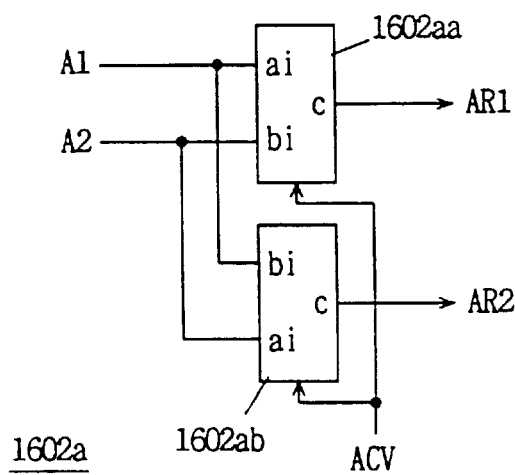
FIG. 57 illustrates an exemplary structure of a substitution circuit shown in FIG. 55A.

FIG. 57 illustrates an exemplary structure of the substitution circuit 1602a shown in FIG. 55A. Referring to FIG. 57, the substitution circuit 1602a includes a selection circuit 1602aa which receives the address signal bits A1 and A1 in inputs ai and bi respectively for selectively passing one of these bits in accordance with a conversion activation signal ACV, and a selection circuit 1602ab which receives the address bits A1 and A2 in inputs bi and ai respectively for selecting and passing one of the supplied bits in accordance with the conversion activation signal ACV. The selection circuits 1602aa and 1602ab output the internal address signal bits AR1 and AR2 respectively.

The selection circuits 1602aa and 1602ab select and output the address signal bits which are supplied to the inputs bi when the conversion activation signal ACV is in an active state and specifies address conversion. When the address conversion activation signal ACV is in an inactive state, on the other hand, the selection circuits 1602aa and 1602ab select the address bits which are supplied to the inputs ai. It is possible to perform address conversion only when necessary by employing the selection circuits 1602aa and 1602ab for switching propagation paths of the address signal bits A1 and A2 through these selection circuits in accordance with the address conversion activation signal ACV.

Figure 58:
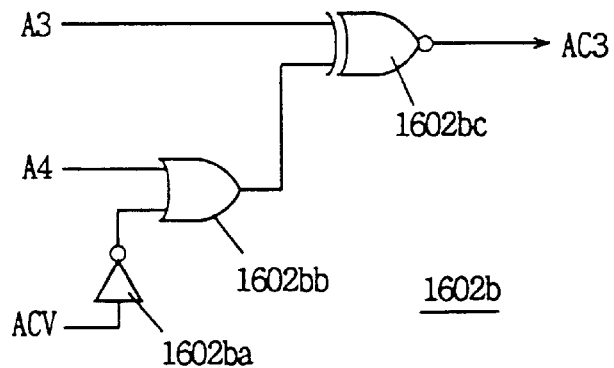
FIG. 58 illustrates an exemplary structure of a coincidence detection circuit shown in FIG. 55A.

FIG. 58 illustrates an exemplary structure of the coincidence detection circuit 1602b shown in FIG. 55A. Referring to FIG. 58, the coincidence detection circuit 1602b includes an inverter circuit 1602ba for receiving the conversion activation signal ACV, an OR circuit 1602bb for receiving an output signal of the invertor circuit 1602ba and the address bit A4, and an EXNOR circuit 1602bc for receiving an output signal of the OR circuit 1602bb and the address bit A3. The EXNOR circuit 1602bc brings the logic of an internal address signal AC3 outputted therefrom to "1" when the logics of the signals supplied to its both inputs coincide with each other.

When the address conversion activation signal ACV is in an active state of a high level ("1"), the output signal of the invertor circuit 1602ba goes low ("0"), and the OR circuit 1602bb acts as a buffer circuit and passes the address bit A4 without converting the same. Therefore, the EXNOR circuit 1602bc determines coincidence/non-coincidence of the logics of the address bits A3 and A4, and outputs the address bit AC3 of a logic in accordance with the result of determination.

When the address conversion activation signal ACV is at a low level of an inactive state, the output signal of the invertor circuit 1602ba is at a high level, and the output signal of the OR circuit 1602bb goes high. The EXNOR circuit 1602bc serves as a buffer for bringing the internal address signal bit AC3 to a high level when the address bit A3 is at a high level, while bringing the former to a low level when the latter is at a low level.

Figure 59:
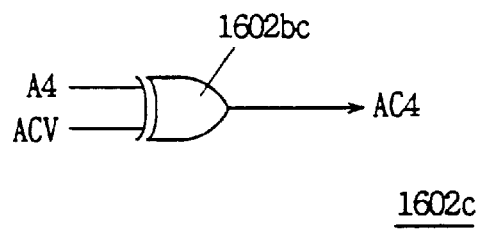
FIG. 59 schematically illustrates the structure of an inversion circuit shown in FIG. 55A.

FIG. 59 illustrates an exemplary structure of the inversion circuit 1602c shown in FIG. 55A. Referring to FIG. 59, the inversion circuit 1602c includes an EXOR circuit 1602bc which receives the address bit A4 and the address conversion activation signal ACV. The EXOR circuit 1602bc brings an internal address signal bit AC4 outputted therefrom to a logic "1". When the address conversion activation signal ACV is in an active state of a high level, therefore, the EXOR circuit 1602bc serves as an invertor, and inverts the logic of the address bit A4 and outputs the internal address bit AC4. When the address conversion activation signal ACV is at a low level of an inactive state, on the other hand, the EXOR circuit 1602bc serves as a buffer, so that the internal address bit AC4 goes high when the address bit A4 is at a high level, while the former goes low when the latter is at a low level.

As shown in FIGS. 57 to 59, the address conversion function can be implemented only when necessary by selectively implementing the functions of the substitution circuit 1602a, the coincidence detection circuit 1602b and the inversion circuit 1602c included in the input conversion part 1602, whereby a plurality of array blocks can be alternately accessed in continuous access, to enable rapid access. When two array blocks are employed, data indicating page conversion may be supplied from the central processing unit every page so that the address conversion activation signal ACV is alternately activated and inactivated every page conversion. Alternatively, a block address change detection circuit for detecting change of the block address signal bits A1 to A4 may be provided for generating the address conversion activation signal ACV through a T flip-flop whose output is alternately changed between high and low levels in response to an output signal of the block address change detection circuit.

Figure 60:
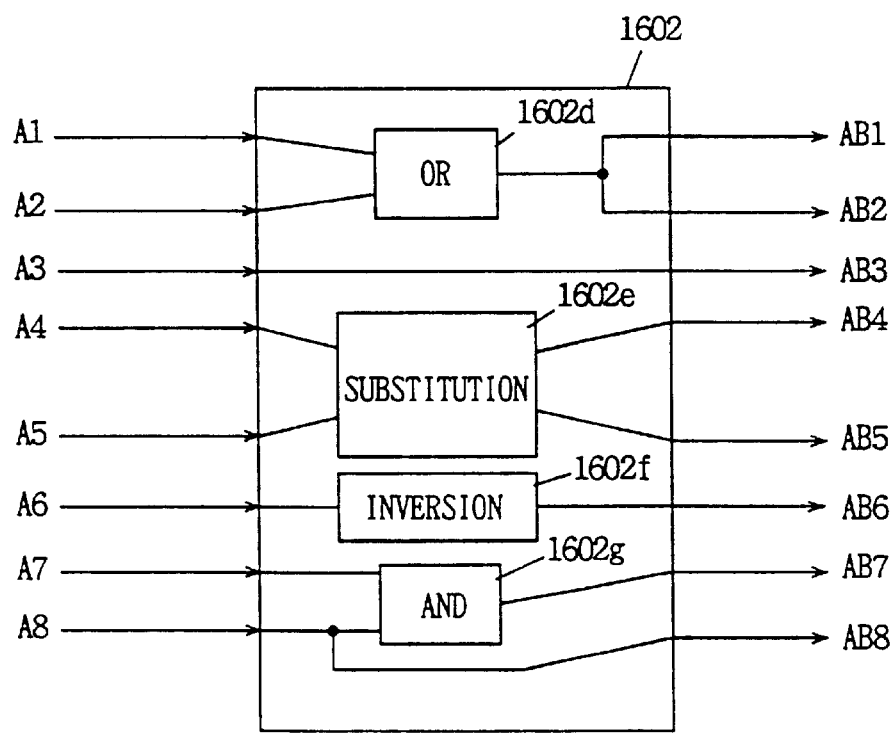
FIG. 60 illustrates the structure of a modification of the input conversion part shown in FIG. 54.

FIG. 60 illustrates a general structure of the input conversion part 1602 shown in FIG. 54. Referring to FIG. 60, one array block is specified by 8-bit address signals A1 to A8. Therefore, one array block is selected from 256 array blocks. Referring to FIG. 60, the input conversion part 1602 includes an OR circuit 1602d which receives the ddress signal bits A1 and A2 and performs OR operation or outputting internal address bits AB1 and AB2, a ubstitution circuit 1602e which interchanges the bit ositions of the address bits A4 and A5 and outputs address bits AB4 and AB5, an inversion circuit 1602f which inverts the logic of the address bit A6 and outputs an internal address bit ABA6, and an AND circuit 1602g which ANDs the address bits A7 and A8 and generates an internal address bit AB7. The address bit A8 is outputted as an internal address bit AB8.

Activation and inactivation of the functions of these circuits 1602d to 1602g are also controlled in accordance with signals from the instruction decoder shown in FIG. 5 respectively. Due to the structure, it is possible to perform address conversion for allotting block addresses for the array blocks included in the memory array in an arbitrary sequence. Also in such a shared sense amplified structure that adjacent array blocks share a sense amplifier, therefore, address conversion can be so performed as to regularly prevent the array blocks share the sense amplifier from being simultaneously selected, and it is not necessary to control activation and inactivation of the sense amplifier. Namely, control of internal array activation is simplified in the shared sense amplifier structure, while it is not necessary to temporarily inactivate an active sense amplifier, thereafter activate the sense amplifier again, and drive another array block to a selected state, whereby rapid access is enabled.

Execution and inexecution of this address conversion may be controlled under control by the instruction decoder, according to the operation mode. Alternatively, the address conversion may be regularly performed regardless of the operation mode. A structure of regularly performing address conversion is now described.

Figure 61:
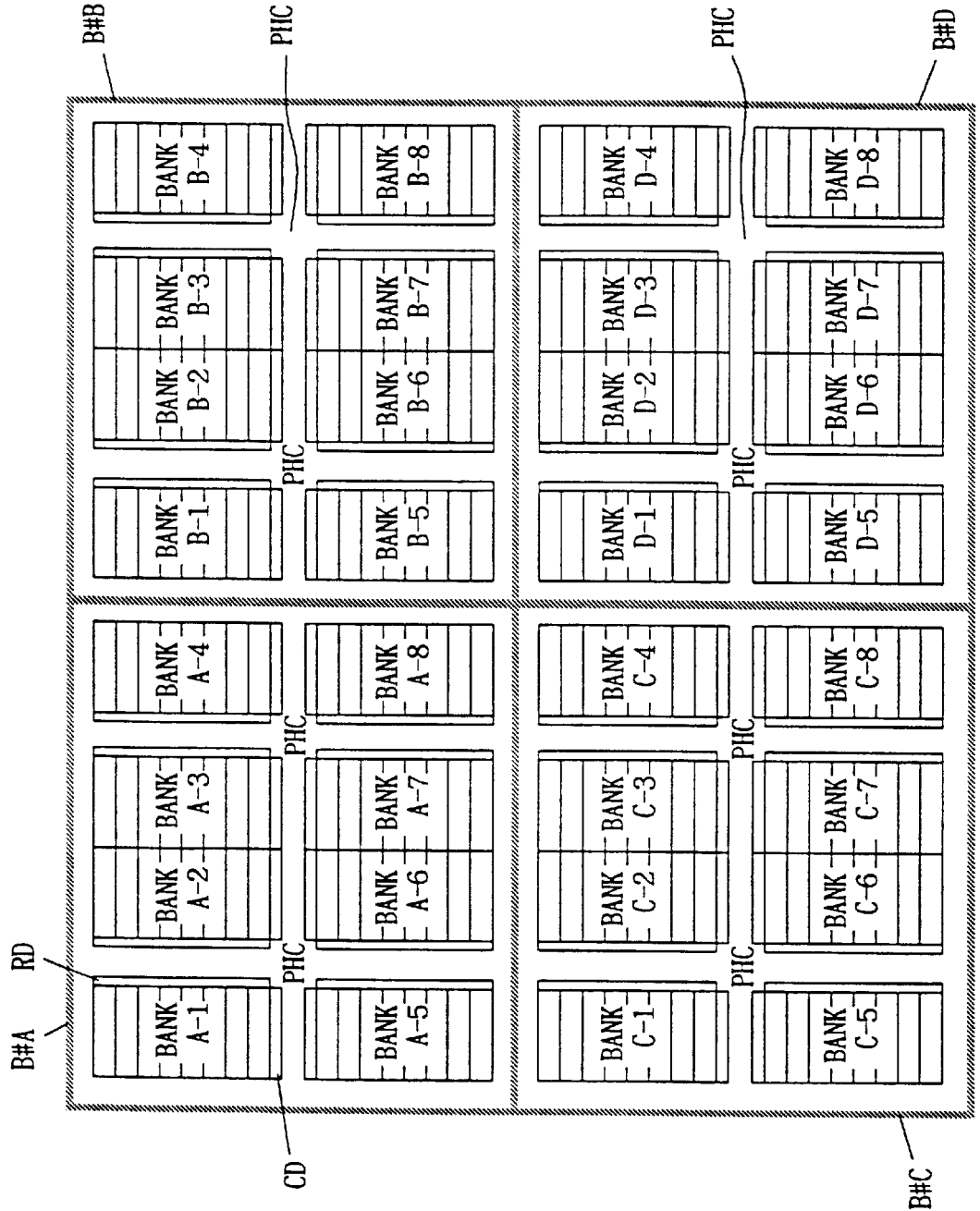
FIG. 61 illustrates the structure of an array part in a modification of the semiconductor memory device according to the embodiment 8 of the present invention.

FIG. 61 schematically illustrates another structure of the memory array part of the semiconductor memory device according to the embodiment 8 of the present invention. Referring to FIG. 61, this semiconductor memory device includes upper banks B#A, B#B, B#C and B#D which are arranged in two rows and two columns. This semiconductor memory device has storage capacity of 16 Gbits, and each of the upper banks B#A to B#D has storage capacity of 4 Gbits.

Each of the upper banks B#A to B#D includes eight middle banks which are arranged in two rows and four columns. Namely, the upper bank B#A includes middle banks A-1 to A-B, the upper bank B#B includes middle banks B-1 to B-8, the upper bank B#C includes middle banks C-1 to C-8, and the upper bank B#D includes middle banks D-1 to D-8 respectively. Each of these middle banks A-1 to D-8 has storage capacity of 512 Mbits. Each of the middle banks A-1 to D-8 includes eight lower banks (corresponding to array blocks). Further, each of the middle banks A-1 to D-8 includes a row decoder RD which is provided in correspondence to each lower bank (array block), and a column decoder CD which is provided in common for the lower banks included in the respective middle banks A-1 to D-8.

The lower banks can be driven to selected states independently of each other, similarly to the case of the precedent embodiments. In the middle banks A2, A3, A6 and A7 which are arranged in central portions of the respective upper banks B#A to B#D, row decoders are arranged in opposite directions along bank boundary lines thereof. In this case, addresses of the upper banks B#A to B#D may be arranged to be mirror-symmetrical about central lines of the banks along the column directions. The layout of the decoders is simplified. In each of the upper banks B#A to B#D, a peripheral control circuit PHC is arranged on a region between the oppositely arranged row decoders. Clock signals are transmitted to these peripheral circuits PHC, as described later. Addresses after address conversion are transmitted as bank specifying signals. The addresses after address conversion may specify the upper banks B#A to B#D, the middle banks, or the lower banks (array blocks) which are included in the middle banks. Which level of bank is specified by a block address subjected to the address conversion is properly set depending on the application of the semiconductor memory device. It is assumed here that the addresses after conversion specify the lower banks.

FIG. 62 illustrates allocation of the address signal bits to the banks of the semiconductor memory device shown in FIG. 61, i.e., address mapping. Referring to FIG. 62, each of the upper banks B#A to B#D is specified by the address signal bits A1 and A2 (including complementary address signal bits /A1 and /A2). Namely, the upper bank B#A is specified when both of the address signal bits A1 and A2 are at high levels of "1" and the upper bank B#B is specified when both of the address signal bits /A1 and A2 are at high levels, while the upper bank B#C is specified when both of the address signal bits A1 and /A2 are at high levels, and the upper bank B#D is specified when both of the address signal bits /A1 and /A2 are at high levels.

The address signal bits are identically allotted to the middle banks and the lower banks included in these upper banks B#A to B#D. Allocation of the address signal bits to the middle banks is representatively shown only with respect to the upper bank B#A. In relation to the lower banks, only allocation of the address signal bits to the lower banks LB1 to LB8 with respect to the middle bank C-5 is representatively shown.

The address signal bit A3 specifies four middle banks arranged in two columns among the middle banks A1 to A8 which are arranged in two rows and four columns. Namely, the middle banks A-1, A-2, A-5 and A-6 are specified when the address signal bit A3 is at a high level, while the middle banks A-3, A-4, A-7 and A-8 are specified when the address signal bit /A3 is at a high level.

Among the four middle banks specified by the address signal bits A3 and /A3, two middle banks which are arranged in a column are specified by the address signal bits A4 and /A4. While FIG. 62 shows the address signal bits A4 and /A4 only with respect to the middle banks A-1, A-2, A-5 and A-6, the middle banks A-3, A-4, A-7 and A-8 are also specified by the address signal bits A4 and /A4. The middle banks A-1 and A-5 are specified when the address signal bit A4 is at a high level, while the middle banks A-2 and A-6 are specified when the address signal bit /A4 is at a high level.

Among the middle banks A-1 to A-8 of two rows, middle banks of one row are specified by the address signal bits A5 and /A5. The middle banks A-1 to A-4 are specified when the address signal bit A5 is at a high level, while the middle banks A-5 to A-8 are specified when the address signal bit /A5 is at a high level.

Each middle bank includes eight lower banks LB1 to LB8 each having storage capacity of 64 Mbits. Among the eight lower banks LB1 to LB8, four lower banks are specified by the address signal bits A6 and /A6. Among the four lower banks specified by the address signal bits A6 and /A6, two lower banks are specified by the address signal bits A7 and /A7. Among the two lower banks specified by the address signal bits A7 and /A7, one lower bank is specified by the address signal bits A8 and /A8. One lower bank is specified by the complementary address signal bits A1, /A1 to A8, /A8.

[Exemplary Application of Address Conversion]

Figure 63:
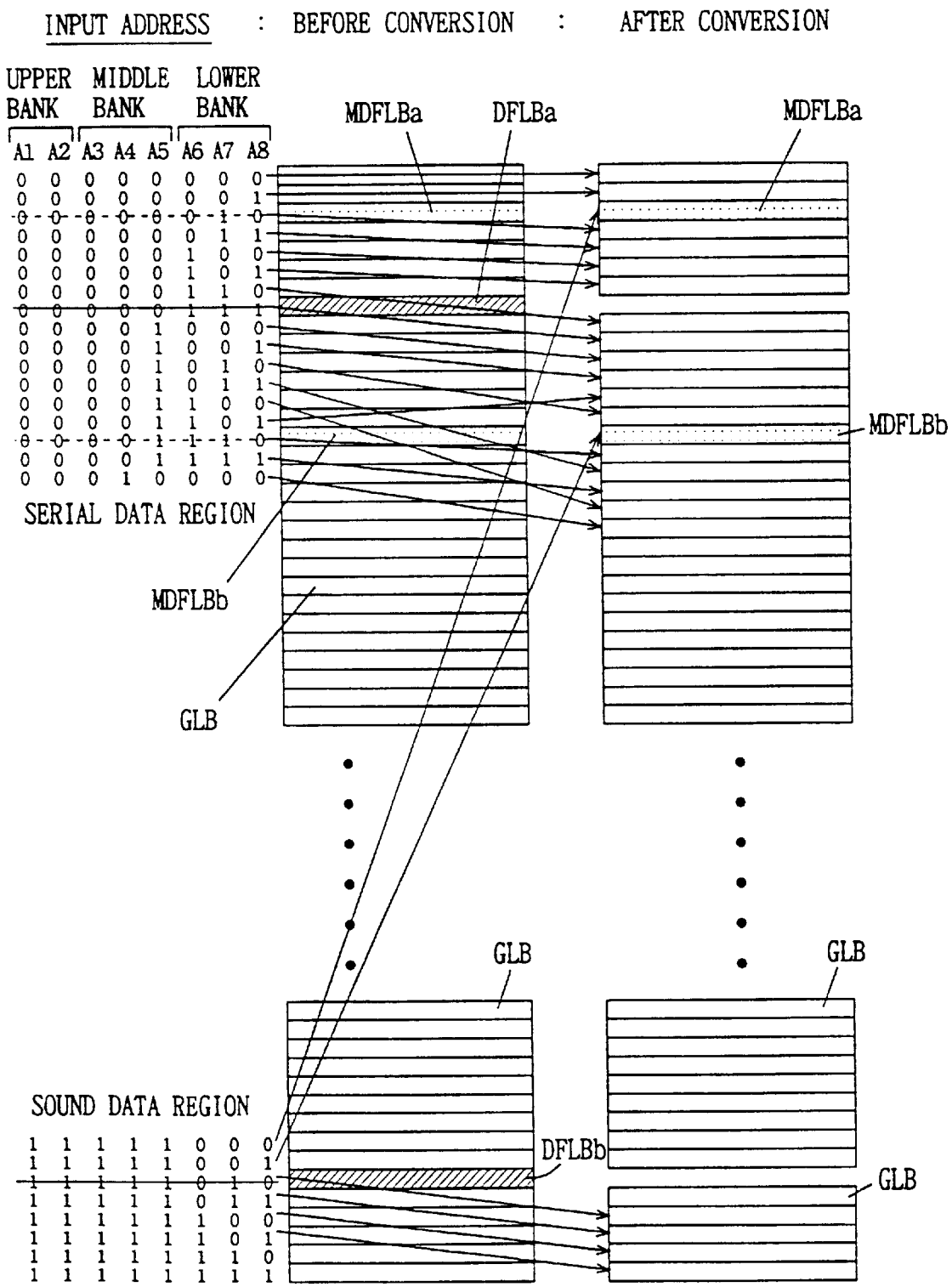
FIG. 63 illustrates an address conversion operation of the memory array shown in FIG. 61.

FIG. 63 illustrates an exemplary application of the address conversion according to the embodiment 8 of the present invention. Referring to FIG. 63, this semiconductor device has the bank arrangement shown in FIGS. 61 and 62. In case of a mass storage semiconductor memory device of 16 Gbits, the increase of the number of memory cells included therein increases defective memory cells due to dispersion of particles or deviation of manufacturing parameters, and hence the yield of completely operating semiconductor devices is reduced. When defective memory cells are distributed in the same ratio in cases of forming mass storage semiconductor memory devices and of small storage semiconductor devices on a wafer of the same area (size), it is possible to dispose one small storage semiconductor memory device made defective by the defective memory cells thereby eliminating influence on the remaining small storage semiconductor memory devices. In case of the mass storage semiconductor memory devices, however, one device corresponds to a plurality of small storage semiconductor memory devices. When a part corresponding to one small storage semiconductor memory device is made defective, therefore, the overall mass storage semiconductor memory device must be disposed as a defective one (the semiconductor memory device is formed by a single chip).

Therefore, the yield is reduced in case of the mass storage semiconductor memory devices, as compared with the small storage semiconductor memory devices.

When the defective memory cells result from relatively large particles, they concentrically exist in a single array block, and hence the same cannot be repaired by redundant memory cells, and there exist unserviceable array blocks (least significant banks; that is, lower banks) DFLBa and FLBb. When these unserviceable least significant banks (lower banks; referred to as least significant banks hereinafter) DFLBa and DFLBb are specified, address conversion is performed to inhibit access to the defective array blocks (least significant banks), for accessing other normal (completely available) array blocks (least significant banks). The normal (completely available) array blocks (least significant banks) may be regions including no defective memory cells, or regions where all defective cells are repaired by redundant cells included therein. When array blocks for substitution are provided in addition to the general array blocks, these additional array blocks may be utilized as the normal array blocks (least significant banks) for substituting for the unserviceable array blocks (least significant banks) (utilization of spare array blocks). Alternatively, only general array blocks (least significant banks) may be utilized so that the defective array blocks (least significant banks) are substituted by other normal array blocks (least significant banks) by address conversion. FIG. 63 shows such a structure that no spare array blocks are provided and access to normal array blocks (least significant banks) is performed by address conversion. While the storage capacity is reduced by the amount of the defective (unserviceable) array blocks in this case, the storage capacity of one least significant bank is 64 Mbits, i.e., 1/256 of the overall storage capacity in case of mass storage capacity such as 16 Gbits. Therefore, reduction of the storage capacity hardly exerts influence on a CPU address space even if such an unserviceable array block (least significant bank) is repaired by another normal array block (least significant bank).

Referring to FIG. 63, an input address (00000111) corresponds to an unserviceable array block (least significant bank), and this unserviceable array block address is so address-converted as to specify another normal array block (least significant bank). Referring to FIG. 63, input address signals A1 to A8 are so indicated that the same are shifted one by one through address conversion while avoiding a defective array block. This address conversion can be readily implemented by a structure of storing the address conversion in the form of a table through a storage element such as a PROM or a RAM (random access memory). Namely, converted address signals are stored in correspondence to the respective input address signals, so that the contents of the conversion storage element are read in address conversion to be utilized as the addresses after conversion. Thus, the address conversion can be so performed as to inhibit access to a defective array block.

When the number of defective memory cells which cannot be repaired by redundant cells is not more than a prescribed number in the structure shown in FIG. 63, presence of the defective memory cells less than the prescribed number is allowed and the cells are utilized as marginal (available) array blocks (least significant banks) MDFLBa and MDFLBb. In case of storage of numerical value data, a program instruction, and temporarily stored calculation data in a general processing operation, even a single-bit destruction is not allowed for the storage data. Therefore, these data are stored in completely available normal array blocks (least significant banks) GLB. Referring to FIG. 63, the region for storing these data is shown as a serial data region.

In case of time-sequential data such as image data and sound data, on the other hand, the correlation between data words which are precedent and subsequent in time is so strong that some bit errors are canceled by a certain correlation processing. In this case, a few bit errors are allowed with respect to the stored data. Therefore, an array block (least significant bank) including allowable defects is utilized as a marginal defective block for storing such sound data and image data. A few defective bits generally indicate bit errors sparsely present in one array block (least significant bank).

When the tolerance for destruction (errors) of bits of used data is high and no problem is caused even if such errors are continuous, however, it may be possible to use the array block in case of defects in units of word lines or bit lines. When defects in units of word lines or bit lines are present in case of storing display image data, for example, merely discontinuity of images of one horizontal or vertical line takes place at the most in the displayed images, to result in no critical disadvantage. A flag indicating the marginal block is set for the array block including such allowable defective bits, i.e., the marginal block, which is utilized as a region for dedicatedly storing sound data and image data.

As shown in FIG. 63, therefore, addresses 11111000 and 11111001 indicating sound data regions are allotted to such incompletely available marginal blocks MDFLBa and MDFLBb respectively. The unserviceable array block DFLBb is not used for the sound data and the image data either. When an address 11111010 specifying the defective array block (least significant bank) DFLBb is supplied, this address is converted to specify another normal array block GLB.

In the structure shown in FIG. 63, the defective array block DFLBb in the sound data region is repaired by the normal array block GLB. Therefore, the maximum address 11111111 of this sound data region is allotted to no region, while address regions allotted to the marginal blocks MDFLBa and MDFLBb may be array blocks (least significant banks) indicated by the address 11111111 in this case.

The number of defective bits included in the array block which is utilized as the marginal block may be properly set depending on the processing application.

Figure 64:
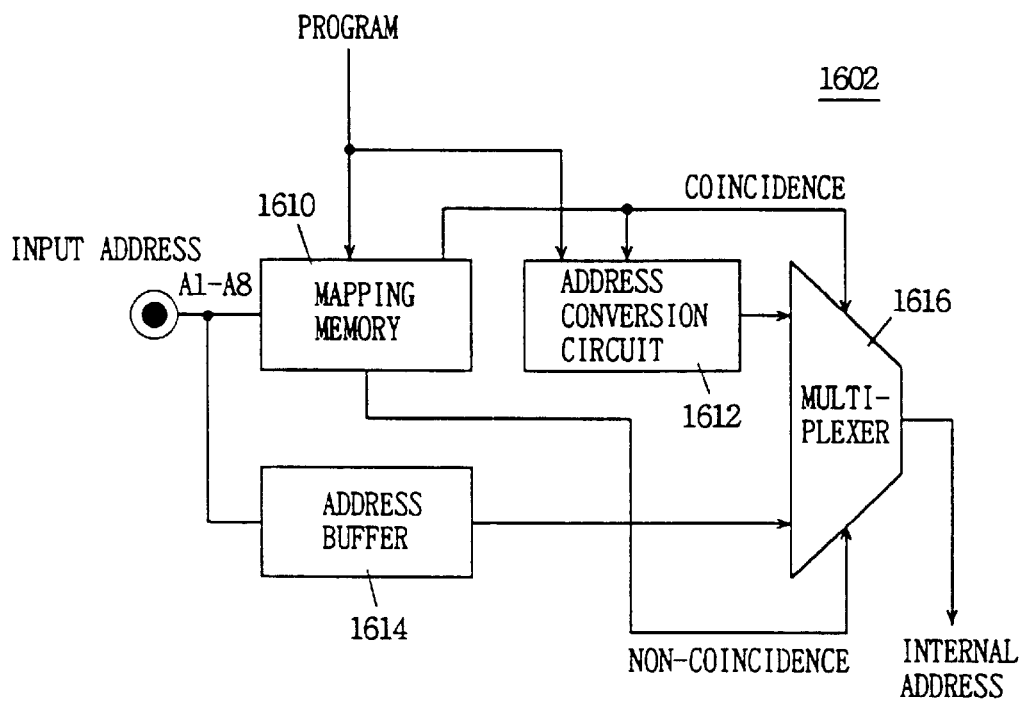
FIG. 64 schematically illustrates the structure of an address conversion part implementing the address conversion shown in FIG. 63.

FIG. 64 illustrates a specific structure of the input conversion part 1602 performing address conversion. Referring to FIG. 64, the input conversion part 1602 includes a mapping memory 1610 storing addresses for specifying array blocks (least significant banks) for performing address conversion, an address conversion circuit 1612 storing converted addresses of bank addresses (A1 to A8) stored in the mapping memory 1610 in correspondence thereto respectively, an address buffer 1614 receiving the external addresses A1 to A8, and a multiplexer 1616 for selecting one of an internal address signal outputted from the address buffer 1614 and a converted address signal read from the address conversion circuit 1612 for outputting an internal address signal.

The mapping memory 1610 compares the supplied addresses A1 to A8 with the stored addresses, and outputs a signal indicating the result of the comparison. The address conversion circuit 1612 outputs a corresponding converted address signal in accordance with a coincidence detection signal from the mapping memory 1610. The multiplexer 1616 selects the address signal read from the address conversion circuit 1612 in accordance with a coincidence instruction signal from the mapping memory 1610 and outputs the same as an internal address signal. When the mapping memory 1610 outputs a non-coincidence instruction signal, on the other hand, the multiplexer 1616 selects the address signal supplied from the address buffer 1614 and outputs the same as an internal address signal.

The structure of the input conversion part 1602 shown in FIG. 64 is substantially identical to that of the address conversion part shown in FIGS. 30 and 32. The former is different from the latter merely in a point that an address signal specifying a defective array block (including both of a marginal defective region and an unserviceable region) is stored. Therefore, the operation of the former is identical to the latter, and hence redundant description is omitted.

Figure 65:
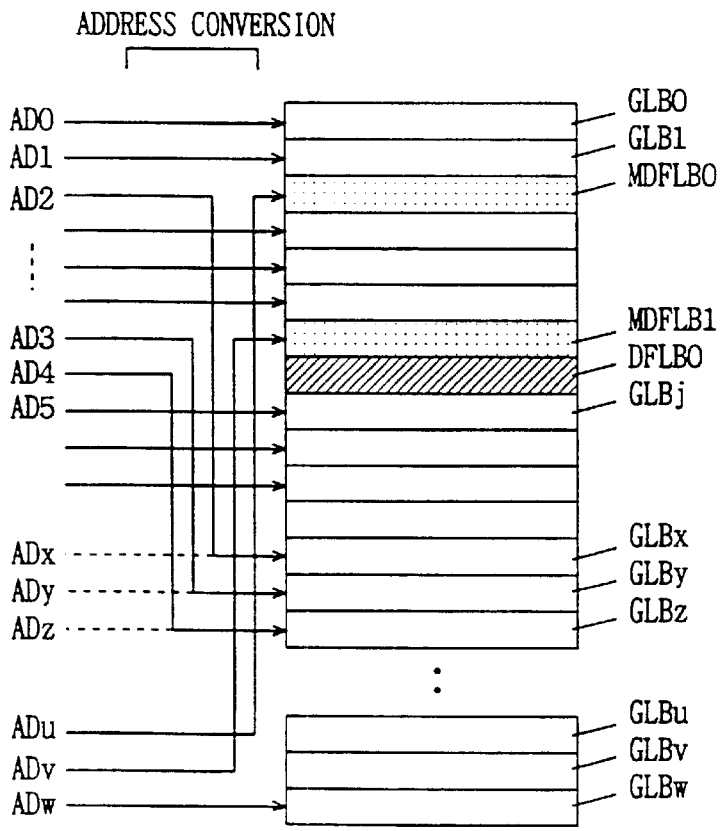
FIG. 65 is adapted to illustrate operations of the address conversion part shown in FIG. 64.

FIG. 65 illustrates an address conversion mode by the input conversion part performing the address conversion shown in FIG. 64. Referring to FIG. 65, addresses AD2, AD3 and AD4 indicating defective array blocks MDFLB0, MDFLB1 and DFLB0 are stored in the mapping memory 1610, and addresses ADx, ADy and ADz are stored in the address conversion circuit 1612 in correspondence to the addresses AD2, AD3 and AD4 respectively. Further, addresses ADu and ADv are stored in the mapping memory 1610, and the addresses AD2 and AD3 are stored in the address conversion circuit 1612 in correspondence to these addresses ADu and ADv. When addresses AD0, AD1, AD5, . . . and ADw specifying normal array blocks (least significant banks) GLB0, GLB1, GLBj, . . . GLBw are supplied, therefore, the input conversion part 1602 selects the supplied addresses and outputs the same as internal address signals, so that no address conversion is performed but the corresponding normal array blocks (least significant banks) are specified.

When the address AD2, AD3 or AD4 is supplied, on the other hand, the input conversion part 1602 performs address conversion, and outputs the address ADx, ADy or ADz in correspondence. When the array blocks (least significant banks) MDFLB0, MDFLB1 and MDFLB0 are specified, therefore, the normal array blocks GLBx, GLBy and GLBz are specified respectively. When external address signals specify normal array blocks GLBu and GLBv, the input conversion part 1602 performs address conversion, so that marginal array blocks MDFLB0 and MDFLB1 are specified respectively.

In this address conversion, no external addresses ADx, ADy and ADz are used. In this case, the semiconductor memory device may transfer information specifying the number of available banks in the upper banks to the CPU (central processing unit), so that the CPU decides available address spaces.

In case of writing addresses in the mapping memory 1610 and the address conversion circuit 1612, address information indicating defective array blocks may be managed in a tester in testing of the semiconductor memory device so that the addresses for the defective array blocks and converted addresses are decided on the basis of the managed defective array block address information.

Figure 66:
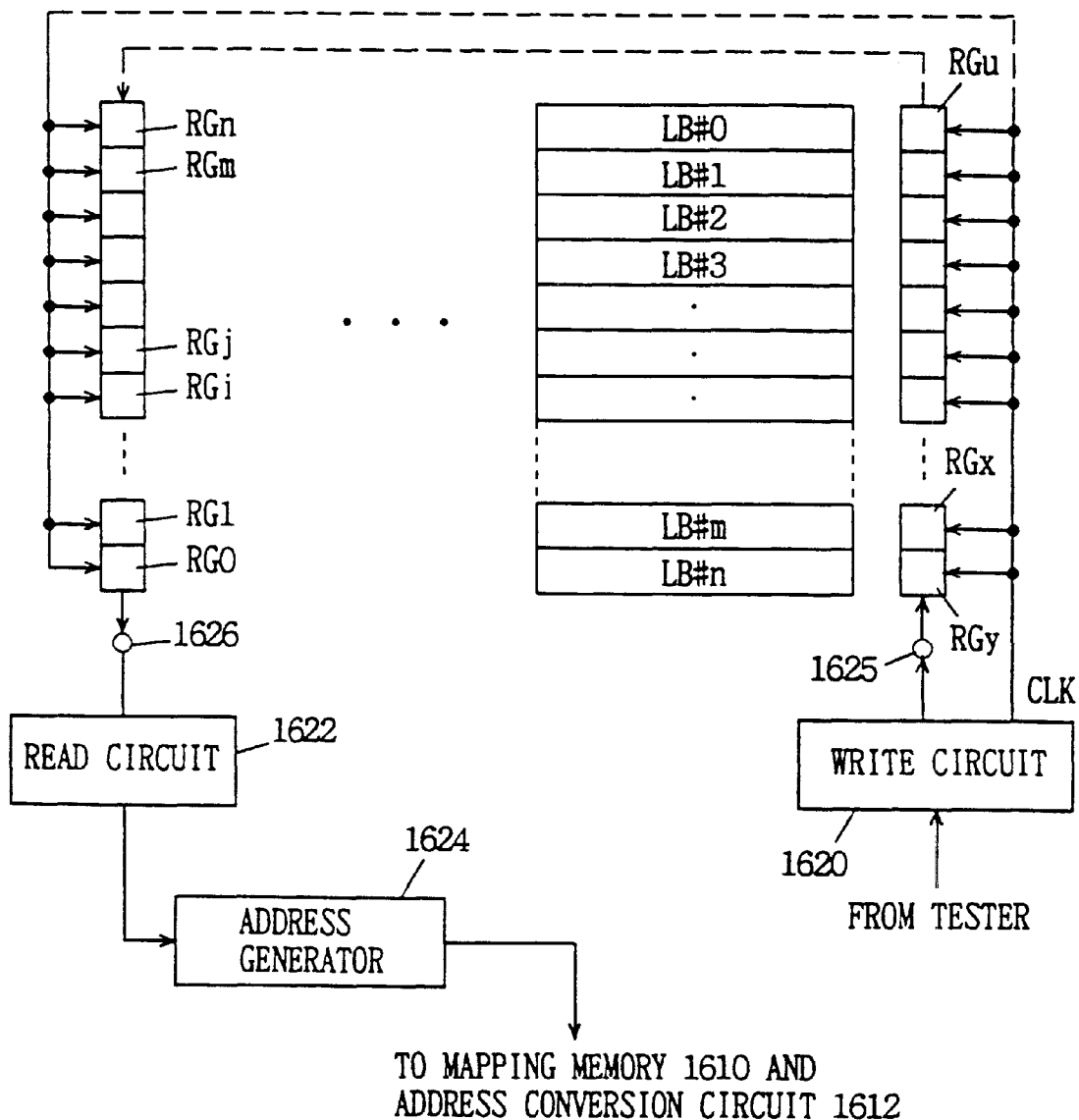
FIG. 66 illustrates a structure for generating converted addresses in the modification of the embodiment 8 of the present invention.

FIG. 66 illustrates an exemplary structure for identifying defective array blocks. Referring to FIG. 66, registers RG0, RG1, . . . , RGi, . . . RGm, RGn, . . . , RGx and RGy are arranged in correspondence to the array blocks (least significant banks). The registers RG0 to RGy store information indicating non-defectiveness/defectiveness and marginal/non-marginal of the corresponding array blocks (two-bit flag registers). The respective ones of these registers RG0 to RGy are connected in series with each other, to form a shift register transferring its holding contents in accordance with a clock signal CLK. FIG. 66 representatively shows array blocks LB#0 to LB#n. Information (flags) indicating non-defectiveness/defectiveness and marginal/non-marginal of these array blocks LB#0 to LB#n is stored in the corresponding registers RG0 to REGn respectively.

In order to write the flags in the registers RG0 to RGy, a write circuit 1620 for generating necessary information in accordance with the information from the tester and supplying the same to the register RGy through an input port 1625 in accordance with the clock signal CLK, a read circuit 1622 for reading the information of the register RG0 supplied from an output port 1626 in reading, and an address generator 1624 for generating addresses to be stored in the mapping memory 1610 and the address conversion circuit 1612 (see FIG. 64) in accordance with the information read by the read circuit 622 are included. The write circuit 1620, the read circuit 1622 and the address generator 1624 may be provided in the interior of the semiconductor memory device as peripheral circuits, or may be simply provided in the exterior of the device.

In a test operation, determinations on non-defectiveness/defectiveness and marginal/non-marginal are performed on the respective array blocks LB#0 to LB#n. These determinations are executed by the tester provided in the exterior of the device or a built-in test circuit, and information indicating the test results is supplied to the write circuit 1620. The write circuit 1620 generates the clock signal CLK every test of the array blocks in the test operation, and generates a flag indicating the state of each corresponding array block and supplies the same to the register RGi through the input port 1625. The information for each array block is stored in the register RGy through the write circuit 1620, and the data stored in the registers RG0 to RGy are successively transferred through the shift register. When the test for all array blocks is completed, information on the array blocks LB#0 to LB#n is stored in the registers RG0 to RGn respectively. After the test for all array blocks is completed, the read circuit 1622 performs a read operation. At this time, the write circuit 1620 generates the clock signal CLK, and further generates a prescribed pattern indicating the final register. When data of a flag read by the read circuit 1622 indicates a normal state, the address generator 1624 generates no address for conversion. When information supplied from the read circuit 1622 indicates that the corresponding array block is defective and completely unserviceable, on the other hand, the address generator 1624 generates an address signal indicating the corresponding array block and stores the same in the mapping memory 1610, for supplying the converted address to the address conversion circuit 1612. In this case, the address region of a normal array block for repairing the defective block is previously set in each of the upper or middle banks, so that the address generator 1624 generates converted addresses successively from the head address of the predetermined address region. This structure is readily implemented with a counter (counting the clock signal CLK). When the read circuit 1622 indicates that the corresponding array block is a marginal array block, the address generator 1624 supplies the address signal for the corresponding array block to the address conversion circuit 1612, and generates a final or head least significant bank address of its specific region, i.e., a sound or image data steerage region, and supplies the same to the mapping memory 1610. The structure of address generation from the address generator 1624 with respect to the defective array block is readily implemented by providing counters for the marginal block and the unserviceable array block respectively and setting the initial count values of the respective counters at addresses indicating the transferred least significant bank in each upper or middle bank.

It is possible to readily identify the address for address conversion and generate a necessary address by providing the registers in correspondence to the respective array blocks (least significant banks) and serially connecting these registers with each other to form a shift register.

Figure 67:
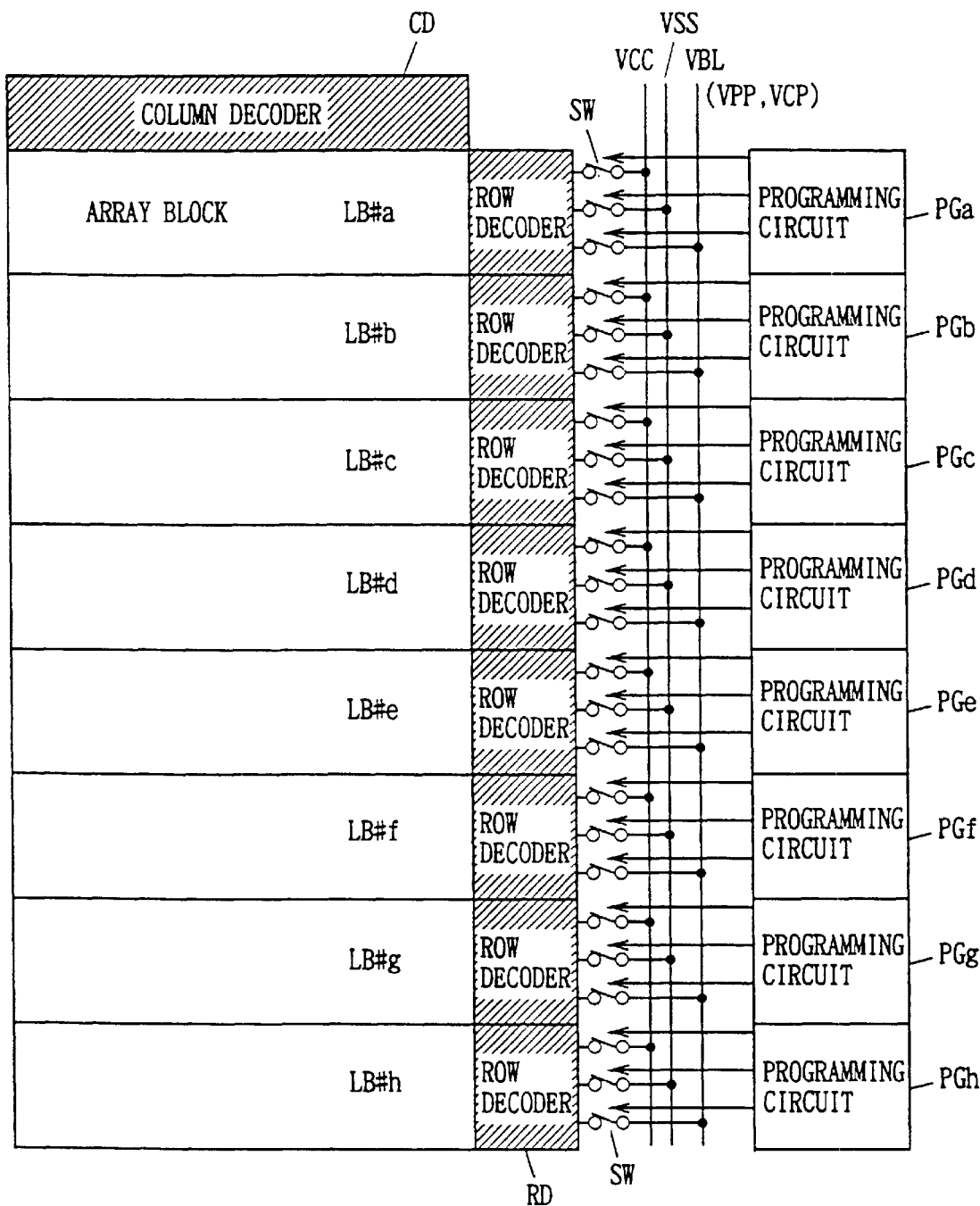
FIG. 67 illustrates exemplary processing on a defective memory block in the modification of the embodiment 8 of the present invention.

FIG. 67 illustrates a mode of treating a defective array block. This figure representatively shows array blocks LB#a to LB#h. A column decoder CD is provided in common for the array blocks LB#a to LB#h, and row decoders RD are provided for the respective ones of the array blocks LB#a to LB#h. Power supply lines transmitting various internal voltages, a source voltage VCC, a ground voltage VSS, a bit line precharge voltage VBL, a stepup voltage VPP and a cell plate voltage VCP are arranged in common for the array blocks LB#a to LB#h. FIG. 67 representatively shows voltage lines VCC, VSS and VBL.

Switching elements SW for selectively transmitting the voltage lines VCC, VSS and VBL (VPP and VCP) to the corresponding array blocks, and programming circuits PGa to PGh for controlling conduction and nonconduction of these switching elements SW are provided for the respective ones of the array blocks LB#a to LB#h. The storage information of each of the programming circuits PGa to PGh is programmed by a fuse element or the like, for example. The programming circuits PGa to PGh may be formed by the aforementioned registers shown in FIG. 66.

A switching element SW provided for a defective array block (unserviceable array block) is brought to a nonconducting state under control by the corresponding programming circuit PG (any one of PGa to PGh). Thus, it is possible to prevent flow of a short-circuit current through the unserviceable array block when a short is caused between the power source line and the ground line in the unserviceable array block due to a defective word line, for example, thereby reducing current consumption. Even if no word line short is caused, the unserviceable array block is isolated from the voltage lines so that loads of these voltage lines are reduced and necessary voltages can be stably supplied to the control array blocks.

In place of fuse elements, the switching elements SW are employed for supplying the necessary voltages VCC, VSS, VPL, VPP and VCP to the respective array blocks, whereby leakage currents of these voltages can be tested for the respective array blocks and abnormality of any voltage line can be readily detected.

[Modification of Input Conversion Part]

Figure 68:
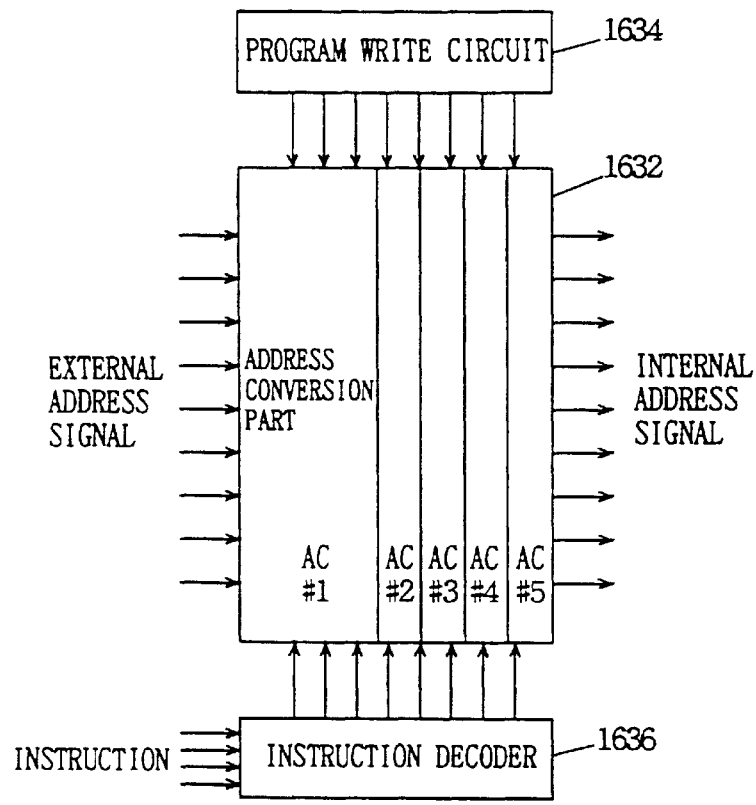
FIG. 68 illustrates still another structure of the input conversion part according to the embodiment 8 of the present invention.

FIG. 68 schematically illustrates the structure of a modification of the input conversion part shown in FIG. 54. Referring to FIG. 68, an input conversion part 1632 includes address conversion parts AC#1 to AC#5 storing address conversion modes respectively. Information indicating the address conversion mode is stored in each of the address conversion parts AC#1 to AC#5 by a program write circuit 1634, so that the address conversion mode is decided. An instruction decoder 1636 decodes a supplied instruction or information indicating the attribute of data, and activates one of the address conversion parts AC#1 to AC#5 included in the input conversion part 1632. Thus, one of the plurality of address conversion modes is employed. The input conversion part 1632 is formed by a programming device such as a static random access memory (SRAM), a field program gate array (FPGA) or a programmable read only memory (PROM), for example, which has a backup function in shutdown of a power source and writable contents. The program write circuit 1634 is formed by a general memory write circuit.

It is possible to reload the contents of the address conversion parts AC#1 to AC#5 in response to the operation modes as well as to change the content of the mapping memory or the address conversion circuit shown in FIG. 64, for example, by the program write circuit 1634, thereby arbitrarily changing the target of address conversion in a time series manner in accordance with the processing contents. Operations of changing the address conversion modes depending on the processing contents are now specifically described.

Figure 69A:
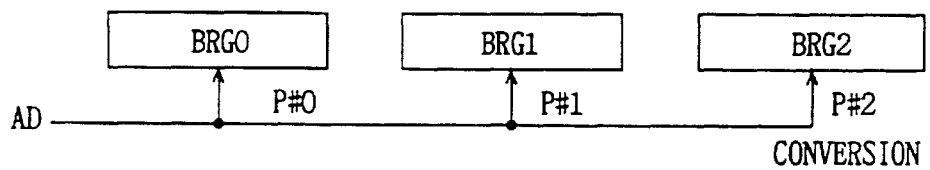
FIGS. 69A to 69C illustrate processing operation modes of the address input conversion part shown in FIG. 68.

It is assumed here that an address signal AD designates an array block (least significant bank) BRG0 in conversion and this array block BRG0 is utilized in accordance with processing P#0, as shown in FIG. 69A. This processing P#0 includes a subroutine P#1, so that address conversion is performed in the processing of the subroutine P#1 and the processing P#1 is executed through the array block BRG1. When an address region allotted to the processing P#0 is previously set in this case, the processing can be performed by substantially extending the address region, so that an address region of a processing result storage region can be substantially extended. When a subroutine P#2 is further executed in execution of the processing P#1, the address signal AD is converted to specify an array block BRG2. Thus, different processing results are stored in different array blocks BRG0 to BRG2 in the same address region in the address space of the CPU in processing. Therefore, the results of execution of such processing of a nesting structure can be stored without changing the address region for storing data required for this processing with no collision of the processing results.

Figure 69B:
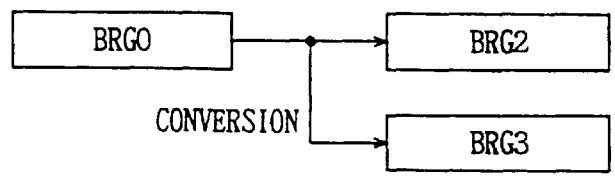

Referring to FIG. 69B, the destination of conversion of the array block BRG is changed from the array block BRG2 further to an array block BRG3. When two CPUs access the semiconductor memory device, for example, these CPUs can access the array blocks BRG2 and BRG3 respectively thereby utilizing different array blocks as working memory regions through the same address region of the semiconductor memory device, by changing the address conversion destinations in correspondence to the processing contents.

When address conversion is so performed as to simultaneously select the array blocks BRG2 and BRG3 in this case, backup data can be stored, whereby reliability of the data is improved.

Figure 69C:
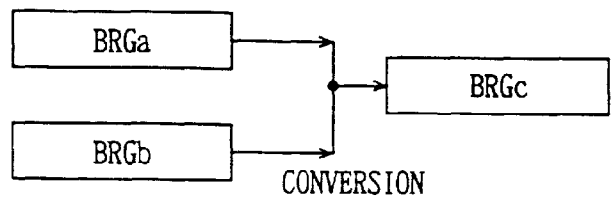

Referring to FIG. 69C, address signals specifying array blocks BRGa and BRGb respectively are address-converted in response to processing operations thereof, for addressing the same array block BRGc. In this case, it is possible to make data of different address regions of the CPU substantially correspond to an address area of one semiconductor memory device, thereby effectively extending an inputtable address space of the semiconductor memory device. Further, the same address region of the semiconductor memory device corresponds to different CPU address regions, whereby a data copy operation between CPU address regions can be efficiently implemented.

In case of the structure of the input conversion part 1632 shown in FIG. 68, the processing operations shown in FIGS. 69A to 69C can be changed for the address regions by changing the respective contents of the address conversion parts AC#1 to AC#5 depending on the processing operations thereof. Further, necessary address conversion can be readily implemented without reloading the contents of the address conversion parts AC#1 to AC#5 by the program write circuit 1634 in parallel with the processing operations, by selectively activating the address conversion parts AC#1 to AC#5 under control by the instruction decoder 1636 thereby previously storing the necessary processing operations in the address conversion parts AC#1 to AC#5.

When a large quantity of data such as image data are successively accessed, for example, it is possible to allot continuous pages to different array blocks in selection of one array block through the address conversion, whereby page change is performed at a higher speed (with array block conversion, with no requirement for RAS precharging) as compared with a structure of performing page change in one array block, and rapid access is enabled.

According to the embodiment 8 of the present invention, as hereinabove described, an external address signal is converted in the interior for specifying an array block which is different from that specified by the external address signal, whereby no RAS precharge time is required in page change, and rapid access is enabled. Also when a defective array block is present, access to the defective array block is completely inhibited with no requirement for driving the defective array block specified by the external address signal to a nonselected state due to the address conversion, whereby rapid access is enabled also in specification of the defective array block.

[Embodiment 9]

Figure 70:
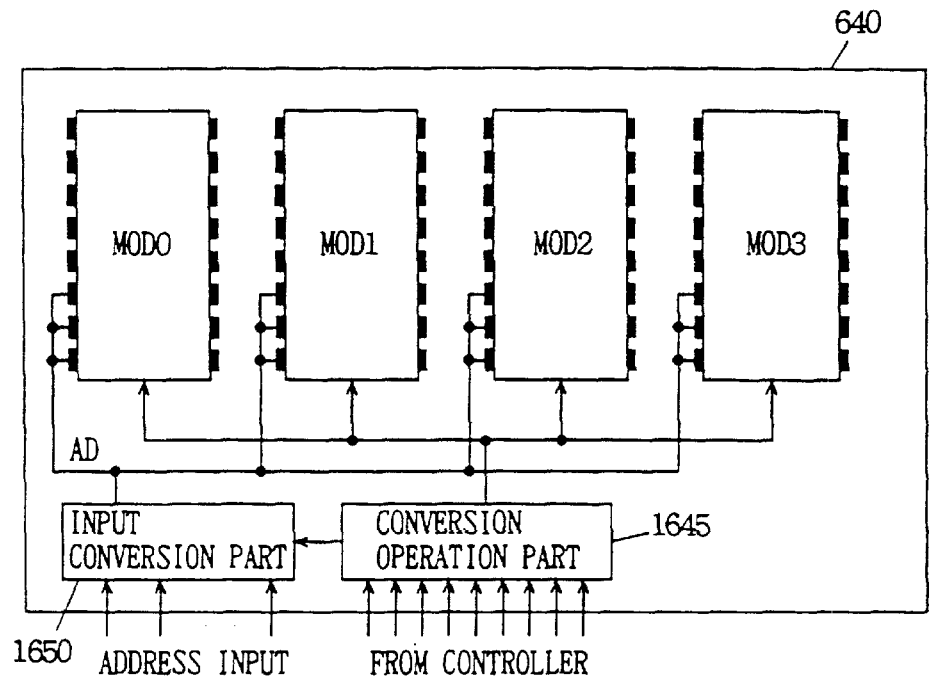
FIG. 70 schematically illustrates the overall structure of a semiconductor memory device according to an embodiment 9 of the present invention.

FIG. 70 schematically illustrates the overall structure of a semiconductor memory device according to an embodiment 9 of the present invention. Referring to FIG. 70, this semiconductor memory device 1640 includes modules MOD0 to MOD3 which are formed by different chips respectively. An input conversion part 1650 performing address conversion and a conversion operation part 1645 defining address conversion modes in the input conversion part 1650 are included for the respective ones of these modules MOD0 to MOD3.

Each of the modules MOD0 to MOD3 has a structure similar to that of the semiconductor memory device shown in FIG. 54 in its interior. The conversion operation part 1645 determines non-defectiveness/defectiveness of respective array blocks (least significant banks) of these modules MOD0 to MOD3 and decides the address conversion modes in the input conversion part 1650 to perform address conversion for inhibiting access to a defective array block in accordance with the results of the determination. The operation mode of the conversion operation part 1645 is decided by a control signal from a controller (not shown).

Figure 71:
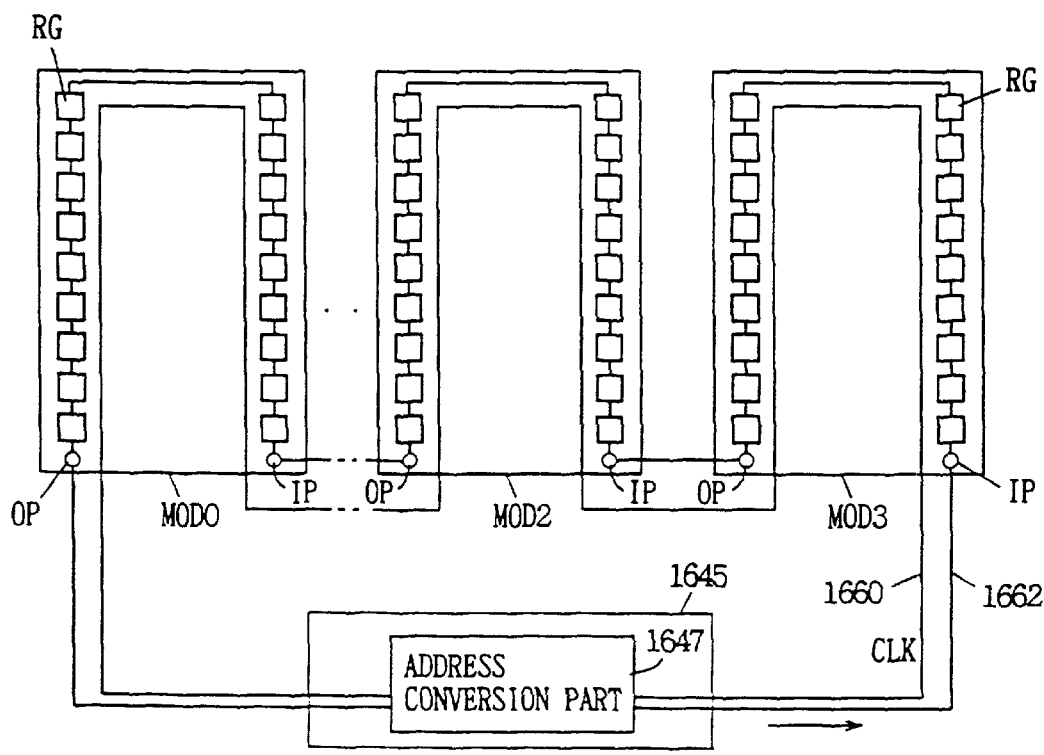
FIG. 71 illustrates a structure for identifying a defective memory block (array block) of the semiconductor memory device shown in FIG. 70.

FIG. 71 schematically illustrates the internal structures of the modules MOD0 to MOD3 shown in FIG. 70. Referring to FIG. 71, each of the modules MOD0 to MOD3 includes registers RG which are serially connected between an input port IP and an output port OP. These registers RG are arranged in correspondence to array blocks which are included in the respective modules MOD0 to MOD3. Information indicating non-defectiveness/defectiveness of the corresponding array blocks is stored in the registers RG. The input ports IP and the output ports OP of the modules MOD0 to MOD3 are successively connected with each other so that the registers RG form one shift register.

The conversion operation part 1645 stores data of the registers RG, and information indicating non-defectiveness/defectiveness of the respective array blocks in the corresponding modules MOD0 to MOD3 is stored in the registers RG under control by the controller (not shown) or a control circuit provided in the interior of each module. Non-defectiveness/defectiveness data (flags) may be written in the registers RG by a structure similar to that described with reference to FIG. 66 in relation to the aforementioned embodiment 8. On the basis of the non-defectiveness/defectiveness data stored in the registers RG, the conversion operation part 1645 performs operation under control by an address conversion part 1647 included in its interior, to decide the address conversion modes.

The address conversion part 1647 transmits a clock signal CLK onto a clock control signal line 1660 which is arranged to form a loop in common for the registers RG, and successively transfers the data stored in the registers RG. On a signal line 1662 successively serially connecting the registers RG with each other in the form of a loop, data indicating defective blocks which are larger in number than those allowed in one module are continuously outputted from the address conversion part 1647. The data stored in the registers RG are successively read from the module MOD0 in accordance with generation of the clock signal CLK, and the address conversion part 1647 decides what array blocks of which module are defective and whether or not address conversion is to be performed on the basis of the read data.

Figure 72:
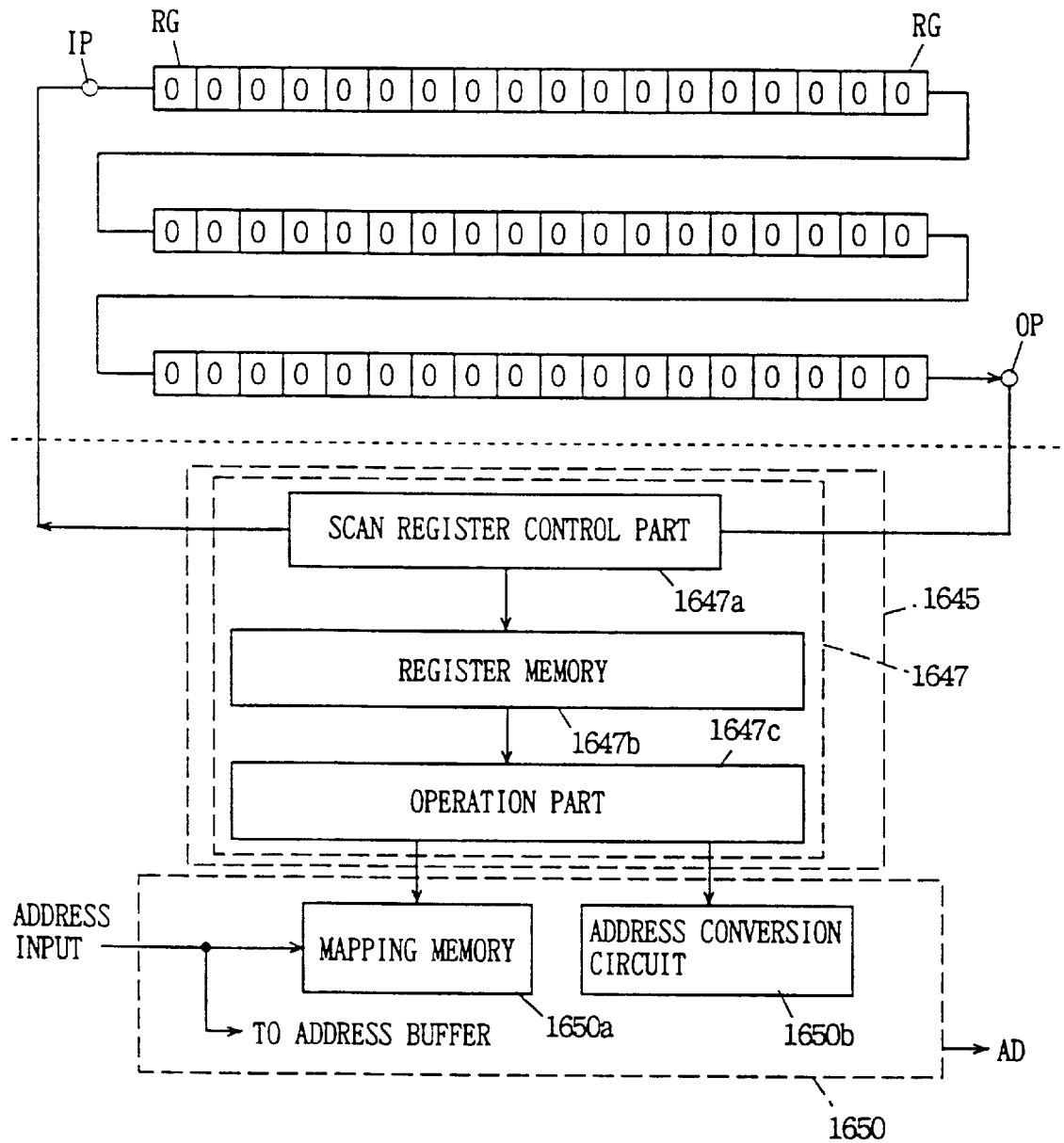
FIG. 72 illustrates the structure of a conversion operation part of the semiconductor memory device shown in FIG. 71 in more detail.

FIG. 72 schematically illustrates the structure of the address conversion part 1647 shown in FIG. 71. Referring to FIG. 72, the address conversion part 1647 includes a scan register control part 1647a controlling reading of the contents of the registers RG included in the modules MOD0 to MOD3, a register memory 1647b storing the address of a corresponding array block when data specifying a defective array block is supplied among data read from the scan register control part 1647a, and an operation part 1647c for calculating an address signal stored in a mapping memory 1650a and an address stored in an address conversion part 1650b in accordance with the address stored in the register memory 1647b. The mapping memory 1650a and the address conversion circuit 1650b are included in the input conversion part 1650. The structure of the input conversion part 1650 is identical to that of the input conversion part shown in FIG. 64. FIG. 72 shows only mapping memory 1650a and address conversion part 1650b.

The scan register control part 1647a includes a counter, for example, increments its count value every transmission of the clock signal CLK, employs the count value as an address for array block specification, and stores the count value of the counter in the register memory 1647b when data "0" indicating a defective array block is supplied from the register RG. The scan register control part 1647a continuously transmits information indicating defective array blocks in a number larger than that of defective array blocks allowed in one module. When a pattern (pattern of bits indicating defective array blocks in excess of a prescribed number) indicating an end of the registers RG transmitted from the scan register control part 1647a is returned from the output port OP of the register RG to the scan register control part 1647a, the scan register control part 1647a determines that all contents of the registers RG in the modules MOD0 to MOD3 are read out. The number of array blocks included in the modules MOD0 to MOD3 is previously determined. Therefore, the scan register control part 1647a can recognize the number of the chips (modules) included in the semiconductor memory device 1640 by observing the count number of the clock. The data on the number of the modules included in the semiconductor memory device 1640 may be transmitted from the scan register control part 1647a to the CPU through a path (not shown). In this case, the CPU address space can be set in coincidence with the number of the modules included in the semiconductor memory device.

The operation part 1647c performs operation of simply storing address information stored in the register memory 1647b in the mapping memory 1650a, deciding addresses of conversion designations successively from the head address in the predetermined address region in the respective modules and transmitting the same to the address conversion circuit 1650b. In this case, the address conversion is performed only for an unserviceable array block. Similarly to the aforementioned embodiment 8, such a structure that information indicating a marginal array block is stored in the registers RG and corresponding addresses are stored in the register memory 1647b along with flags indicating whether or not the array blocks are marginal so that the operation part 1647c decides addresses before and after conversion when image data or sound data are employed in the modules.

Also in the module structure shown in FIGS. 70 to 72, access to a defective array block can be readily inhibited by performing address conversion, similarly to the aforementioned embodiment 8. When the defective array block is repaired by a general redundant array block in this case, it is necessary to perform a determination operation by a program circuit for driving the defective array block to a nonselected state. In the embodiment 9, however, it is not necessary to drive the defective array block to a nonselected state in accordance with a result of determination of coincidence/non-coincidence in a program circuit storing such a defective array block address, but rapid access is implemented.

In the embodiment 9, each of the modules MOD0 to MOD3 is shown in such a manner that the array blocks included in its interior form banks respectively. However, the structure that the array blocks included in the modules MOD0 to MOD3 may not be banks but only one memory block (array block) is driven to a selected state in each module may be employed.

In this case, one memory block is driven to a selected state in each of the plurality of modules MOD0 to MOD3. Therefore, rapid access in page change can be readily implemented by substituting array blocks by modules, similarly to the aforementioned embodiment 8.

According to the embodiment 9 of the present invention, as hereinabove described, the registers indicating non-defectiveness/defectiveness of the memory blocks are arranged in the respective modules also in the semiconductor memory device of the module structure and these registers are interconnected with each other to form a shift register between the modules, whereby nondefective/defective array blocks in the respective modules can be readily identified in the externally provided conversion operation part 1647c and address conversion can be readily performed to inhibit access to a defective array block when the defective array block is addressed.

In the above description of the embodiment 9, defective bits in excess of the number of defective blocks allowed in one module are continuously outputted from the scan register control part 1647a, in order to identify the final register. Alternatively, the scan register control part 1647a may transmit a data series having a specific bit pattern as final register identification information.

[Embodiment 10]

Figure 73:
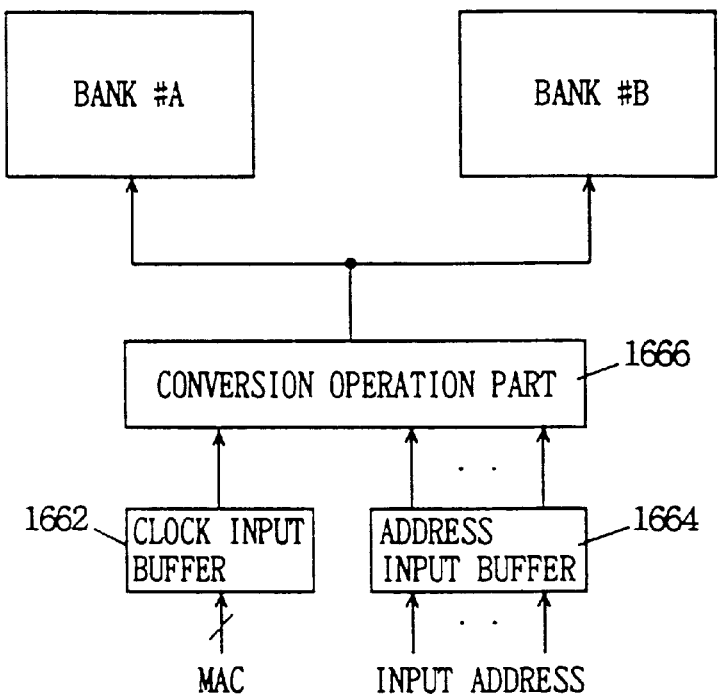
FIG. 73 schematically illustrates the structure of a principal part of a semiconductor memory device according to an embodiment 10 of the present invention.

FIG. 73 schematically illustrates the structure of a principal part of a semiconductor memory device according to an embodiment 10 of the present invention. Referring to FIG. 73, the semiconductor memory device is illustrated including two banks #A and #B. More banks may be provided. Referring to FIG. 73, this semiconductor memory device includes a clock input buffer 1662 receiving an externally supplied clock (control signal) MAC, an address input buffer 1664 receiving an externally supplied input address signal, and a conversion operation part 1666 receiving signals from the clock input buffer 1662 and the address input buffer 1664 for performing prescribed conversion processing for supplying to the banks #A and #B. The conversion operation part 1666 has a function similar to that of the conversion operation part in the aforementioned embodiment 8. The conversion operation part 1666 converts a bank address signal which is supplied from the address input buffer 1664, converts a clock signal which is supplied from the clock input buffer 1662 in accordance with the converted bank address signal, and supplies an active internal clock signal to only a bank specified by the converted bank address signal. Namely, the conversion operation part 1666 performs conversion processing also on the external clock signal MAC.

Figure 74:
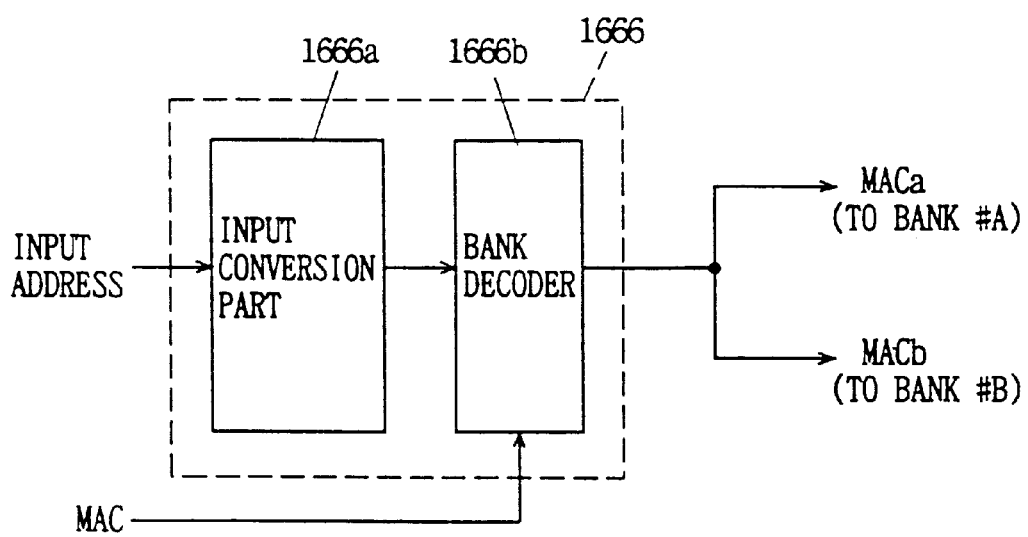
FIG. 74 schematically illustrates the structure of a conversion operation part shown in FIG. 73.

FIG. 74 illustrates an exemplary structure of the conversion operation part 1666 shown in FIG. 73. Referring to FIG. 74, the conversion operation part 1666 includes an input conversion part 1666*a* receiving the input address signal for performing prescribed conversion processing, and a bank decoder 1666*b* which is activated in response to the internal clock signal MAC from the clock input buffer 1662 for decoding the internal address signal supplied from the input conversion part 1666*a* and outputting local clock signals MACa and MACb for the banks #A and #B respectively. The bank decoder 1666*b* decodes the internally converted (or unconverted) internal bank address signal supplied from the input conversion part 1666*a,* and outputs a clock signal which is activated only for an addressed bank.

In case of the structure shown in FIG. 74, the following advantages can be attained as compared with a structure of supplying the internal clock signals from the clock input buffer 1662 to the banks #A and #B and carrying out decoding operations in the banks #A and #B for activation thereof. Namely, the bank decoder 1666*b* can be provided in common for the banks #A and #B, the number of bank decoders for forming the clock signals can be reduced, and the area occupied by the device can be reduced. When the output signals from the clock input buffer 1662 are supplied to the banks #A and #B in common, on the other hand, the output load of the clock input buffer 1662 is increased. When the bank decoder 1666*b* outputs the local clock signals MACa and MACb for the banks #A and #B separatedly from each other, however, the output load of the bank decoder 1666*b* is only one bank. Thus, the output load is reduced, the signals can be propagated at a high speed, and rapid access is enabled.

The clock signals MAC may be /RAS and /CAS, and /WE, /OE and /CAS, which are signals employed in case of a DRAM (dynamic random access memory). In this case, the write enable signal /WE and the output enable signal /OE are supplied to an input/output buffer which is provided in common for the banks #A and #B in the semiconductor memory device, while a local write enable signal and a local output enable signal for writing/reading data are supplied to the respective banks (when the respective banks are provided with write and read circuits independently of each other).

In the structure of the conversion operation part 1666 shown in FIG. 74, the bank decoder 1666*b* may have the structure of a predecoder. In this case, the conversion operation part 1666 outputs a predecoded local clock signal, which in turn is further decoded in each bank for activating the corresponding bank. This bank may be an array block which has been described in relation to any of the precedent embodiments.

According to the embodiment 10 of the present invention, as hereinabove described, the clock signal is also processed so that the active internal clock signal is transmitted to an addressed bank (array block) alone, whereby the load on the signal line for transmitting the clock signal is reduced and the internal clock signal can be transmitted to each array block (bank) at a high speed.

[Embodiment 11]

Figure 75:
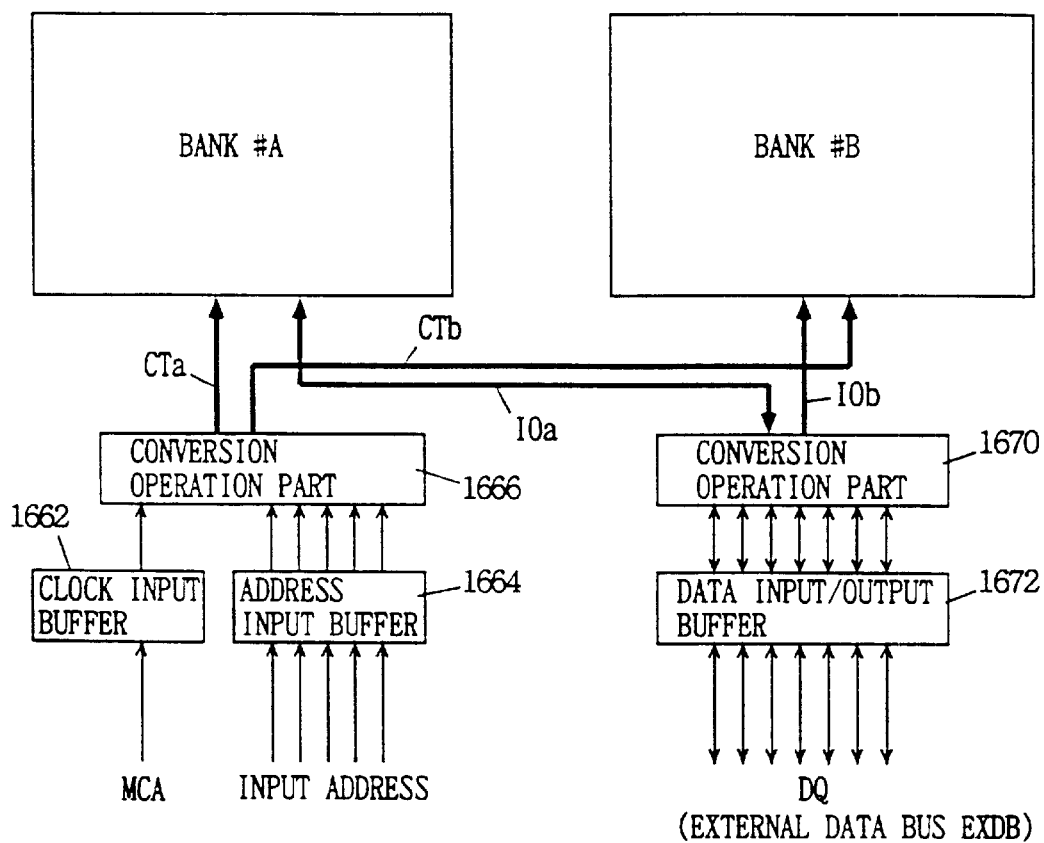
FIG. 75 schematically illustrates the structure of a principal part of a semiconductor device according to an embodiment 11 of the present invention.

FIG. 75 schematically illustrates the structure of a principal part of a semiconductor memory device according to an embodiment 11 of the present invention. Referring to FIG. 75, this semiconductor memory device includes two banks #A and #B. In order to specify operation modes and addresses for these banks #A and #B, the semiconductor memory device further includes a clock input buffer 1662 for receiving an external clock signal MCA, an address input buffer 1664 for receiving an external input address signal, a conversion operation part 1666 for converting the signals from the buffers 1662 and 1664 and transmitting local control signals to the banks #A and #B through control buses CTa and CTb respectively, another conversion operation part 1670 which is connected to the banks #A and #B through internal data buses IOa and IOb, and a data input/output buffer 1672 inputting/outputting data in/from the bank #A and/or #B through the conversion operation part 1670. The data input/output buffer 1672 is connected to an external data bus EXDB.

The clock input buffer 1662, the address input buffer 1664 and the conversion operation part 1666 are identical in structure to those of the embodiment 10 shown in FIG. 73.

The conversion operation part 1670 controls the connection between the internal data buses IOa and IOb and the data input/output circuit 1672. Each of the internal data buses IOa and IOb has bus lines of the same number as those of the external data bus EXDB.

The conversion operation part 1670 divides the external data bus EXDB (data input/output terminal of the data input/output buffer 1672) into a plurality of groups EDB0 to EDB3 having prescribed numbers of bus lines (data input/output terminals) respectively, and establishes connection between the data bus lines of the internal data buses IOa and IOb and the output buffer 1672 in units of respective groups. Thus, the connection mode between the external and internal data buses through the data input/output buffer 1672 is changed.

Figure 76:
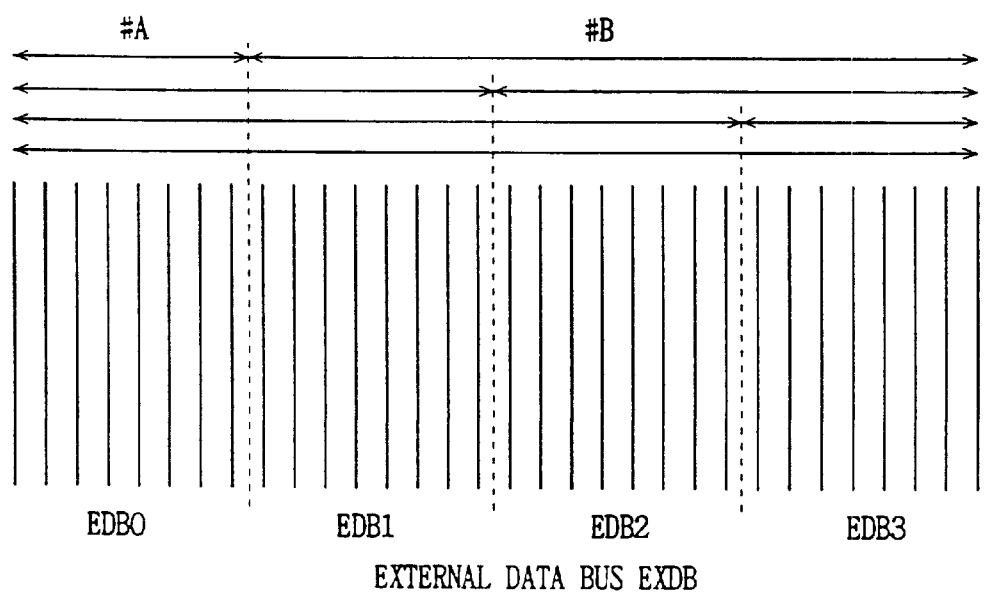
FIG. 76 illustrates an exemplary bus conversion mode of a bus conversion operation part in FIG. 75.

In general, one of the banks #A and #B transfers data with the external data bus EXDB through all bus lines of the internal data bus IOa or IOb. If the external data bus EXDB has a number of bus lines (32-bit width in FIG. 76), however, 32-bit words are not necessarily regularly transferred between the external data bus EXDB and the internal data bus IO (IOa or IOb). 16-bit or 8-bit words may alternatively be employed. In this case, the connection between the external data bus EXDB and the internal data bus is changed in accordance with the employed word number, as shown in FIG. 76. At this time, the banks #A and #B are simultaneously activated. The bus lines of the internal data buses IOa and IOb utilized by the banks #A and #B are decided by the conversion operation part 1670. Therefore, the banks #A and #B transfer data with the external data bus EXDB in parallel with each other.

When data transfer is performed through the subdata buses EDB2 and EDB3 shown in FIG. 76 by the bank #B, for example, data are transferred by free subdata buses EDB0 and EDB1 with the bank #A. Thus, the data transfer efficiency is remarkably improved. When the subdata buses EDB2 and EDB3 transfer data to a processor CPU#A and the subdata buses EDB0 and EDB1 transfer data to another processor CPU#B, a plurality of CPUs can simultaneously transfer necessary data in a multiprocessor system.

Figure 77:
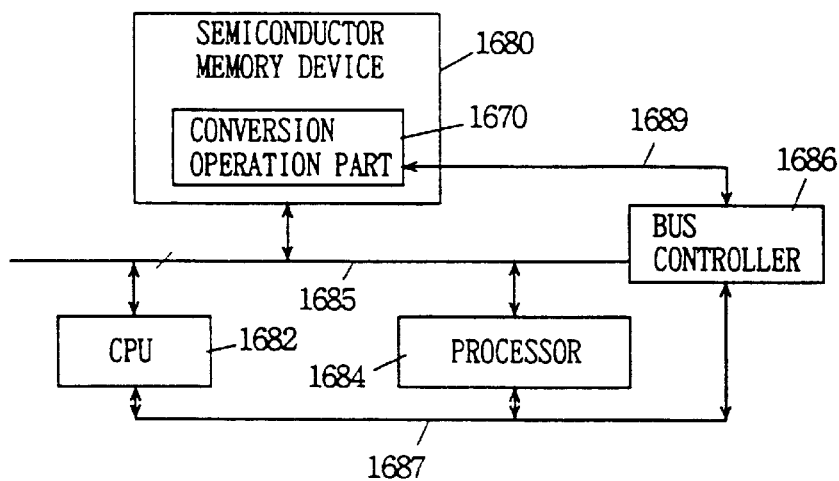
FIG. 77 illustrates an exemplary structure of a processing system employing the semiconductor memory device according to the embodiment 11 of the present invention.

FIG. 77 illustrates an exemplary structure of a processing system utilizing the semiconductor memory device shown in FIG. 75. Referring to FIG. 77, a CPU 1682 and a processor 1684 are connected to a semiconductor memory device 1680 through an external data bus (EXDB) 1685. This external data bus 1685 is connected to a conversion operation part 1670 included in the semiconductor memory device 1680. The CPU 1682 and the processor 1684 are connected to a bus controller 1686 through a control bus 1687. This bus controller 1686 is coupled with the conversion operation part 1670 through a control bus 1689. The CPU 1682 and the processor 1684 access banks #A and #B included in the semiconductor memory device 1686 as access regions in an interleave mode, for example. The processor 1684 may be a CPU, or a functional module which executes only a prescribed operation function. For the purpose of simplification, it is assumed here that the CPU 1682 performs an arithmetic processing operation and the processor 1684 controls a display operation of image data. The CPU 1682 and the processor 1684 output requests for occupation of the external data bus 1685. At this time, the CPU 1682 also transmits information as to which data bus lines of the external data bus 1685 are used to the bus controller 1686. In accordance with the request from the CPU 1682, the bus controller 1686 allows the CPU 1682 to access the semiconductor memory device 1680 when the corresponding bus is brought to a free state (not used by the processor 1684).

The conversion operation part 1670 decides the connection mode between the internal data bus and the external data bus 1685 in accordance with bus information included in an instruction from the CPU 1682. In this case, the conversion operation part 1670 connects the internal data bus IOa of the bank #A to the external data bus 1685 for transferring data in access of the CPU 1682. At this time, when not all bus lines of the external data bus 1685 are used, the CPU 1682 supplies this information to the conversion operation part 1670. The conversion operation part 1670 decides the connection mode between the internal data bus and the external data bus 1685 in response to the bus use information from the CPU 1682. When not all bus lines of the external data bus 1685 are used, the conversion operation part 1670 supplies information indicating free subdata buses to the bus controller 1686 through the control bus 1689 in accordance with an instruction from the CPU 1682. The bus controller 1686 supplies acknowledgement information for the free subdata buses to the processor 1684 in accordance with the subdata bus information supplied from the conversion operation part 1670. The processor 1684 accesses the semiconductor memory device 1680 through the free subdata buses in accordance with the free bus information. When the CPU 1682 and the processor 1684 can access the semiconductor memory device 1680 only in the interleave mode, the processor 1684 can transfer data through a free subdata bus if the bit width of operation data used by the CPU 1682 is smaller than the bus width of the external data bus 1685, thereby improving the utilization efficiency of the external data bus 1685.

The conversion operation part 1670 may alternatively be structured to decide the connection mode between the internal and external data buses under control by the bus controller 1686. In this case, the CPU 1682 also transmits information indicating which subdata bus group of the external data bus 1685 is utilized to the bus controller 1686.

In the above description, it is assumed that the processor 1684 processes image data, for example, and one pixel data is of eight bits, which are equal to the bit width of one subdata bus. Alternatively, the device may be so structured that the processor 1684 performs similar arithmetic processing and supplies information indicating the subdata bus to be used in the external data bus EXDB to the bus controller 1686 for supplying information for deciding the connection mode between the internal and external data buses to the conversion operation part 1670.

Figure 78:
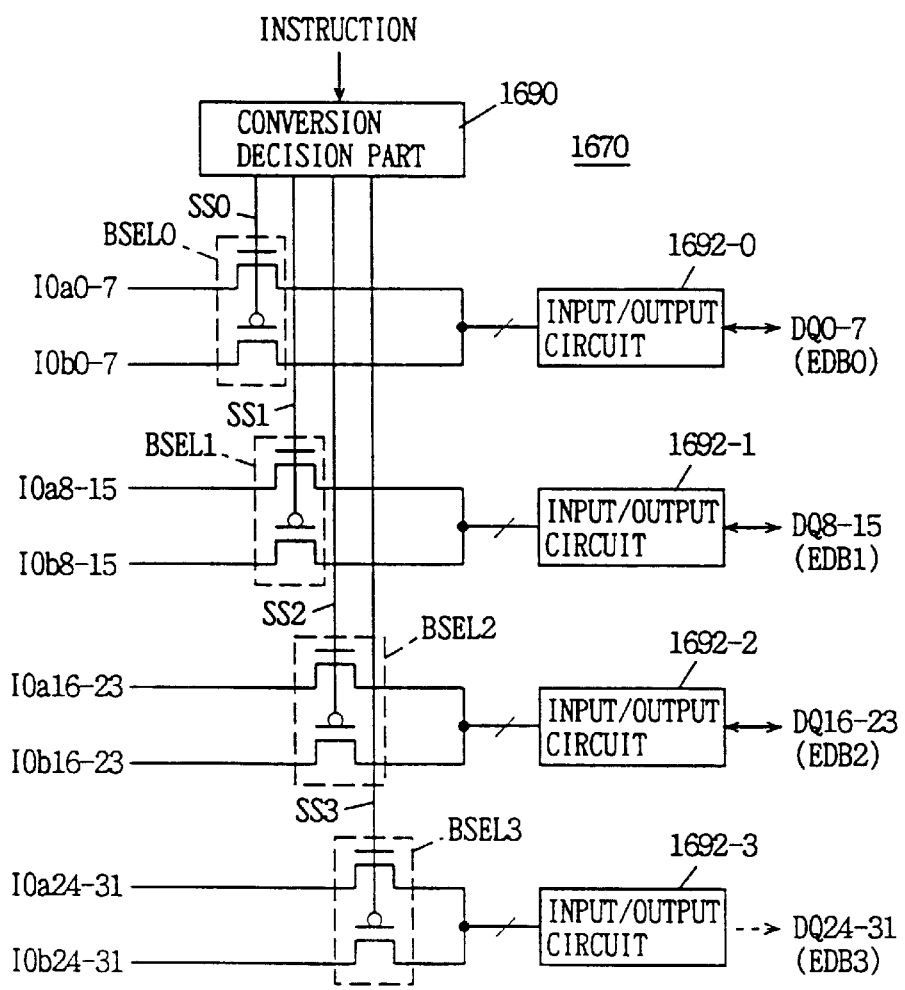
FIG. 78 illustrates an exemplary structure of a conversion operation part shown in FIG. 77.

FIG. 78 schematically illustrates an exemplary structure of the conversion operation part 1670 shown in FIG. 77. Referring to FIG. 78, the conversion operation part 1670 includes a conversion decision part 1690 deciding the conversion mode of the internal and external data buses in accordance with an instruction supplied from the CPU, the processor or the bus controller, a selection circuit BSEL0 which is provided in correspondence to internal data buses IOa0 to IOa7 and IOb0 to IOb7 for selecting either the internal data buses IOa0 to IOa7 or the internal data buses IOb0 to IOb7 in accordance with a selection control signal SS0 from the conversion decision part 1690, a selection circuit BSEL1 for selecting either internal data buses IOa8 to IOa15 or internal data buses IOb8 to IOb15 in response to a selection control signal SS1 from the conversion decision part 1690, a selection circuit BSEL2 for selecting either internal data buses IOa16 to IOa23 or internal data buses IOb16 to IOb23 in response to a selection control signal SS2 from the conversion decision part 1690, and a selection circuit BSEL3 for selecting either internal data buses IOa214 to IOa31 or internal data buses IOb24 to IOb31 in accordance with a selection control signal SS3 from the conversion decision part 1690. Input/output circuits 1692-0 to 1692-3 are provided between the selection circuits BSEL0 to BSEL3 and the subdata buses EDB0 to EDB3 of the external data bus 1685.

The conversion decision part 1690 decides the logic states of the selection control signals SS0 to SS3 in accordance with bus width under use information and bus position information included in a supplied instruction (from the CPU, the processor or the bus controller). Consider that the CPU 1682 utilizes the bank #A of the semiconductor memory device 1680 and the processor 1684 uses the bank #B of the semiconductor memory device 1680, for example. The CPU 1682 supplies information indicating which one of the subdata buses EDB0 to EDB3 of the external data bus 1685 is used to the conversion decision part 1690 by its instruction. The conversion decision part 1690 decodes the bit width information and the bit position information included in the supplied instruction, and decides the logic states of the selection control signals SS0 to SS3.

When the CPU 1682 uses all subdata buses EDB0 to EDB3 of the external data bus 1685, for example, all selection control signals SS0 to SS3 are brought to high levels. In this state, only the CPU 1682 can access the semiconductor memory device 1680, and the external data bus 1685 is occupied by the CPU 1682. When the CPU 1682 uses only the subdata buses EDB0 to EDB2 of the external data bus 1685, on the other hand, this information is supplied to the conversion decision part 1690 included in the conversion operation part 1670, so that the conversion decision part 1690 brings the selection control signals SS0, SS1 and SS2 to high levels while bringing the selection control signal SS3 to a low level. Thus, the external subdata bus EDB3 is connected to the bank #B, so that the processor 1684 can access the bank 0B included in the semiconductor memory device 1680 through the subdata bus EDB3.

In the structure shown in FIG. 78, the selection circuits BSEL0 to BSEL3 alternatively connect the corresponding input/output circuits and internal subdata buses with each other. When a structure of simultaneously connecting the input/output circuits with the corresponding internal subdata buses is added, the same data can be simultaneously written in the banks #A and #B, thereby readily implementing a copy operation.

When a structure of simultaneously connecting one internal subdata bus to a plurality of input/output circuits is contrarily employed, on the other hand, the same data can be transferred to the CPU 1682 and the processor 1684.

This embodiment 11 is directed to only the two banks #A and #B. In this case, the aforementioned structure may be employed for the most significant bank in the semiconductor memory device shown in FIG. 60.

According to the embodiment 11 of the present invention, as hereinabove described, the connection mode between the internal and external data buses is changed, whereby high-speed and high-efficiency data transfer is enabled.

[Modification]

Figure 79:
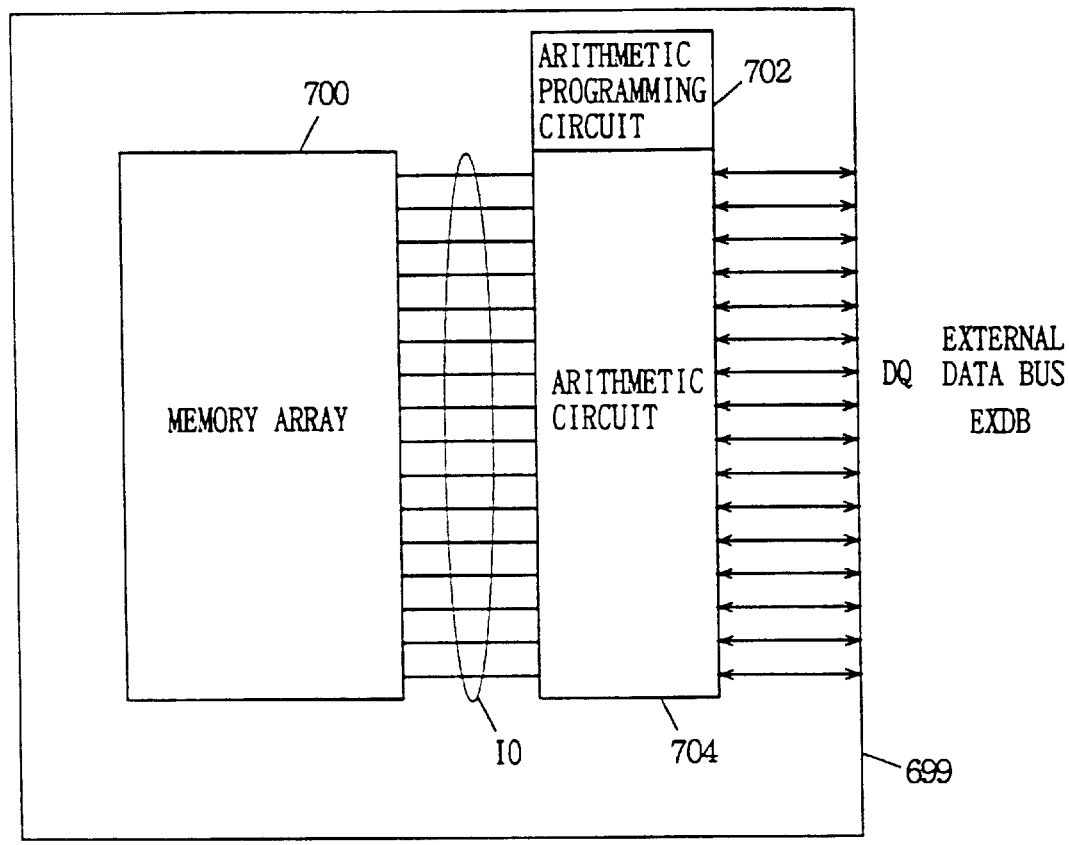
FIG. 79 illustrates the structure of a modification of the semiconductor memory device according to the embodiment 11 of the present invention.

FIG. 79 schematically illustrates the structure of a semiconductor memory device 699 according to a modification of the embodiment 11 of the present invention. Referring to FIG. 79, the semiconductor memory device 699 includes a memory array 700 including a plurality of array blocks, an arithmetic circuit 704 for deciding the connection mode between an internal data bus IO which is coupled with the memory array 700 and an external data bus EXDB, and an arithmetic programming circuit 702 for deciding the connection mode of the arithmetic circuit 704. FIG. 79 illustrates no data input/output buffer, for the purpose of simplification. The data input/output buffer (input/output circuit) may be provided between the arithmetic circuit 704 and the external data bus EXDB, or the arithmetic circuit 704 may be provided between the data input/output buffer (input/output circuit) and the external data bus EXDB.

The array blocks included in the memory array 700 may be in such a structure that activation/inactivation thereof depends on each other similarly to a general semiconductor memory device, or these array blocks may be in a bank structure of being activated/inactivated independently of each other, similarly to the aforementioned embodiments. In case of the general array block structure (non-bank structure), a plurality of array blocks are selected so that prescribed numbers of bits of memory cells in the selected array blocks are coupled to the internal data bus IO. When the array blocks are in the bank structure, on the other hand, selected memory cells of a selected bank are coupled to the internal data bus IO. Selected memory cells are present either over a plurality of array blocks (in case of the non-bank structure) or in a single array block (bank structure) simply with difference in distribution (physical positions) of 1-word data bits, and there exists no substantial difference. The following description is made in relation to both structures.

Figure 80:
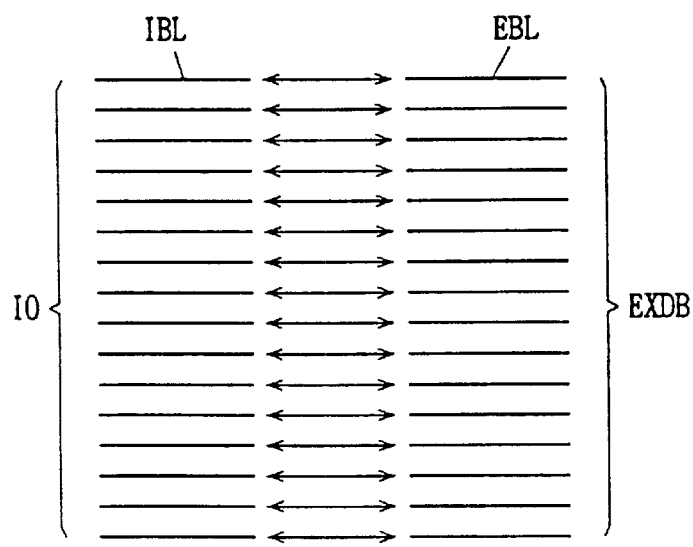
FIG. 80 illustrates a connection mode between an external bus and internal data buses in the semiconductor memory device shown in FIG. 79.

The arithmetic circuit 704 decides the connection mode of bus lines of the internal data bus IO and the external data bus EXDB. In a general operation, all bus lines IBL included in the internal data bus IO and bus lines EBL of the external data bus EXDB are previously set in one-to-one correspondence and coupled with each other in the mode, as shown in FIG. 80. In this state, therefore, data transfer is performed through all bus lines EBL of the external data bus EXDB. In this data transfer, one CPU or functional module (or processor) occupies the external data bus EXDB.

Figure 81:
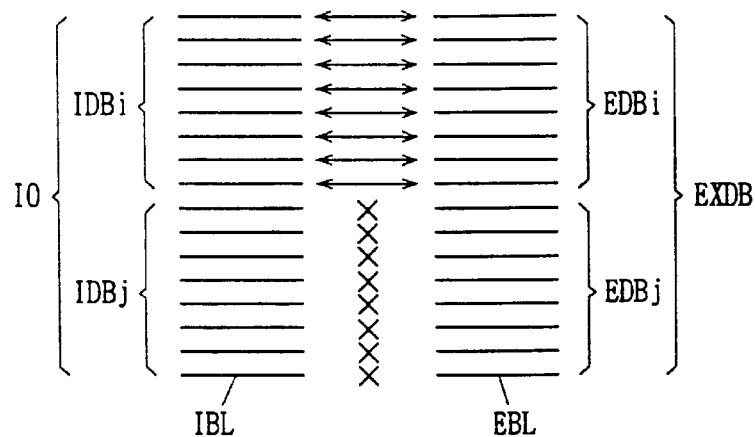
FIG. 81 illustrates a connection mode between internal and external data buses in the semiconductor memory device shown in FIG. 79.

FIG. 81 illustrates a first conversion connection mode between the internal data bus IO and the external data bus EXDB. In the connection shown in FIG. 81, the internal data bus IO is divided into two subdata buses IDBi and IDBj each including eight internal data bus lines IBL. The external data bus EXDB is also divided into subdata buses EDBi and EDBj each including 8-bit external data bus lines EBL. Only the subdata buses IDBi and EDBi are interconnected with each other. The subdata buses IDBj and EDBj are isolated from each other. In this state, data transfer is performed with the semiconductor memory device only through the subdata bus EDBi of the external data bus EXDB. The subdata bus EDBj is in a free state. Therefore, another processor or functional module can perform data transfer between the processors or between the processor and the functional module through the free subdata bus EDBj.

Figure 82:
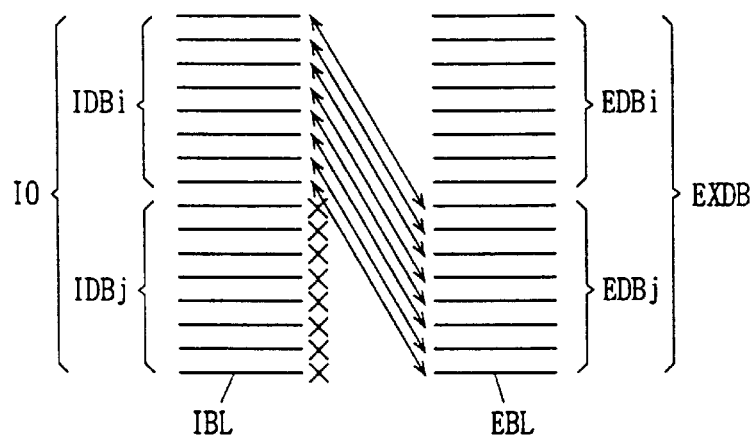
FIG. 82 illustrates a connection mode between the internal and external data buses in the semiconductor memory device shown in FIG. 79.

FIG. 82 illustrates a second conversion connection mode between the internal data bus IO and the external data bus EXDB. In the connection shown in FIG. 82, the subdata bus IDBi of the internal data bus IO is connected to the subdata bus EDBj of the external data bus EXDB, and byte positions are converted. The subdata bus IDBj of the internal data bus IO is not utilized. The subdata bus EDBi of the external data bus EXDB is not employed for accessing the semiconductor memory device. Therefore, data transfer can be performed with an external CPU or processor or functional module through the free subdata bus EDBi so that all bus lines EBL of the external data bus EXDB can be regularly brought to under-use states, whereby data transfer efficiency is improved.

When the subdata bus IDBj of the internal data bus IO is brought to an isolated state in each of FIGS. 81 and 82, corresponding memory cells in the selected array block are selected. In this case, no external data are written in the memory cells corresponding to the subdata bus IDBj, and hence merely a refresh operation is performed on these selected memory cells.

When the external CPU accessing the semiconductor memory device utilizes 8-bit information in case of the bus conversion structure shown in FIG. 82, the 8-bit information can be stored in a lower byte register included in the interior. Therefore, the CPU requires no processing operation of reading an upper byte (corresponding to the subdata bus IDBi) of the semiconductor memory device through a byte high enable signal, for example, through the subdata bus EDBi of the external data bus EXDB for converting data supplied through the subdata bus EDBi to a lower byte register in the interior, whereby a byte swap operation for the byte position conversion is simplified and the processing efficiency of the CPU is improved by immediately storing necessary data in a prescribed position.

Figure 83:
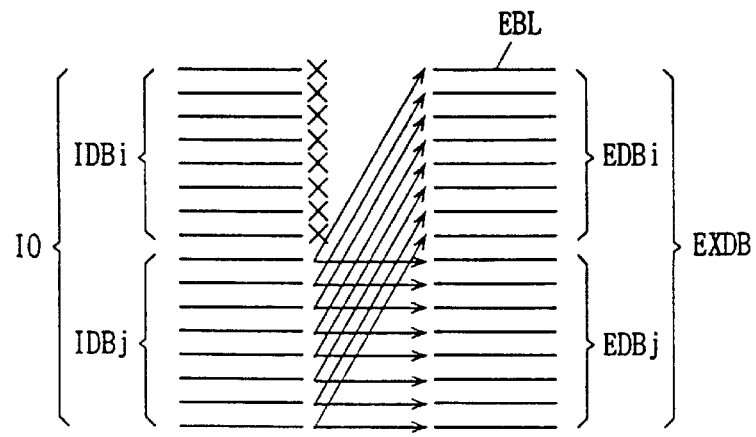
FIG. 83 illustrates a connection mode between the internal and external data buses in the semiconductor memory device shown in FIG. 79.

FIG. 83 illustrates a third conversion connection mode between the internal data bus IO and the external data bus EXDB. In the connection shown in FIG. 83, the subdata bus IDBj of the internal data bus IO is connected to the subdata buses EDBi and EDBj of the external data bus EXDB. Data read on the subdata bus IDBj is simultaneously transmitted to the subdata buses EDBi and EDBj of the external data bus EXDB. The subdata bus EDBi is coupled to an 8-bit CPU #A, and the subdata bus EDBj is coupled to an 8-bit CPU #B. Therefore, the data read on the subdata bus IDBj of the internal data bus IO is simultaneously transmitted to the CPUs #A and #B. When no bus conversion function is provided and the CPUs #A and #B simultaneously utilize the same data, the CPU #B which is coupled to the subdata bus EDBj of the external data bus EXDB reads the data and stores the same in a buffer memory, and thereafter the CPU

A accesses the externally provided buffer memory and reads necessary data. In this case, therefore, the structure for transmitting the same data to the CPUs #A and #B is complicated and the time for the data transfer is lengthened. When a bus connection conversion function is provided in the interior of the semiconductor memory device as shown in FIG. 83, the same data can be transferred to the CPUs #A and #B at a high speed to enable high-speed data processing, while all bus lines EBL of the external data bus EXDB can be used to improve the bus utilization efficiency.

Figure 84:
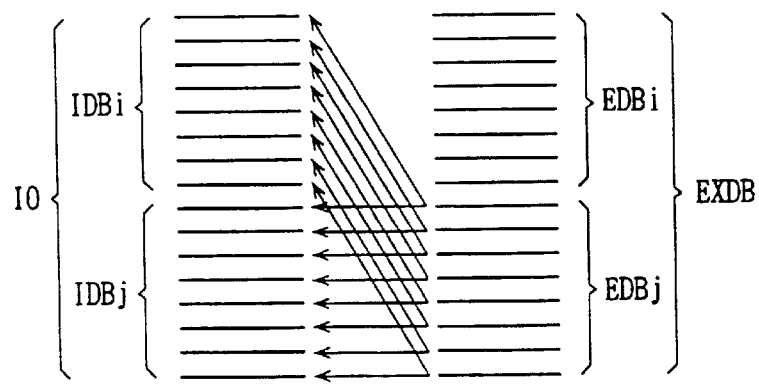
FIG. 84 illustrates a connection mode between the internal and external data buses in the semiconductor memory device shown in FIG. 79.

FIG. 84 illustrates a fourth conversion connection mode between the internal data bus IO and the external data bus EXDB. Referring to FIG. 84, the subdata bus EDBj of the external data bus EXDB is coupled to the subdata buses IDBi and IDBj of the internal data bus IO respectively. Therefore, data transferred onto the subdata bus EDBj are simultaneously transferred to the subdata buses IDBi and IDBj. Thus, the same data are stored in two regions (regions corresponding to the subdata buses IDBi and IDBj respectively) in the memory cell array. Therefore, backup data for reliability can be stored in a memory region in single write sequence. The subdata bus EDBi, which is not utilized for accessing the semiconductor memory device in this write operation, is utilized for data transfer with another processor or functional module.

Figure 85:
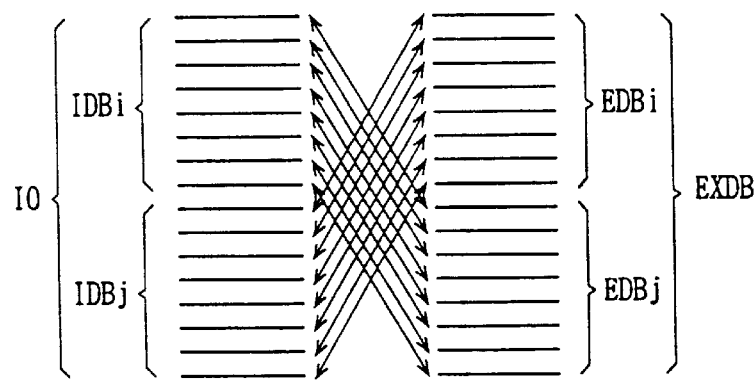
FIG. 85 illustrates a connection mode between the internal and external data buses in the semiconductor memory device shown in FIG. 79.

FIG. 85 illustrates a fifth conversion connection mode between the internal data bus IO and the external data bus EXDB. Referring to FIG. 85, the subdata buses IDBi and IDBj of the internal data bus IO are connected to the subdata buses EDBj and EDBi of the external data bus EXDB respectively. Byte positions are interchanged. In this case, data are stored in the semiconductor memory device in a general connection mode between the internal data bus IO and the external data bus EXDB as shown in FIG. 80, and parity is generated in units of the subdata buses. In reading, data are read in a general connection mode (refer to FIG. 80), and parity is generated for the respective subdata buses EDBi and EDBj in the exterior for checking and correcting errors. Then, the byte swap connection shown in FIG. 85 is made and the parity is checked and corrected as to the respective data of the external subdata buses EDBi and EDBj again. When the parities match with each other in the general connection and in the byte swap connection, the read data are determined as being correct. This byte swap connection structure can utilize the duplicate writing shown in FIG. 84. Namely, reliability of doubly written backup data is further guaranteed by identifying whether or not the doubly written data generate the same parity also in byte swapping, whereby the system performance is improved.

Figure 86:
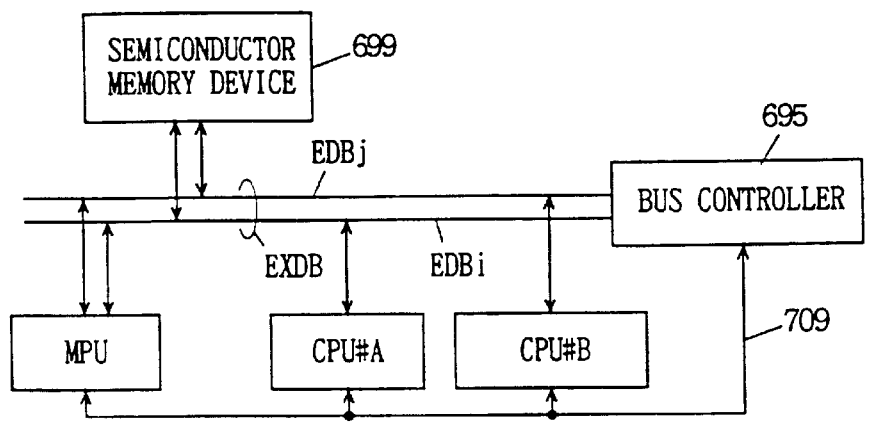
FIG. 86 illustrates an exemplary structure of a processing system employing the semiconductor memory device shown in FIG. 79.

FIG. 86 illustrates an exemplary structure of a processing system utilizing the semiconductor memory device 699 shown in FIG. 79. Referring to FIG. 86, the semiconductor memory device 699 is coupled to a microprocessor MPU through the external data bus EXDB, coupled to the CPU #A through the subdata bus EDBi, and coupled to the CPU #B through the subdata bus EDBj. The MPU can access the semiconductor memory device 699 through both subdata buses EDBj and EDBi. A bus controller 695 is connected to the MPU, the CPU #A and the CPU #B in common through a control bus 709. This bus controller 695 regularly monitors the access condition of the external data bus EXDB and returns bus available information to a processor (the MPU, the CPU #A or the CPU #B) requiring access on the basis of the use condition of the external data bus EXDB, in accordance with an access request signal supplied through the control bus 709. The semiconductor memory device 699 has the internal bus conversion connection control functions shown in FIGS. 81 to 85. As to the bus connection function, the bus connection mode may be decided by a conversion operation part which is provided in the semiconductor memory device 699 in accordance with an instruction from the MPU, the CPU #A or the CPU #B. Alternatively, -underbus use information may be supplied to the conversion operation part of the semiconductor memory device 699 (this path is not shown) under control by the bus controller 695, for performing bus connection control.

Also when the CPUs #A and #B utilize different subdata buses EDBi and EDBj as shown in FIG. 86, the CPUs #A and #B can access the same array block through the bus connection shown in FIG. 81. Through the bus connection shown in FIG. 83, on the other hand, the CPUs #A and #B can simultaneously receive the same data from the semiconductor memory device 699. Depending on the under-use condition of the external data bus EXDB, the MPU can execute data transfer in parallel through the CPU #B and the subdata bus EDBj when the CPU #A performs data transfer with the semiconductor memory device 699 through the subdata bus EDBi, for example. Thus, bus utilization efficiency is improved, and processors performing different processing can utilize the external data bus EXDB in parallel with each other, whereby data transfer efficiency is improved.

Figure 87:
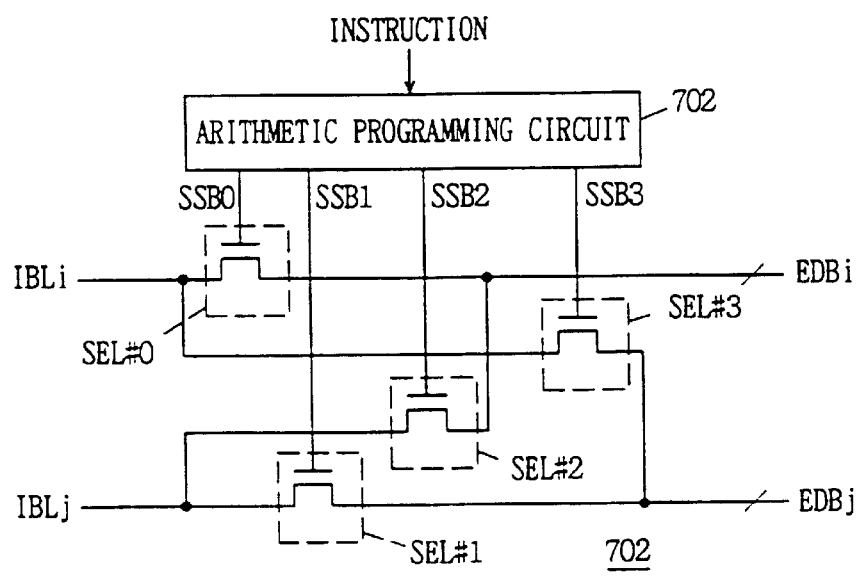
FIG. 87 illustrates an exemplary structure of an arithmetic circuit shown in FIG. 79.

FIG. 87 illustrates an exemplary specific structure of the arithmetic circuit 704 shown in FIG. 79. FIG. 87 shows a structure in units of subdata buses. Therefore, each circuit simultaneously transfers a plurality of bits.

Referring to FIG. 87, the arithmetic circuit 704 includes a selection circuit SEL#0 which conducts in response to a connection control signal SSB0 from the arithmetic programming circuit 702 for selectively connecting an internal subdata bus IBLi to an external subdata bus EDBi, a selection circuit SEL#1 which conducts in response to a connection control signal SSB1 from the arithmetic programming circuit 702 for selectively connecting an internal subdata bus IBLj to an external subdata bus EDBj, a selection circuit SEL#2 which conducts in response to a connection control signal SSB2 from the arithmetic programming circuit 702 for selectively connecting the subdata bus IBLj to the external subdata bus EDBi, and a selection circuit SEL#3 which conducts in response to a connection control signal SSB3 from the arithmetic programming circuit 702 for selectively connecting the subdata bus IBLi to the external subdata bus EDBi.

The arithmetic programming circuit 702 receives an instruction from each processor (an MPU, a CPU or a bus controller). The instruction includes information indicating a bus under use and a data transfer mode (any data transfer operation shown in FIGS. 80 to 85), and the arithmetic programming circuit 702 decodes this instruction for selectively activating/inactivating the connection control signals SSB0 to SSB3 for implementing necessary bus connection. This arithmetic programming circuit 702 may have the structure of a general instruction decoder.

[Modification]

Figure 88A:
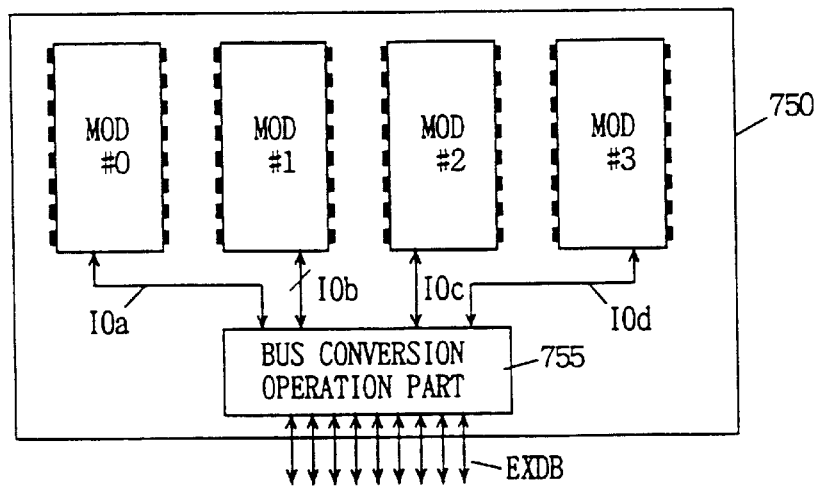
FIGS. 88A and 88B illustrate the structures of a modification of the embodiment 11 of the present invention.
Figure 88B:
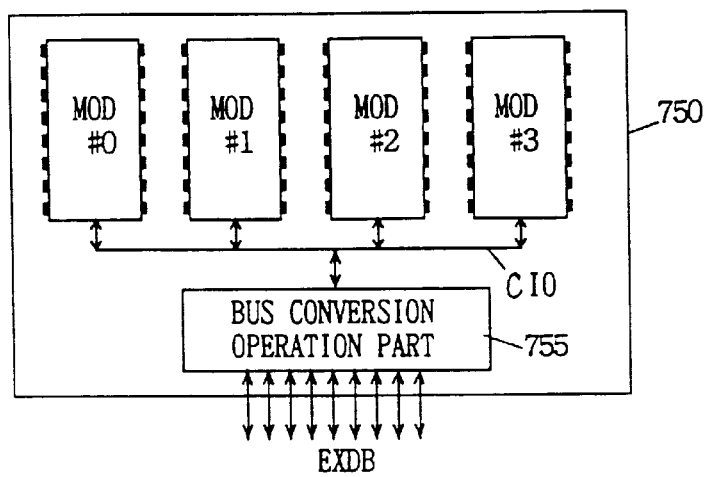

FIGS. 88A and 88B illustrate the structures of other modifications of the embodiment 11 of the present invention. Referring to FIG. 88A, a semiconductor memory device 750 includes a plurality of modules (chips) MOD#0 to MOD#3 which are accessible independently of each other, and a bus conversion operation part 755 which is connected with these modules MOD#0 to MOD#3 through internal data buses IOa, IOb, IOc and IOd respectively. This bus conversion operation part 755 is connected with an external data bus EXDB through a data input buffer (not shown). In the structure shown in FIG. 88A, each of the modules MOD#0 to MOD#3 comprises the structure shown in FIG. 79 or 75. These modules MOD#0 to MOD#3 form banks, and are accessible independently of each other. The modules MOD#0 to MOD#3 may have bank structures, or general non-bank array block structures, similarly to FIGS. 79 and 75, as a matter of course. The bus conversion operation part 755 selectively couples the internal data buses IOa to IOd which are provided in correspondence to the modules MOD#0 to MOD#3 respectively to the external data bus EXDB in accordance with a supplied instruction, similarly to the aforementioned structure shown in FIG. 75. Therefore, when the module MOD#0 transfers data with a partial subdata bus of the external data bus EXDB through a prescribed number of data bus lines of the internal data bus IOa, for example, the remaining modules can perform data transfer through the remaining sub data buses.

FIG. 88B illustrates another structure of the semiconductor memory device 750. Also in the structure shown in FIG. 88B, a plurality of memory modules MOD#0 to MOD#3 are arranged. The modules MOD#0 to MOD#3 are coupled to a bus conversion operation part 755 through a common internal data bus CIO. The bus conversion operation part 755 selectively couples internal data bus lines (subdata buses) included in the common internal data bus CIO to an external data bus EXDB. Thus, the bus conversion operation part 755 performs a bus conversion operation similar to that of the arithmetic circuit 704 shown in FIG. 79. In this case, therefore, a similar address bus conversion operation is implemented by making the selected array blocks of the memory array shown in FIG. 79 correspond to the memory modules MOD#0 to MOD#3 respectively.

The structures shown in FIGS. 88A and 88B may be combined with each other. Further, each of the memory modules MODR0 to MOD#3 may further have the structures shown in FIGS. 74 to 79. It is possible to perform a hierarchical bus conversion operation by these combinations, thereby more flexibly implementing data transfer.

Figure 89A:
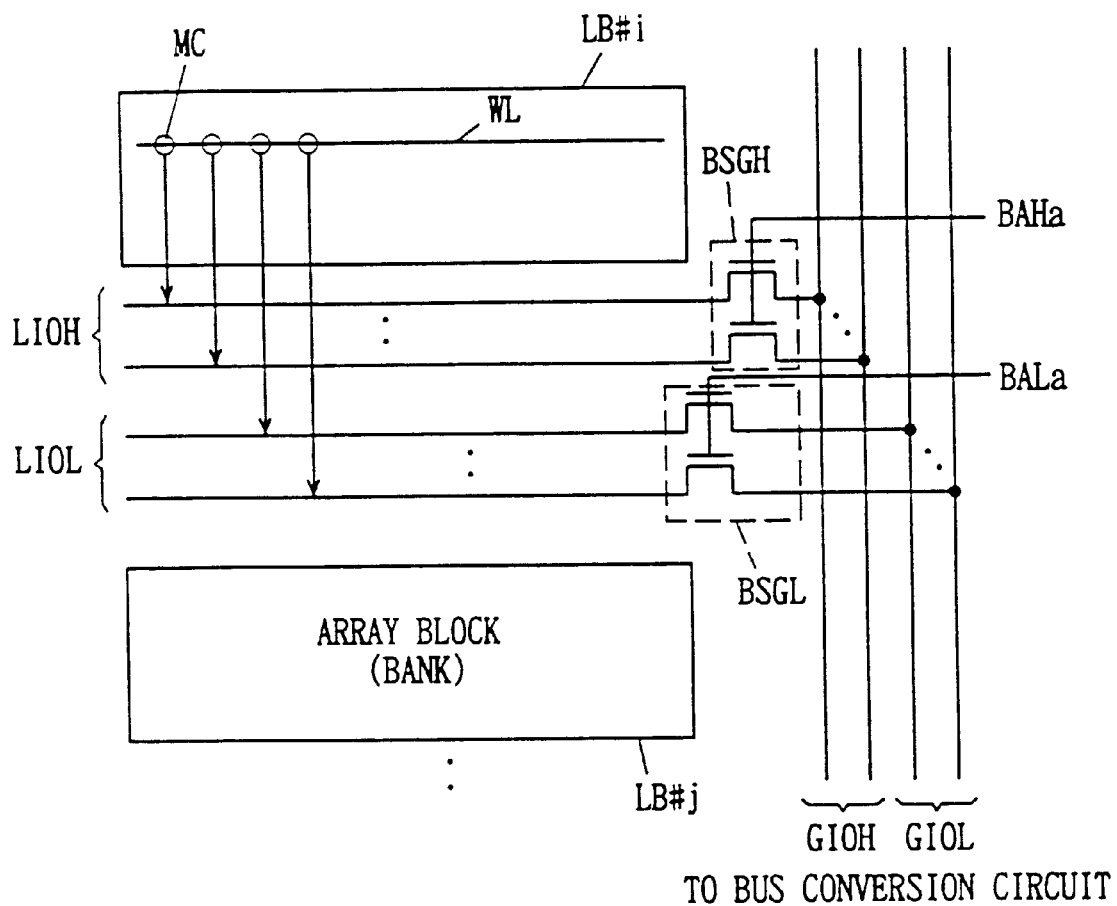
FIGS. 89A and 89B illustrate internal bus switching structures of a bank structure according to the embodiment 11 of the present invention.

FIG. 89A shows a schematic arrangement for implementing a selective connection of internal data bus in a semiconductor memory device including a plurality of array blocks configured into banks. Referring to FIG. 89A, two array blocks LB4i and LB#a are representatively shown.

For array block LB#1, there are provided a lower local IO bus LIOL for transferring lower byte data and a higher local IO bus LIOH for transferring higher byte data. Local IO buses LIOL and LIOH transmit and receive data to and from memory cells MCs connected to a selected word line in array block LB#i. Local IO buses LIOL and LIOH are provided only for array block LB#i. An adjacent array block LB#j transmits and receives data to and from a not shown different local IO bus.

Local IO buses LIOH and LIOL are coupled through bank select gates BSGH and BSGL to global IO buses GIOH and GIOL serving as an internal data bus. In a normal mode of operation, global IO bus GIOH transfers higher byte data, and global IO bus LIOH transfers lower byte data.

Bank select gates BSGH and BSGL are made conductive in response to bank/byte select signals BAHa and BALa, respectively. Bank/byte select signal BAHa includes both information for designating a bank or an array block and information for indicating the use of a bus for higher byte data (in a normal mode of operation). Bank/byte select signal BALa similarly includes band designation information and lower byte bus usage indicating information. Bank/byte select signals NAHa and BALa are produced based on the result of decoding of a bank address signal and of bus usage information supplied from a processor, as described later.

As shown in FIG. 89A, by inclusion of bank designation information and bus usage indicating information in control signals controlling the on/off of bank select gates BSGH and BSGL for establishing a connection between local IO buses provided for respective array blocks and global IO buses provided for respective array blocks and global IO buses provided commonly to the respective array blocks, accurate access to memory cells required in a designated operation mode can be implemented even in switching of bus connection in the semiconductor memory device.

Figure 89B:
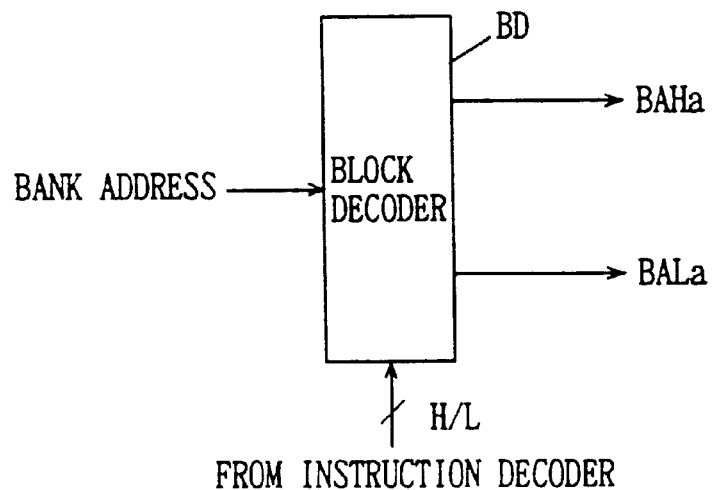

FIG. 89B shows an arrangement for generating bank/byte select signals BAHa and BALa shown in FIG. 89A. Referring to FIG. 89B, a block decoder BD receives bank address information as well as higher byte/lower byte usage indicating information from an instruction decoder, to produce bank/byte select signals BAHa and BALa. Block decoder BD may be provided corresponding to the plurality of array blocks, or may be provided in common to the plurality of array blocks to transmit the bank/byte select signals BAHa and BALa only to a selected array block. The bank address supplied to block decoder BD is a converted bank address (memory block designation address) if the address conversion arrangement is employed.

As described above, connection between internal data bus lines and external data bus lines are selectively established, and thus all the bus lines of the external data bus can be always used for data transfer, resulting in efficient data transfer. In addition, when internal data bus is provided corresponding to each of array blocks and an internal data bus is selectively coupled to external data bus, data copy operation and transfer of common data to a plurality of processors can readily be implemented.

According to the embodiment 11 of the present invention, as hereinabove described, the connection mode between the internal and external data buses is selectively implemented, whereby data transfer can be performed by regularly using the external data bus for implementing efficient data transfer. Further, a data copy operation, transfer of the same data to a plurality of processors and the like can be readily implemented by providing the internal data buses in correspondence to a plurality of array blocks respectively and selectively connecting the internal data buses corresponding to the array blocks to the external data bus.

[Embodiment 12]

Figure 90A:
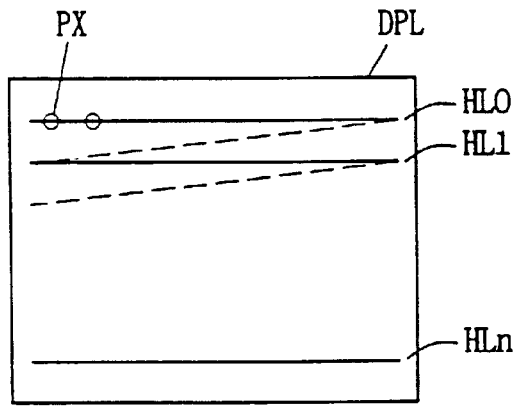
FIG. 90A illustrates the scan mode of image data to which a semiconductor memory device according to an embodiment 12 of the present invention is applied.

FIG. 90A illustrates an exemplary structure of a processing system to which an embodiment 12 of the present invention is applied. Referring to FIG. 90A, pixels PX on a display screen DPL of a display unit are horizontally arranged on scanning lines HL0 to HLn. After the horizontally arranged pixels PX are successively accessed, pixels on a subsequent scanning line are accessed in the so-called raster scan system (in both of image data writing and reading). In scanning of the scanning lines HL0 to HLn on the display screen DPL, every other scanning line (even scanning line, for example) is successively accessed and then the remaining scanning lines (odd scanning lines, for example) are successively accessed in case of an interlace system. In case of a non-interlace system, on the other hand, the scanning lines HL0 to HLn on the display screen DPL are successively accessed. Pixel data are supplied in units of frames in case of the non-interlace system, while the same are supplied in units of fields in case of the interlace system. Namely, pixel data of scanning lines of even fields are supplied after all pixel data of scanning lines of odd fields are supplied.

Image data are mass image data (in general, pixels of 720 columns and 520 rows are arranged in the MPEG standard currently employed for motion image processing on the display screen DPL). The pixels PX are formed by four bits in general. These data are successively accessed at a high speed in prescribed order. When such image data are stored, each scanning line HL is generally made to correspond to one page (word line). This is because the pixel data PX can be successively accessed through page mode access. When pages in the same bank (array block) are continuously accessed, it is necessary to temporarily drive a selected word line to a non-selected state in page change and thereafter drive a word line for the next new page to a selected state in this array block.

This is because the semiconductor memory device utilizes a dynamic access memory and data of the selected word line is latched in a sense amplifier SA and hence the data latched by the sense amplifier SA must be temporarily reset into a precharge state in next page selection. When page change is made in the same array block, therefore, the access time is increased.

Figure 90B:
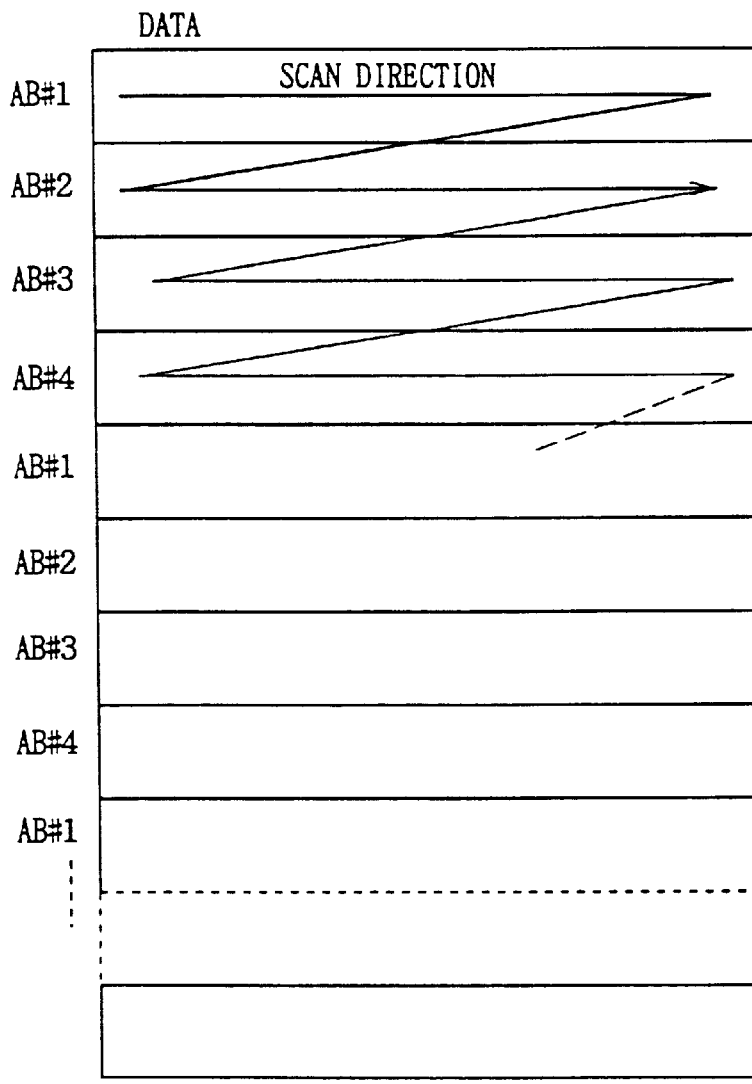
FIG. 90B illustrates data access order in the semiconductor memory device according to the embodiment 12 of the present invention.

In the embodiment 12, therefore, address conversion is so made that pages (word lines) corresponding to the successively accessed scanning lines are included in array banks corresponding to different least significant (lower) banks, as shown in FIG. 90B. Referring to FIG. 90B, array banks (least significant (lower) banks) AB#1 to AB#4 are utilized as image data storage regions, and successively accessed. These array banks AB#1 to AB#4 have bank structures, and can be activated/inactivated independently of each other. Therefore, a page (word line) of the array bank AB#2 can be selected while data in the array bank AB#1 is accessed. Thus, page change is array block change, no RAS precharge time tRP is required, and rapid access is enabled.

Figure 91:
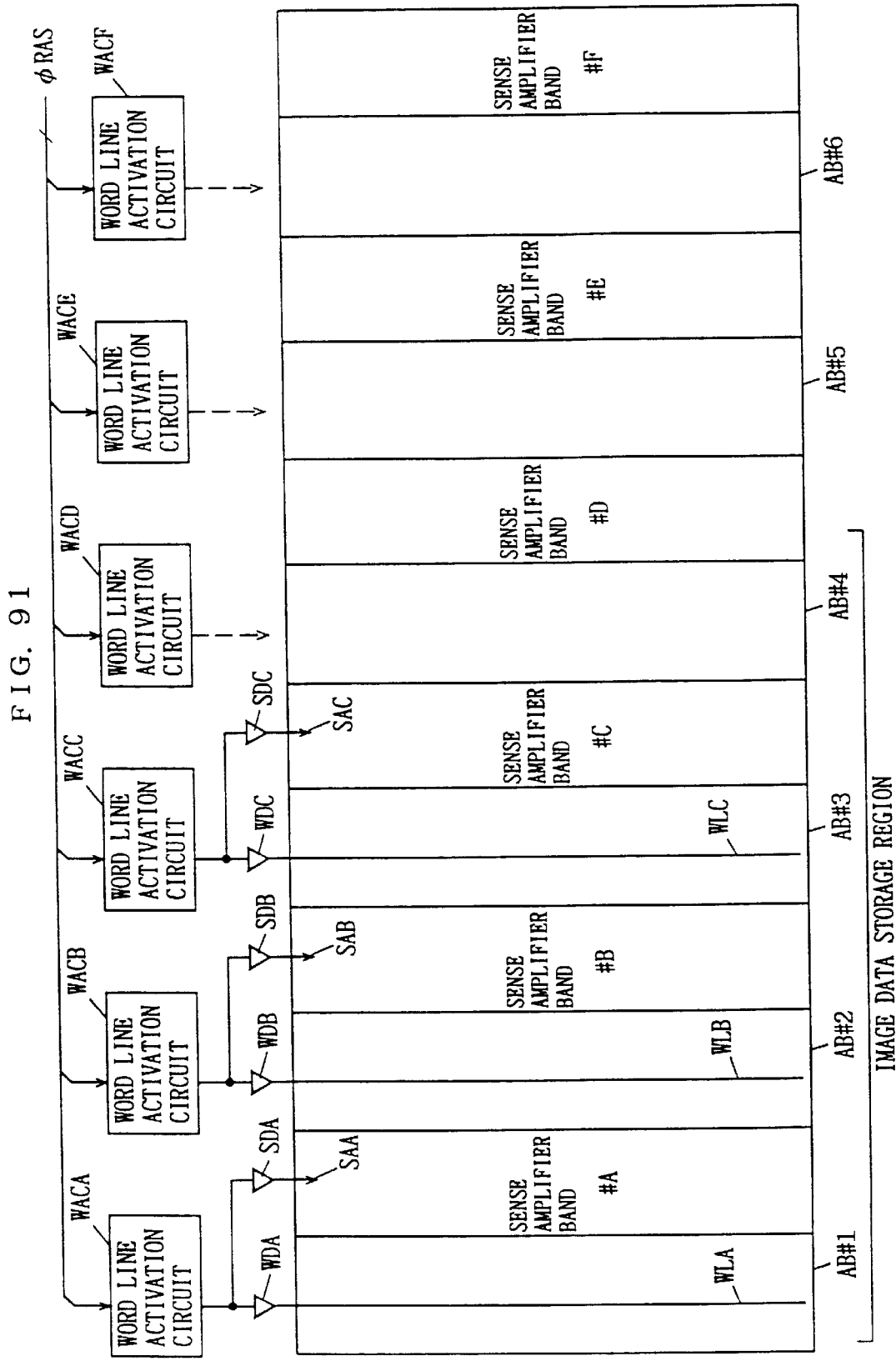
FIG. 91 schematically illustrates the structure of a principal part of the semiconductor memory device according to the embodiment 12 of the present invention.

FIG. 91 schematically illustrates the structure of a principal part of the semiconductor memory device according to the embodiment 12 of the present invention. FIG. 91 representatively shows the array blocks (least significant (lower) banks) AB#1 to AB#5 and word line activation circuits WACA to WACF which are provided in correspondence to these array banks AB#1 to AB#5 respectively.

Each of the word line activation circuits WACA to WACF is activated in response to a word line activation signal (including least significant (lower) bank specifying information) φRAS. The word line activation circuits WACA to WACF decode word line selection addresses (page addresses) supplied through an address buffer circuit, and generate signals for driving the corresponding word lines (pages) to selected states in accordance with the results of decoding. In order to drive the selected word lines (pages) to selected states, word line drivers WDA, WDB, WDC, . . . are provided in correspondence to the respective ones of the array banks AB#1 to AB#5. FIG. 91 representatively illustrates only the word line drivers WDA, WDB and WDC for driving word lines WLA, WLB and WLC with respect to the array banks AB#1 to AB#3 respectively. In correspondence to the respective ones of these array banks AB#1 to AB#5, sense amplifier drivers SDA, SDB, SDC, . . . for driving sense amplifiers to active states are provided. These sense amplifier bands #A, #B, #C, . . . are activated in response to sense amplifier activation signals SAA, SAB, SAC . . . supplied from the corresponding sense amplifier drivers SDA, SDB, SDC, . . .

In the structure shown in FIG. 91, the word lines WLA, WLB and WLC correspond to the successively continuously accessed scanning lines shown in FIG. 90A (correspondence between the scanning lines and the word lines may be different from or identical to each other in the non-interface and interlace systems). In this case, addresses supplied to the word lines WLA, WLB and WLC from an external CPU are continuously changed page addresses. In the interior of the semiconductor memory device, the continuously supplied CPU page addresses are converted to the same page (word line) addresses of different banks. Thus, it is possible to asynchronously drive pages (word lines) corresponding to the continuously accessed scanning lines to selected states in different banks.

Figure 92:
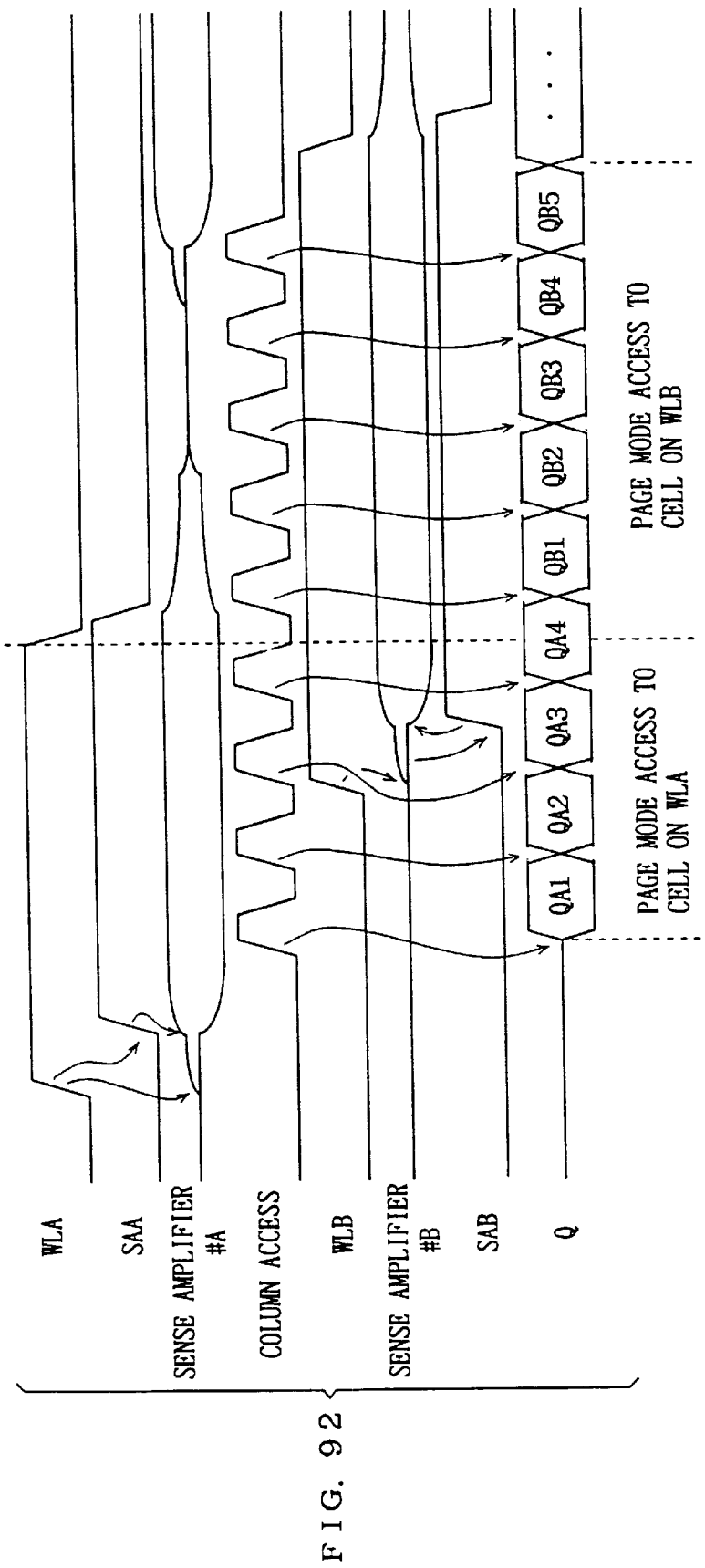
FIG. 92 is a diagram representing an operation of the memory device according to the embodiment 12.

FIG. 92 illustrates a data read operation of the semiconductor memory device shown in FIG. 91. The data read operation is now described with reference to FIGS. 91 and 92. First, the array bank AB#1 is specified, the word line activation circuit WACA is activated, and the word line WLA is selected through the word line driver WDA. Thus, the potential of sense nodes (nodes connected to bit lines) of the sense amplifier band #A is changed from a precharge state of an intermediate potential. Then, the sense amplifier activation signal SAA from the sense amplifier driver SDA is activated, and the potential of each sense node of this sense amplifier band #A is changed and latched in accordance with data of selected memory cells. Then, column access in a page mode is performed after a lapse of a prescribed period, so that data QA1, QA2, QA3 and QA4 of memory cells connected to the word line WLA are successively read.

The array bank AB#2 is specified in parallel with the read operation of the data QA1 to QA4 of the memory cells on the word line WLA, so that the word line WLB included in the array bank AB#2 is selected through the word line activation circuit WACB and driven to a selected state by the word line driver WDB. Due to the driving of the word line WLB to the selected state and activation of the sense amplifier activation signal SAB, the sense nodes of the sense amplifier band #B is changed in potential from a precharge state and latches memory cell data. This state, is maintained until all data of necessary memory cells on the word line WLA of the array block AB#1 are read. When all necessary data are read among the memory cell data on the word line WLA, column access to the array block AB#2 in a page mode is started, so that data QB1, QB2, . . . , QB5 of memory cells on the word line WLB are successively read, following the data QA4.

It is possible to perform page change in continuously reading data on the word lines WLA and WLB by asynchronously driving the word lines WLA and WLB of the array blocks AB#1 and AB#2 without requiring a RAS precharge time and a waiting time of a RAS access time tRAC.

The operation of successively driving the word lines WLA, WLB and WLC with selected states overlapped with each other in the respective ones of the array banks AB#1, AB#2, AB#3, . . . is referred to as "asynchronous operation". Thus, when the array blocks can be driven to selected states independently of each other, it is possible to read memory cell data at a high speed by asynchronously driving the respective array blocks to selected states, driving necessary word lines to selected states before page change is necessary and latching memory cell data in the sense amplifier band. In particular, it is possible to read data at a high speed through the asynchronous operation of the array blocks by dispersively arranging continuously accessed pages in different banks (array blocks).

Figure 93:
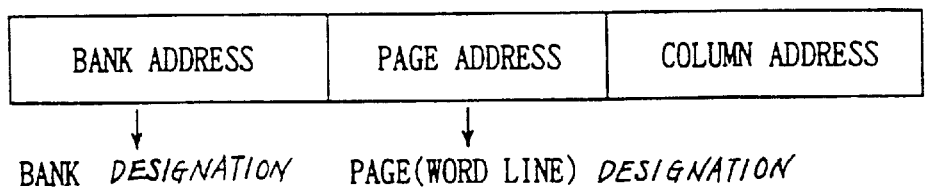
FIG. 93 illustrates an exemplary structure of CPU addresses employed in the embodiment 12 of the present invention.

FIG. 93 illustrates the structure of addresses supplied to the semiconductor memory device. As shown in FIG. 93, an address supplied from a processor (CPU) includes a bank address specifying a bank, a page address specifying a page (word line) in the bank, and a column address specifying a column on this page. The bank address includes addresses specifying all banks from most significant (higher) to least significant (lower) banks in the structure shown in FIG. 61. Therefore, the page address specifies a word line in the least significant (lower) bank (array block). The number of columns specified by the column address is decided depending on the number of data bits read from the array block in parallel with each other.

Figure 94:
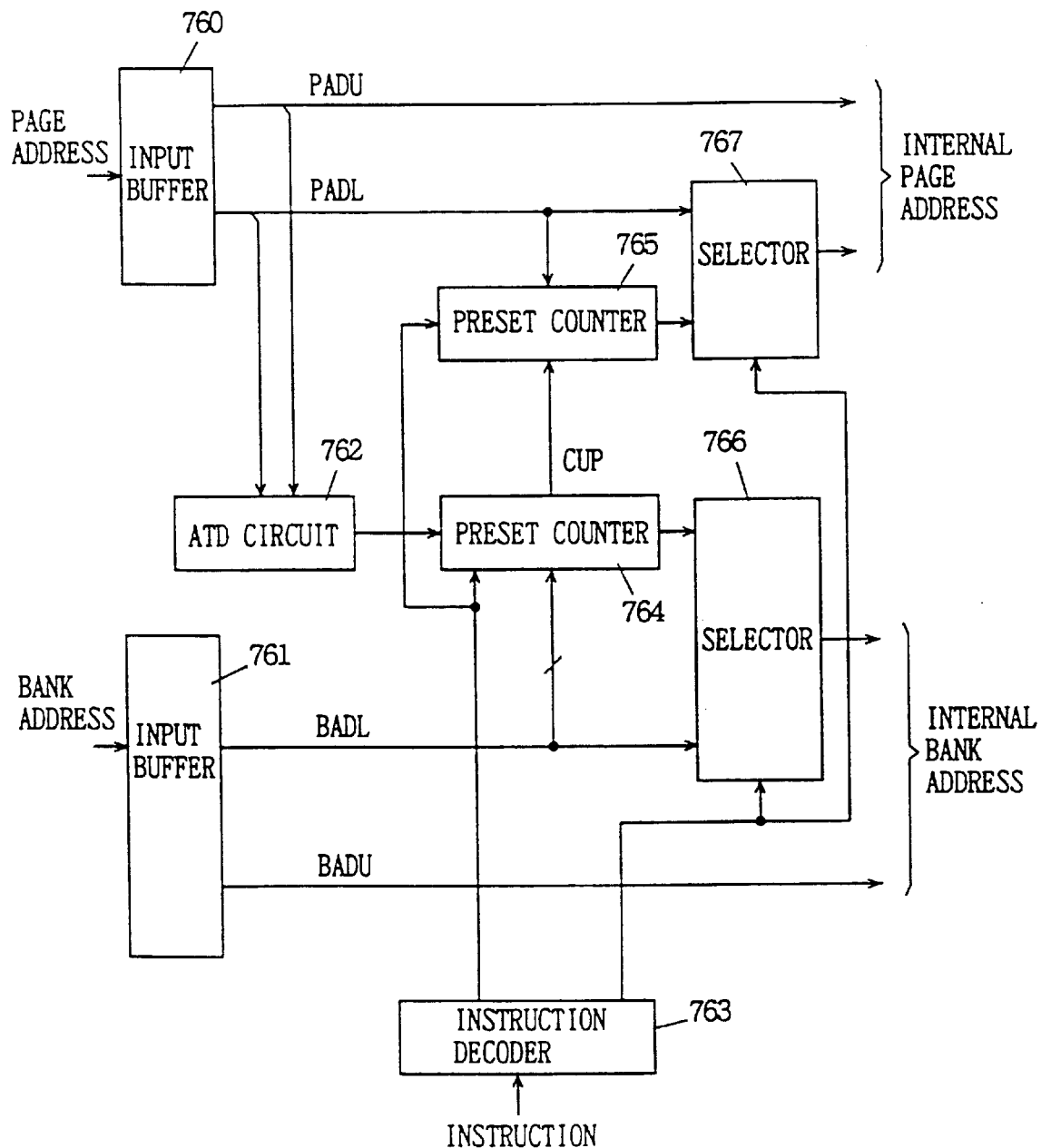
FIG. 94 schematically illustrates the structure of an address conversion part of the semiconductor memory device according to the embodiment 12 of the present invention.
Figure 97:
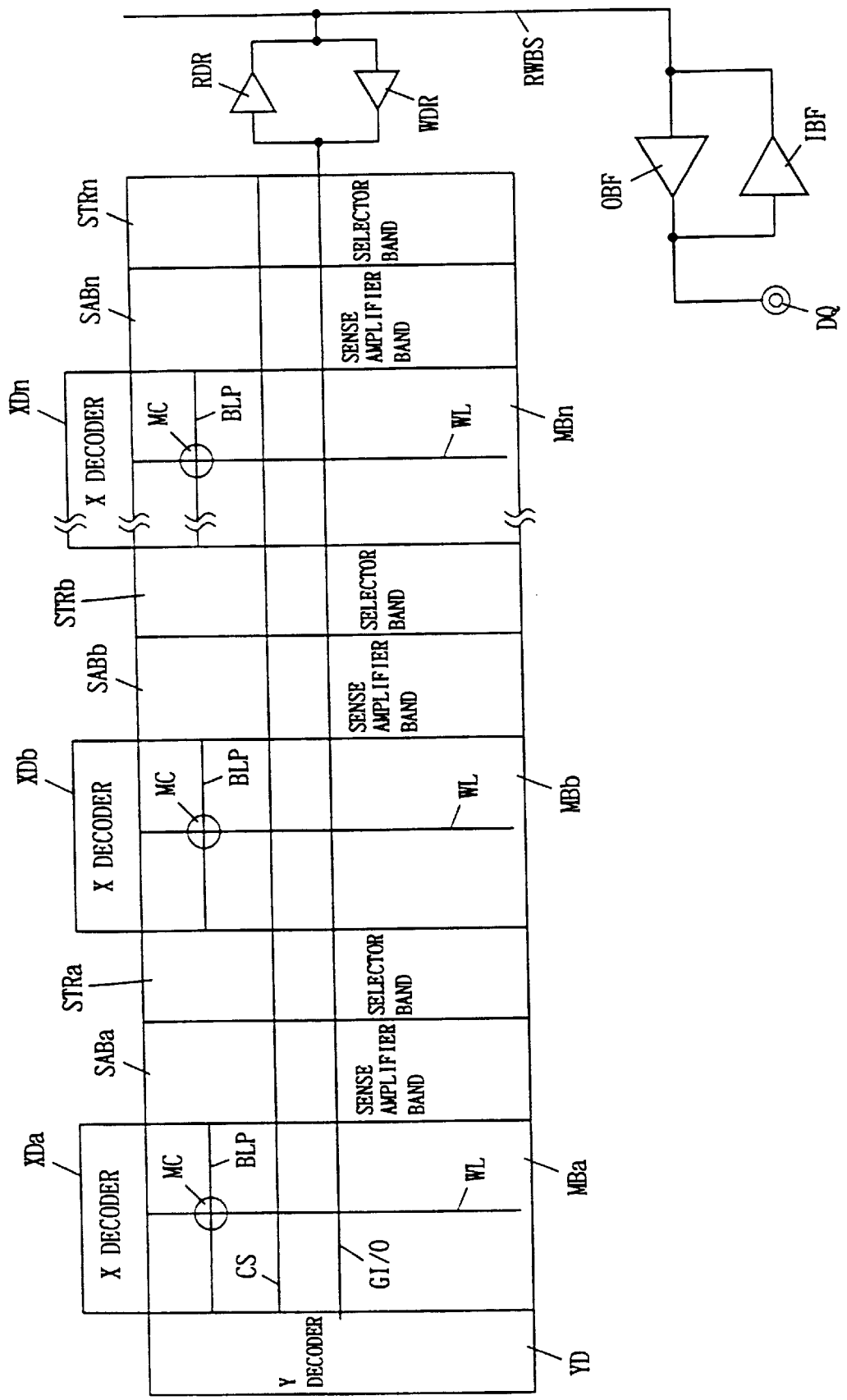
FIG. 97 illustrates the structure of an array part of a conventional semiconductor memory device.
Figure 98:
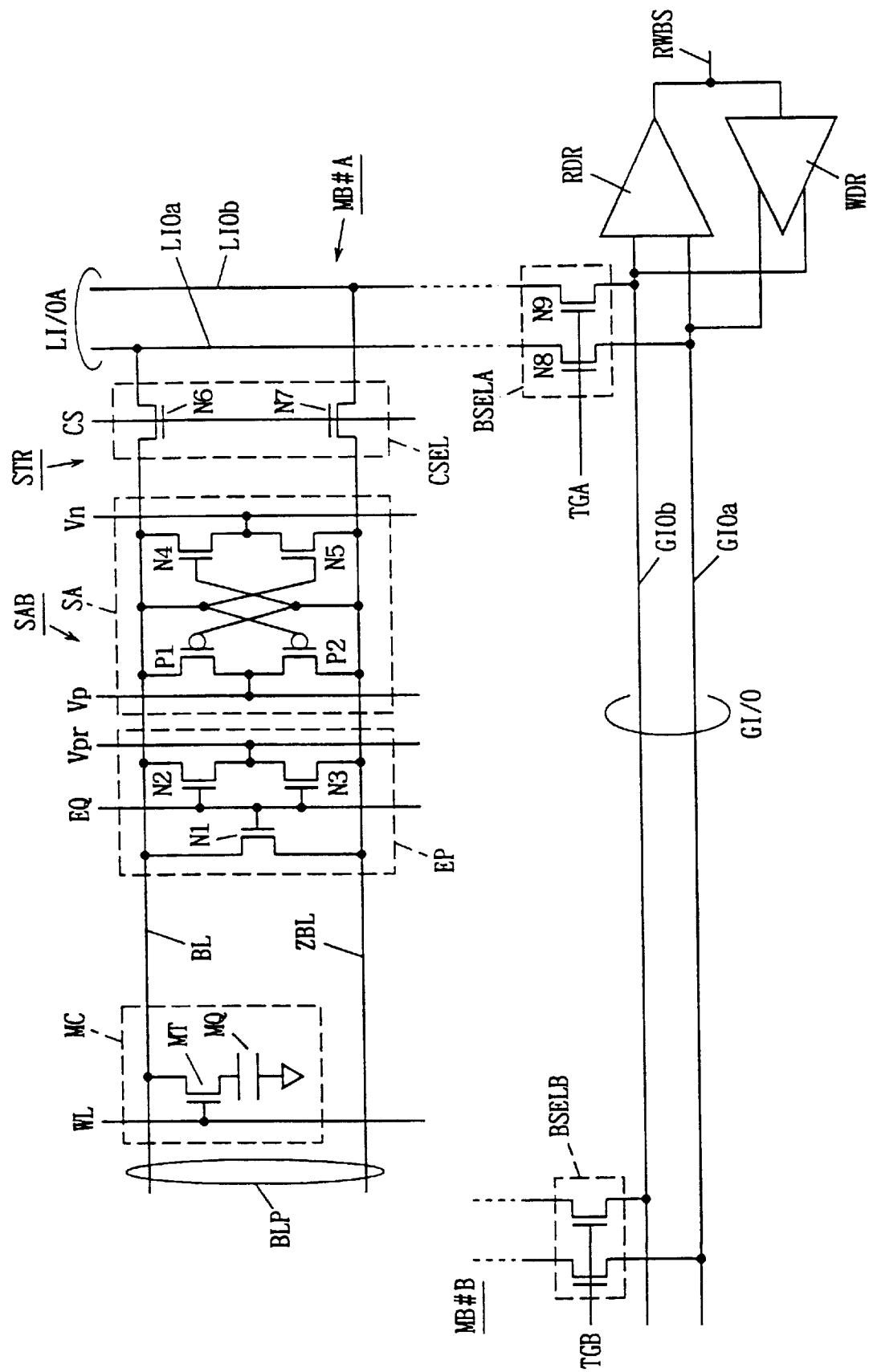
FIG. 98 illustrates the structure of a portion related to one column of an array block of the semiconductor memory device shown in FIG. 97.
Figure 99:
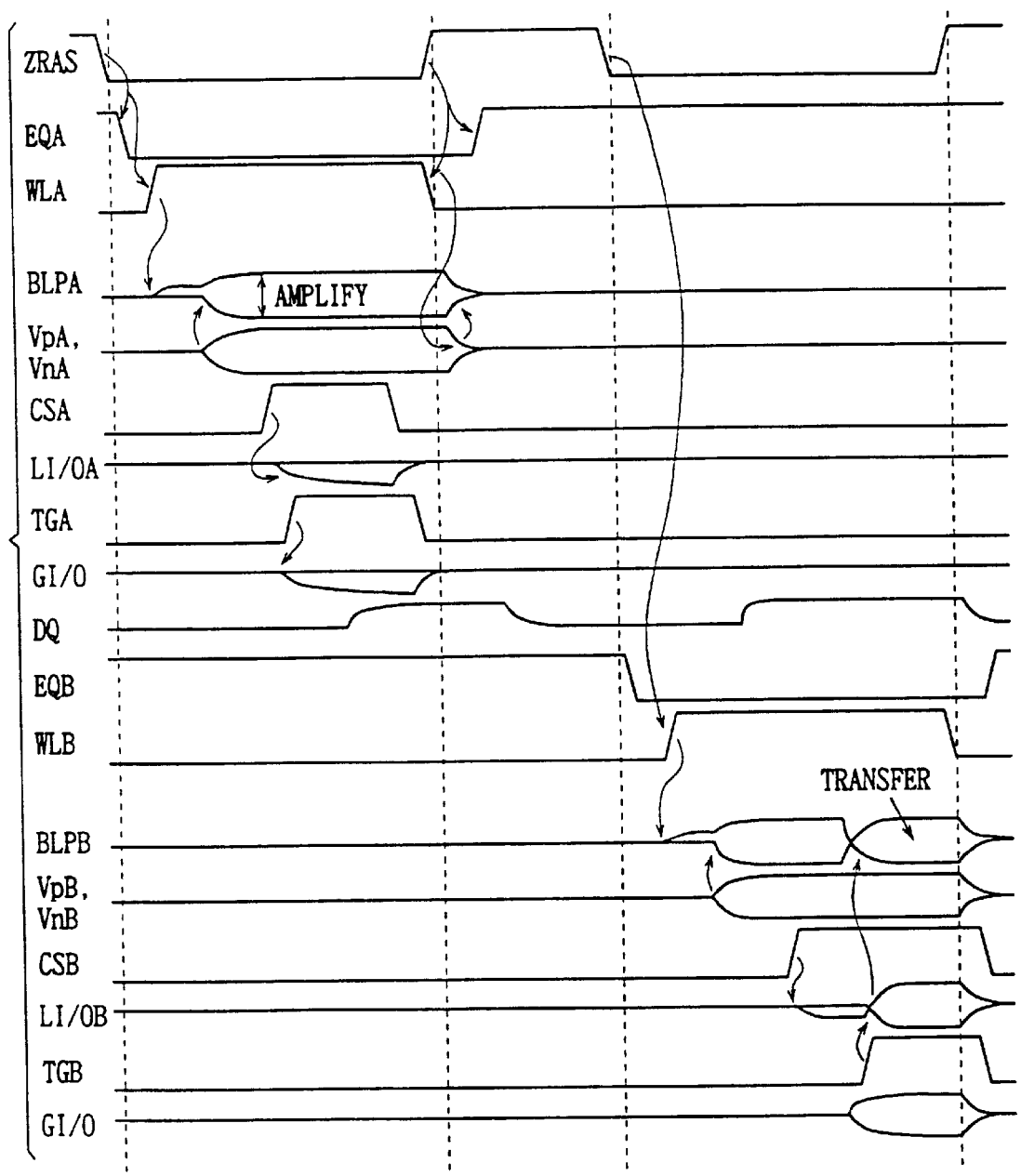
FIG. 99 is a signal waveform diagram representing operations of the semiconductor memory device shown in FIG. 97.

FIG. 94 schematically illustrates the structure of an address conversion part. Referring to FIG. 94, the address conversion part includes an input buffer 760 inputting a page address signal, another input buffer 761 inputting a bank address signal, an ATD circuit 762 detecting change of the page address signal supplied from the input buffer 760, a preset counter 764 which is activated under control of an instruction decoder 763 for presetting a lower bank address bit BADL supplied from the input buffer 761 as an initial value and performing a count operation in accordance with an address transition detection signal from the ATD circuit 762, another preset counter 765 which is activated under control of the instruction decoder 763 for setting a lower bit PADL of a page address supplied from the input buffer 760 as an initial value and performing a count operation in response to a countup signal CUP from the preset counter 764, a selector 766 for selecting one of a count value outputted from the preset counter 764 and the lower bank address signal bit BADL supplied from the input buffer 761, and another selector 767 selecting one of a count value outputted from the preset counter 765 and the lower page address signal bit PADL supplied from the input buffer 760 under control of the instruction decoder 763.

When an instruction (indicating continuous access to mass data) is supplied from the processor (CPU), the instruction decoder 763 sets the selectors 766 and 767 in states selecting the count values outputted from the counter 764 and 765 respectively. When the mass data continuous access instruction is supplied, the instruction decoder 763 also makes the counters 764 and 765 set the count to the address signal bits BADL and PADL supplied from the input buffer 761 and 760 as initial values respectively, while activating the counters 760 and 765 at the same time.

The ATD circuit 762 detects transition of upper and lower page address signal bits PADU and PADL supplied from the input buffer 760, and supplies transition detection signals to the preset counter 764. The instruction decoder 763 may be so structured as to set the counters 764 and 765 and the selectors 766 and 767 in prescribed states after first bank and page address signals are supplied and before next bank and page addresses are supplied in the continuous data access. Alternatively, the instruction decoder 763 may control the preset counters 764 and 765 and the selectors 766 and 767 to perform address conversion after a lapse of a prescribed time from supply of the first bank and page addresses in mass data access. Any structure may be employed.

In a general operation, the selectors 766 and 767 select the address signal bits BADL and PADL supplied from the input buffers 761 and 760. In the general operation, therefore, internal bank and page address selection is performed in accordance with externally supplied bank and page address signals.

In mass data access, on the other hand, the selectors 766 and 767 select the count values outputted from the counters 764 and 765. Corresponding bank and page are selected in accordance with the page and bank addresses supplied first. Then, the output signal of the ATD circuit 762 is brought to an active state indicating address change when the same bank address and a different page address are supplied, so that the preset counter 764 performs a count operation for incrementing the value of the lower address signal bit BADL of the first set bank address by 1. Thus, it comes to that the internal bank address specifies an adjacent bank even if the external bank address remains unchanged. This preset counter 764 performs a count operation when the address transition detection signal from the ATD circuit 762 is activated. When different page addresses are successively supplied, the preset counter 764 performs a count operation so that adjacent banks are successively specified. At this time, the preset counter 765 maintains its initial value since the countup signal CUP from the preset counter 764 is still in an inactive state. Therefore, the same pages are successively selected in continuous different banks.

When all the banks allotted to the mass data access are successively selected, the countup signal CUP from the preset counter 764 is activated, and the preset counter 765 increments the count value by 1. Thus, the value of the head page address signal PADL is incremented by 1. Therefore, the process returns to the first bank (array block) in the next cycle, so that the next page is specified.

FIG. 95A specifically illustrates the operation of the address conversion part shown in FIG. 94. Referring to FIG. 95A, each bank address is formed by four bits, and each page address is formed by four bits, as an example. Four banks are used for mass data access. The preset counters 764 and 765 are 2-bit counters respectively.

The bank address currently supplied from the CPU or the processor is 0000, which specifies the same bank. The page addresses are successively incremented by 1. In the first cycle, the counters output the initial values thereof, and hence the externally supplied bank and page addresses are outputted as internal bank and page addresses.

When the page address is incremented by 1 in the next cycle, the count value of the preset counter 764 is incremented by 1 in accordance with the transition detection signal outputted from the ATD circuit 762, so that the bank address is also incremented by 1. Therefore, a bank 0001 is specified. At this time, the page address remains unchanged and maintains 0000.

When the page address is again incremented by 1 in the next cycle, the bank address is again incremented by 1, to specify a bank 0010. Also in this state, the page address remains unchanged and maintains the initial value 0000.

When the page address is incremented by 1 in the next cycle, the bank address is also incremented by 1 again, to specify a bank 0011. In this state, the page address remains unchanged and maintains the initial value.

When the page address is incremented by 1 again to specify a page 0100, the count value of the preset counter 764 which is a 2-bit counter returns to its initial value. Therefore, the bank 0000 is specified. At this time, the preset counter 765 performs counting in response to the countup signal CUP from the preset counter 764, so that the page address is incremented by 1 to specify a page 0001.

Therefore, when an external CPU (or processor) address specifies the bank 0000 and continuous pages are successively specified from the page 0000 in the bank 0000, the page 0000 is successively specified in the banks 0000, 0001, 0010 and 0011 after conversion, as shown in FIG. 95B. When the page 0000 is selected in the bank 0010, the next page 0001 is specified in the original bank 0000 again. Therefore, the next page is selected every four cycles in each bank. Thus, it is possible to make data access by asynchronously selecting the respective banks in page mode access.

In the above description, the pages are incremented one by one. However, this conversion mode may be properly modified in accordance with the interlace or non-interlace system and the frame or field form of the employed image data. The number of employed banks is arbitrarily selected, so far as the same is at least 2.

While the above description is made with reference to image data, data can be similarly transferred in a page mode at a high speed also in case of arithmetic data which are accessed by a CPU (or a processor) in a burst mode, by previously dispersing the data regions subjected to transfer in the burst mode into a plurality of bank regions.

FIG. 96 illustrates an address region which is employed for mass data access in the semiconductor memory device. Referring to FIG. 96, upper banks B#A to B#D are arranged so that middle banks are arranged in the respective banks B#A to B#D. Among these middle banks, a region shown with slant lines is utilized as a dedicated region for rapid data access. In units of the middle banks, therefore, rapid data access can be implemented through the dedicated region even if other middle banks are selected, with no collision with data of the selected middle banks.

In the above description, further, the bank address specified by the CPU is regarded as an initial value for successively selecting adjacent banks. Alternatively, the bank addresses may be so converted that not the adjacent banks but every other bank is specified. In this case, the semiconductor memory device has a shared sense amplifier structure, and the respective array blocks can be successively selected at a high speed without controlling activation/inactivation of sense amplifiers when the array blocks are banks (array blocks sharing the sense amplifier are not simultaneously selected).

The preset counters 764 and 765 may not preset the address signal bits supplied from the input buffers 761 and 760 as initial values, but a region for mass data access required by the CPU may be set in an address region previously allotted under control by the instruction decoder 763. Namely, the region shown by the slant lines in FIG. 96 may be regularly dedicatedly employed as a rapid data access region so that the address region is not converted but regularly fixed in each processing application.

In the above description, further, address conversion is carried out in the semiconductor memory device. If the semiconductor memory device is formed in units of modules as shown in FIG. 70, however, it is possible to access data by alternately allotting pages to two modules at the minimum by providing an address conversion part in common for these modules (in this case, the employed modules must not be selected for data access in other application).

According to the embodiment 12 of the present invention, as hereinabove described, address conversion is so performed as to disperse continuously accessed pages in different banks in rapid data access, whereby the respective array blocks can be asynchronously driven to selected states to be accessed, RAS precharge and access times are unnecessary in page change, and rapid access is enabled.

In the structure shown in FIG. 94, the preset counters 764 and 765 may alternatively be so formed that all bank and page address signal bits are set as initial values for performing count operations in prescribed sequences respectively. In this case, not continuous banks or pages are accessed but banks and pages are selected in accordance with specific prescribed sequences. Also in this case, continuous pages are dispersively arranged in different banks in a CPU address space, whereby an effect similar to the above can be attained.

Epilogue

According to the present invention, as hereinabove described, a plurality of array blocks are rendered drivable independently of each other, whereby a plurality of word lines can be simultaneously made in selected states and a semiconductor memory device implementing high-speed access can be obtained.

Further, charges of the sense amplifier activation signal lines can be reused by coupling the sense amplifier activation signal lines and the capacitances with each other for prescribed periods in transition of the sense amplifiers from inactivation to activation and vice verse, thereby reducing the current consumed for driving the sense amplifiers.

In addition, an external address signal is changed internally to designate a different memory block, and a defective memory block can be repaired readily, and a repairing memory block can be accessed at high speed.

Further, connection between internal data bus lines and external data bus lines is selectively established, and data operability, bus utilization efficiency and data transfer rate can be greatly improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory groups each including a plurality of memory cells and allotted with a unique address;
    address conversion circuitry receiving a first address signal designating a first memory group among said plurality of memory croups for converting the received first address signal into a second address signal designating a second memory group different from the first memory group designated by the received address signal, said address conversion circuitry being capable of converting said received address signal into a plurality of different address signals, said second address signal being one of said plurality of different address signals; and
    access circuitry for accessing the second memory group designated by the converted address signal.

2. The semiconductor memory device according to claim 1, wherein each of said plurality of memory groups is driven to an active state independently of the others.

3. The semiconductor memory device according to claim 1, wherein said address conversion circuitry includes a circuit for performing a logical operation on the received address signal to produce said second address signal.

4. The semiconductor memory device according to claim 1, further comprising circuitry receiving an external operation mode designating signal for producing a local operation mode designating signal applied to the second memory group designated by the second address signal in accordance with the second address signal.

5. The semiconductor memory device according to claim 1, further comprising a mapping memory for storing an address signal designating a memory group of said plurality of memory groups, comparison circuitry for comparing the received address signal with the address signal stored in the mapping memory, and activation circuitry responsive to said comparison circuitry indicating a coincidence, for activating said address conversion circuitry.

6. The semiconductor memory device according to claim 5, wherein said address conversion circuitry includes, address register circuitry for storing a post-conversion address signal corresponding to the address signal stored in the mapping memory, read circuitry responsive to said comparison circuitry indicating the coincidence, for reading out a corresponding converted address signal stored in said address register circuitry, and selection circuitry coupled to receive the received address signal and the post-conversion address signal read from the address register circuitry and responsive to said comparison circuitry indicating the coincidence for passing the address signal read from the address register circuitry as said second address signal.

7. The semiconductor memory device according to claim 1, wherein said first memory group designated by the received address signal is a defective memory group incapable of storing data correctly.

8. The semiconductor memory device according to claim 1, further comprising, a plurality of registers provided corresponding to said plurality of memory groups and storing flags indicating pass/fail of corresponding memory groups, said plurality of registers connected in series between an output port and an input port to form a shift register responsive to a clock signal for transferring the flags.

9. The semiconductor memory device according to claim 1, wherein said address conversion circuitry includes, programmable storage circuitry for programmably storing data defining a mode of address conversion, and circuitry for performing a conversion operation on the received address signal in accordance with the data stored in said programmable storage circuitry.

10. The semiconductor memory device according to claim 9, further comprising program circuitry for updating data stored in said programmable storage circuitry in accordance with an operation mode.

11. The semiconductor memory device according to claim 1, further comprising circuitry responsive to an operation mode designation signal for asynchronously activating at least two memory groups in said plurality of memory groups with each other.

12. The semiconductor memory device according to claim 1, wherein each of said plurality of memory groups is a memory module including a plurality of subarrays each having a plurality of memory cells arranged in rows and columns, and each of said plurality of subarrays is driven to an active state and to an inactive state, respectively, independently from the others of said plurality of subarrays.

13. The semiconductor memory device according to claim 12, further comprising, a plurality of registers provided corresponding to said plurality of subarrays and storing flags indicating pass/failure of corresponding subarrays, said plurality of registers connected to form a shift register over the memory modules, mapping memory circuitry for reading the contents of said plurality of registers to determine an address to be converted in accordance with the read out flags and to store the address signal indicating the address to be converted, and circuitry for comparing the received address signal with the address signal stored in the mapping circuitry and performing an address conversion in response to the result of comparison indicating a coincidence for supplying a resultant converted address signal to the memory groups configured as the memory modules.

14. The semiconductor memory device according to claim 1, wherein said address conversion circuitry includes a circuit for converting successively applied address signals designating memory groups into address signals designating different memory groups from each other.

15. A semiconductor memory device comprising:

a plurality of memory blocks each including a plurality of memory cells;

a data bus including a plurality of data lines, for transferring data for a selected memory cell, said data bus and said plurality of memory blocks being formed on a common chip;

a data node group including a plurality of data nodes coupled to an external circuit provided external to said plurality of memory blocks, for transferring data with said external circuit; and bus conversion circuitry coupled to said data bus and said data node group, for converting a connection between the data lines of said data bus and the data nodes of said data node group.

16. The semiconductor memory device according to claim 15, wherein said bus conversion circuitry includes a circuit for changing a bus width of said data bus indicating the number of bus lines transferring valid data.

17. The semiconductor memory device according to claim 15, wherein said bus conversion circuitry includes a circuit for coupling a set of a predetermined number of data lines of said data bus to each of at least two sets of predetermined number of data nodes of said data node group.

18. The semiconductor memory device according to claim 15, wherein said bus conversion circuitry includes a circuit for coupling a set of a predetermined number of data nodes of said data node group to each of at least two sets of predetermined number of data lines of said data bus.

19. The semiconductor memory device according to claim 15, wherein said bus conversion circuitry includes a circuit for interchanging a connection between the data lines of said data bus and the data nodes of said data node group on a set basis, said set including a predetermined number of data lines.

20. The semiconductor memory device according to claim 15, wherein said bus conversion circuitry includes programmable storage circuitry for programmably storing data defining a mode of connection of data lines, and a circuit for performing a conversion operation on the data lines of the data bus and data nodes of said data node group in accordance with the data stored in said programmable storage circuitry.

21. The semiconductor memory device according to claim 20, further comprising program circuitry for updating data stored in said programmable storage circuitry in accordance with an operation mode.

22. The semiconductor memory device according to claim 15, further comprising circuitry responsive to an operation mode designation signal for asynchronously activating at least two memory blocks in said plurality of memory blocks with each other.

23. A semiconductor memory device comprising:

a plurality of memory modules each including a plurality of subarrays each having a plurality of memory cells arranged in rows and columns, each of said plurality of subarrays being driven to an active state and to an inactive state, respectively, independently from the others of said plurality of subarrays;

a data bus including a plurality of data lines coupled to the memory modules, for transferring data with said memory modules;

a data node group including a plurality of data nodes and coupled to external circuitry provided external to said memory modules; and bus conversion circuitry arranged between said data bus and said data node group, for converting a connection between the data lines of said data bus and the data nodes of said data node group.

* * * * *

UNITED STATES PATENT AND TRADEMARK OFFICE
CERTIFICATE OF CORRECTION

PATENT NO.  : 6,028,810
DATED       : February 22, 2000
INVENTOR(S) : Tsukasa OOISHI It is certified that error appears in the above-identified patent and that said Letter Patent is hereby corrected as shown below:

Column 90, Claim 13, Line 12, after "mapping" insert --memory--.

Signed and Sealed this

Third Day of April, 2001

Attest:

NICHOLAS P. GODICI

*Attesting Officer*         *Acting Director of the United States Patent and Trademark Office*